US012685008B2

(12) United States Patent
Kim et al.

(10) Patent No.: US 12,685,008 B2
(45) Date of Patent: Jul. 14, 2026

(54) ORGANOMETALLIC COMPOUND, LIGHT-EMITTING DEVICE INCLUDING THE SAME AND ELECTRONIC APPARATUS INCLUDING THE LIGHT-EMITTING DEVICE

(71) Applicant: Samsung Display Co., Ltd., Yongin-si (KR)

(72) Inventors: Haejin Kim, Yongin-si (KR); Soobyung Ko, Yongin-si (KR); Sungbum Kim, Yongin-si (KR); Sujin Shin, Yongin-si (KR); Eunsoo Ahn, Yongin-si (KR); Jaesung Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1233 days.

(21) Appl. No.: 17/564,187

(22) Filed: Dec. 28, 2021

(65) Prior Publication Data

US 2022/0209142 A1 Jun. 30, 2022

(30) Foreign Application Priority Data

Dec. 30, 2020 (KR) ........................ 10-2020-0188058

(51) Int. Cl.

| | |
|---|---|
| ***C07B 59/00*** | (2006.01) |
| ***C07F 15/00*** | (2006.01) |
| ***C09K 11/06*** | (2006.01) |
| ***H10K 50/11*** | (2023.01) |
| ***H10K 59/12*** | (2023.01) |

(Continued)

(52) U.S. Cl.

CPC ....... *H10K 85/346* (2023.02); *C07F 15/0086* (2013.01); *C09K 11/06* (2013.01); *C09K 2211/1029* (2013.01); *C09K 2211/1044* (2013.01); *C09K 2211/185* (2013.01); *H10K 50/11* (2023.02); *H10K 2101/10* (2023.02)

(58) Field of Classification Search

CPC .............. H10K 85/346; C07F 15/0086; C09K 2211/185

See application file for complete search history.

(56) References Cited

U.S. PATENT DOCUMENTS

| | | | |
|---|---|---|---|
| 9,318,725 | B2 | 4/2016 | Li |
| 9,385,329 | B2 | 7/2016 | Li et al. |
| 9,461,254 | B2 | 10/2016 | Tsai et al. |

(Continued)

FOREIGN PATENT DOCUMENTS

| | | | |
|---|---|---|---|
| CN | 114349792 | A | 4/2022 |
| EP | 3715353 | A1 | 9/2020 |

(Continued)

OTHER PUBLICATIONS

Korean Notice of Allowance for KR Application No. 10-2020-0188058, dated Aug. 5, 2025, 3 pages.

*Primary Examiner* — Rachel Simbana

(74) *Attorney, Agent, or Firm* — Womble Bond Dickinson (US) LLP

(57) ABSTRACT

A light-emitting device includes: a first electrode; a second electrode facing the first electrode; an interlayer between the first electrode and the second electrode and including an emission layer; and at least one organometallic compound of Formula 1, as defined herein. The first electrode includes an anode, and the second electrode includes a cathode.

19 Claims, 6 Drawing Sheets

(51) Int. Cl.
*H10K 85/30* (2023.01)
*H10K 101/10* (2023.01)

(56) References Cited

U.S. PATENT DOCUMENTS

| | | | | |
|---|---|---|---|---|
| 9,540,329 | B2 | 1/2017 | Beers et al. | |
| 2005/0236970 | A1* | 10/2005 | Matsudate | H10K 59/12 313/500 |
| 2013/0048963 | A1 | 2/2013 | Beers et al. | |
| 2014/0364605 | A1 | 12/2014 | Li et al. | |
| 2018/0166647 | A1* | 6/2018 | Shin | H10K 50/16 |
| 2020/0119289 | A1 | 4/2020 | Lin et al. | |
| 2020/0140471 | A1* | 5/2020 | Chen | H10K 99/00 |
| 2020/0216481 | A1* | 7/2020 | Chen | H10K 99/00 |
| 2022/0112231 | A1 | 4/2022 | Han et al. | |

FOREIGN PATENT DOCUMENTS

| | | | |
|---|---|---|---|
| JP | 2009-267244 | | 11/2009 |
| KR | 10-2014-0011952 | | 1/2014 |
| KR | 10-2020-0116036 | A | 10/2020 |
| KR | 10-2020-0116039 | A | 10/2020 |
| KR | 10-2022-0049076 | A | 4/2022 |

* cited by examiner

Formula 1

Formula 2

Formula 1-1

Formula 1-2:

Formula 1-3:

Formula 301-1:

Formula 301-2:

ORGANOMETALLIC COMPOUND, LIGHT-EMITTING DEVICE INCLUDING THE SAME AND ELECTRONIC APPARATUS INCLUDING THE LIGHT-EMITTING DEVICE

CROSS-REFERENCE TO RELATED APPLICATION

This application claims priority from and the benefit of Korean Patent Application No. 10-2020-0188058, filed on Dec. 30, 2020, which is hereby incorporated by reference for all purposes as if fully set forth herein.

BACKGROUND

Field

Embodiments of the invention relate generally to an organometallic compound, and more particularly, to a light-emitting device including the same, and an electronic apparatus including the light-emitting device.

Discussion of the Background

Organic light-emitting devices (OLEDs) are self-emissive devices that, as compared with devices of the related art, have wide viewing angles, high contrast ratios, short response times, and excellent characteristics in terms of luminance, driving voltage, and response speed, and produce full-color images.

In a light-emitting device, a first electrode is located on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. The excitons transition from an excited state to a ground state to thereby generate light.

The above information disclosed in this Background section is only for understanding of the background of the inventive concepts, and, therefore, it may contain information that does not constitute prior art.

SUMMARY

An organometallic compound made, light-emitting device constructed, and an electronic apparatus including the light-emitting device according to illustrative implementations of the invention are capable of providing an organometallic compound, a light-emitting device including the organometallic compound having high efficiency and long lifespan, and an electronic apparatus including the light-emitting device.

Additional features of the inventive concepts will be set forth in the description which follows, and in part will be apparent from the description, or may be learned by practice of the inventive concepts.

According to one aspect of the invention, a light-emitting device includes: a first electrode; a second electrode facing the first electrode; an interlayer between the first electrode and the second electrode and including an emission layer; and at least one organometallic compound of Formula 1:

Formula 1

See FIG. 5A wherein, in Formula 1, the variables are defined herein.

An electronic apparatus may include the light-emitting device as described above.

According to another aspect of the invention, An organometallic compound of Formula 1:

Formula 1

See FIG. 5A wherein, in Formula 1, the variables are defined herein.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
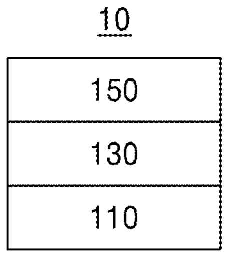
FIG. 1 shows a schematic cross-sectional view of an embodiment of a light-emitting device.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The organometallic compound may be represented by Formula 1:

Formula 1

Figure 5A:
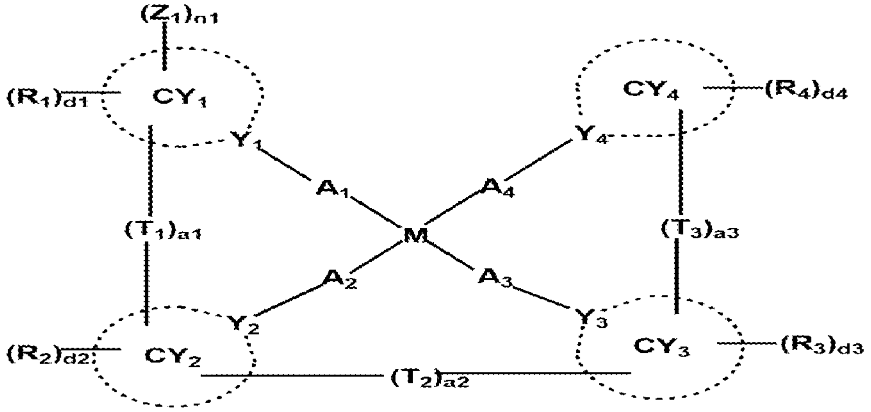
FIGS. 5A and 5B show formulas utilized in various embodiments.
Figure 5A:
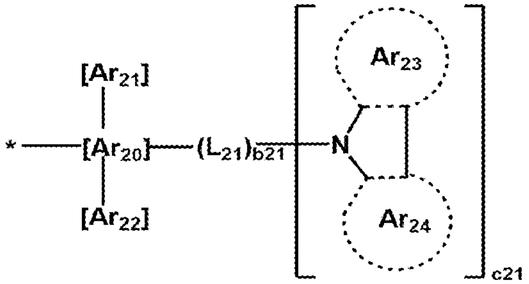
Figure 5A:
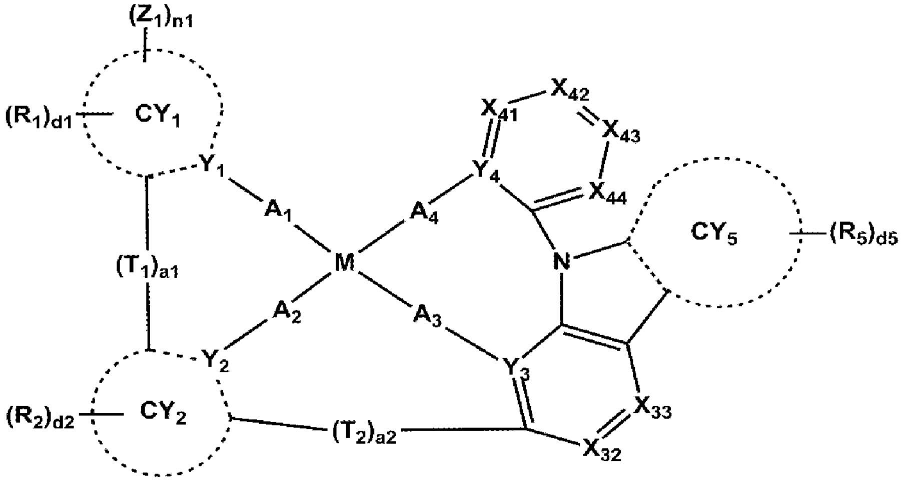

See FIG. 5A

Formula 2

See FIG. 5A wherein, in Formula 1, $Z_1$ may be a group represented by Formula 2.

n1 may be an integer selected from 1 to 3.

In Formulae 1 and 2,

M may be platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm).

In an embodiment, M may be platinum (Pt), palladium (Pd), copper (Cu), silver (Ag), gold (Au), rhodium (Rh), iridium (Ir), ruthenium (Ru), or osmium (Os). The groups $CY_1$ to $CY_4$ may each independently be a $C_3$-$C_{60}$ carbocyclic group or a $C_1$-$C_{60}$ heterocyclic group.

In an embodiment, $CY_1$ to $CY_4$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzotriazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, $CY_1$ may be a group represented by one of Formulae CY1-1 to CY1-70, $CY_2$ may be a group represented by one of Formulae CY2-1 to CY2-14, $CY_3$ may be a group represented by one of Formulae CY3-1 to CY3-14, and CY4 may be a group represented by one of Formulae CY4-1 to CY4-70:

CY1-1

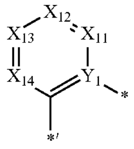

CY1-2

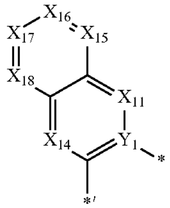

CY1-3

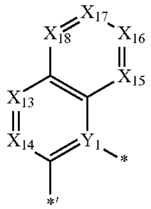

CY1-4

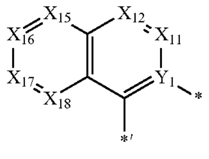

-continued

CY1-5

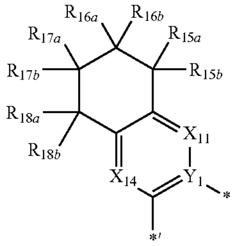

CY1-6

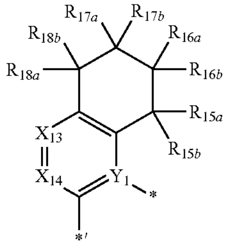

CY1-7

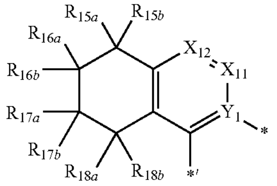

CY1-8

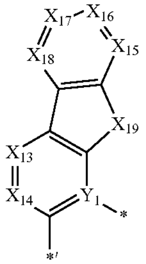

CY1-9

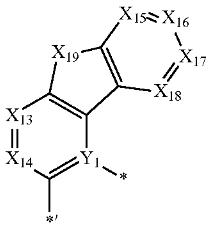

CY1-10

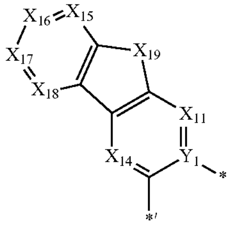

-continued
CY1-11
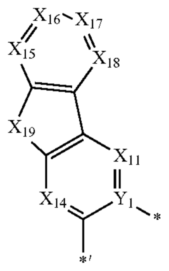
CY1-12
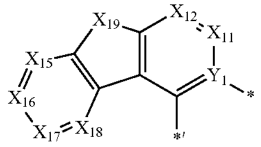
CY1-13
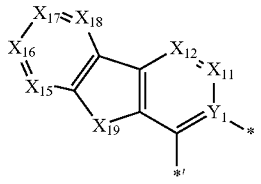
CY1-14
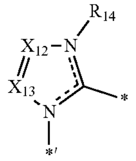
CY1-15
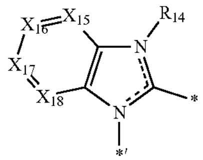
CY1-16
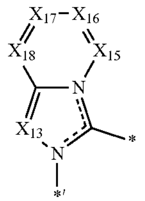
CY1-17
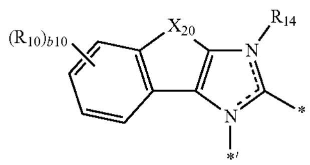
CY1-18
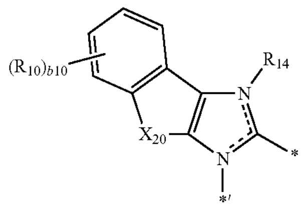
-continued
CY1-19
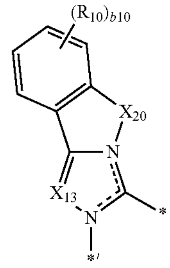
CY1-20
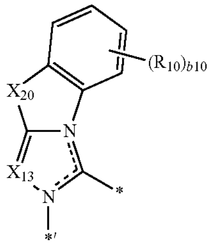
CY1-21
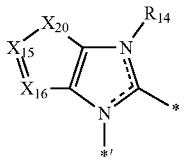
CY1-22
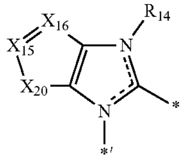
CY1-23
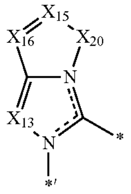
CY1-24
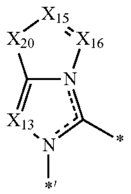
CY1-25
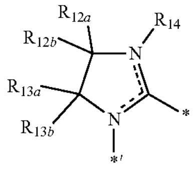

-continued
CY1-26
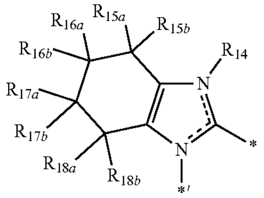
CY1-27
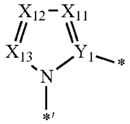
CY1-28
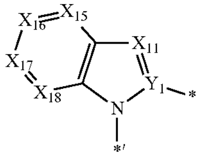
CY1-29
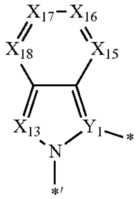
CYI-30
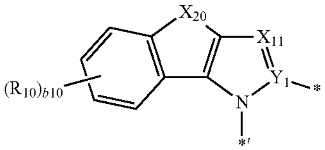
CYI-31
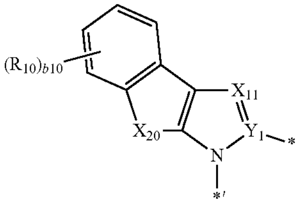
CYI-32
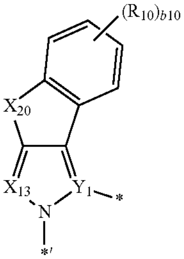
CYI-33
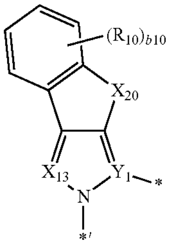
-continued
CYI-34
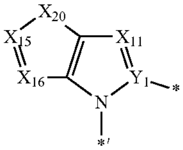
CYI-35
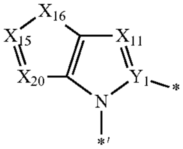
CYI-36
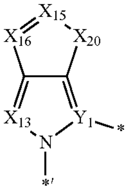
CYI-37
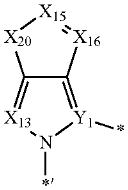
CY1-38
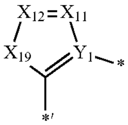
CY1-39
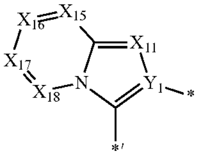
CY1-40
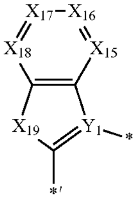
CY1-41
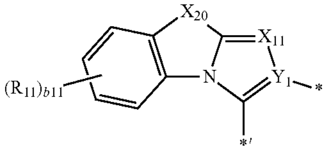
CY1-42
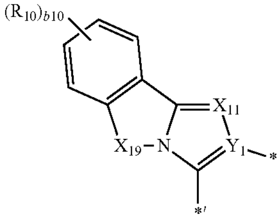

-continued
CY1-43
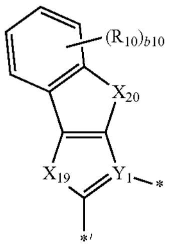
CY1-44
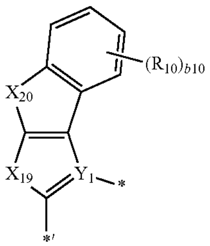
CY1-45
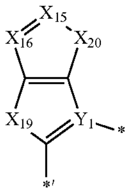
CY1-46
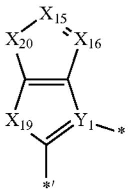
CY1-47
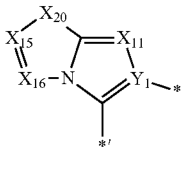
CY1-48
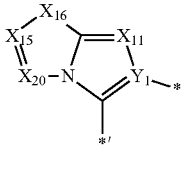
CY1-49
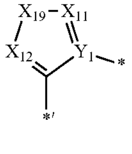
CY1-50
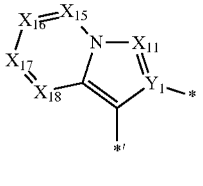
-continued
CY1-51
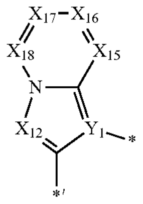
CY1-52
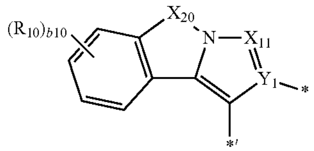
CY1-53
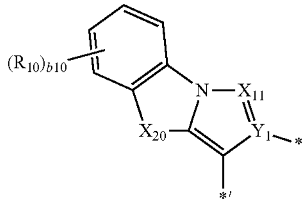
CY1-54
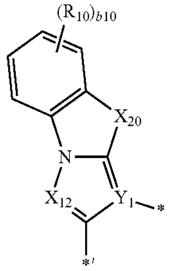
CY1-55
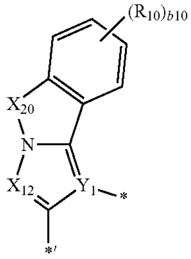
CY1-56
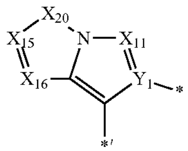
CY1-57
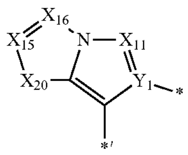

-continued
CY1-58
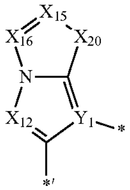
CY1-59
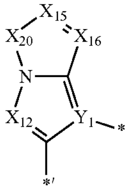
CY1-60
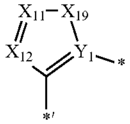
CY1-61
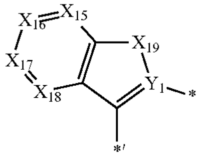
CY1-62
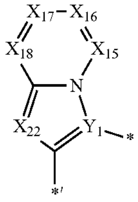
CY1-63
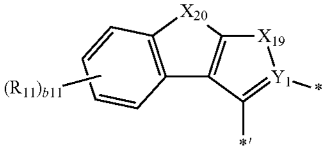
CY1-64
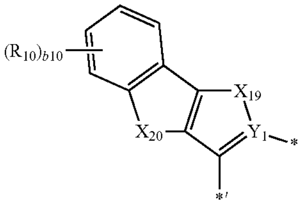
CY1-65
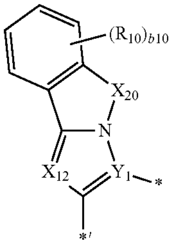
-continued
CY1-66
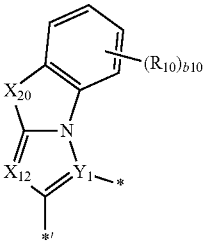
CY1-67
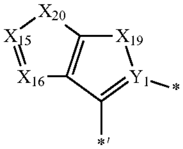
CY1-68
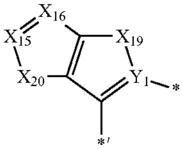
CY1-69
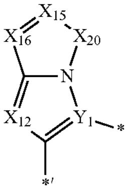
CY1-70
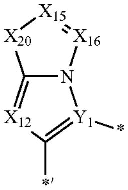
CY2-1
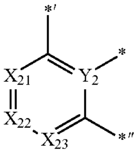
CY2-2
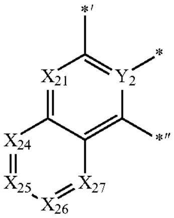
CY2-3
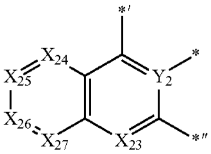

-continued
CY2-4
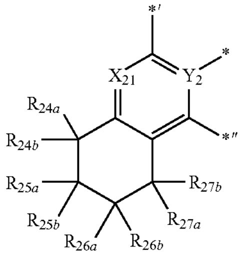
CY2-5
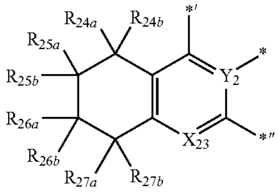
CY2-6
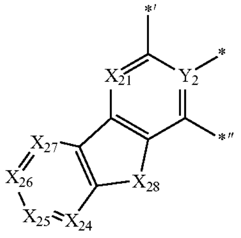
CY2-7
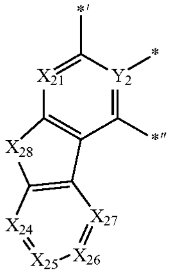
CY2-8
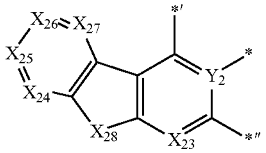
CY2-9
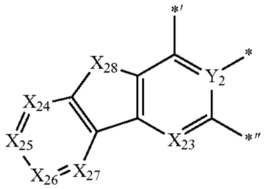
CY2-10
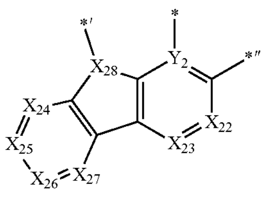
-continued
CY2-11
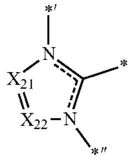
CY2-12
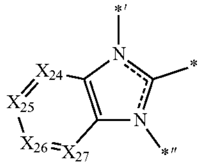
CY2-13
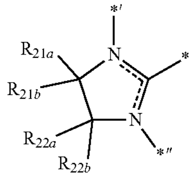
CY2-14
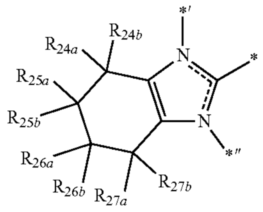
CY3-1
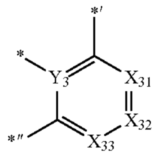
CY3-2
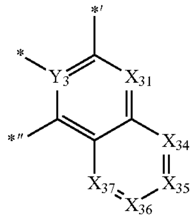
CY3-3
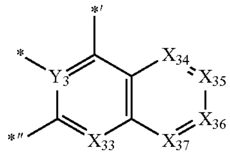
CY3-4
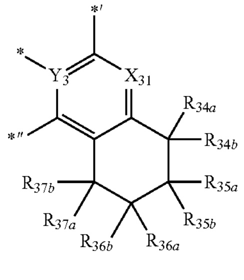

-continued
CY3-5
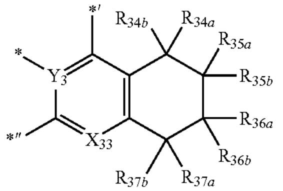
CY3-6
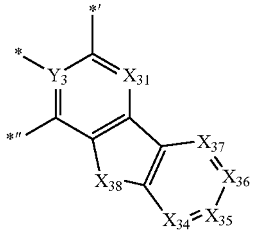
CY3-7
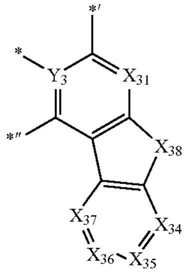
CY3-8
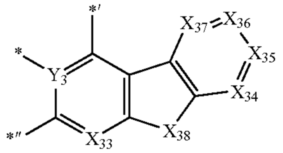
CY3-9
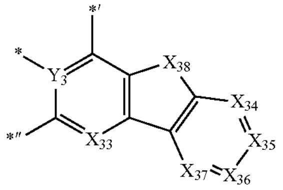
CY3-10
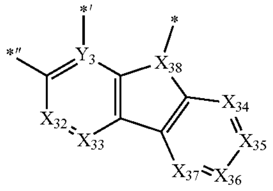
CY3-11
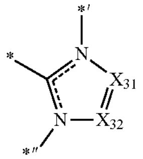
CY3-12
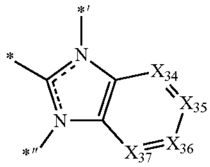
-continued
CY3-13
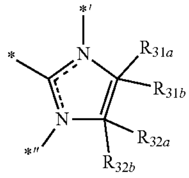
CY3-14
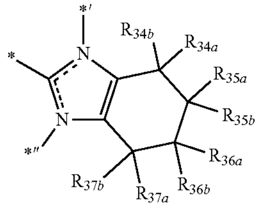
CY4-1
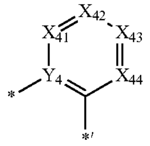
CY4-2
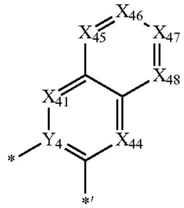
CY4-3
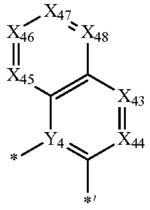
CY4-4
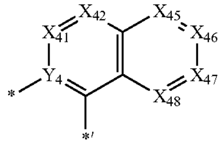
CY4-5
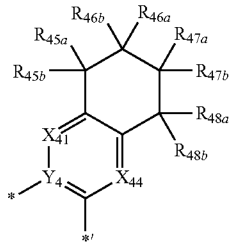

-continued
CY4-6
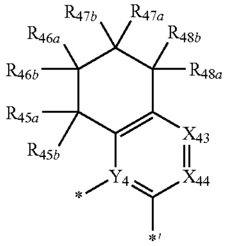
CY4-7
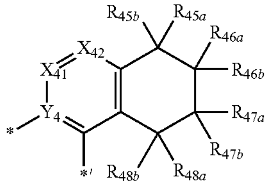
CY4-8
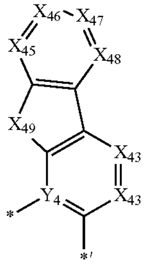
CY4-9
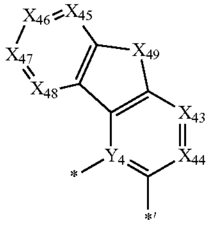
CY4-10
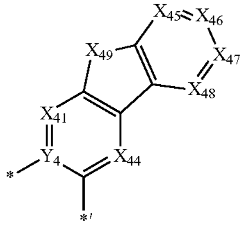
CY4-11
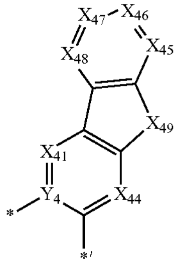
CY4-12
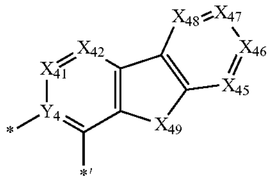
-continued
CY4-13
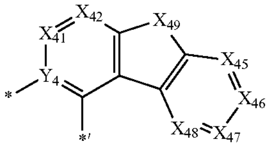
CY4-14
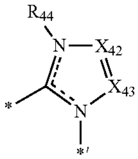
CY4-15
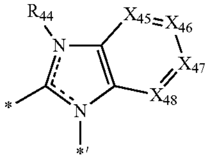
CY4-16
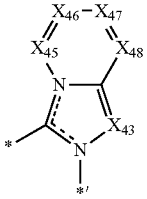
CY4-17
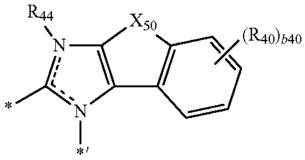
CY4-18
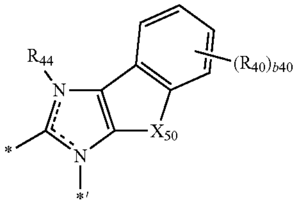
CY4-19
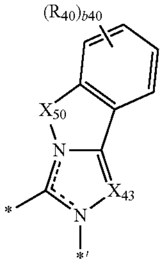
CY4-20
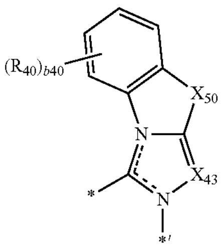

-continued
CY4-21
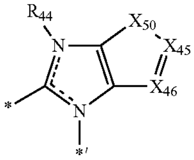
CY4-22
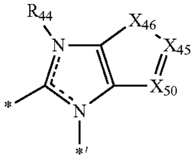
CY4-23
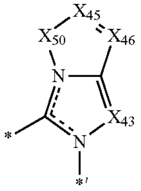
CY4-24
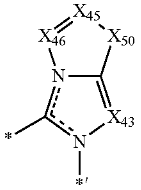
CY4-25
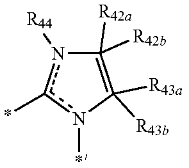
CY4-26
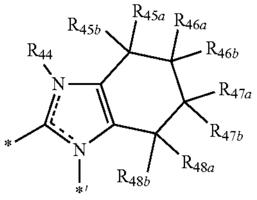
CY4-27
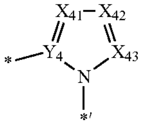
CY4-28
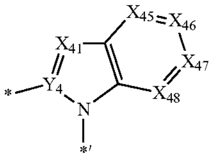
CY4-29
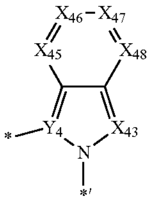
-continued
CY4-30
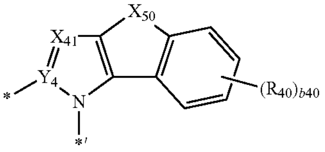
CY4-31
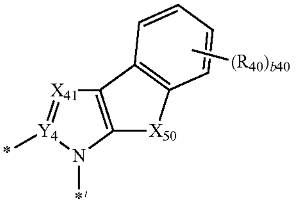
CY4-32
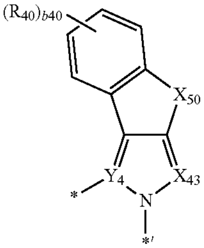
CY4-33
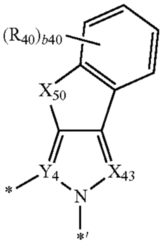
CY4-34
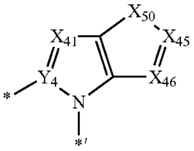
CY4-35
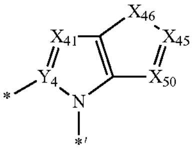
CY4-36
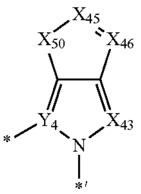
CY4-37
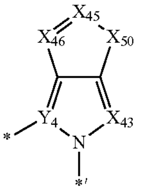

-continued
CY4-38
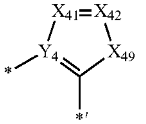
CY4-39
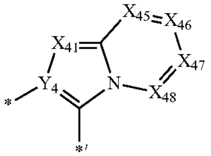
CY4-40
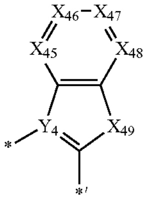
CY4-41
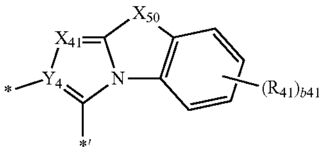
CY4-42
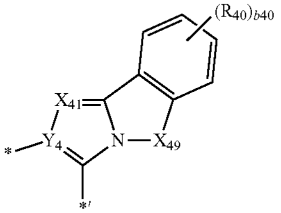
CY4-43
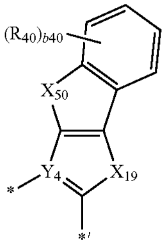
CY4-44
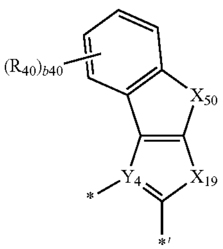
CY4-45
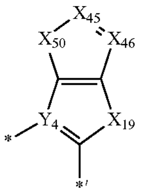
-continued
CY4-46
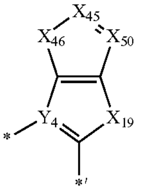
CY4-47
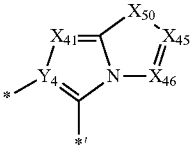
CY4-48
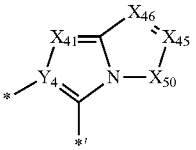
CY4-49
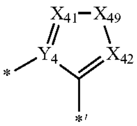
CY4-50
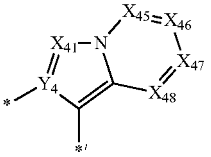
CY4-51
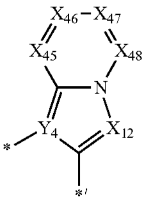
CY4-52
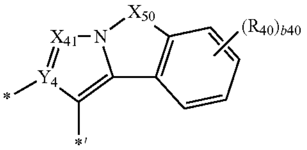
CY4-53
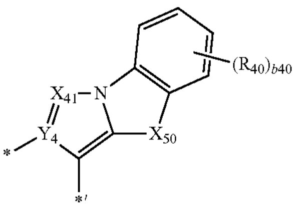

-continued
CY4-54
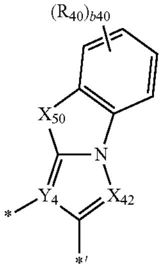
CY4-55
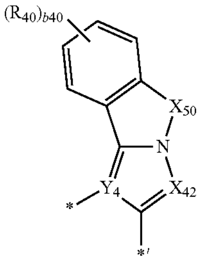
CY4-56
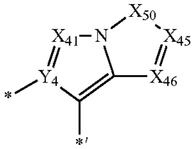
CY4-57
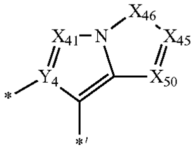
CY4-58
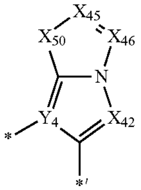
CY4-59
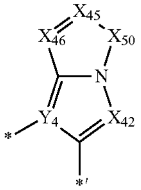
CY4-60
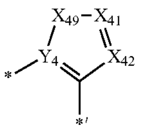
CY4-61
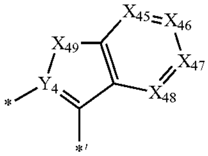
-continued
CY4-62
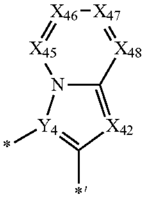
CY4-63
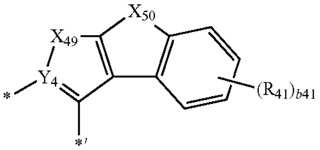
CY4-64
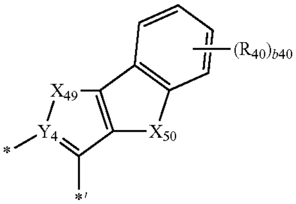
CY4-65
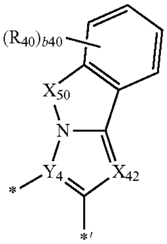
CY4-66
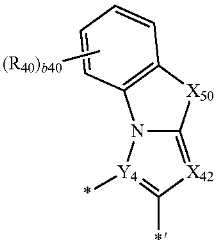
CY4-67
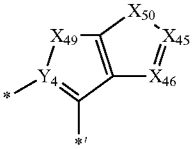
CY4-68
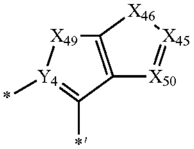
CY4-69
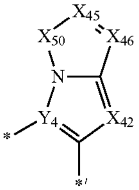

-continued

CY4-70

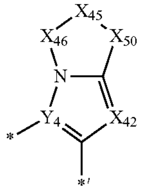

In Formulae CY1-1 to CY1-70, Formulae CY2-1 to CY2-14, CY3-1 to CY3-14, and Formulae CY4-1 to CY4-70, $Y_1$ to $Y_4$ are each the same as described above, $X_{11}$ may be $C(R_{11})$ or N, $X_{12}$ may be $C(R_{12})$ or N, $X_{13}$ may be $C(R_{13})$ or N, $X_{14}$ may be $C(R_{14})$ or N, $X_{15}$ may be $C(R_{15})$ or N, $X_{16}$ may be $C(R_{16})$ or N, $X_{17}$ may be $C(R_{17})$ or N, $X_{18}$ may be $C(R_{18})$ or N, $X_{19}$ may be $C(R_{19a})(R_{19b})$, $Si(R_{19a})(R_{19b})$, $N(R_{19})$, O, or S, $X_{20}$ may be $C(R_{20a})(R_{30b})$, $Si(R_{20a})(R_{20b})$, $N(R_{20})$, O, or S, $X_{21}$ may be $C(R_{21})$ or N, $X_{22}$ may be $C(R_{22})$ or N, $X_{23}$ may be $C(R_{23})$ or N, $X_{24}$ may be $C(R_{24})$ or N, $X_{25}$ may be $C(R_{25})$ or N, $X_{26}$ may be $C(R_{26})$ or N, $X_{27}$ may be $C(R_{27})$ or N, $X_{28}$ may be $C(R_{28a})(R_{28b})$, $Si(R_{28a})(R_{28b})$, $N(R_{28})$, O, or S, $X_{31}$ may be $C(R_{31})$ or N, $X_{32}$ may be $C(R_{32})$ or N, $X_{33}$ may be $C(R_{33})$ or N, $X_{34}$ may be $C(R_{34})$ or N, $X_{33}$ may be $C(R_{33})$ or N, $X_{36}$ may be $C(R_{36})$ or N, $X_{37}$ may be $C(R_{37})$ or N, $X_{38}$ may be $C(R_{38a})(R_{38b})$, $Si(R_{38a})(R_{38b})$, $N(R_{38})$, O, or S, $X_{41}$ may be $C(R_{41})$ or N, $X_{42}$ may be $C(R_{42})$ or N, $X_{43}$ may be $C(R_{43})$ or N, $X_{44}$ may be $C(R_{44})$ or N, $X_{45}$ may be $C(R_{45})$ or N, $X_{46}$ may be $C(R_{46})$ or N, $X_{47}$ may be $C(R_{47})$ or N, $X_{48}$ may be $C(R_{48})$ or N, $X_{49}$ may be $C(R_{49a})(R_{49b})$, $Si(R_{49a})(R_{49b})$, $N(R_{49})$, O, or S, $X_{50}$ may be $C(R_{50a})(R_{50b})$, $Si(R_{50a})(R_{50b})$, $N(R_{50})$, O, or S, $R_{10}$ to $R_{20}$, $R_{12a}$, $R_{13a}$, $R_{15a}$ to $R_{20a}$, $R_{12b}$, $R_{13b}$, and $R_{15b}$ to $R_{20b}$ are each independently the same as described in connection with $R_1$, $R_{21}$ to $R_{28}$, $R_{21a}$, $R_{22a}$, $R_{24a}$ to $R_{28a}$, $R_{21b}$, $R_{22b}$, and $R_{24b}$ to $R_{28b}$ are each independently the same as described in connection with $R_2$, $R_{31}$ to $R_{38}$, $R_{31a}$, $R_{32a}$, $R_{34a}$ to $R_{38a}$, $R_{31b}$, $R_{32b}$, and $R_{34b}$ to $R_{38b}$ are each independently the same as described in connection with $R_3$, $R_{40}$ to $R_{50}$, $R_{42a}$, $R_{43a}$, $R_{45a}$ to $R_{50a}$, $R_{42b}$, $R_{43b}$, and $R_{45b}$ to $R_{50b}$ are each independently the same as described in connection with $R_4$, b10, b11, b40, and b41 are each independently an integer selected from 1 to 4,

* indicates a binding site to M, and

*' in Formulae CY1-1 to CY1-70 indicates a binding site to $T_1$, *' in Formulae CY2-1 to CY2-14 indicates a binding site to $T_1$ and *" indicates a binding site to $T_2$, *' in Formulae CY3-1 to CY3-14 indicates a binding site to $T_3$, and *" indicates a binding site to $T_2$, and *' in Formulae CY4-1 to CY4-70 indicates a binding site to $T_3$.

In an embodiment, at least one of $CY_1$ and $CY_4$ may be a 6-membered ring having one or more N(s) or a condensed cyclic group including the 6-membered ring having one or more N(s).

$Y_1$ to $Y_4$ may each independently be C or N.

In an embodiment, $Y_1$, $Y_3$, and $Y_4$ may be C and $Y_2$ may be N; or $Y_1$ to $Y_3$ may be C and $Y_4$ may be N.

$A_1$ to $A_4$ may each independently be a chemical bond, O, or S.

For example, the chemical bond may be a covalent bond or a coordinate bond, but embodiments are not limited thereto.

In an embodiment, when $Y_1$ is C, $A_1$ may be a coordinate bond.

$T_1$ to $T_3$ may each independently be a single bond, a double bond, $*-N[(L_1)_{b1}-(R_{1a})]-*'$, $*-B(R_{1a})-*'$, $*-P(R_{1a})-*'$, $*-C(R_{1a})(R_{1b})-*'$, $*-Si(R_{1a})(R_{1b})-*'$, $*-Ge(R_{1a})(R_{1b})-*'$, $*-S-*'$, $*-Se-*'$, $*-O-*'$, $*-C(=O)-*'$, $*-S(=O)-*'$, $*-S(=O)_2-*'$, $*-C(R_{1a})=*'$, $*=C(R_{1a})-*'$, $*-C(R_{1a})=C(R_{1b})-*'$, $-C(=S)-*'$, or $*-C\equiv C-*'$.

a1 to a3 may each independently be an integer selected from 1 to 3.

* and *' each indicate a binding site to a neighboring atom.

In an embodiment, $T_2$ may be $*-N[(L_1)_{b1}-(R_{1a})]-*'$, $L_1$ may be a single bond, b1 may be 1, $R_{1a}$ and $R_2$ may be linked to each other to form a $C_2$-$C_{30}$ heterocyclic group unsubstituted or substituted with at least one $R_{10a}$, $R_{1a}$ and $R_3$ may be linked to each other to form a $C_2$-$C_{30}$ heterocyclic group unsubstituted or substituted with at least one $R_{10a}$ and $Ar_{20}$ to $Ar_{24}$ in Formula 2 are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

In an embodiment, $Ar_{20}$ to $Ar_{24}$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzotriazole, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$.

$L_1$ and $L_{21}$ may each independently be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

b1 and b21 may each independently be an integer selected from 1 to 3.

c21 may be an integer selected from 1 to 3.

$R_1$ to $R_4$, $R_{1a}$, and $R_{1b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$.

d1 to d4 may each independently be an integer selected from 1 to 10.

Two or more groups of $R_1$ to $R_4$, $R_{1a}$, and $R_{1b}$ may optionally be linked to form a $C_5$-$C_{30}$ carbocyclic group unsubstituted or substituted with at least one $R_{10a}$ or a $C_2$-$C_{30}$ heterocyclic group unsubstituted or substituted with at least one $R_{10a}$.

In an embodiment, a moiety represented by

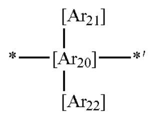

in Formula 2 may be represented by one of Formulae 2-1 to 2-20:

2-1

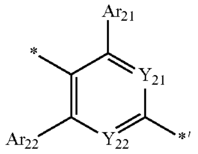

2-2

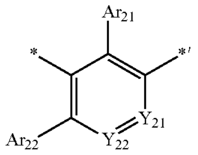

-continued 2-3

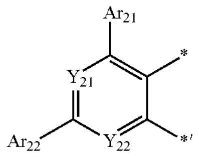

2-4

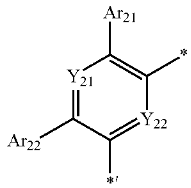

2-5

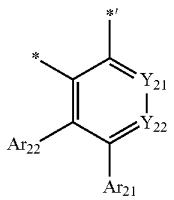

2-6

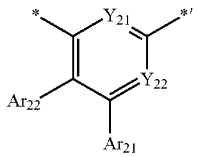

2-7

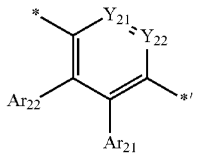

2-8

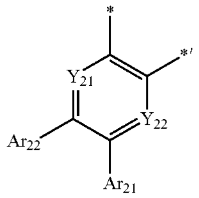

2-9

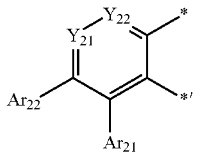

2-10

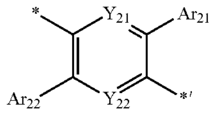

2-11

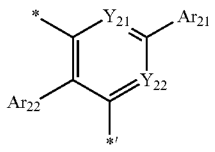

-continued 2-12

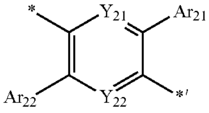

2-13

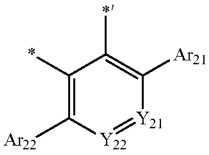

2-14

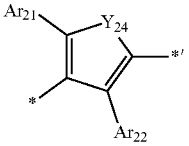

2-15

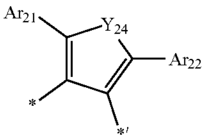

2-16

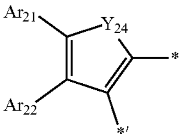

2-17

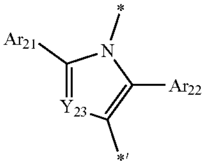

2-18

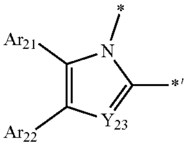

2-19

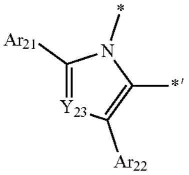

2-20

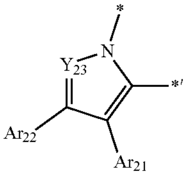

In Formulae 2-1 to 2-20, $Y_{21}$ may be N or $C(Z_{21})$, $Y_{22}$ may be N or $C(Z_{22})$, $Y_{23}$ may be N or $C(Z_{23})$, $Y_{24}$ may be O, S, $C(Z_{24})(Z_{25})$, or $N(Z_{24})$,

* indicates a binding site to $CY_1$,

*' indicates a binding site to a neighboring atom, $Z_{21}$ to $Z_{25}$ are each the same as described in connection with $R_1$, but neighboring groups among $Z_{21}$ to $Z_{25}$ may optionally be linked to form a $C_2$-$C_{30}$ heterocyclic group unsubstituted or substituted with at least one $R_{10a}$ or a $C_3$-$C_{30}$ carbocyclic group unsubstituted or substituted with at least one $R_{10a}$.

$R_{10a}$, $Ar_{21}$, and $Ar_{22}$ each the same as described herein.

In an embodiment, Formula 2 may be represented by Formula 2A:

Formula 2A

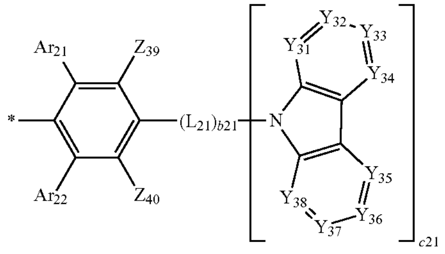

In Formula 2A, $Y_{31}$ may be N or $C(Z_{31})$, $Y_{32}$ may be N or $C(Z_{32})$, $Y_{33}$ may be N or $C(Z_{33})$, $Y_{34}$ may be N or $C(Z_{34})$, $Y_{35}$ may be N or $C(Z_{35})$, $Y_{36}$ may be N or $C(Z_{36})$, $Y_{37}$ may be N or $C(Z_{37})$, $Y_{38}$ may be N or $C(Z_{38})$, may be a binding site to a neighboring atom, and $Ar_{21}$, $Ar_{22}$, $L_{21}$, b21, and c21 are each the same as described herein, and $Z_{31}$ to $Z_{40}$ are each the same as described in connection with $R_1$.

In an embodiment, $Ar_{21}$ and $Ar_{22}$ in Formula 2 may each independently be a group represented by one of Formulae 3-1 to 3-34:

3-1

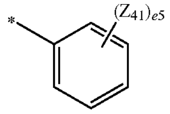

3-2

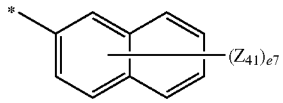

3-3

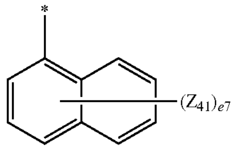

3-4

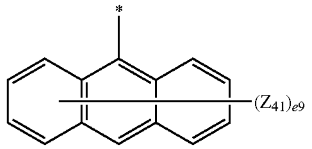

-continued
3-5
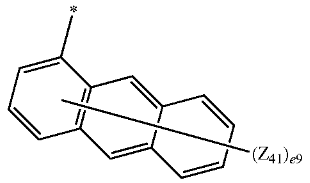
3-6
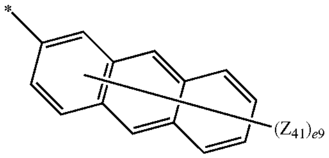
3-7
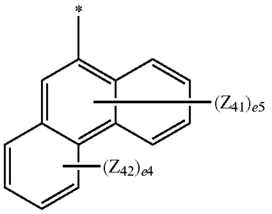
3-8
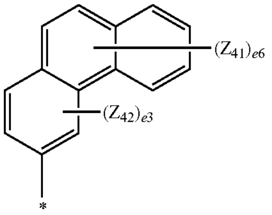
3-9
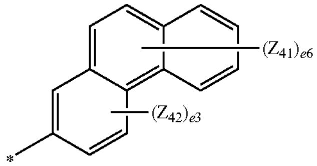
3-10
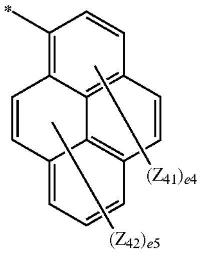
3-11
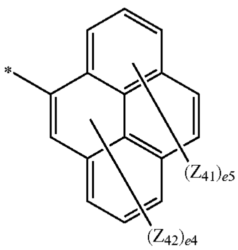
-continued
3-12
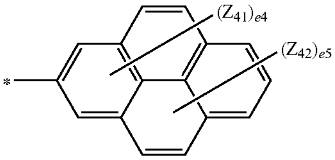
3-13
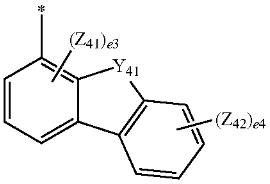
3-14
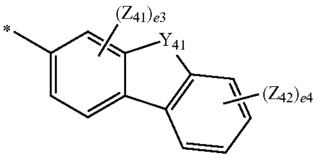
3-15
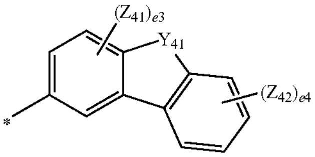
3-16
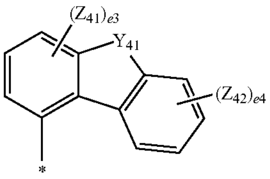
3-17
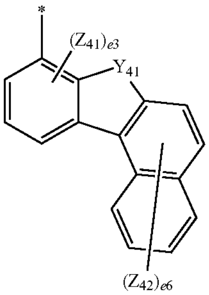
3-18
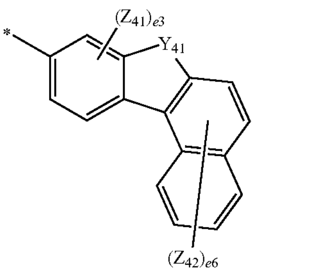

-continued
3-19
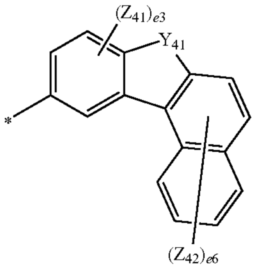
3-20
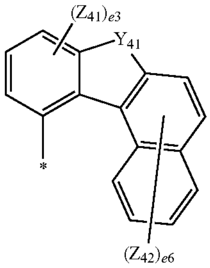
3-21
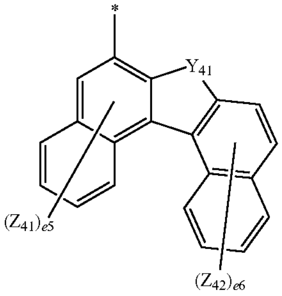
3-22
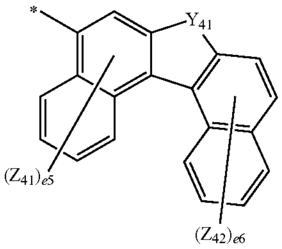
3-23
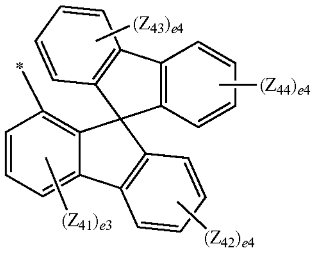
3-24
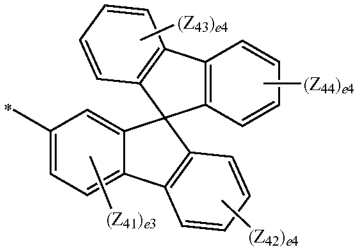
-continued
3-25
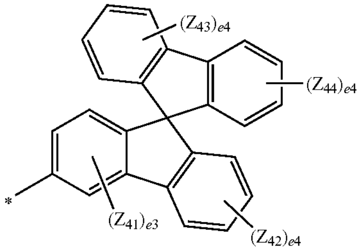
3-26
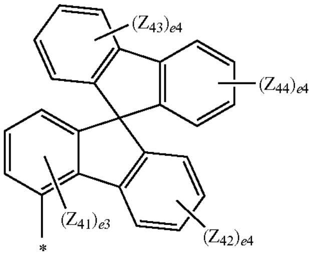
3-27
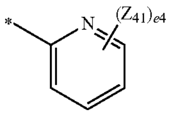
3-28
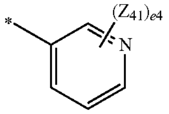
3-29
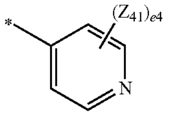
3-30
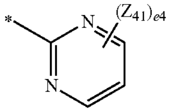
3-31
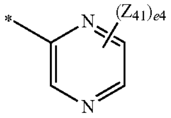
3-32
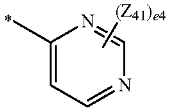
3-33
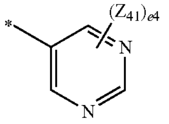
3-34
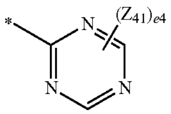

In Formulae 3-1 to 3-34, $Y_{41}$ may be O, S, $N(Z_{45})$, $C(Z_{45})(Z_{46})$, or $Si(Z_{45})(Z_{46})$, $Z_{41}$ to $Z_{46}$ may each independently be hydrogen, deuterium, —F, —Cl, —Br, —I, a hydroxyl group, a cyano group, a nitro group, an amidino group, a hydrazino group, a hydrazono group, $—CF_3$, $—CF_2H$, $—CFH_2$, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyridinyl group, a pyrimidinyl group, a pyrazinyl group, a triazinyl group, a quinolinyl group, an isoquinolinyl group, a benzoquinolinyl group, a naphthyridinyl group, a quinoxalinyl group, a quinazolinyl group, a phenanthridinyl group, an acridinyl group, a phenanthrolinyl group, a phenazinyl group, a carbazolyl group, a dibenzofuranyl group, a dibenzothiophenyl group, a dibenzosilolyl group, $—Si(Q_{31})(Q_{32})(Q_{33})$, $—N(Q_{31})(Q_{32})$, or $—B(Q_{31})(Q_{32})$, e2 may be 1 or 2, e3 may be an integer selected from 1 to 3, e4 may be an integer selected from 1 to 4, e5 may be an integer selected from 1 to 5, e6 may be an integer selected from 1 to 6, e7 may be an integer selected from 1 to 7, e9 may be an integer selected from 1 to 9, $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group, and

* indicates a binding site to a neighboring atom.

In an embodiment, at least one of $Ar_{20}$ to $Ar_{24}$ in Formula 2 may include at least one deuterium.

In an embodiment, the organometallic compound may be represented by Formula 1-1:

Formula 1-1

See FIG. 5A

In Formula 1-1,

M, $Y_1$ to $Y_4$, $CY_1$, $CY_2$, $A_1$ to $A_4$, $T_1$, $T_2$, a1, a2, $R_1$, $R_2$, $Z_1$, d1, d2, and n1 are each the same as described herein, $X_{32}$ may be $C(R_{32})$ or N, $X_{33}$ may be $C(R_{33})$ or N, $X_{41}$ may be $C(R_{41})$ or N, $X_{42}$ may be $C(R_{42})$ or N, $X_{43}$ may be $C(R_{43})$ or N, $X_{44}$ may be $C(R_{44})$ or N, d5 may be an integer selected from 1 to 8, $R_5$, $R_{32}$, and $R_{33}$ are each the same as described in connection with $R_3$, and $R_{41}$ to $R_{44}$ are each the same as described in connection with $R_4$.

In an embodiment, the organometallic compound may be represented by Formula 1-2 or 1-3:

Formula 1-2

Figure 5B:
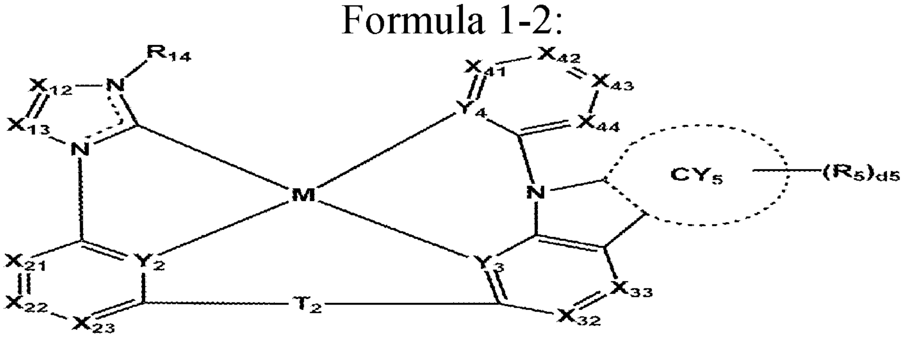
Figure 5B:
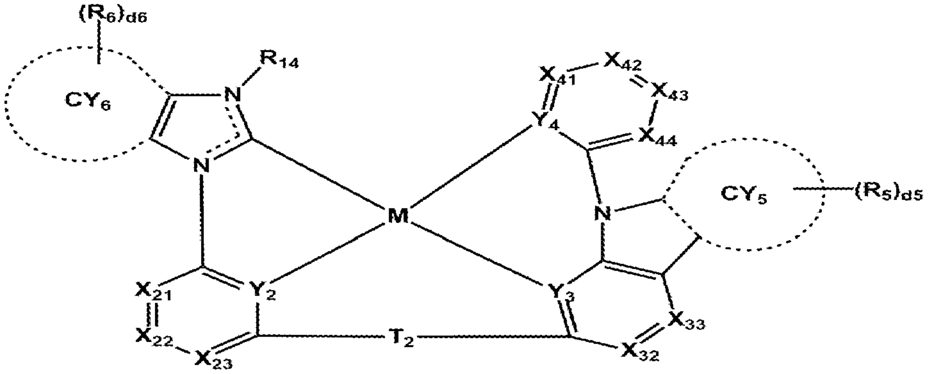
Figure 5B:
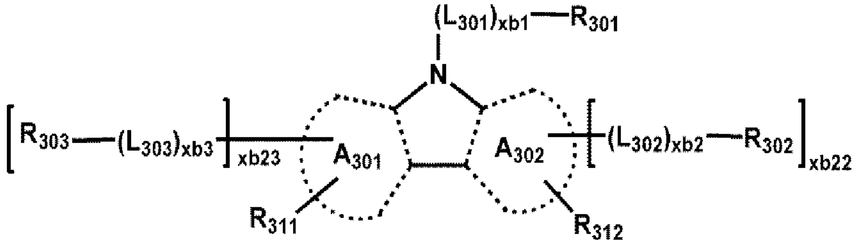
Figure 5B:
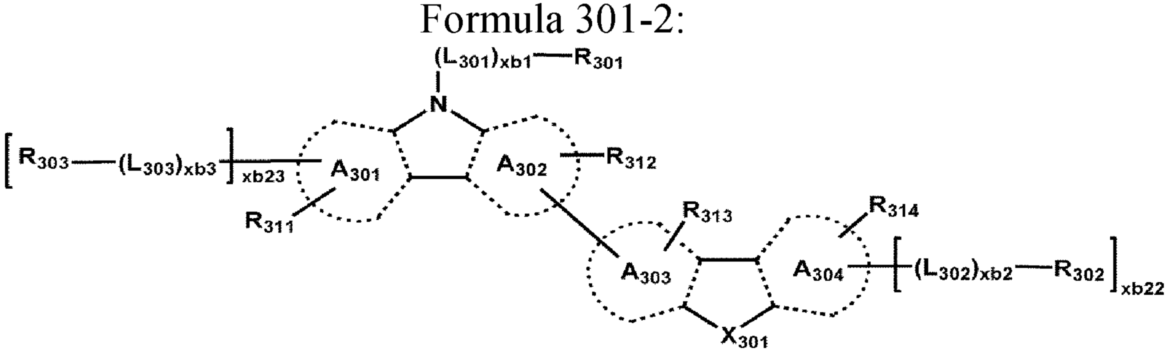

See FIG. 5B

Formula 1-3

See FIG. 5B

In Formulae 1-2 and 1-3,

M, $Y_2$ to $Y_4$, and $T_2$ are each the same as described herein, $X_{12}$ may be $C(R_{12})$ or N, $X_{13}$ may be $C(R_{13})$ or N, $X_{21}$ may be $C(R_{21})$ or N, $X_{22}$ may be $C(R_{22})$ or N, $X_{23}$ may be $C(R_{23})$ or N, $X_{32}$ may be $C(R_{32})$ or N, $X_{33}$ may be $C(R_{33})$ or N, $X_{41}$ may be $C(R_{41})$ or N, $X_{42}$ may be $C(R_{42})$ or N, $X_{43}$ may be $C(R_{43})$ or N, $X_{44}$ may be $C(R_{44})$ or N, $R_6$ and $R_{12}$ to $R_{14}$ are each the same as described in connection with $R_1$, $R_{21}$ to $R_{23}$ are each the same as described in connection with $R_2$, $R_5$, $R_{32}$, and $R_{33}$ are each the same as described in connection with $R_3$, and $R_{41}$ to $R_{44}$ are each the same as described in connection with $R_4$.

$CY_5$ and $CY_6$ may each independently be a $C_5$-$C_{60}$ carbocyclic group or a $C_1$-$C_{60}$ heterocyclic group, d5 and d6 may each independently be an integer selected from 1 to 8, and at least one of $R_{12}$ to $R_{14}$ in Formula 1-2 may be a group represented by Formula 2, and at least one of $R_6$ and $R_{14}$(s) in the number of d6 may be a group represented by Formula 2.

In an embodiment, $R_{14}$ in Formula 1-2 may be a group represented by Formula 2.

In an embodiment, $R_{14}$ in Formulae 1 to 3 may be a group represented by Formula 2.

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=)(Q_{21})(Q_{22})$, or any combination thereof, or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, wherein $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The organometallic compound represented by Formula 1 may be one of Compounds 1 to 99 below, but embodiments are not limited thereto:

1
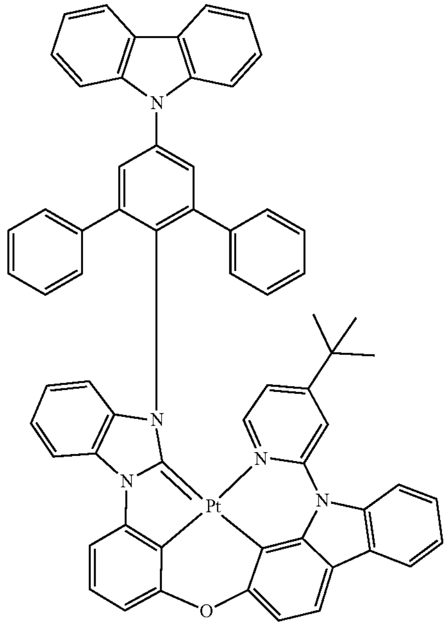
2
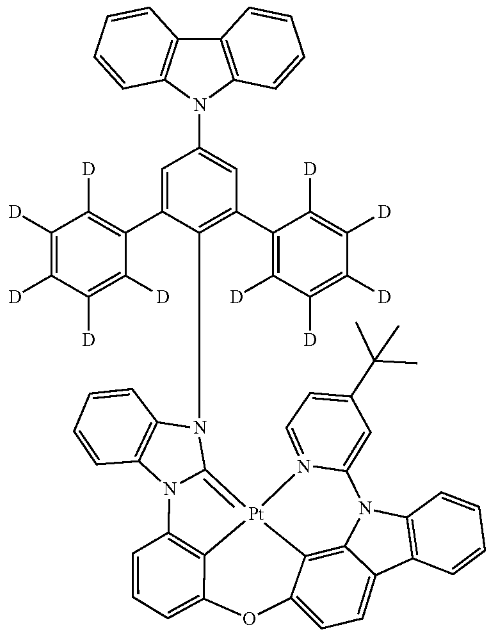
-continued
3
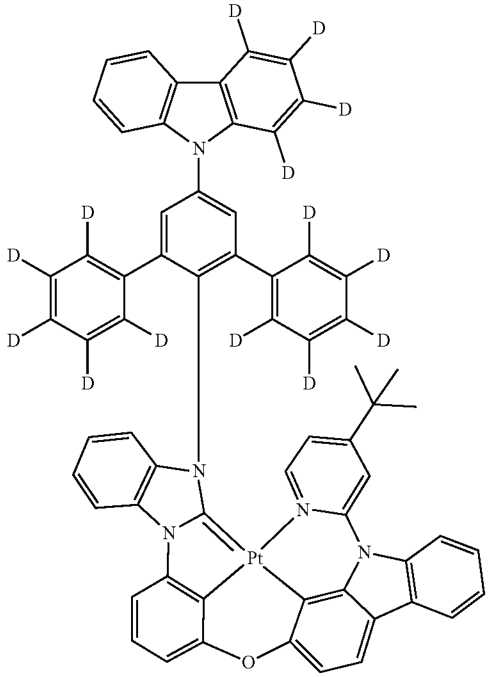
4
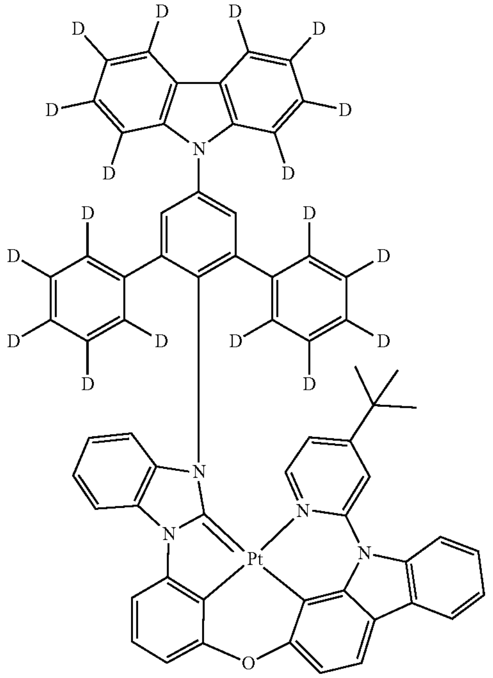

-continued
5
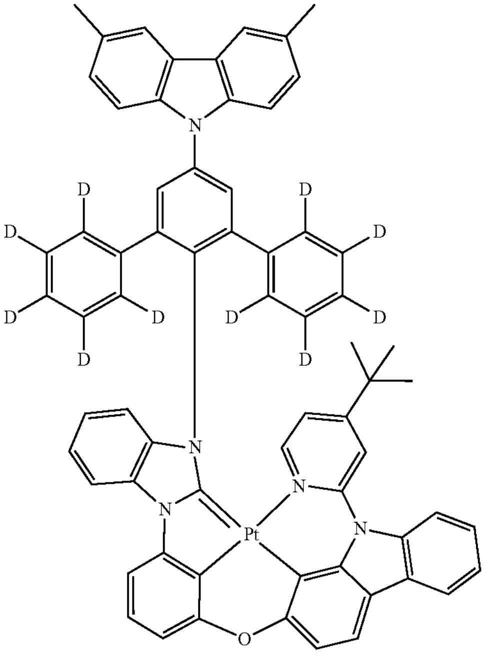
6
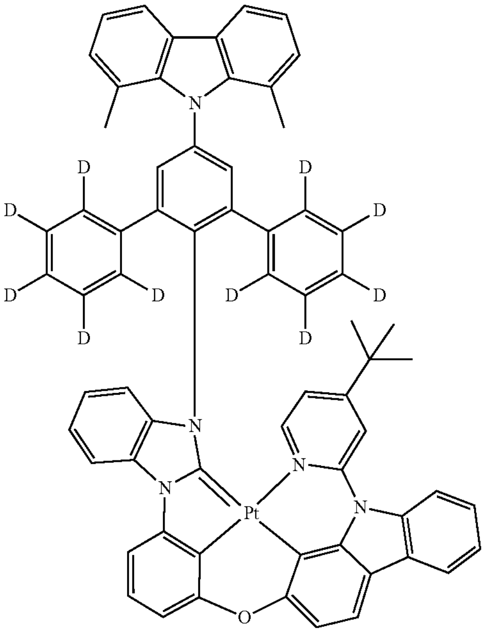
-continued
7
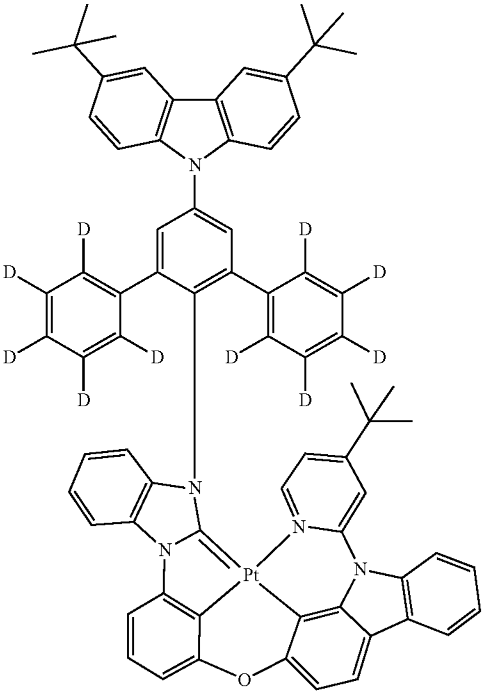
8
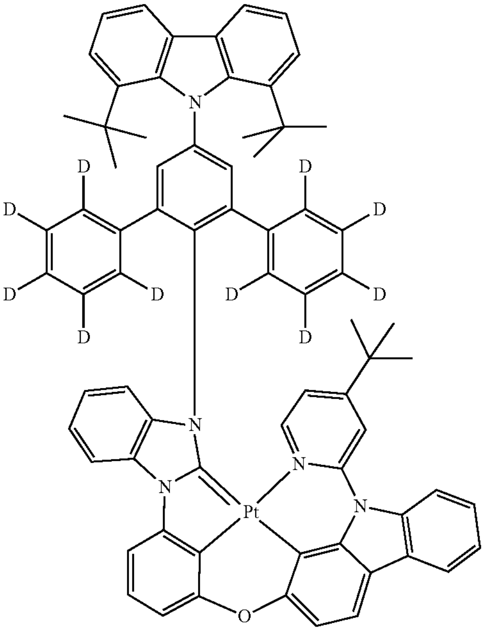

-continued
9
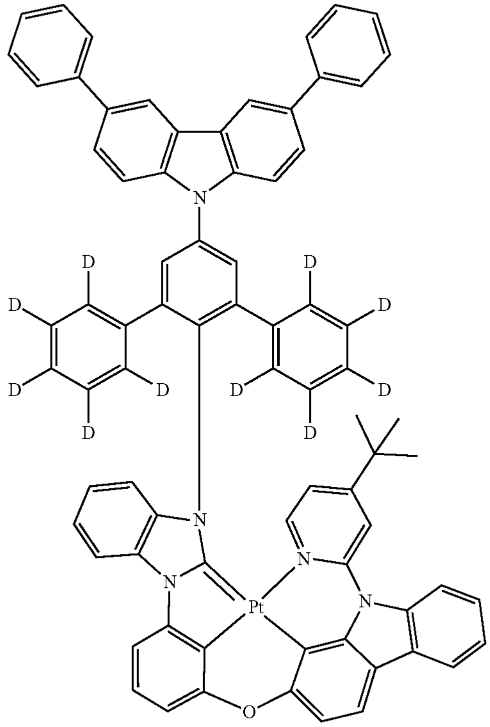
10
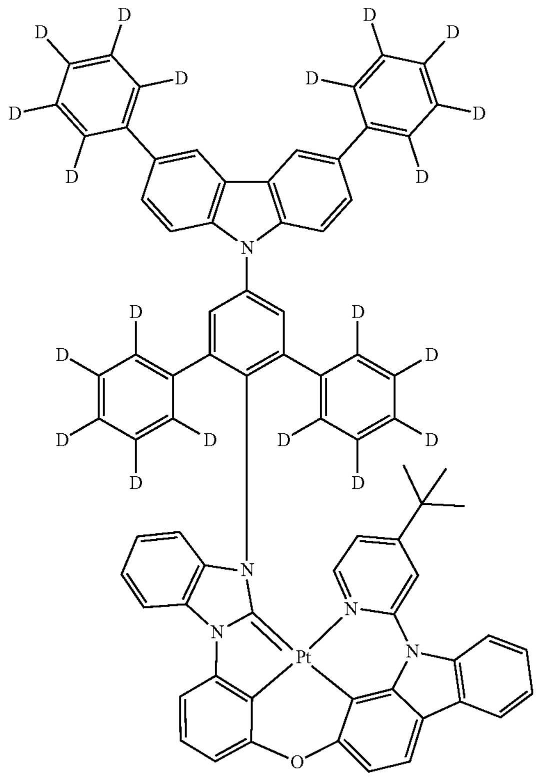
-continued
11
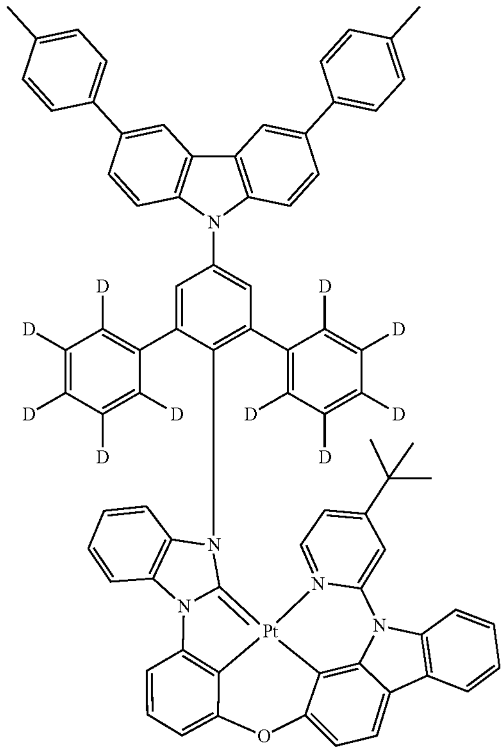
12
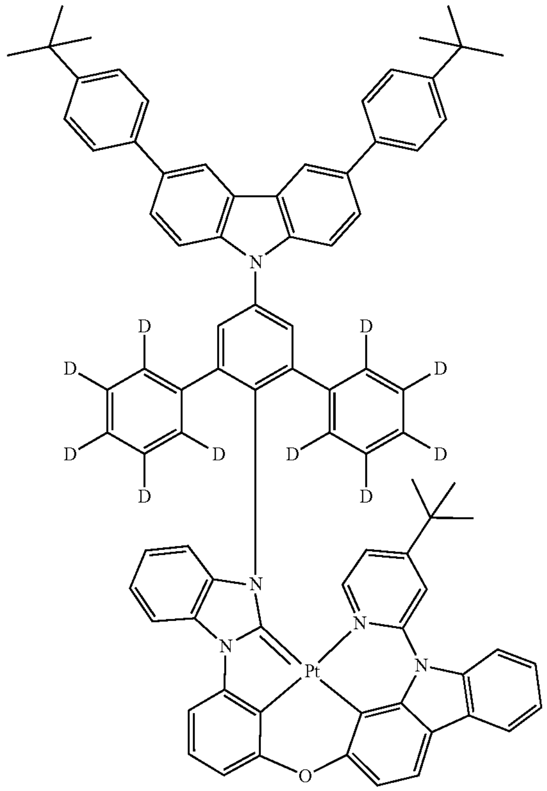

-continued
13
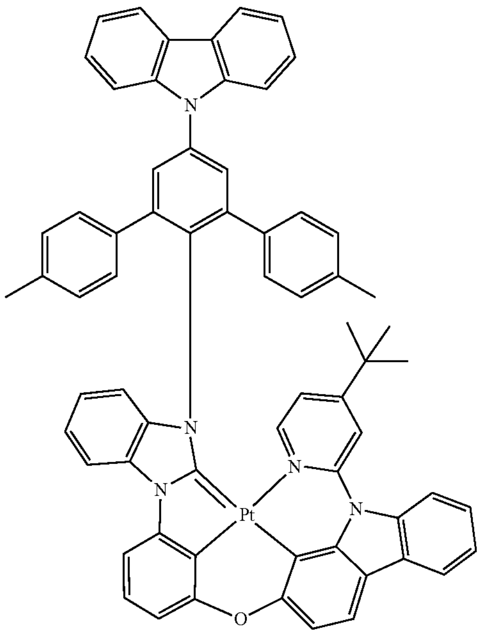
14
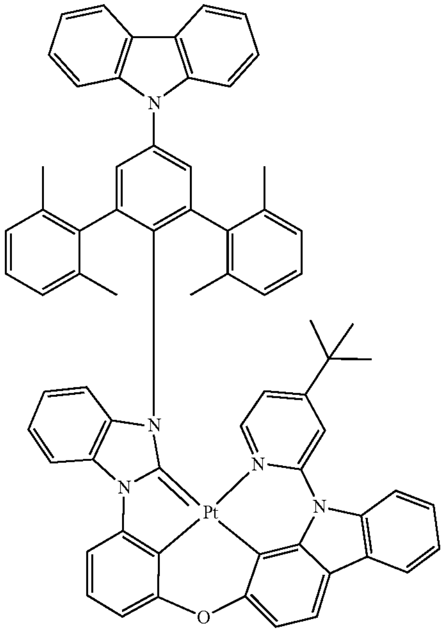
-continued
15
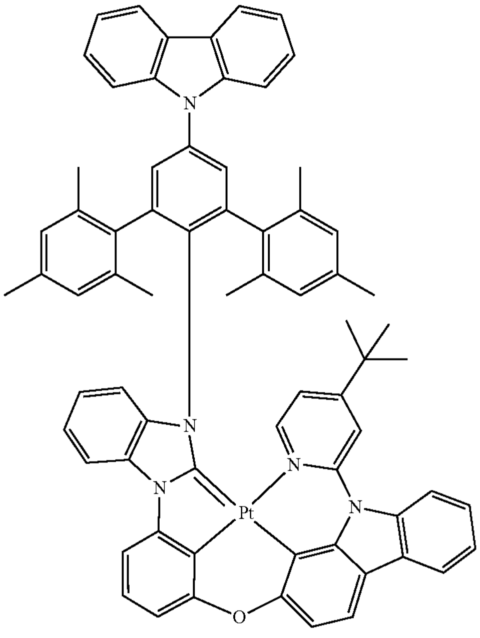
16
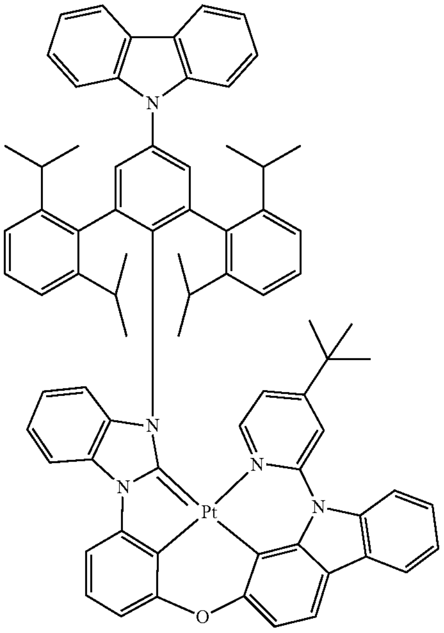

-continued
17
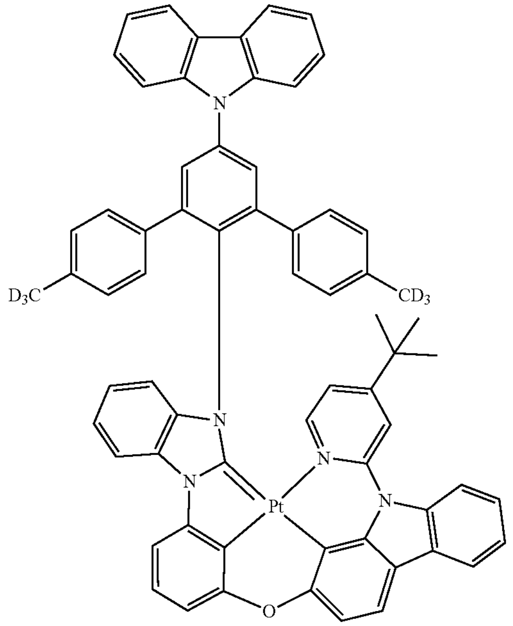
18
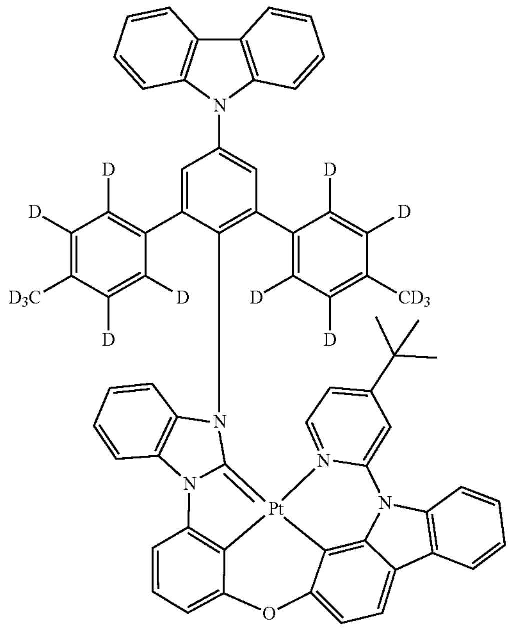
-continued
19
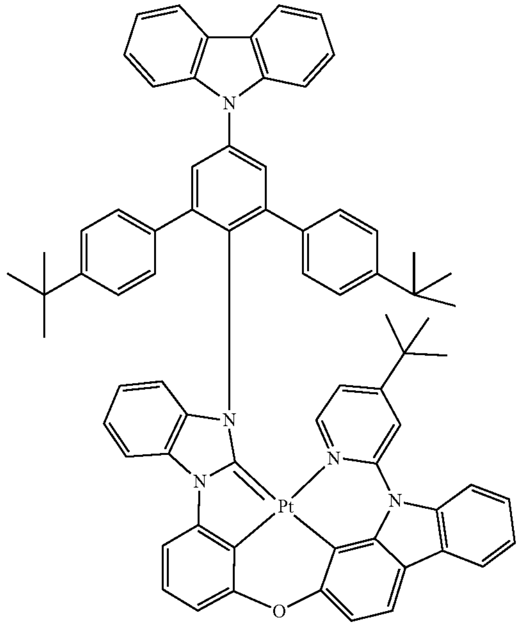
20
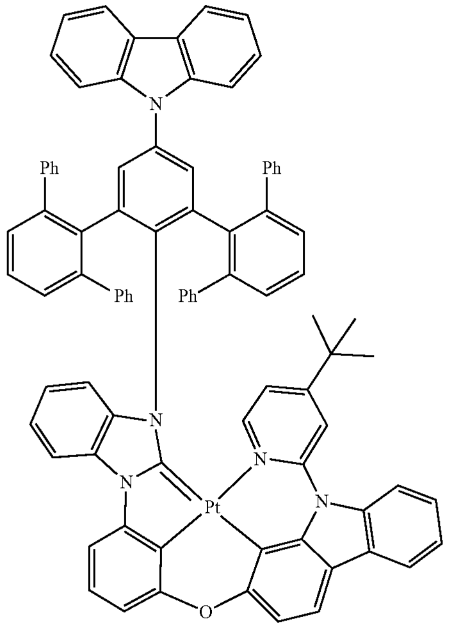

-continued
21
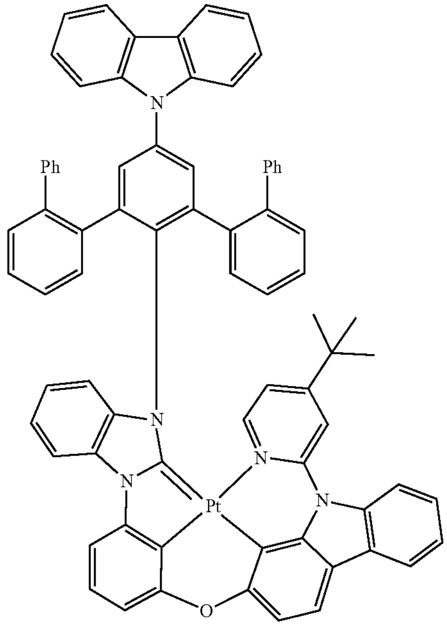
22
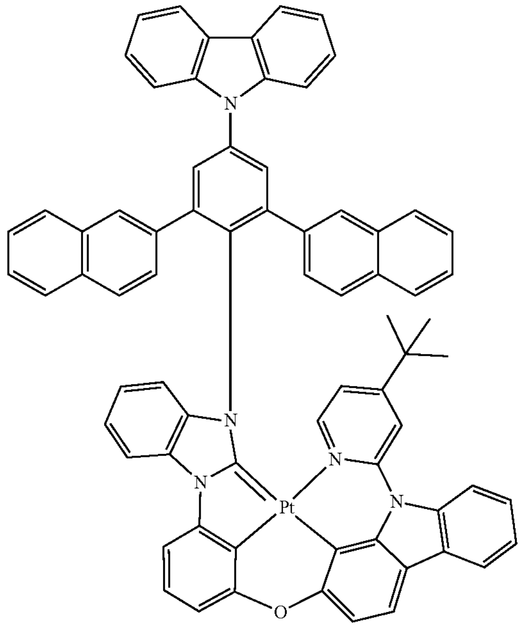
-continued
23
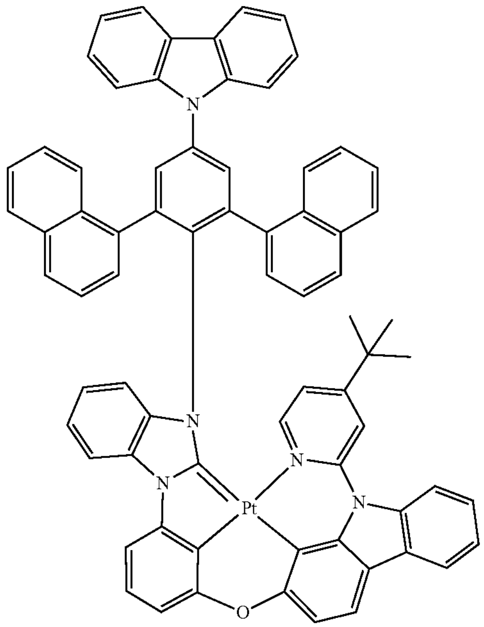
24
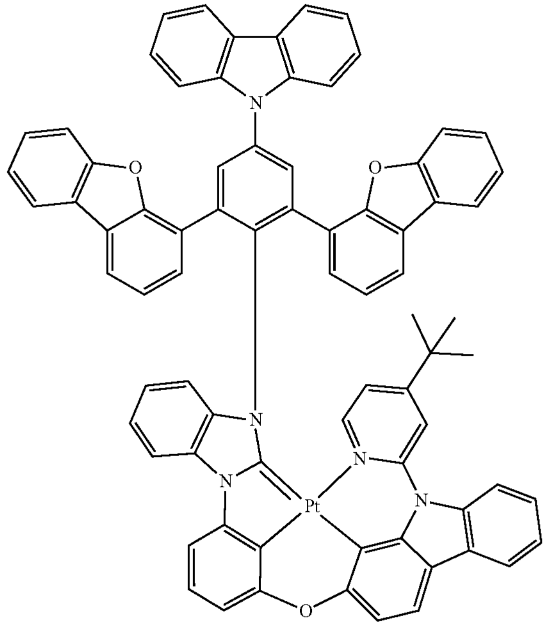

-continued
25
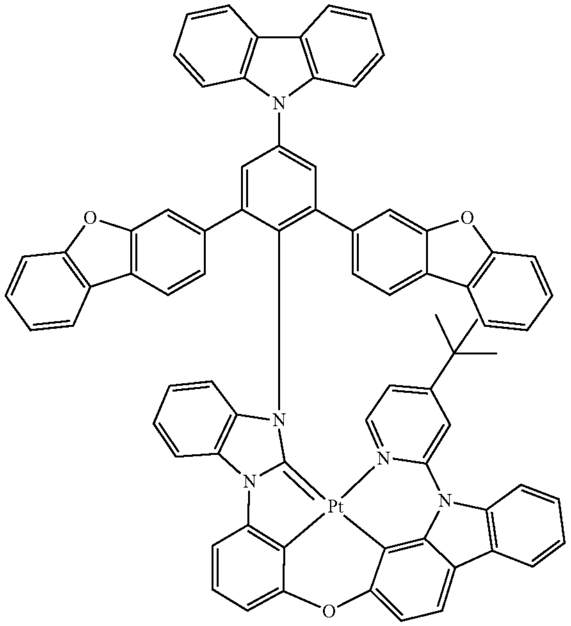
26
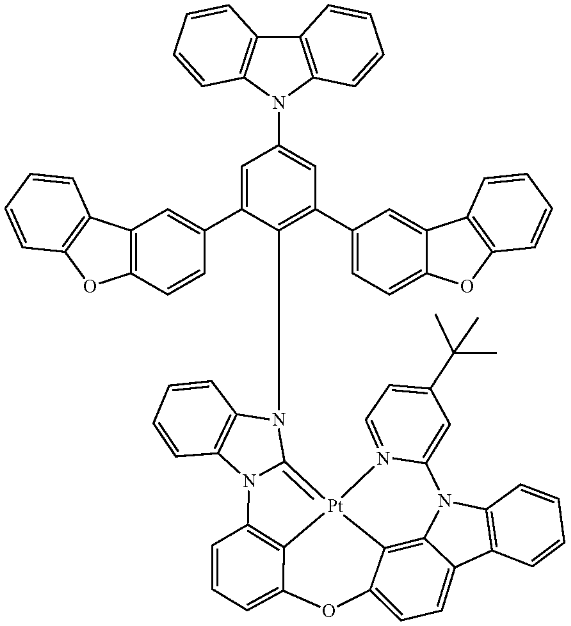
-continued
27
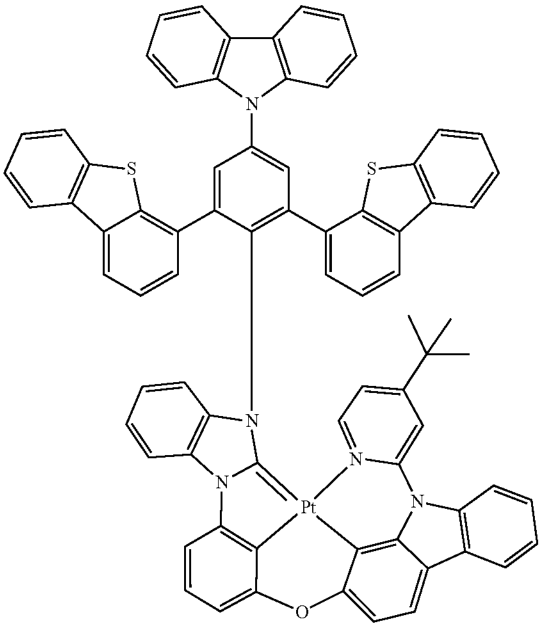
28
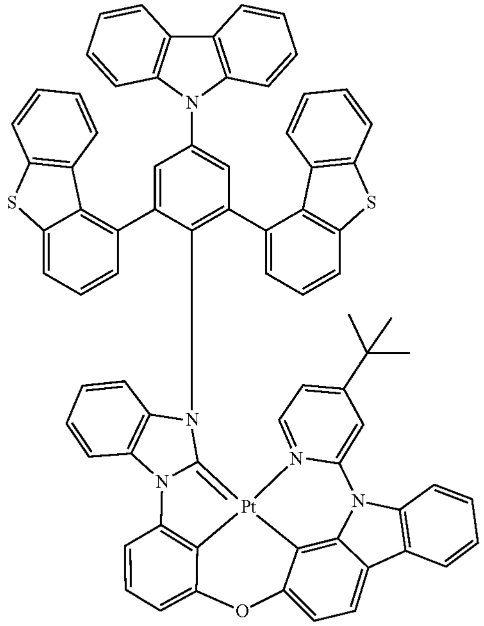

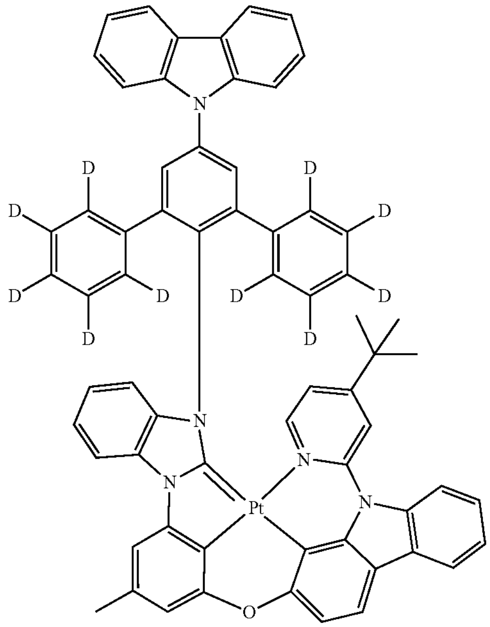
29
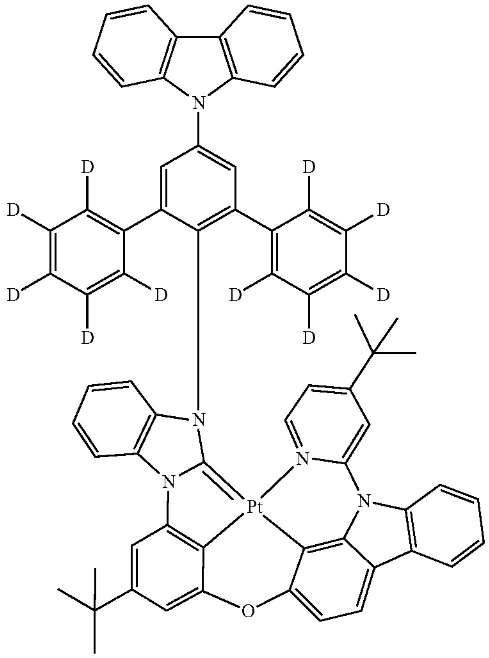
31
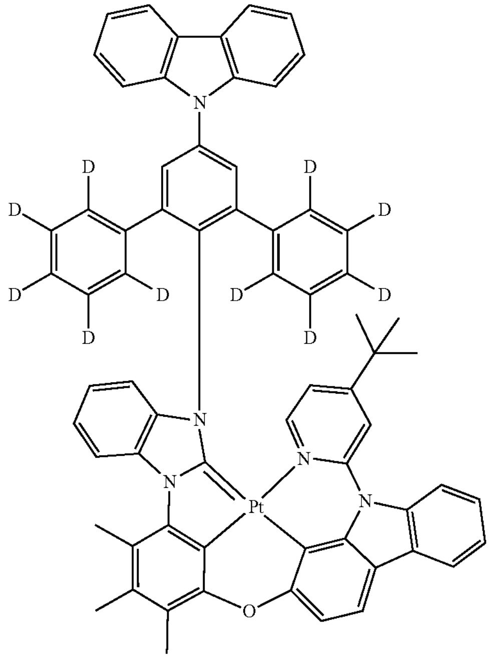
30
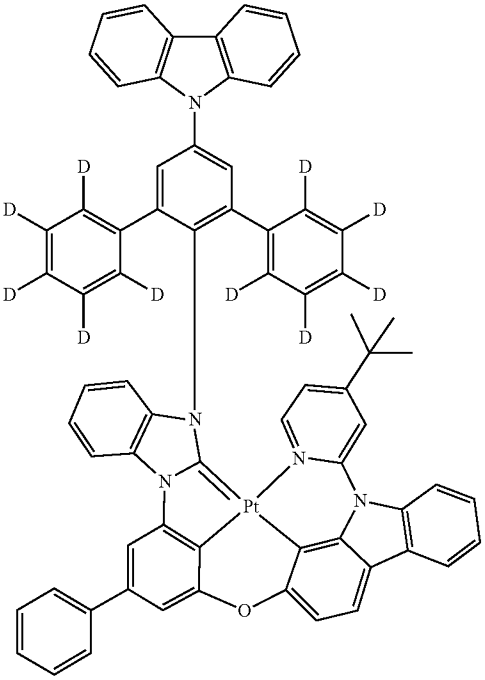
32

-continued
33
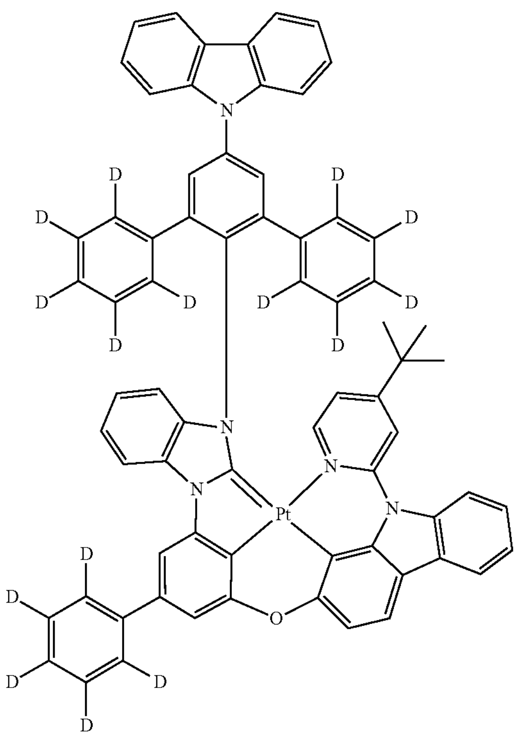
35
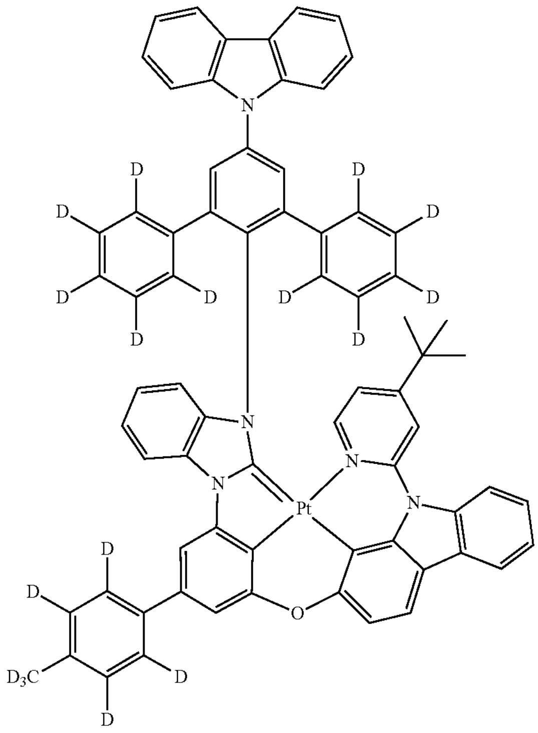
34
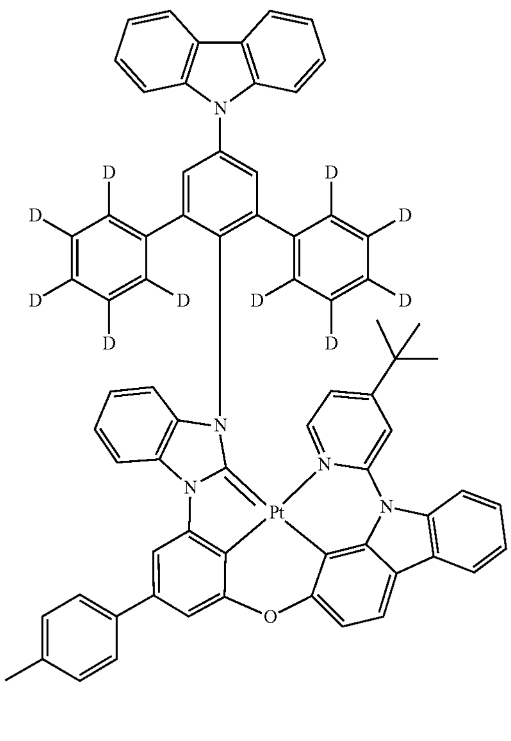
36
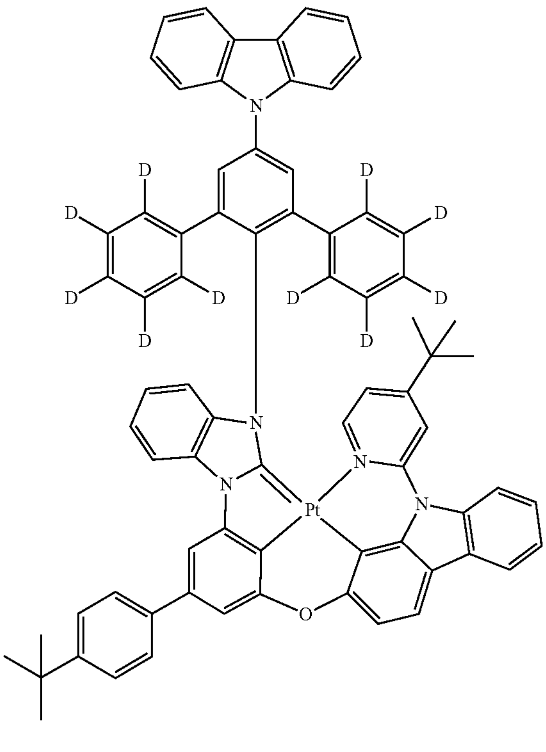

-continued
37
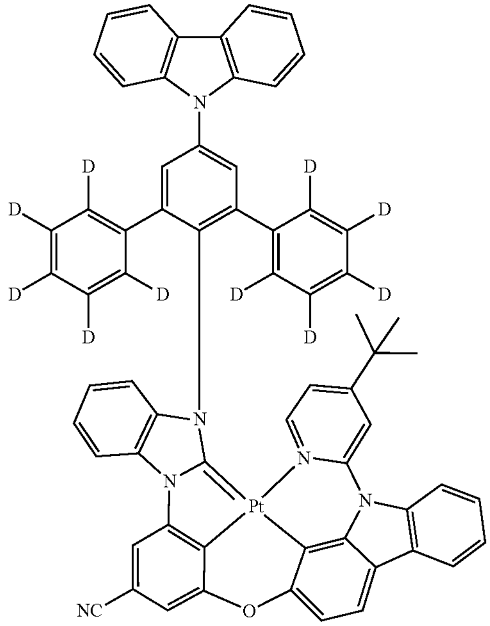
38
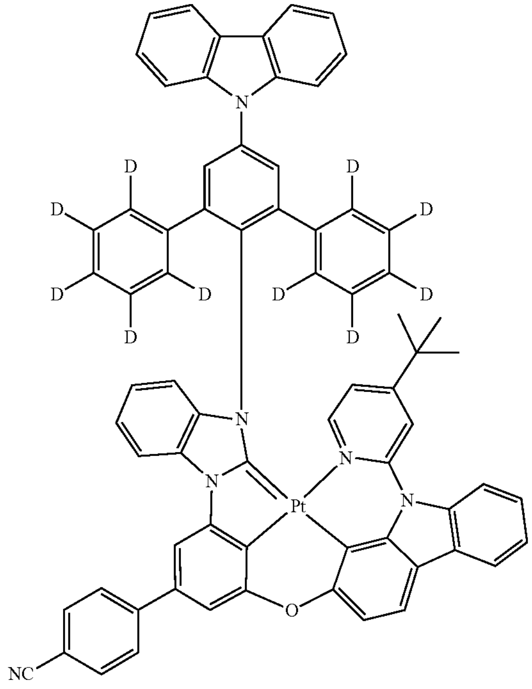
-continued
39
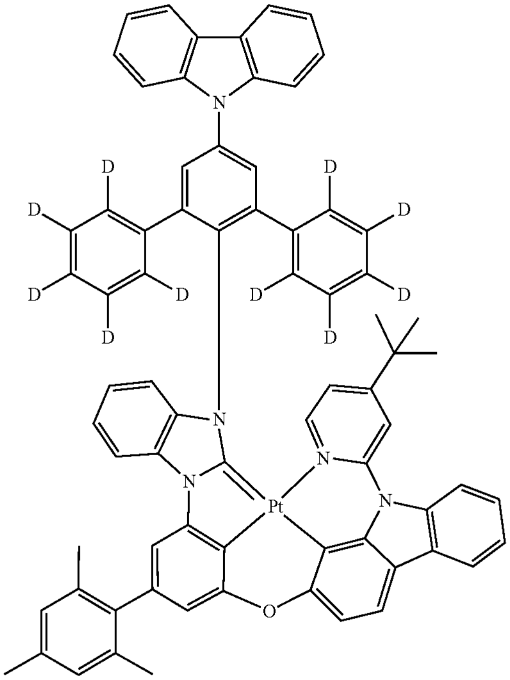
40
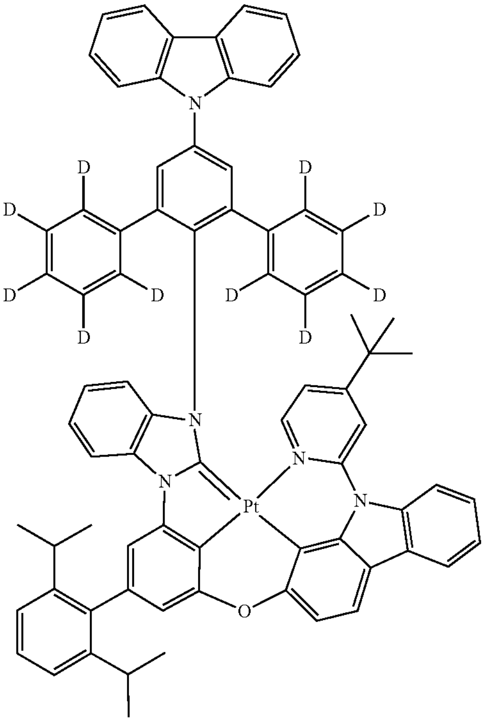

-continued
41
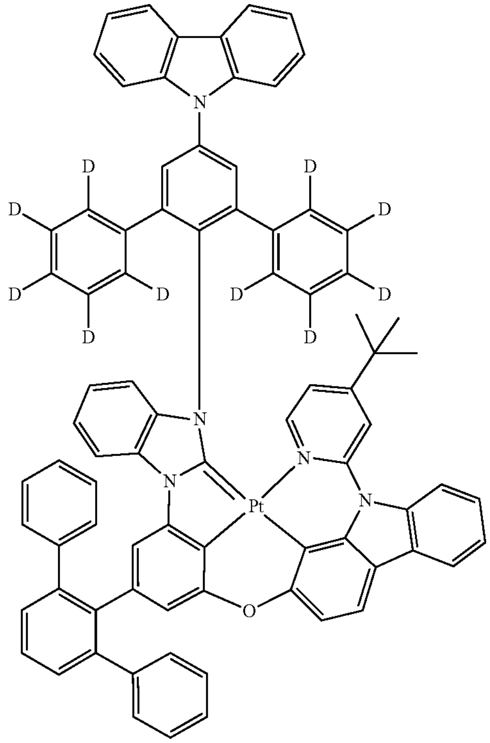
42
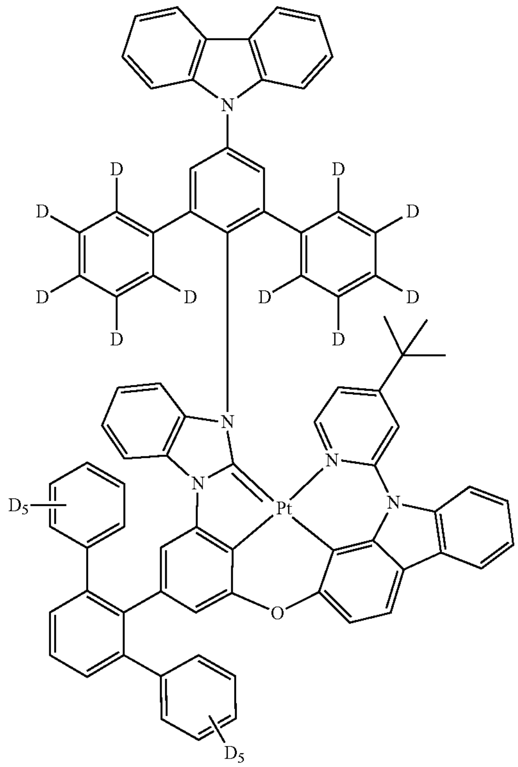
-continued
43
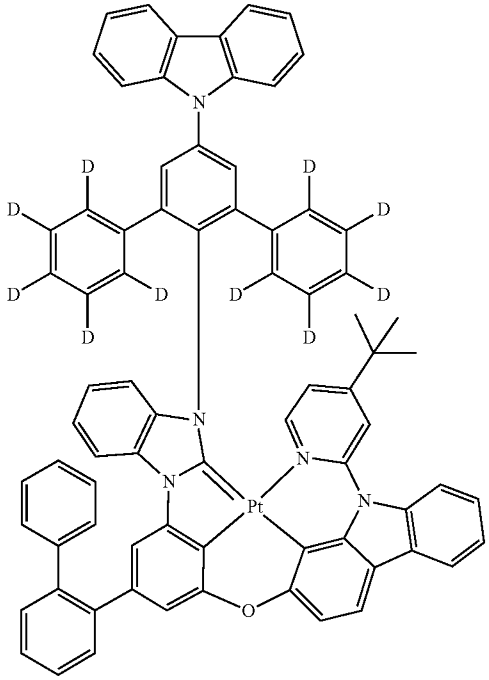
44
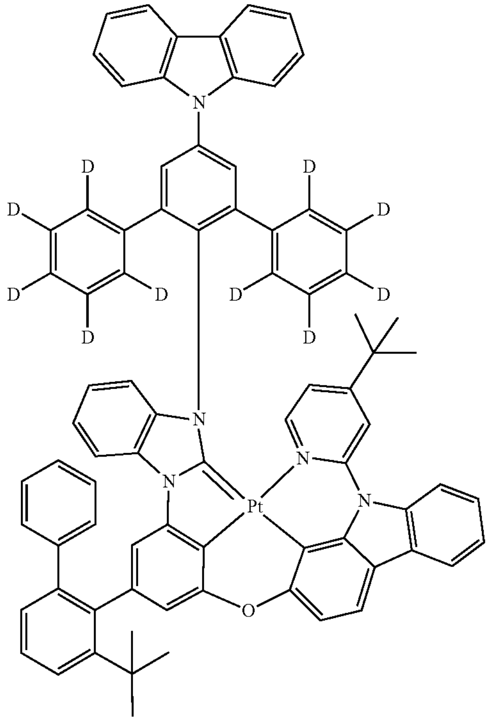

-continued
45
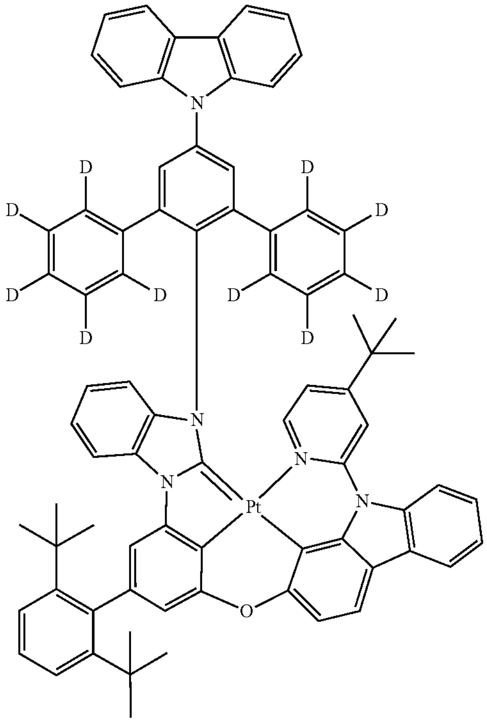
46
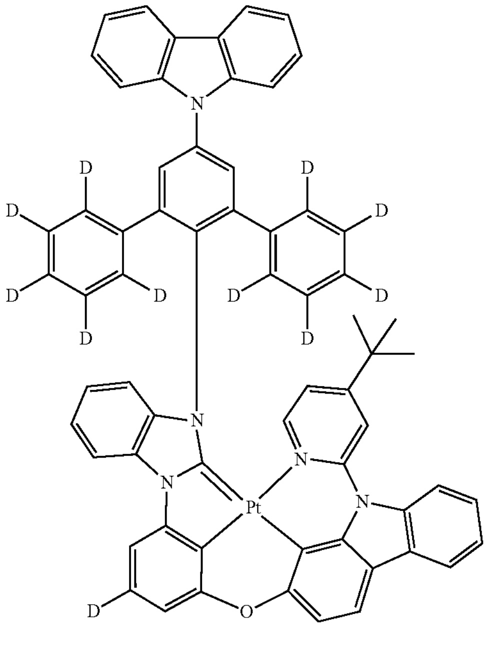
-continued
47
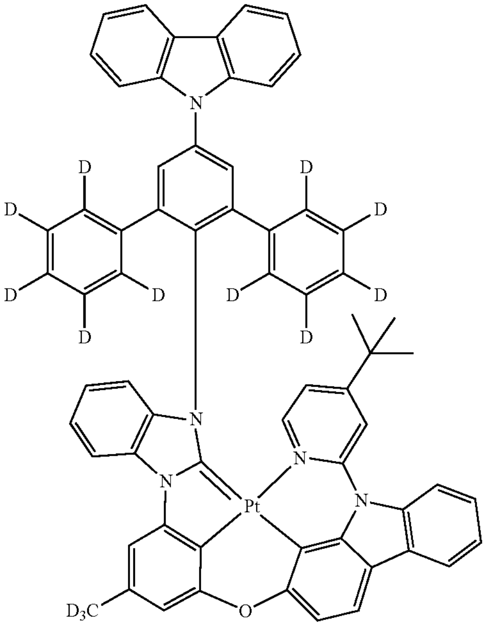
48
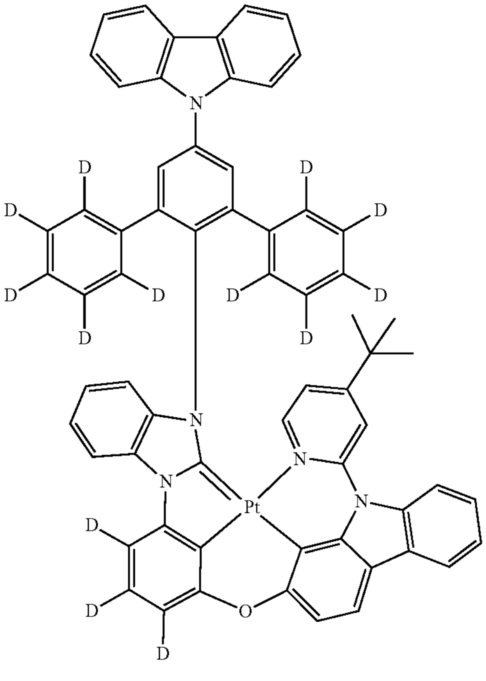

-continued
49
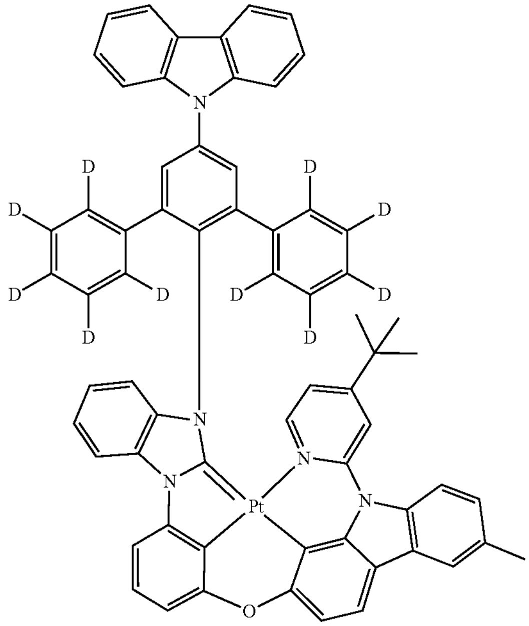
50
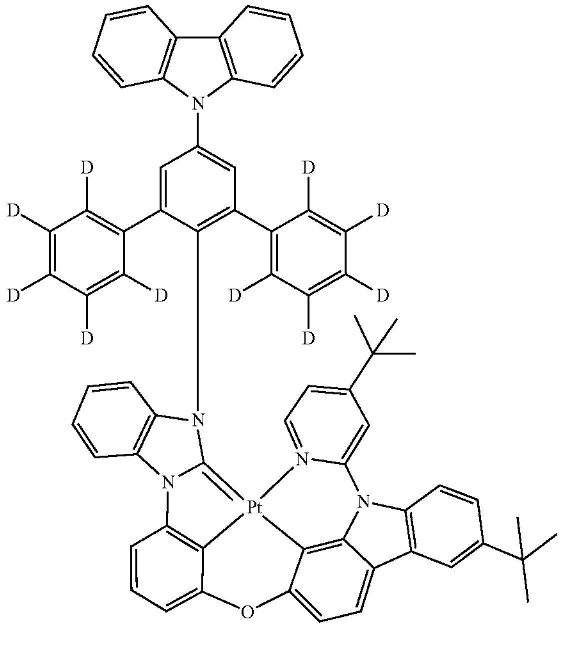
-continued
51
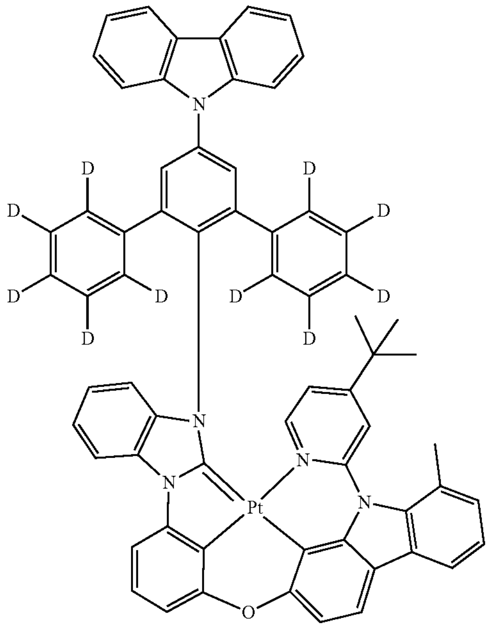
52
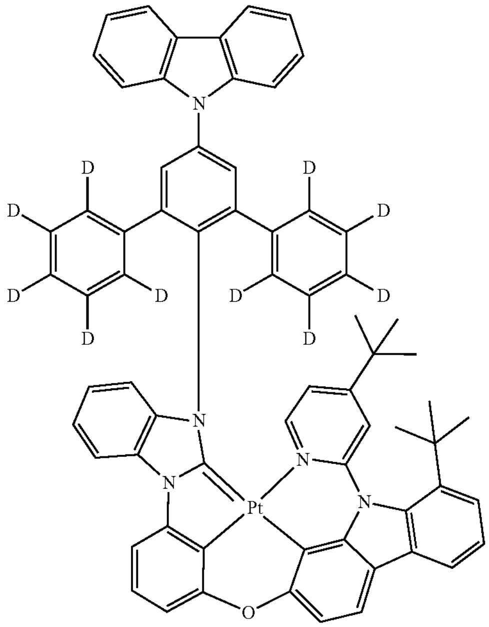

-continued
53
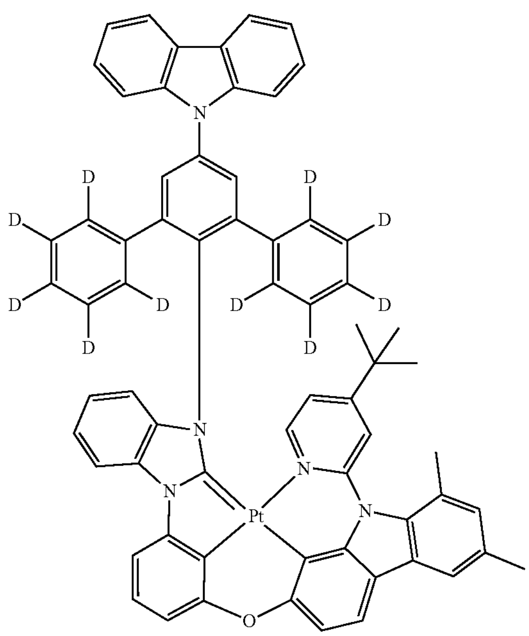
54
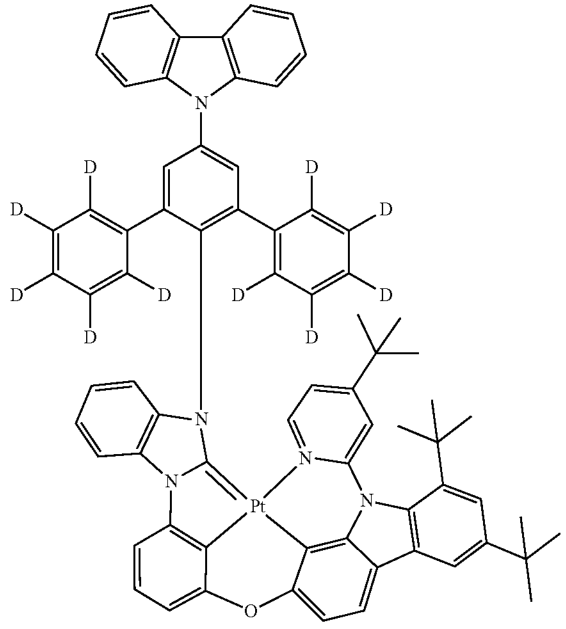
-continued
55
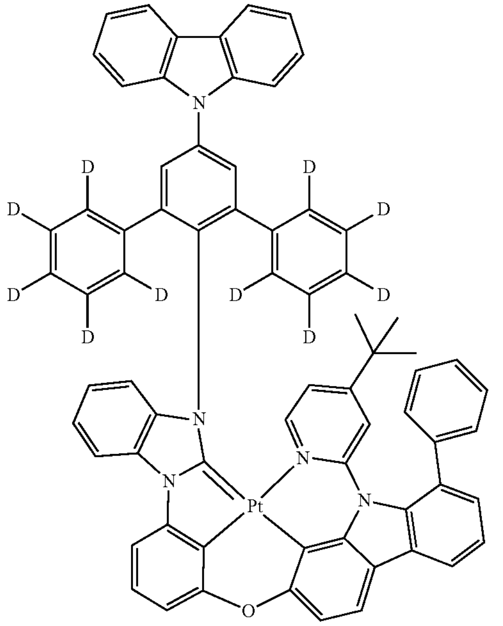
56
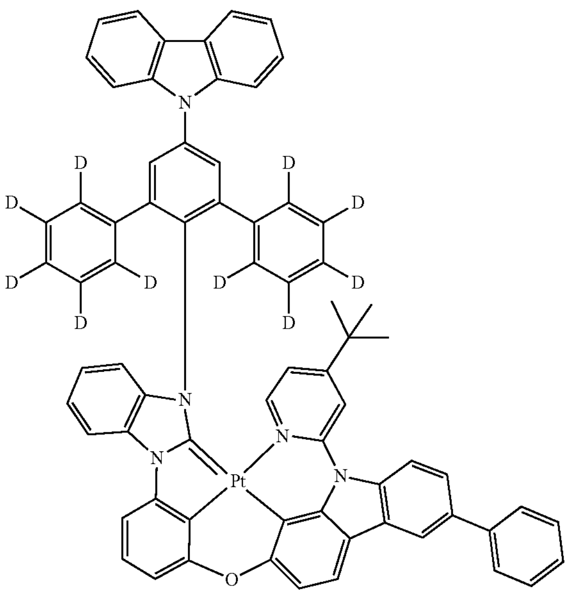

-continued
57
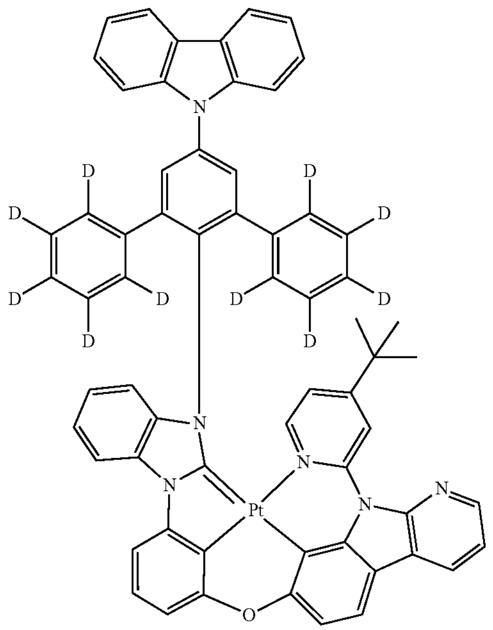
58
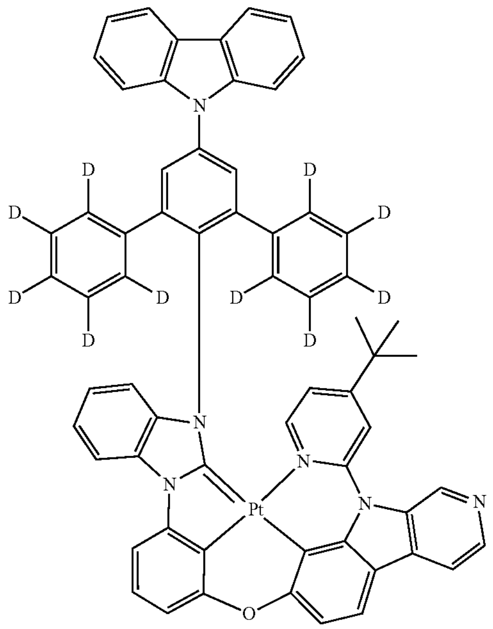
-continued
59
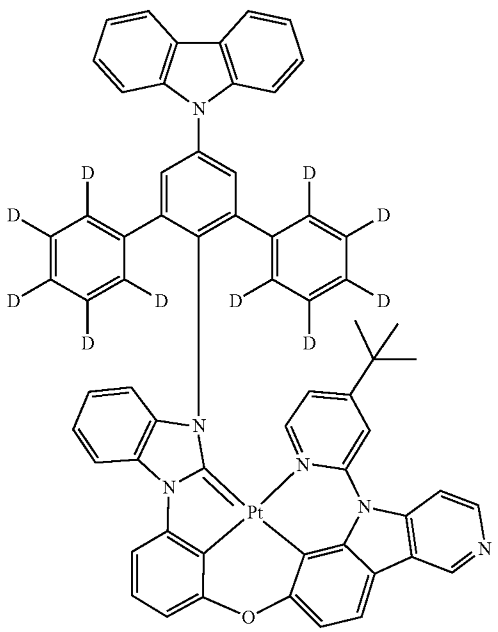
60
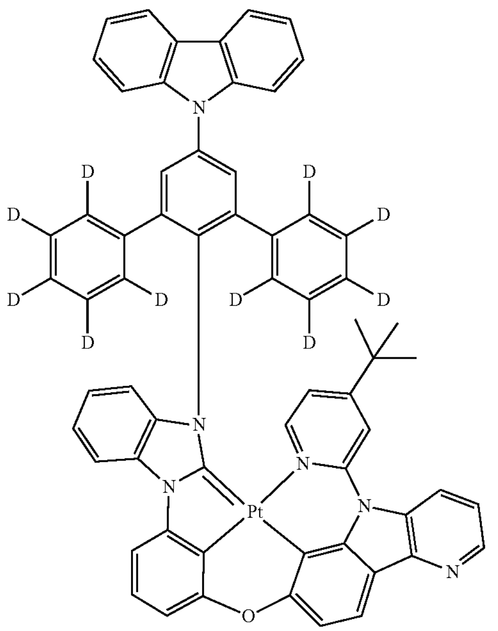

-continued
61
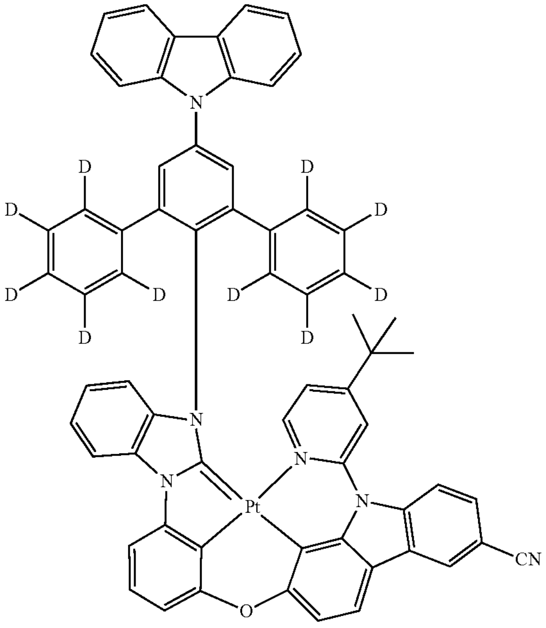
62
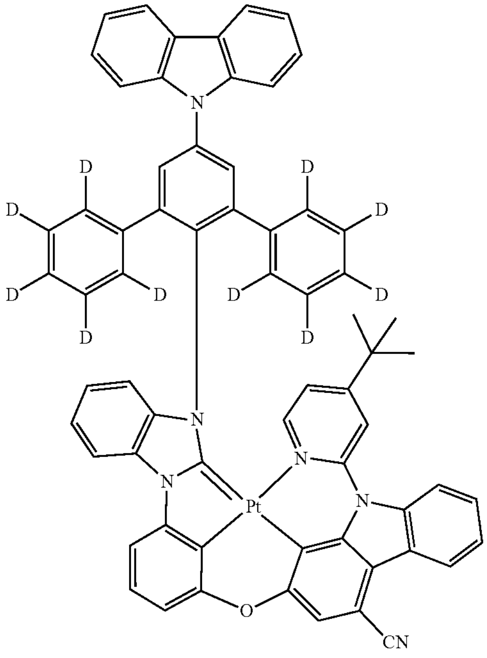
-continued
63
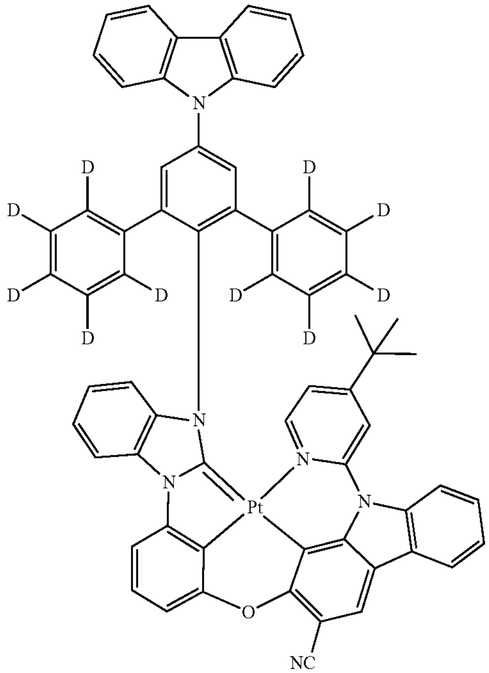
64
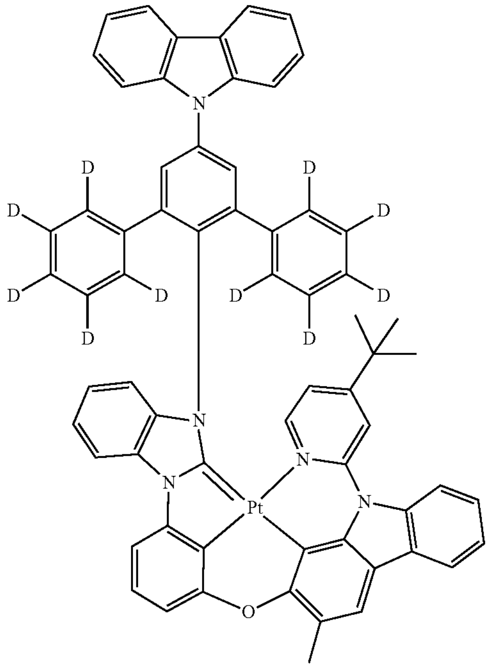

-continued
65
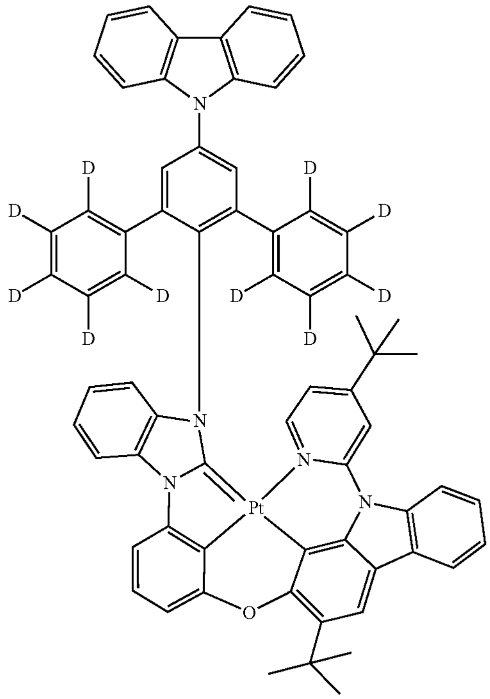
66
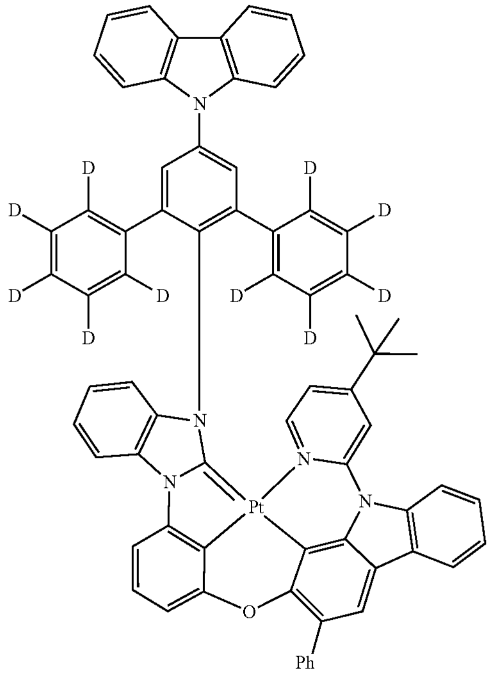
-continued
67
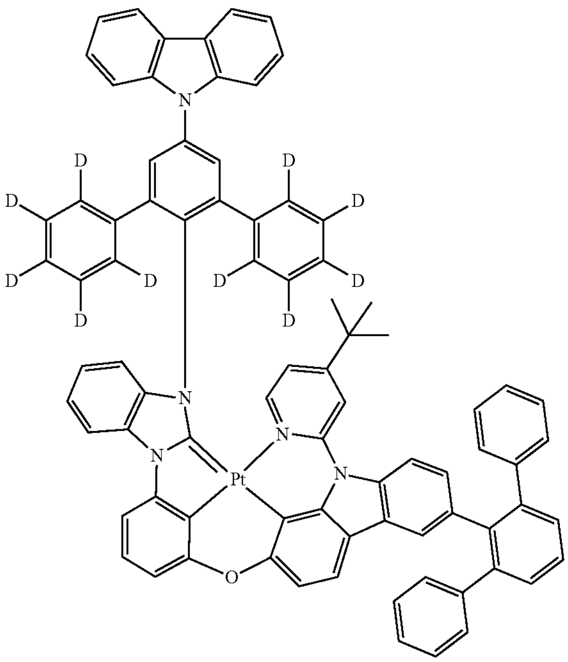
68
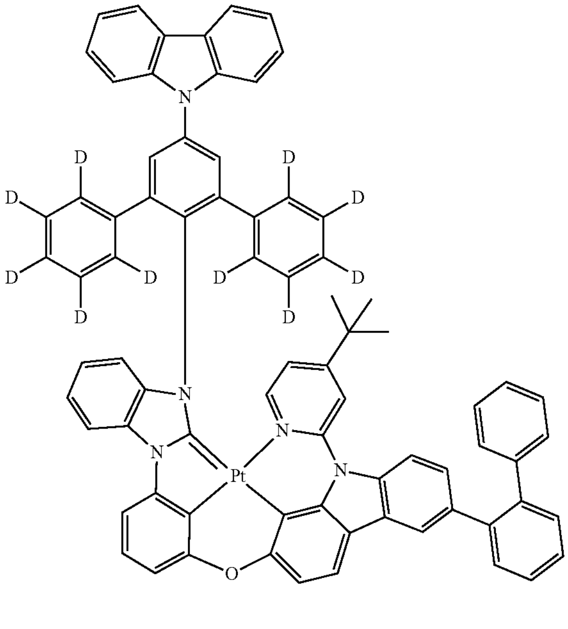

-continued
69
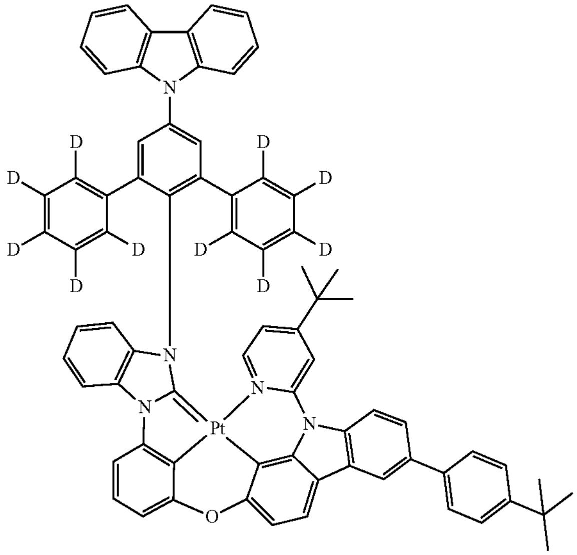
70
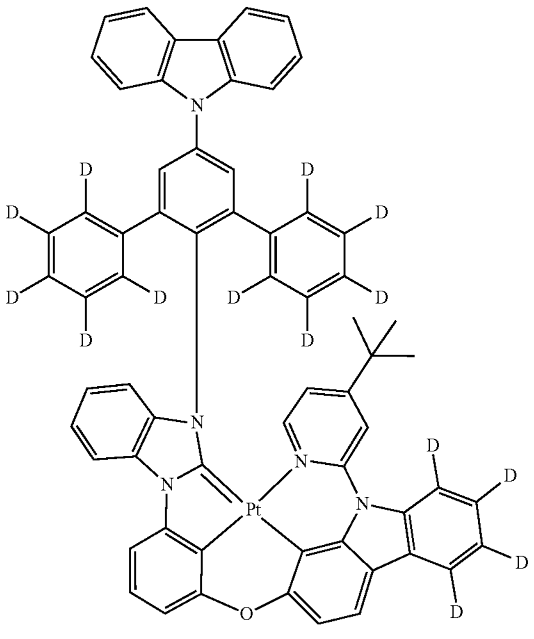
-continued
71
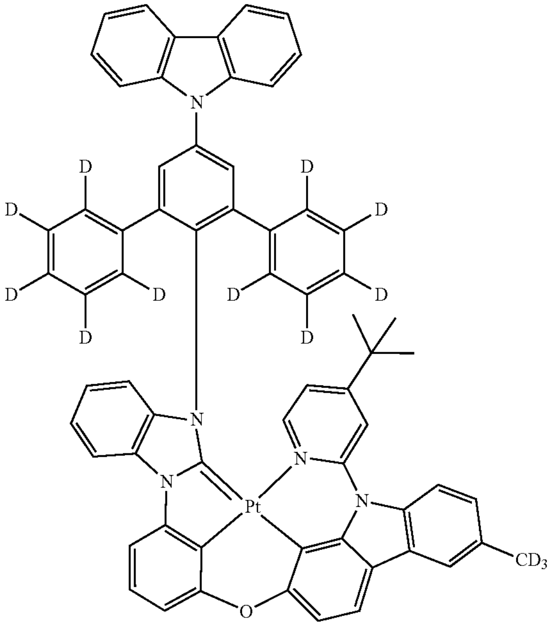
72
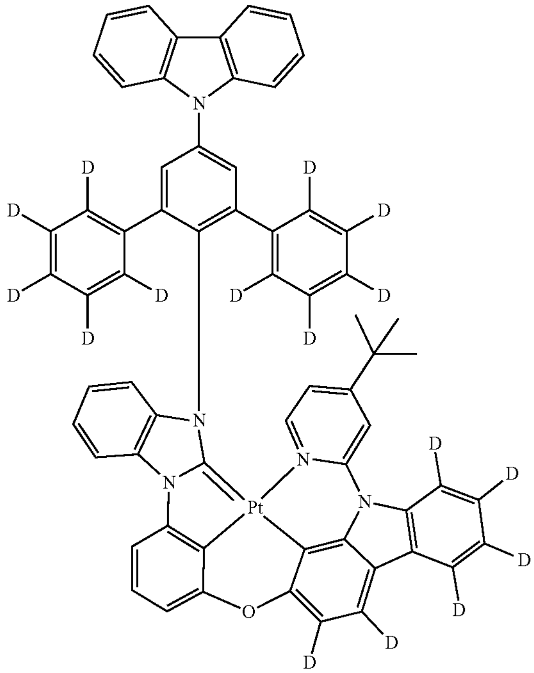

-continued
73
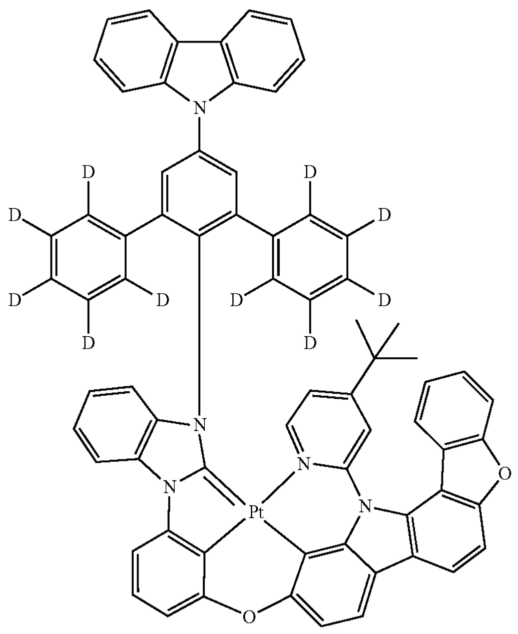
74
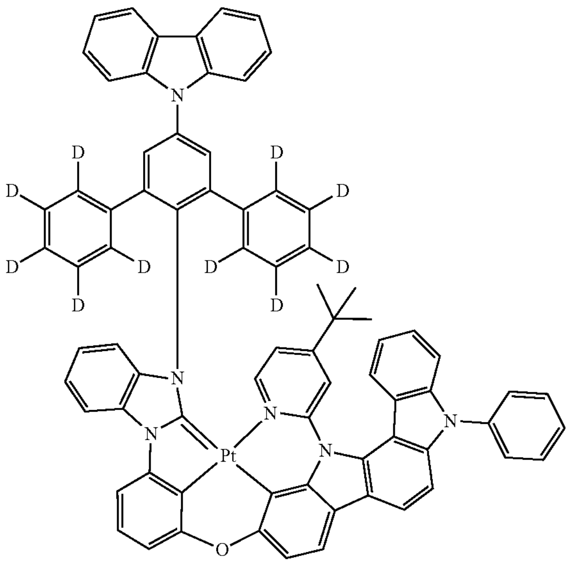
-continued
75
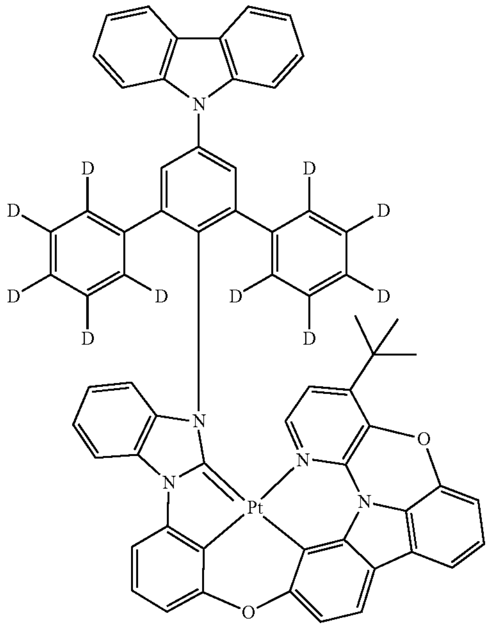
76
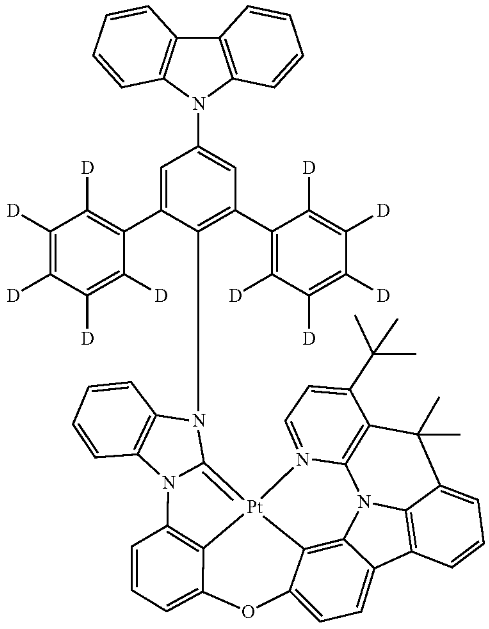

-continued
77
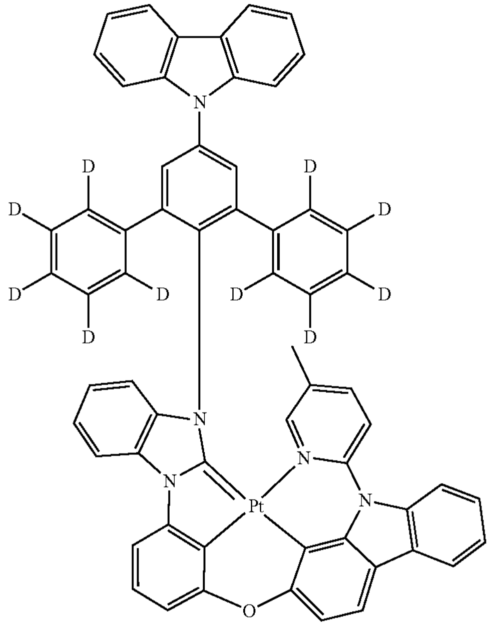
79
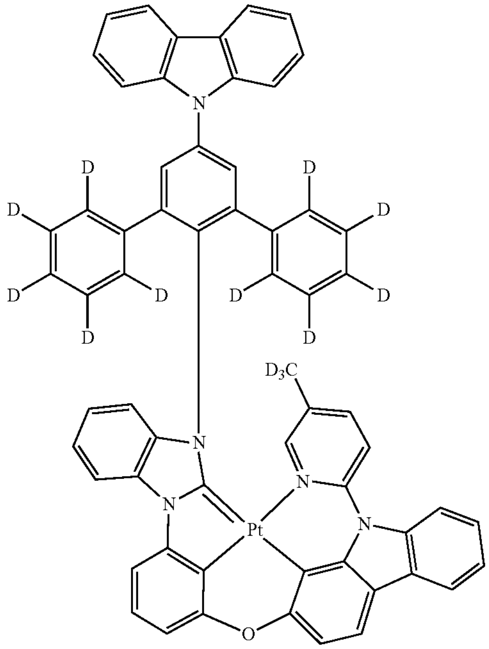
78
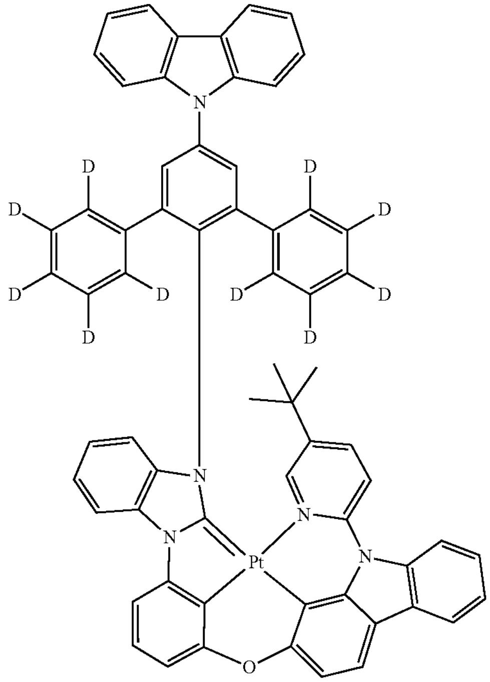
80
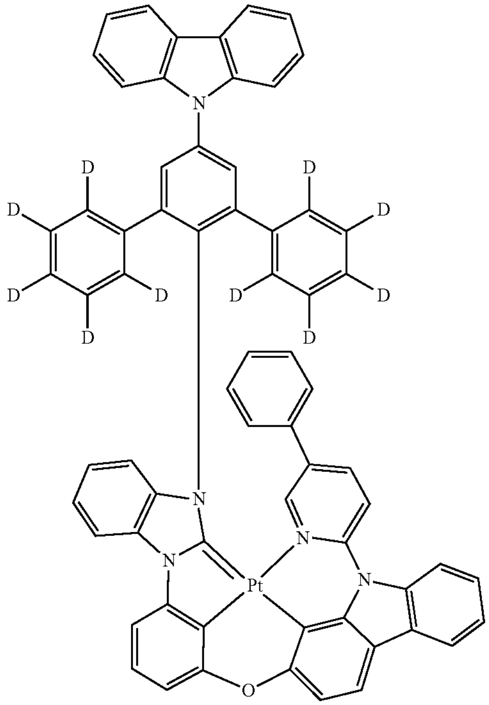

-continued
81
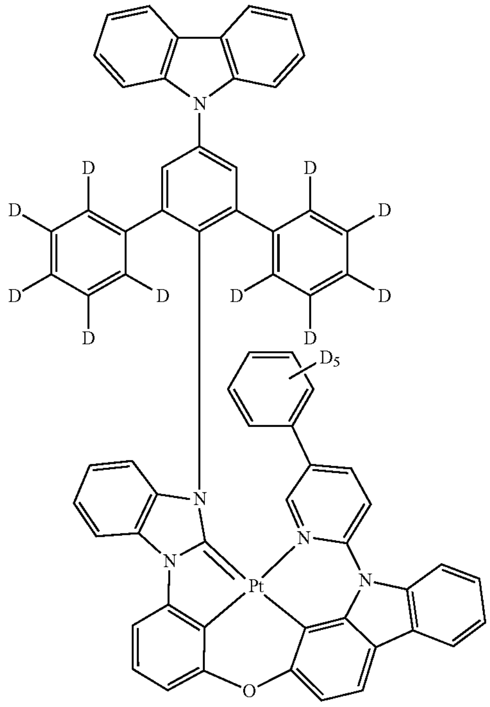
82
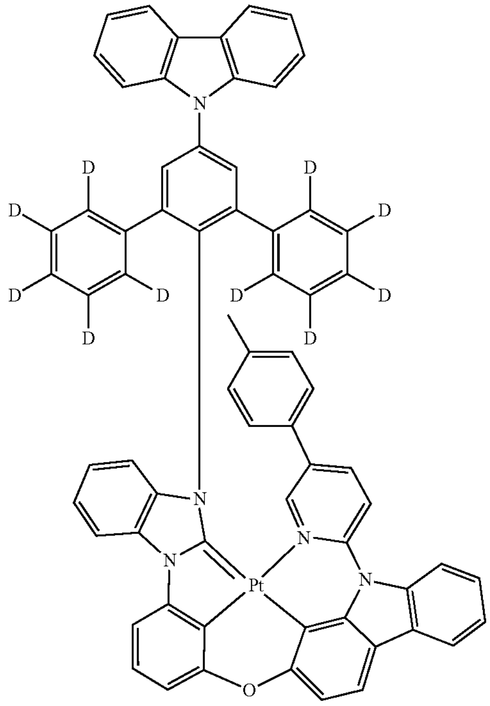
-continued
83
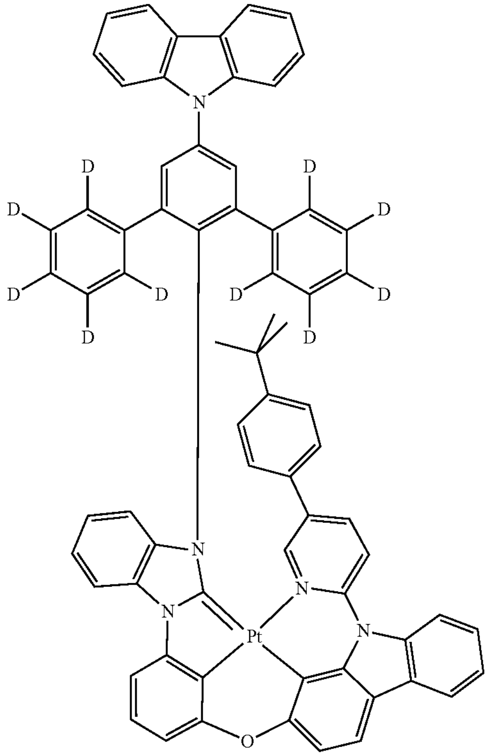
84
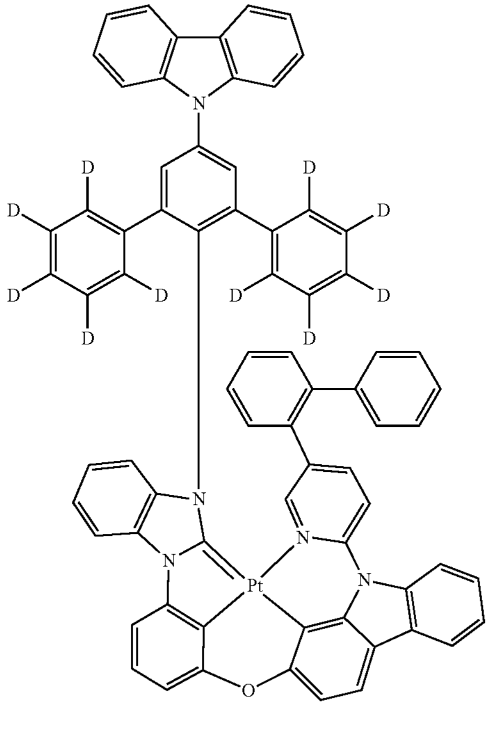

-continued
85
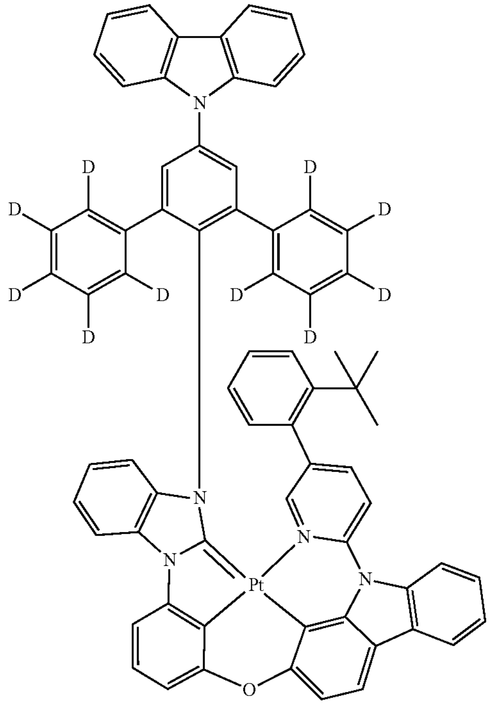
86
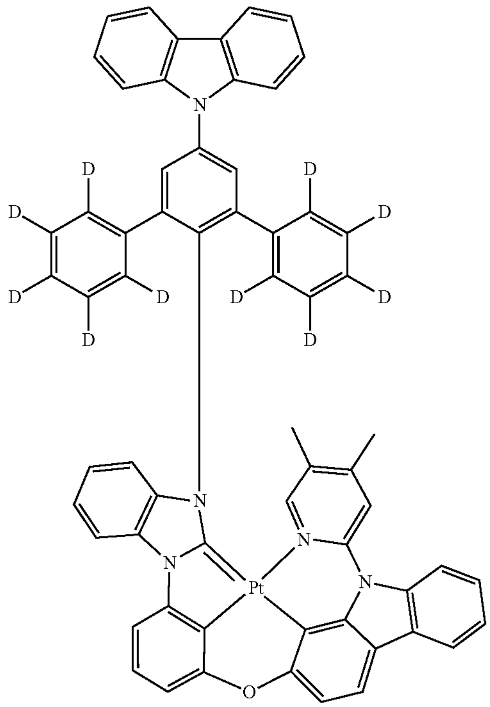
-continued
87
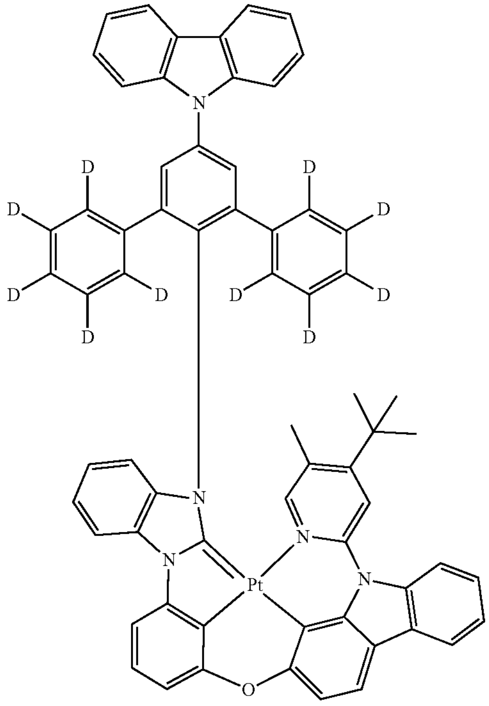
88
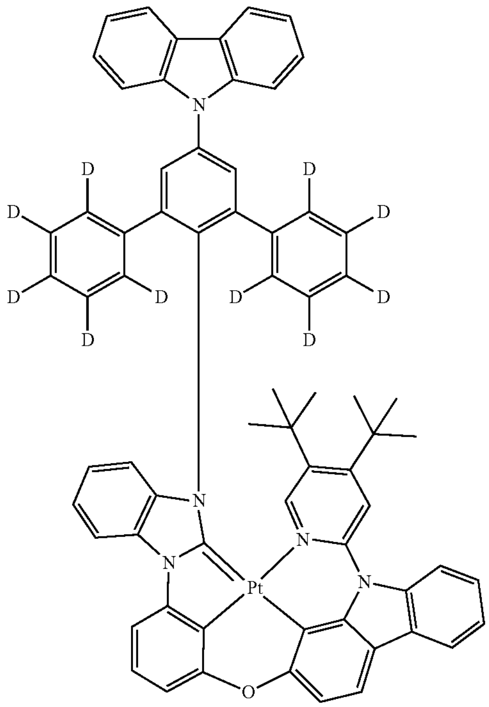

-continued
89
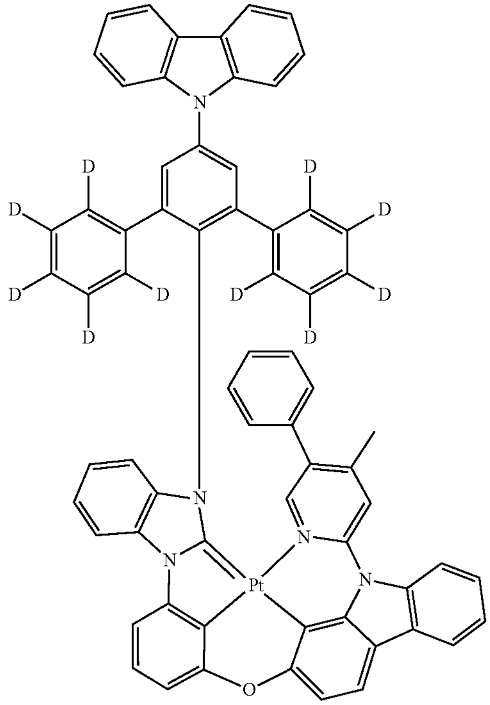
91
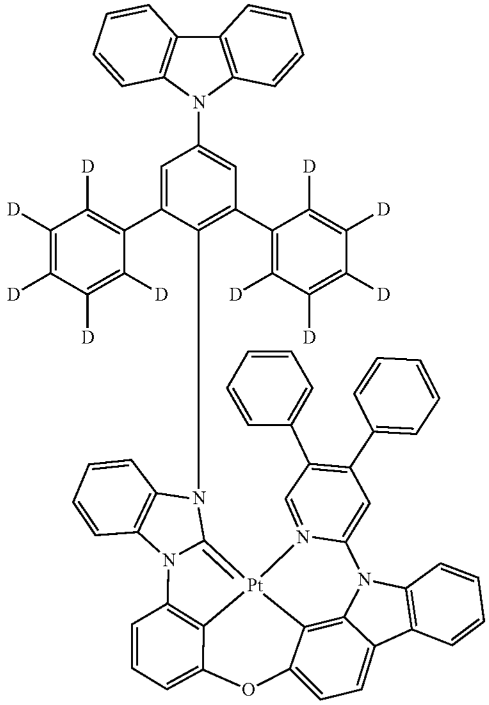
90
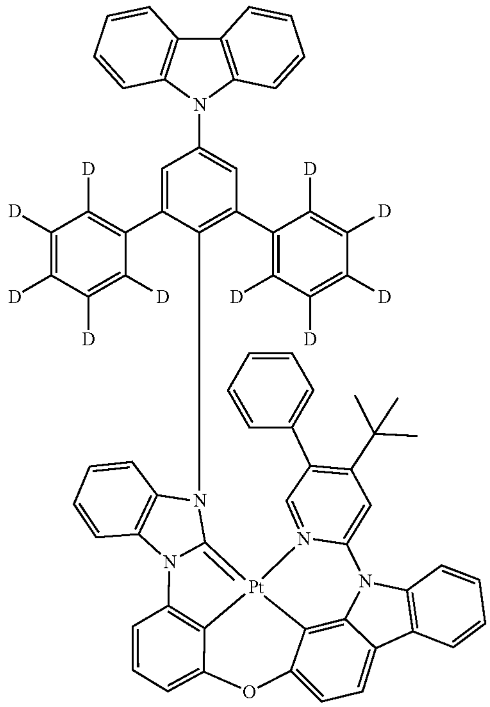
92
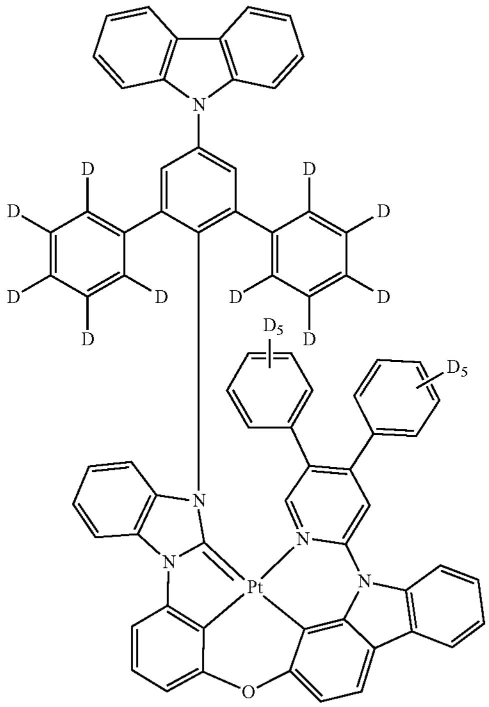

-continued
93
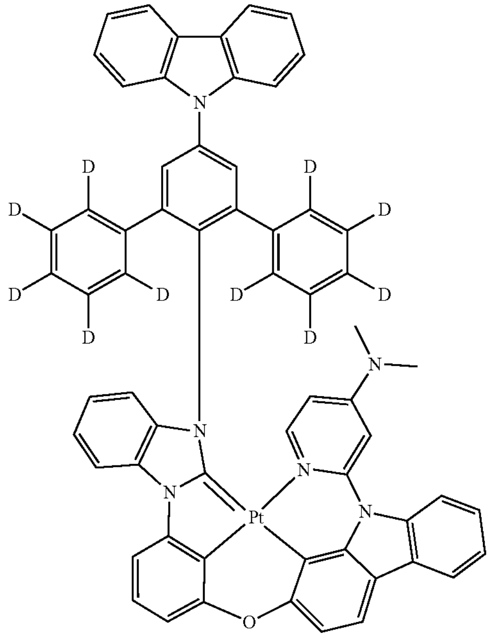
94
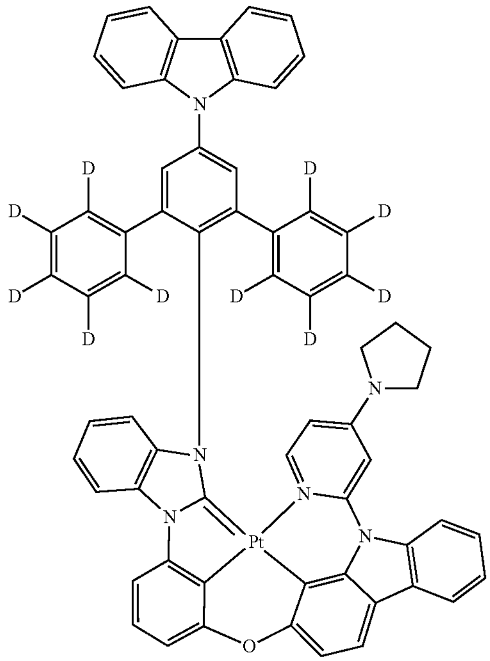
-continued
95
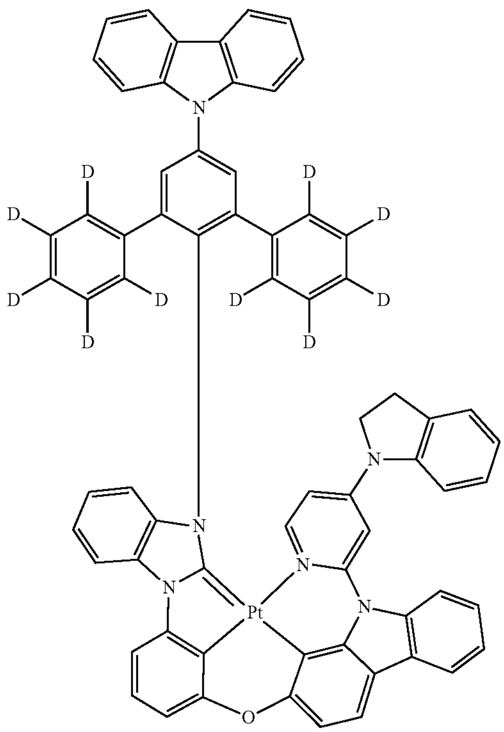
96
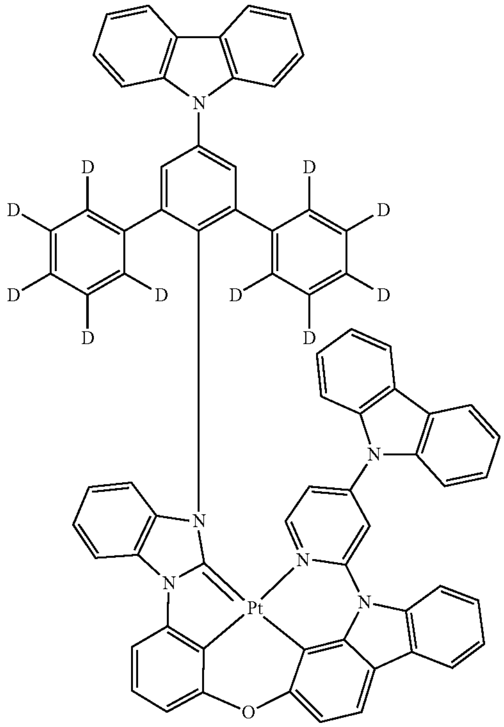

-continued

97

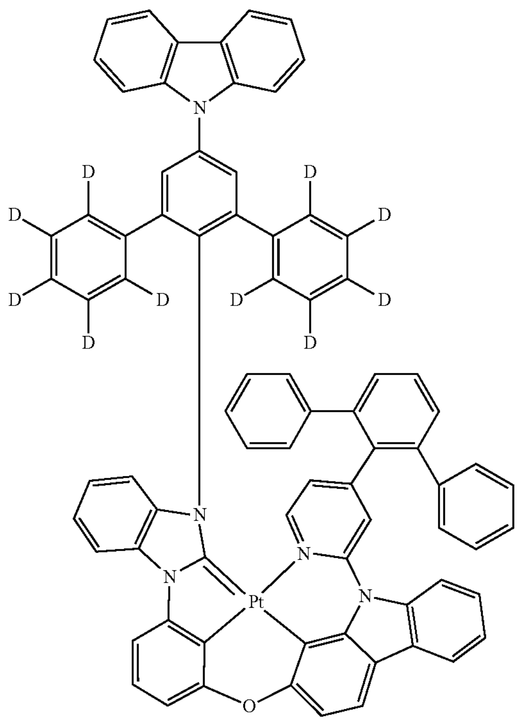

98

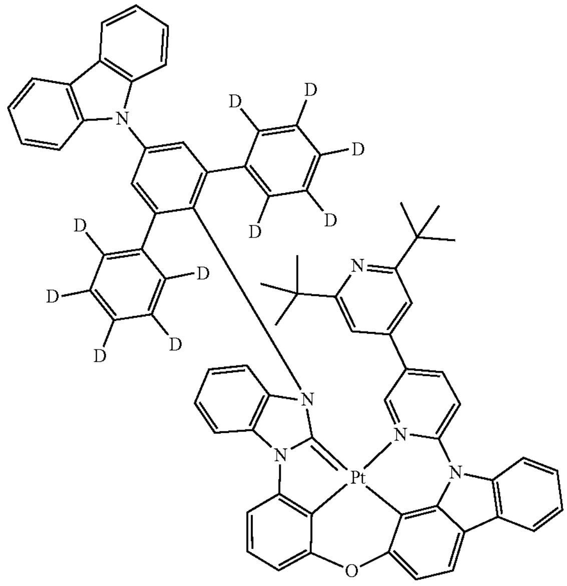

-continued

99

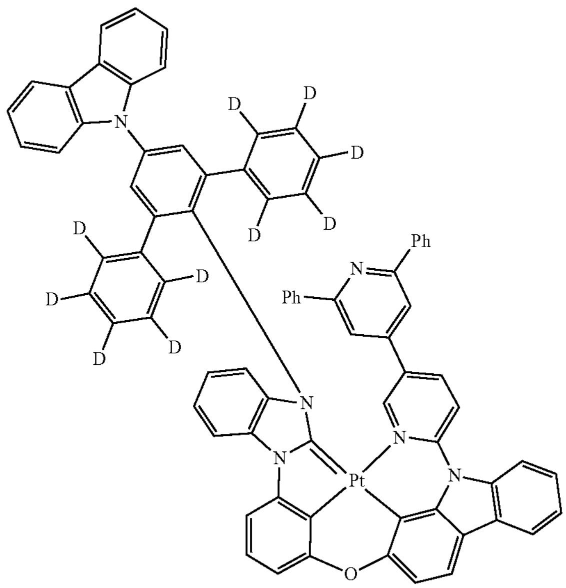

The organometallic compound may include a ligand including at least one group represented by Formula 2, thereby strengthening the bond between the ligand and a metal and improve stability of the compound. As the LUMO site is transferred to $CY_1$ connected to a group represented by Formula 2 including a bulky substituent including a carbazole group, a backbone having a shorter wavelength may be formed to improve the stability of the compound, but the mechanism is not limited thereto. Therefore, the luminance efficiency and lifespan of the light-emitting device including the organometallic compound may be increased.

In the organometallic compound according to an embodiment, $CY_1$ may be coordinated with the center of a metal through a carbon atom of carbene. Because the binding force of carbon and the center of a metal is stronger than the binding force of nitrogen and the center of a metal, the organometallic compound may be more optically and/or electrically stable, and a light-emitting device having long lifespan may be implemented.

In addition, the organometallic compound according to an embodiment may have an asymmetric molecular structure. When the organometallic compound has an asymmetric molecular structure, the lowest unoccupied molecular orbital (LUMO) energy may become relatively high, and the emission wavelength may shift to a short wavelength, and thus blue light having high color purity may be emitted.

The organometallic compound according to an embodiment may include at least one deuterium. When the organometallic compound includes deuterium, the binding force between molecules are increased and the vibration mode is decreased, thereby increasing the rigidity of the organometallic compound, and thus the luminance efficiency and lifespan of the light-emitting device may be increased.

The highest occupied molecular orbital (HOMO)/LUMO energy level, the triplet energy ($T_1$) level and emission wavelength, the presence ratio of the triplet metal-to-ligand charge transfer state ($^3$MLCT), and the energy of the triplet metal-centered state ($^3$MC) of Compound 2 and Compound C1 according to an embodiment were evaluated using the density functional theory (DFT) method of the Gaussian program, which is structure-optimized at a level of empirical dispersion B3LYP/6-31G(d,p) basis set applied to selective atoms. All calculations were performed using the Gaussian-09 (Rev. C01) software package with a processor.

Figure 4:
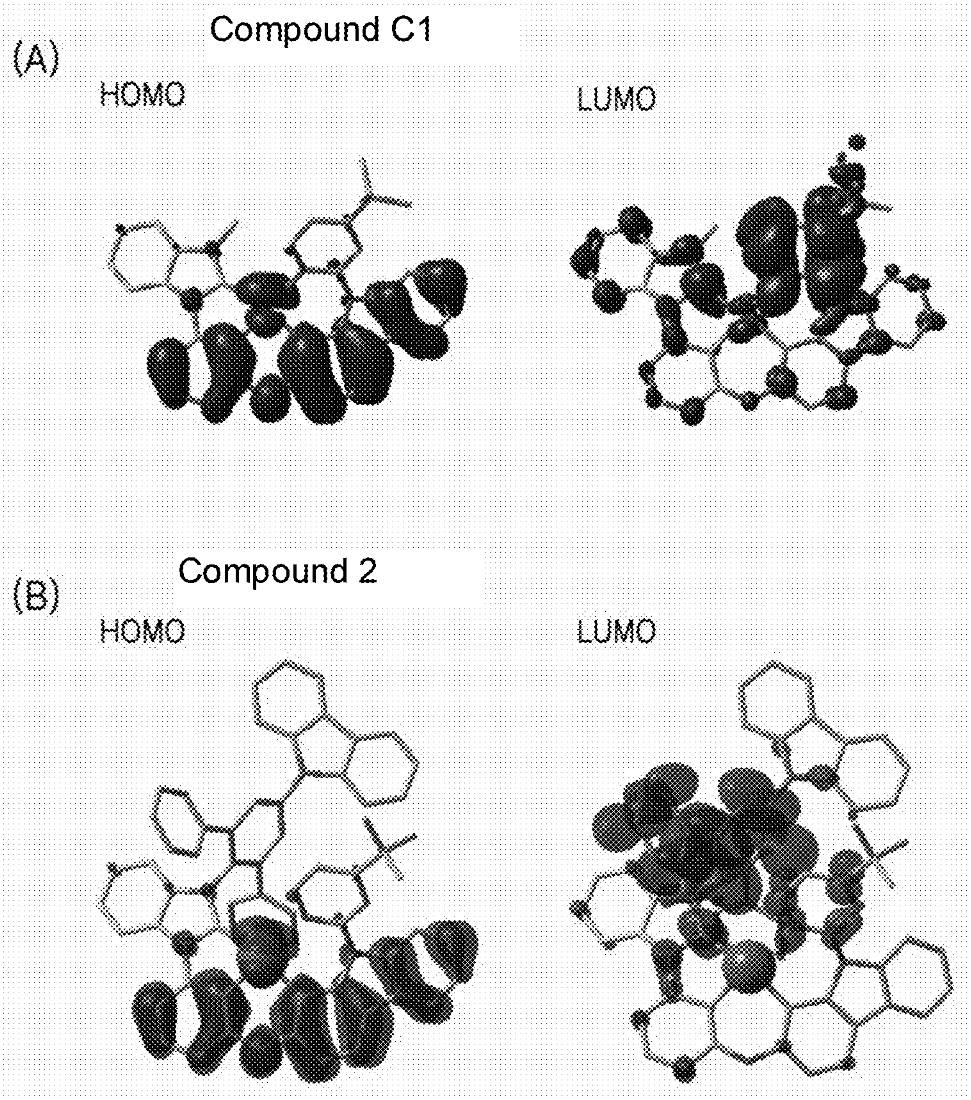
FIG. 4 shows the electron distribution in the HOMO and LUMO energy level of Compound C1 and Compound 2 measured using the DFT method of the Gaussian program, which is structure-optimized at the B3LYP/6-31G(d,p) level.

The results thereof are shown in Table 1, and the electron distribution of each compound in the HOMO and LUMO energy level are shown in FIG. 4, discussed further below.

TABLE 1

| Compound | HOMO (eV) | LUMO (eV) | $T_1$ (nm) | $T_1$ (eV) | $^3$MLCT (%) | $^3$MC state (eV) |
|---|---|---|---|---|---|---|
| C1 | −4.92 | −1.57 | 469.5 | 2.64 | 9.0 | 0.41 |
| 2 | −4.98 | −1.59 | 457.3 | 2.7 | 10.8 | 0.27 |

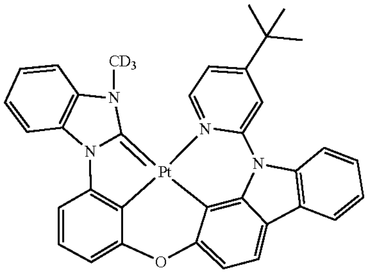
Compound C1

The presence ratio of the triplet metal-to-ligand charge transfer state ($^3$MLCT), the energy of the triplet metal-centered state ($^3$MC) in kilocalorie per mole (Kcal/mol), and the bond dissociation energy of the ligand and the pyridine ring of Compounds 1, 2, and 7 and Compounds C1 and 2 according to an embodiment were evaluated using the DFT method of the Gaussian program, which is structure-optimized at the B3LYP/6-31G(d,p) level, as described above. The results thereof are shown in Table 2. In Table 2, $\lambda_{max}^{sim}$ represents a simulation value of wavelength of maximum emission, and $\lambda_{max}^{exp}$ represents an experiment value of wavelength of maximum emission.

TABLE 2

| | $^3$MLCT (%) | $\lambda_{max}^{sim}$ (nanometer (nm)) | $\lambda_{max}^{exp}$ (nm) | $^3$MC (Kcal/mol) | Bond dissociation energy (BDE) (eV) |
|---|---|---|---|---|---|
| C1 | 9.1 | 469.5 | 459 | 6.99 | 2.87 |
| C2 | 11.3 | 465.3 | 459 | 7.87 | 3.03 |
| 1 | 13.2 | 461.1 | 456 | 8.01 | 3.21 |
| 2 | 15.5 | 457.3 | 455 | 8.99 | 3.50 |
| 7 | 13.5 | 462.2 | 455 | 8.23 | 3.45 |

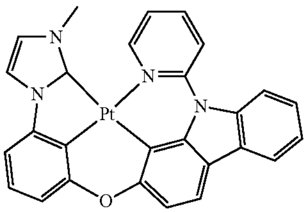
Compound C2

Table 2 shows that Compounds 1, 2 and 7 have higher bond dissociation energy than Compounds C1 and C2. Therefore, an electronic device, for example, a light-emitting device, including an organometallic compound represented by Formula 1 may have low driving voltage, high maximum quantum efficiency, high efficiency, and long lifespan.

Synthesis methods of the organometallic compound represented by Formula 1 may be recognizable by one of ordinary skill in the art by referring to Synthesis Examples and/or Examples provided below.

At least one organometallic compound represented by Formula 1 may be used in a light-emitting device (for example, an organic light-emitting device). Accordingly, provided is a light-emitting device including: a first electrode; a second electrode facing the first electrode; and an interlayer between the first electrode and the second electrode and including an emission layer, wherein the interlayer includes the organometallic compound represented by Formula 1.

In some embodiments, the first electrode of the light-emitting device may be an anode, the second electrode of the light-emitting device may be a cathode, the interlayer further includes a hole transport region between the first electrode and the emission layer and an electron transport region between the emission layer and the second electrode, the hole transport region includes a hole injection layer, a hole transport layer, an emission auxiliary layer, an electron blocking layer, or any combination thereof. The electron transport region may include a hole-blocking layer, an electron transport layer, an electron injection layer, or any combination thereof.

In an embodiment, the organometallic compound may be included between a pair of electrodes of the light-emitting device. Accordingly, the organometallic compound may be included in the interlayer of the light-emitting device, for example, in the emission layer of the interlayer. In an embodiment, the emission layer may further include a host, and the amount of the organometallic compound may be from about 0.01 parts by weight to about 49.99 parts by weight based on 100 parts by weight of the emission layer. In an embodiment, the emission layer may emit blue light or blue-green light. In an embodiment, the emission layer may emit light having a maximum emission wavelength of about 400 nm to about 500 nm.

The expression "(an interlayer) includes an organometallic compound" used herein may include a case in which "(an interlayer) includes identical organometallic compounds represented by Formula 1" and a case in which "(an interlayer) includes two or more different organometallic compounds represented by Formula 1."

For example, the interlayer may include the organometallic compound, and may include only Compound 1. In this regard, Compound 1 may exist in the emission layer of the light-emitting device. In an embodiment, the interlayer may include, as the organometallic compound, Compound 1 and Compound 2. In this regard, Compound 1 and Compound 2 may exist in an identical layer (for example, Compound 1 and Compound 2 may all exist in an emission layer), or different layers (for example, Compound 1 may exist in an emission layer and Compound 2 may exist in an electron transport region).

Another aspect provides an electronic apparatus including the light-emitting device. The electronic apparatus may further include a thin-film transistor. In an embodiment, the electronic apparatus may further include a thin-film transistor including a source electrode and a drain electrode, and the first electrode of the light-emitting device may be electrically connected to the source electrode or the drain electrode. In an embodiment, the electronic apparatus may further include a color filter, a color conversion layer, a touchscreen layer, a polarizing layer, or any combination thereof. More details on the electronic apparatus are the same as described herein.

Description of FIG. 1

FIG. 1 shows a schematic cross-sectional view of an embodiment of a light-emitting device.

The light-emitting device 10 includes a first electrode 110, an interlayer 130, and a second electrode 150. Hereinafter, the structure of the light-emitting device 10 according to an embodiment and an illustrative method of manufacturing the light-emitting device 10 will be described in connection with FIG. 1.

First Electrode 110

In FIG. 1, a substrate may be additionally located under the first electrode 110 or above the second electrode 150. As the substrate, a glass substrate or a plastic substrate may be used. In an embodiment, the substrate may be a flexible substrate, and may include plastics with excellent heat resistance and durability, such as a polyimide, a polyethylene terephthalate (PET), a polycarbonate, a polyethylene naphthalate, a polyarylate (PAR), a polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include an indium tin oxide (ITO), an indium zinc oxide (IZO), a tin oxide ($SnO_2$), a zinc oxide (ZnO), or any combinations thereof. In an embodiment, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode. The first electrode 110 may have a single layer consisting of a single-layered structure or a multilayer structure including a plurality of layers. For example, the first electrode 110 may have a three-layered structure of an ITO/Ag/ITO.

Interlayer 130

The interlayer 130 may be located on the first electrode 110. The interlayer 130 may include an emission layer. The interlayer 130 may further include a hole transport region between the first electrode 110 and the emission layer and an electron transport region between the emission layer and the second electrode 150. The interlayer 130 may further include metal-containing compounds such as organometallic compounds, inorganic materials such as quantum dots, and the like, in addition to various organic materials.

In an embodiment, the interlayer 130 may include, i) two or more emitting units sequentially stacked between the first electrode 110 and the second electrode 150 and ii) a charge generation layer located between the two emitting units. When the interlayer 130 includes the emitting unit and the charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer consisting of a plurality of different materials, or iii) a multi-layered structure including a plurality of layers including different materials. The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, wherein, in each structure, layers are stacked sequentially from the first electrode 110.

The hole transport region may include a compound represented by Formula 201, a compound represented by Formula 202, or any combination thereof:

Formula 201

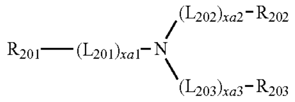

Formula202

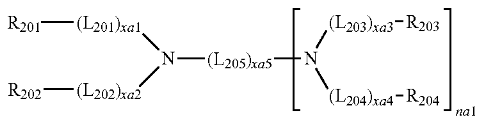

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer selected from 0 to 5, xa5 may be an integer selected from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_5$-$C_{60}$ polycyclic group unsubstituted or substituted with at least one $R_{10a}$, and na1 may be an integer selected from 1 to 4.

In an embodiment, each of Formulae 201 and 202 may include at least one of groups represented by Formulae CY201 to CY217.

CY201

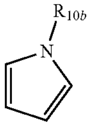

CY202

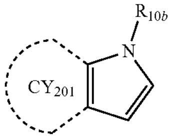

CY203

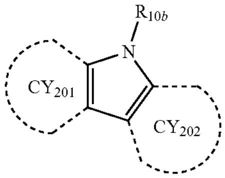

CY204

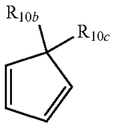

CY205

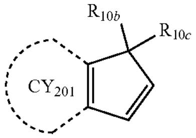

CY206

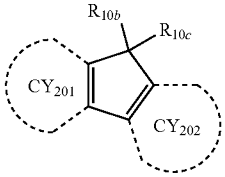

CY207

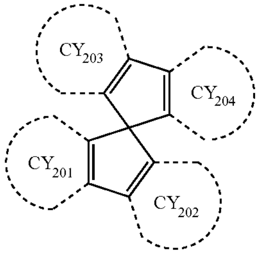

CY208

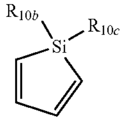

CY209

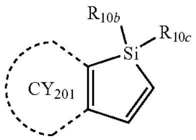

-continued

CY210

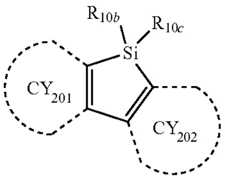

CY211

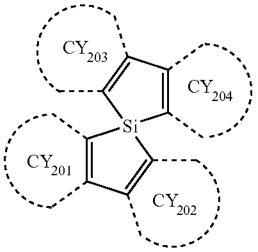

CY212

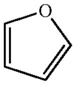

CY213

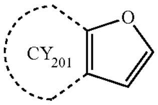

CY214

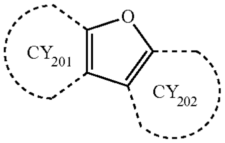

CY215

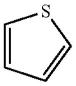

CY216

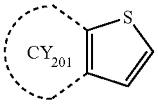

CY217

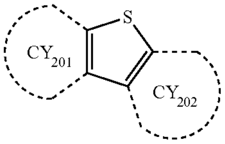

The variables $R_{10b}$ and $R_{10c}$ in Formulae CY201 to CY217 are the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, ring $CY_{201}$ to ring $CY_{204}$ in Formulae CY201 to CY217 may each independently be a benzene group, a naphthalene group, a phenanthrene group, or an anthracene group. In an embodiment, each of Formulae 201 and 202 may include at least one of groups represented by Formulae CY201 to CY203. In an embodiment, Formula 201 may include at least one of groups represented by Formulae CY201 to CY203 and at least one of groups represented by Formulae CY204 to CY217.

In an embodiment, xa1 in Formula 201 is 1, $R_{201}$ is a group represented by one of Formulae CY201 to CY203, xa2 may be 0, and $R_{202}$ may be a group represented by one of Formulae CY204 to CY207.

In an embodiment, each of Formulae 201 and 202 may not include a group represented by one of Formulae CY201 to CY203. In an embodiment, each of Formulae 201 and 202 may not include a group represented by one of Formulae CY201 to CY203, and may include at least one of groups represented by Formulae CY204 to CY217. In an embodiment, each of Formulae 201 and 202 may not include a group represented by one of Formulae CY201 to CY217.

In an embodiment, the hole transport region may include one of Compounds HT1 to HT44, 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino] triphenylamine (2-TNATA), bis(naphthalen-1-yl)-N,N'-bis(phenyl)benzidine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (spiro-TPD), N2,N7-di-1-naphthalenyl-N2,N7-diphenyl-9,9'-spirobi[9H-fluorene]-2,7-diamine (spiro-NPB), N,N'-di(1-naphthyl)-N,N'-diphenyl-2,2'-dimethyl-(1,1'-biphenyl)-4,4'-diamine (methylated NPB), 4,4'-cyclohexylidenebis[N,N-bis(4-methylphenyl)benzenamine] (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

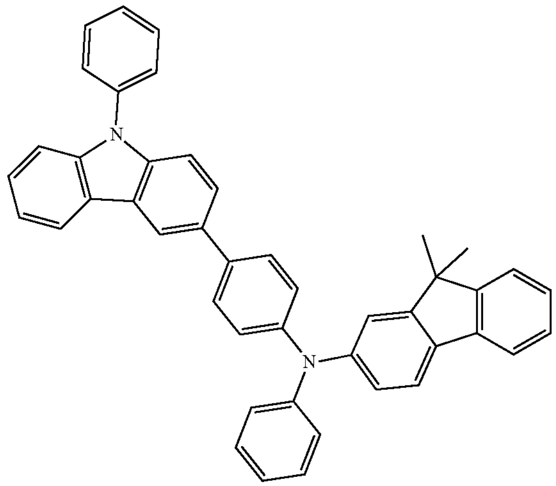

HT2

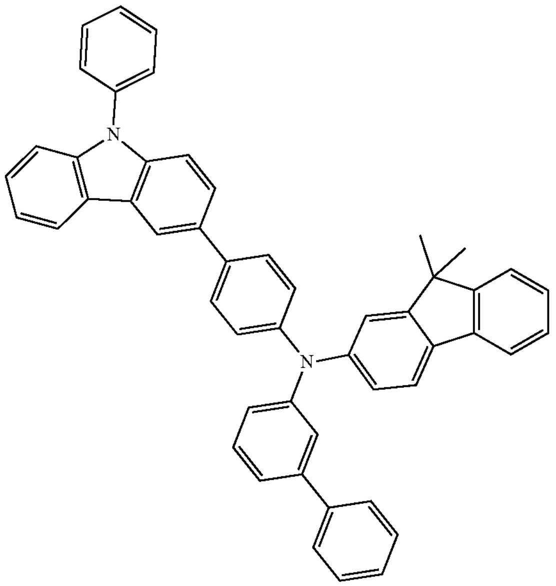

HT3

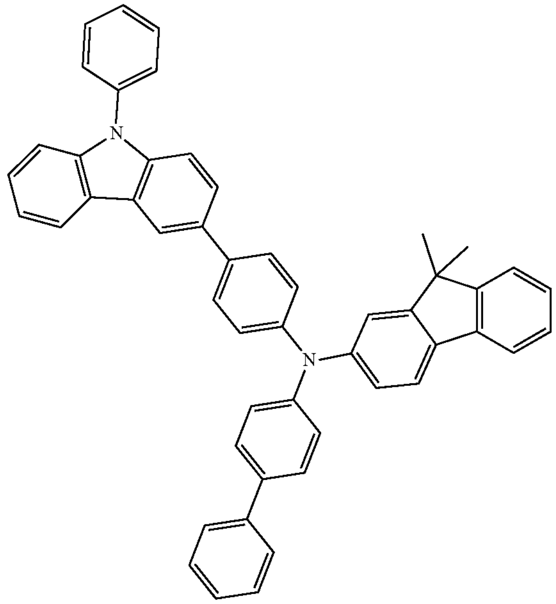

HT4

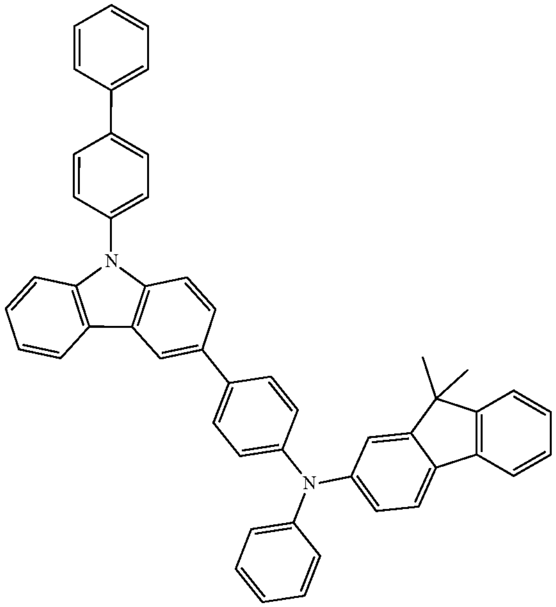

-continued
HT5
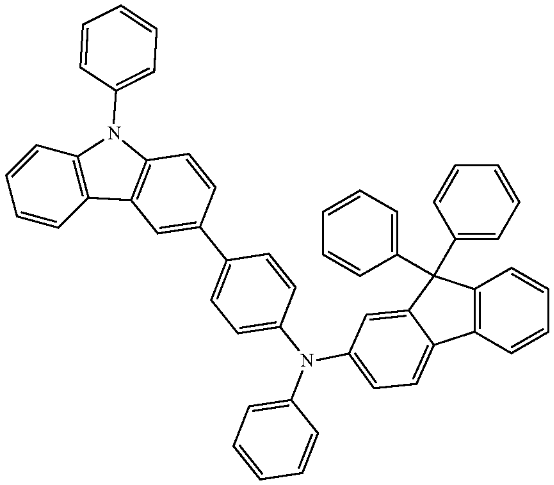
HT6
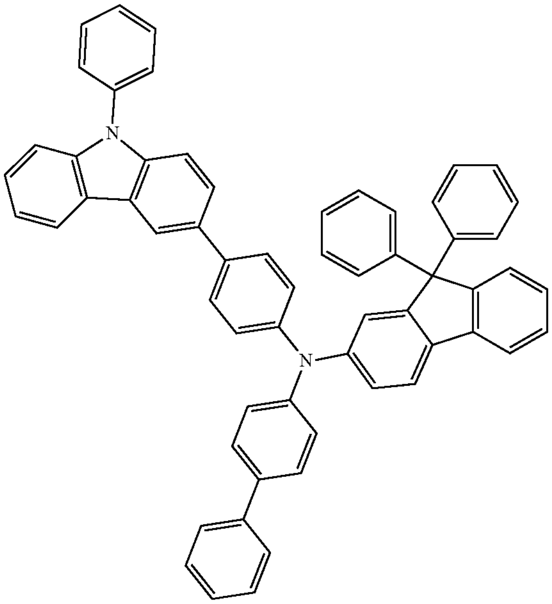
HT7
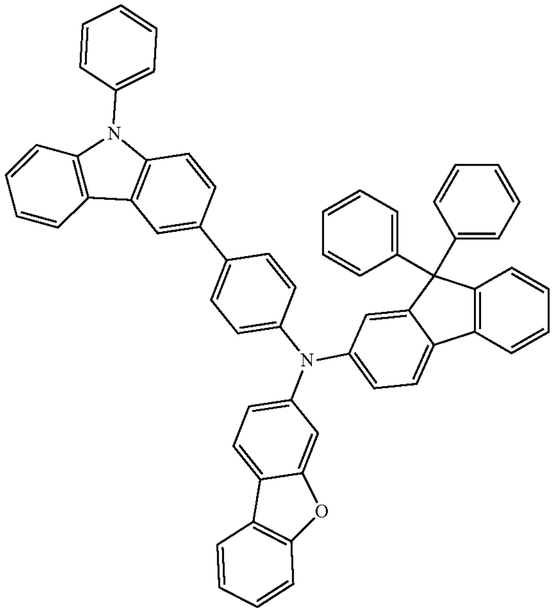
HT8
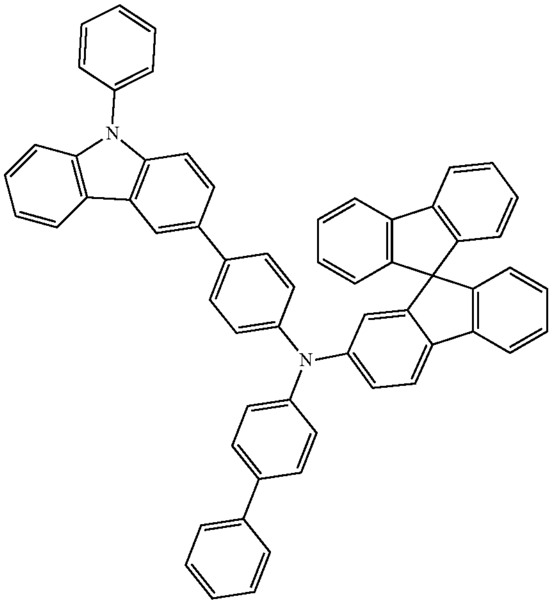

-continued
HT9
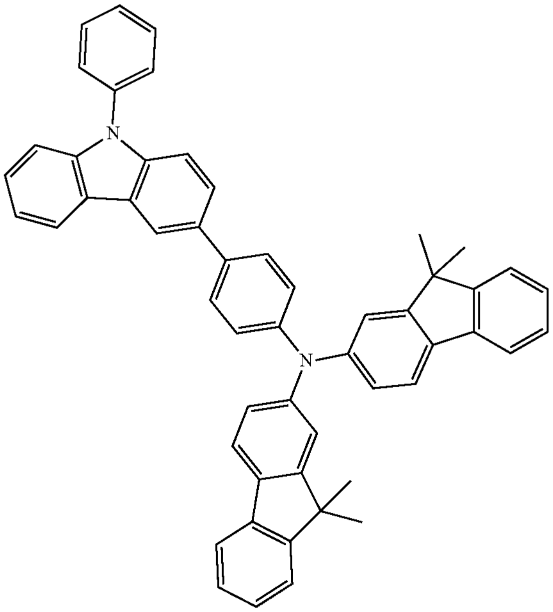
HT10
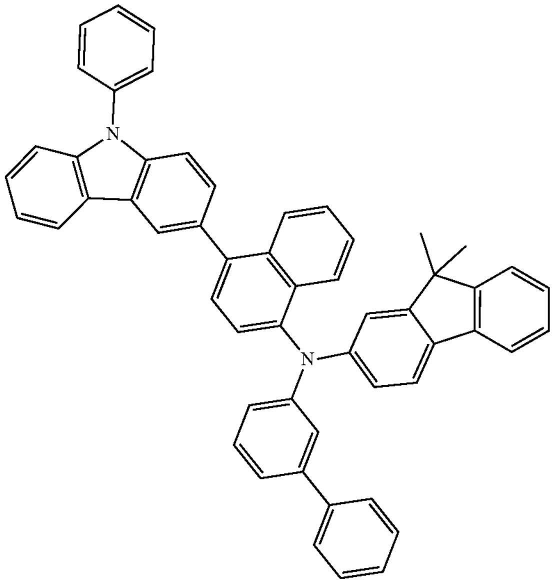
HT11
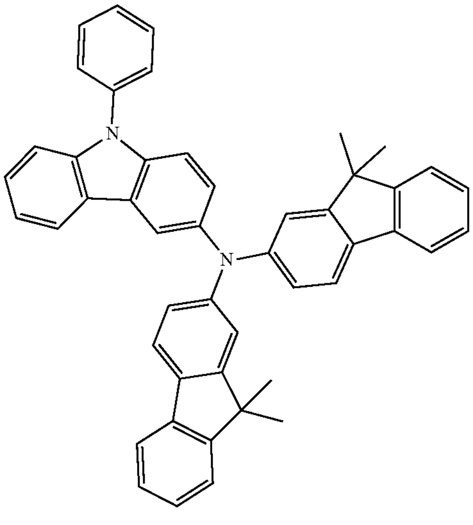
HT12
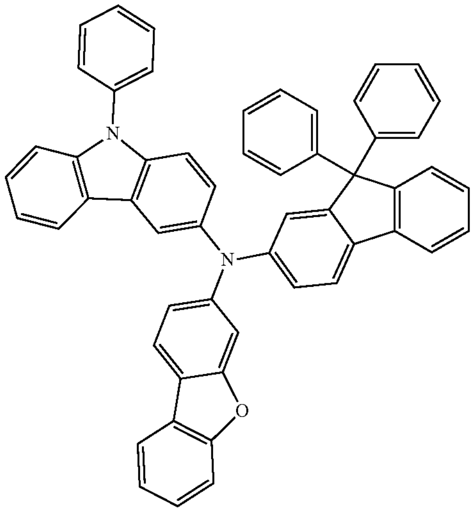

-continued
HT13
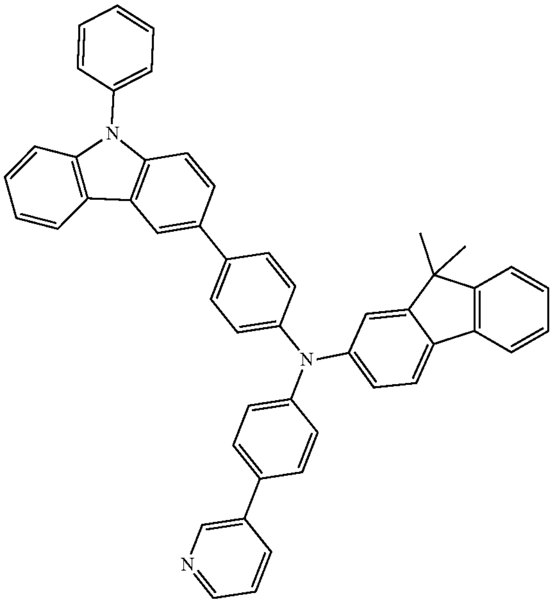
HT14
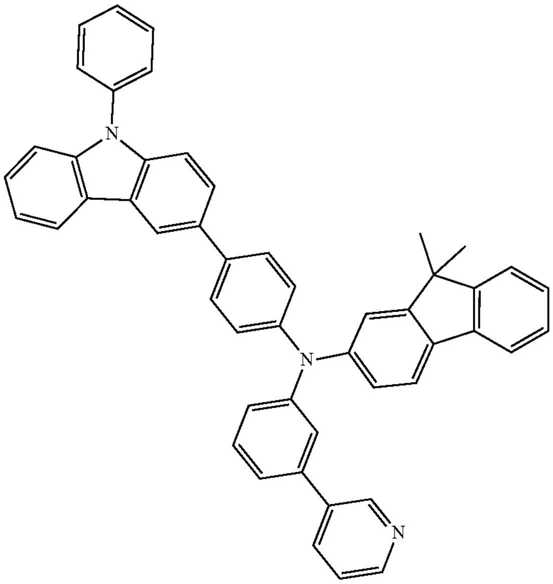
HT15
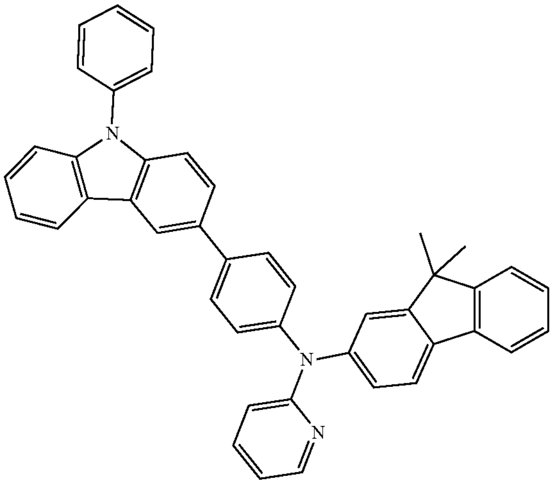
HT16
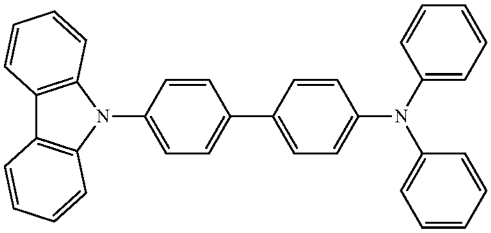
HT17
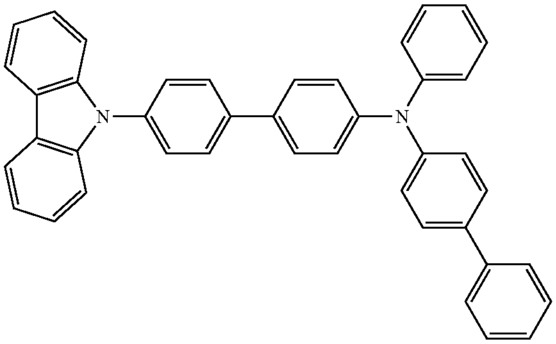
HT18
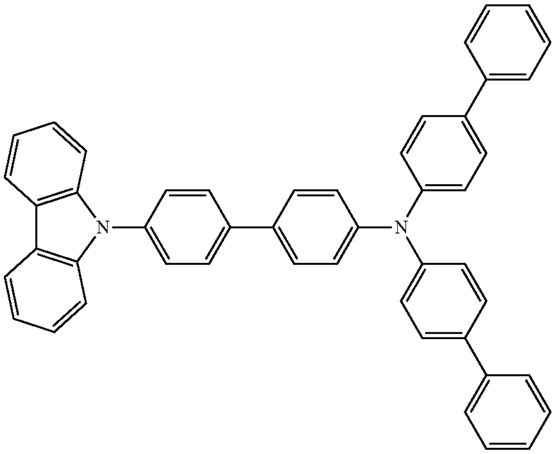

-continued
HT19
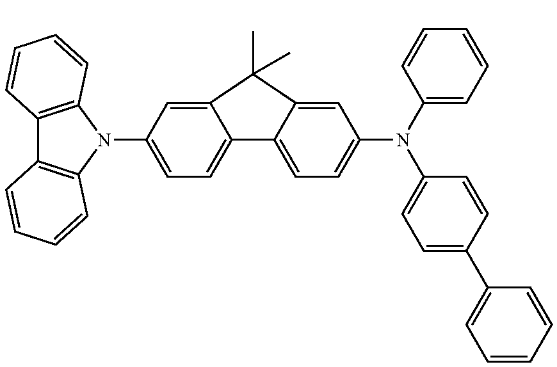
HT20
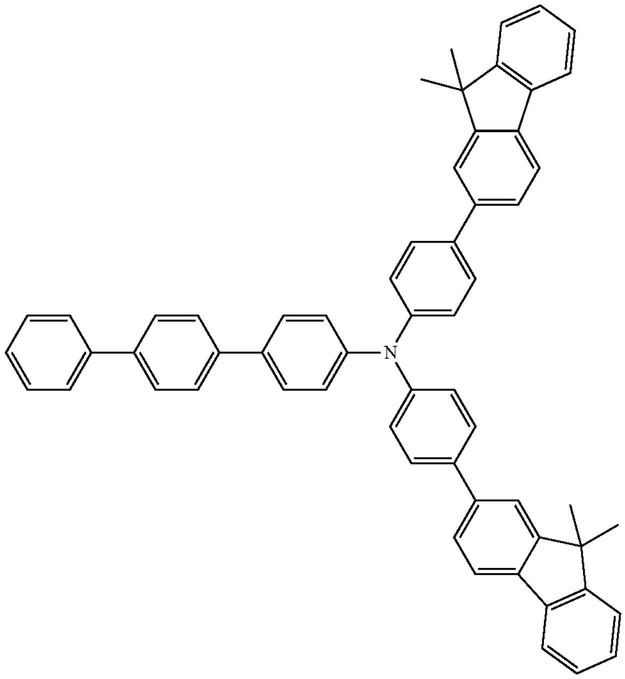
HT21
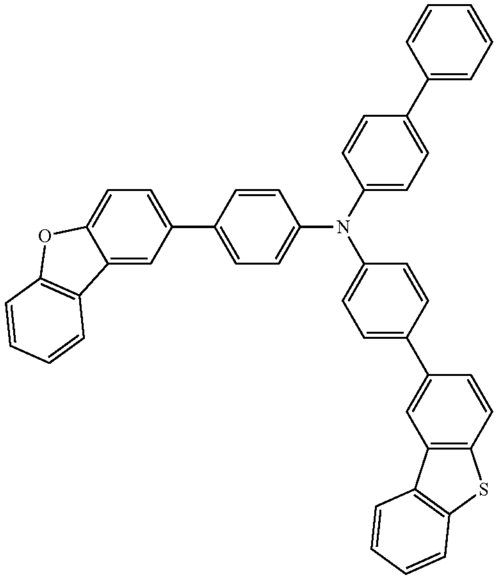
HT22
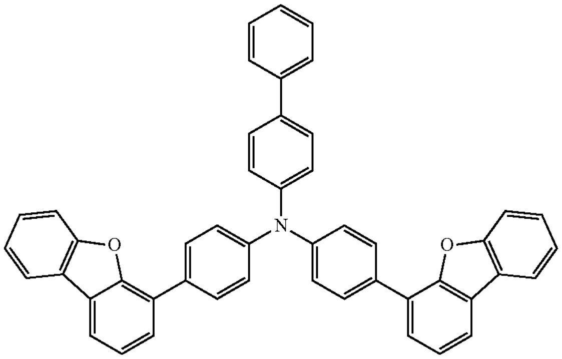

-continued
HT23
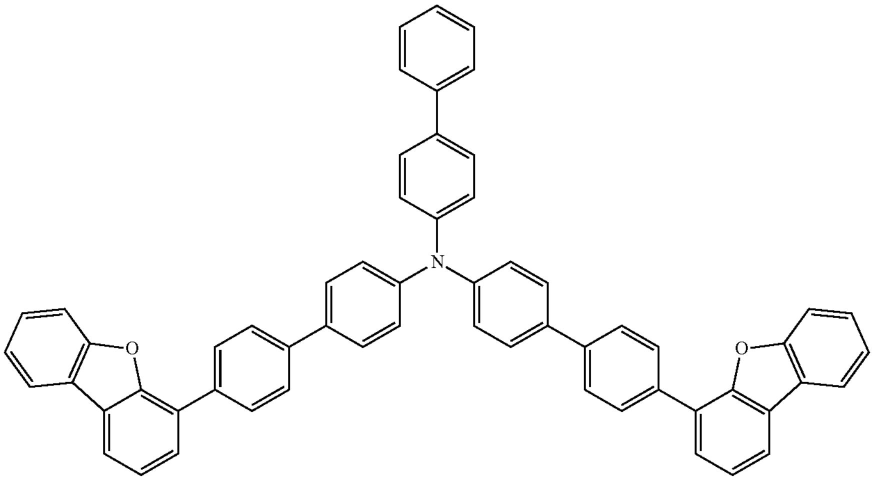
HT24
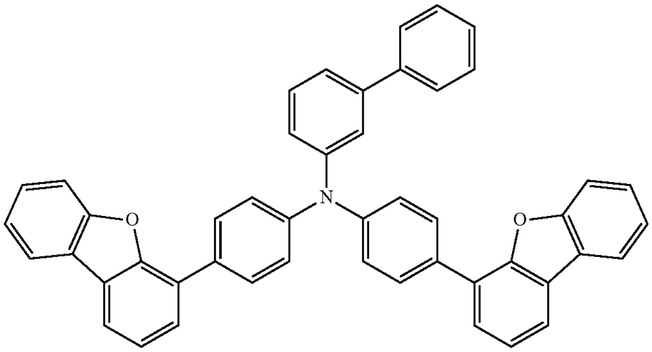
HT25
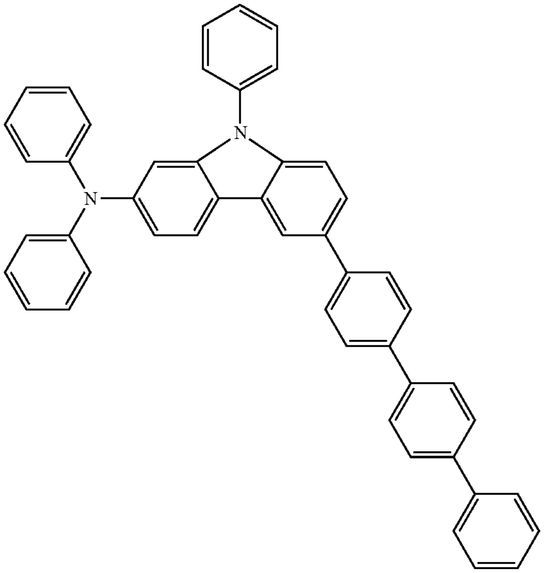
HT26
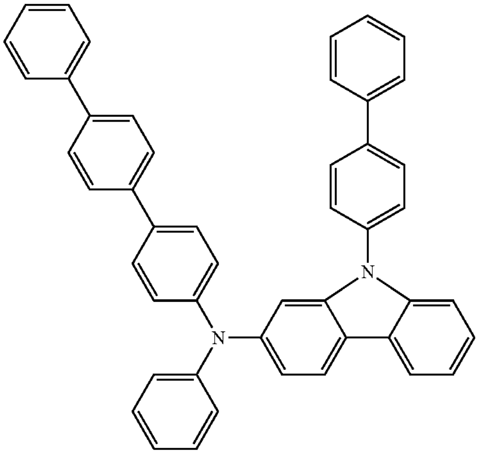

-continued
HT27
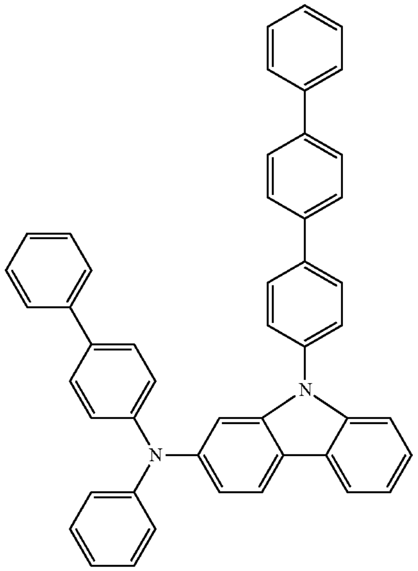
HT28
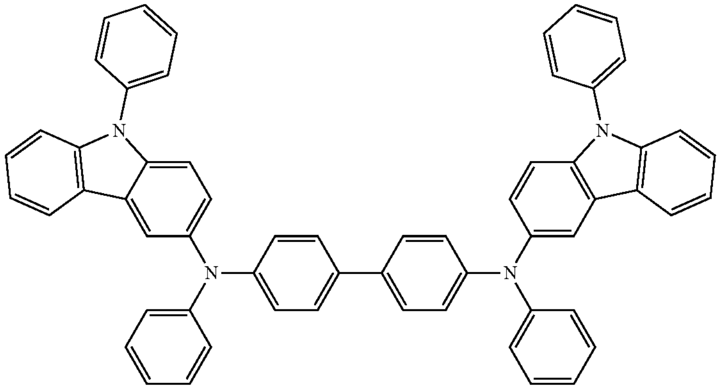
HT29
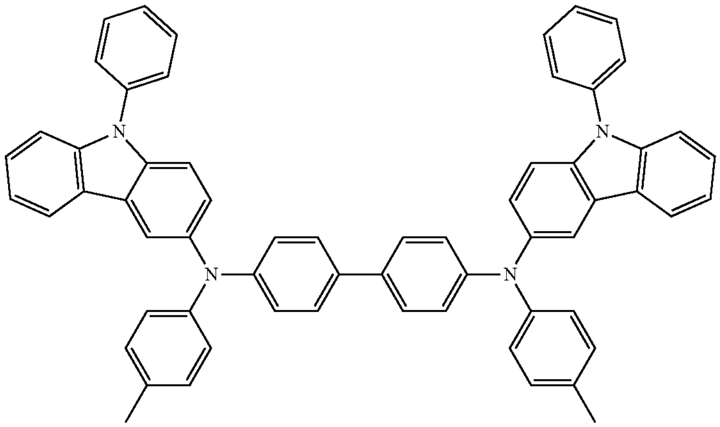

-continued
HT30
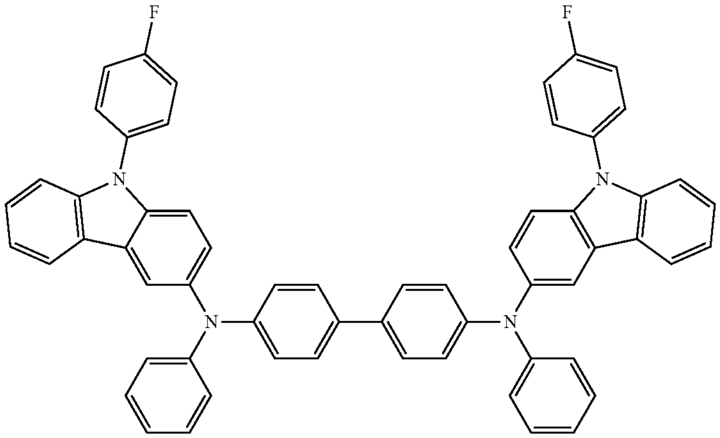
HT31
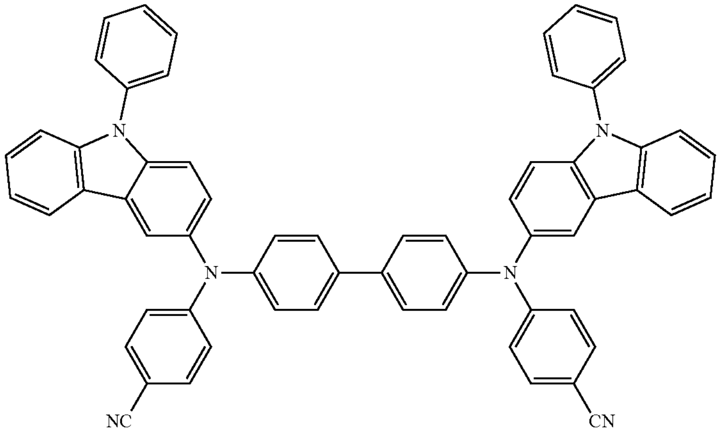
HT32
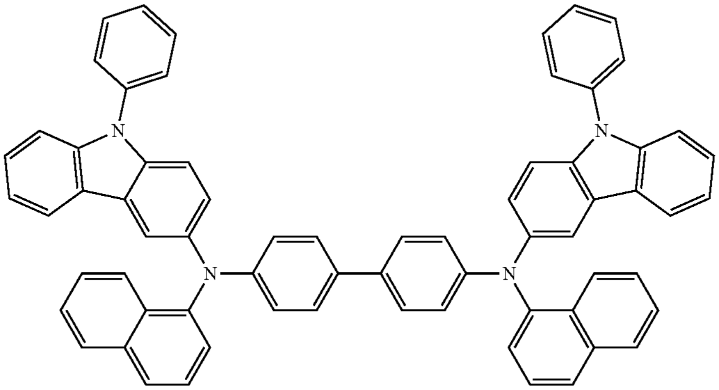

-continued
HT33
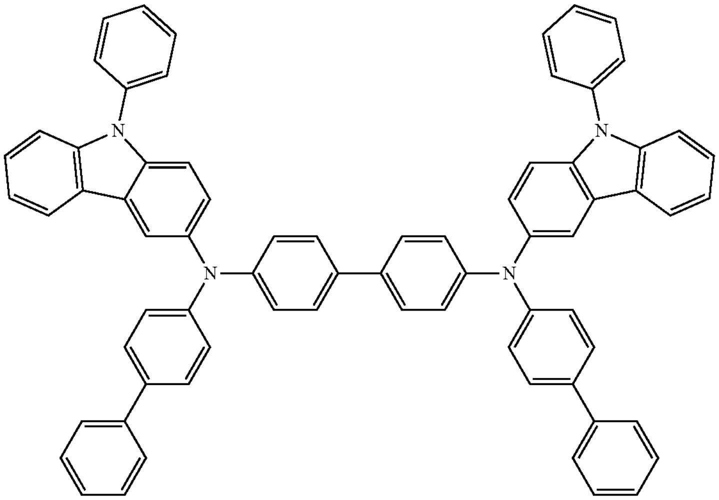
HT34
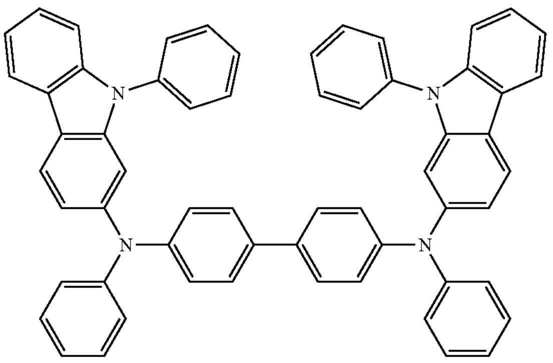
HT35
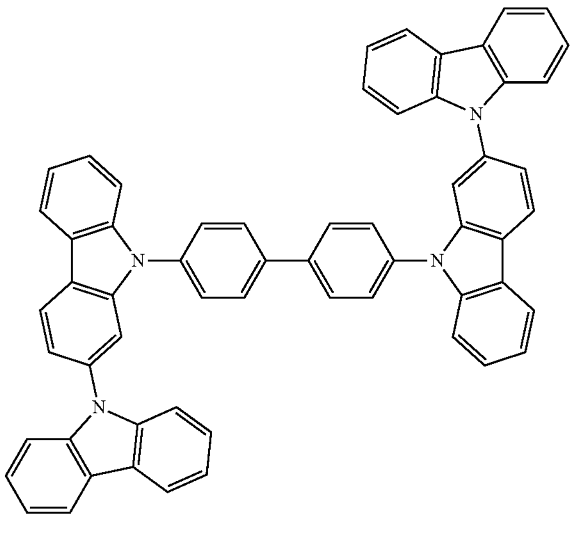
HT36
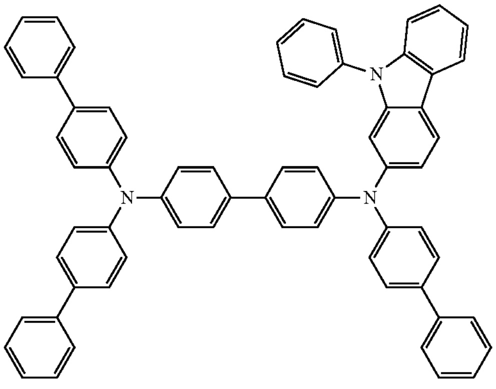
HT37
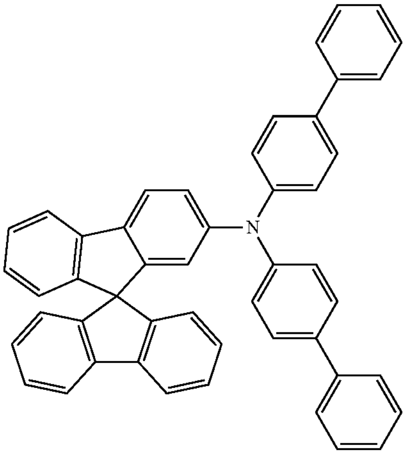

-continued
HT38
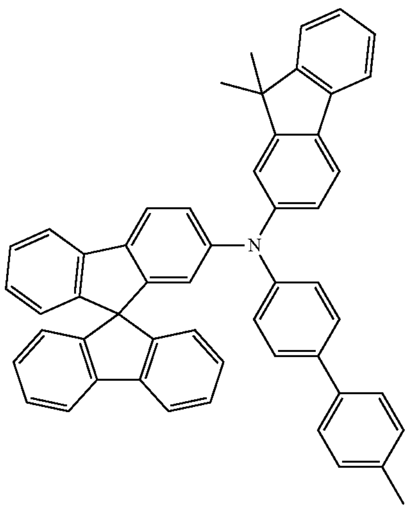
HT39
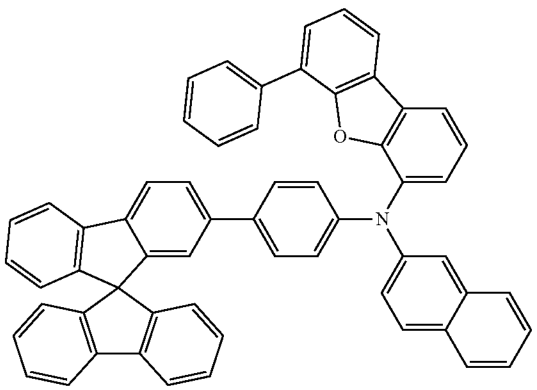
HT40
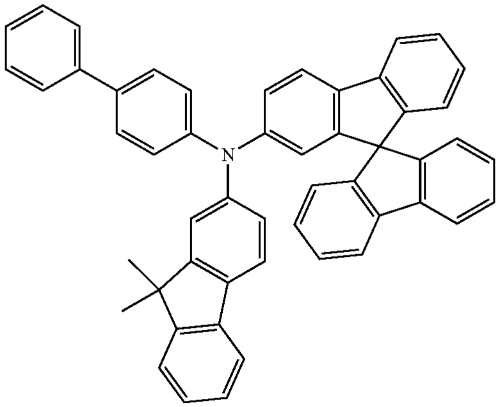
HT41
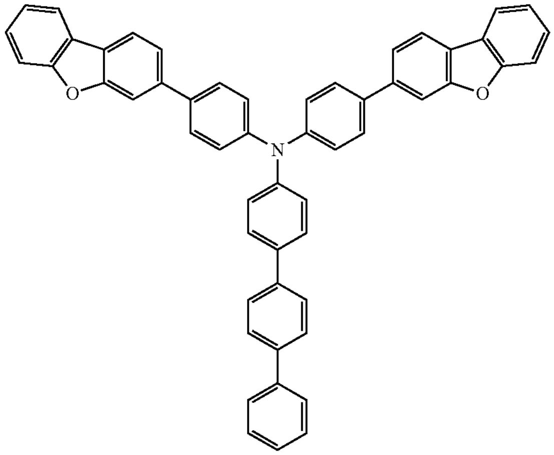
HT42
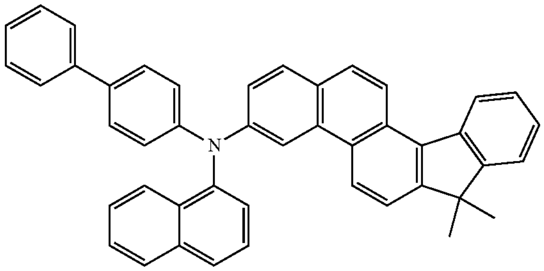
HT43
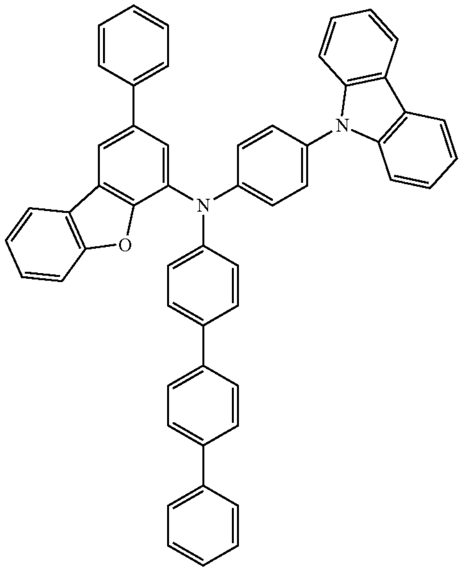

-continued
HT44
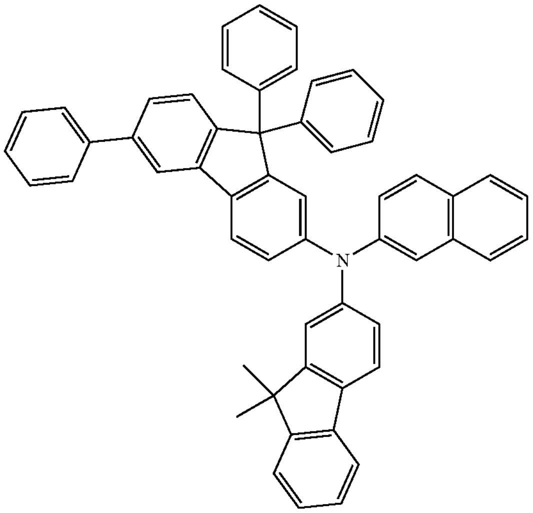
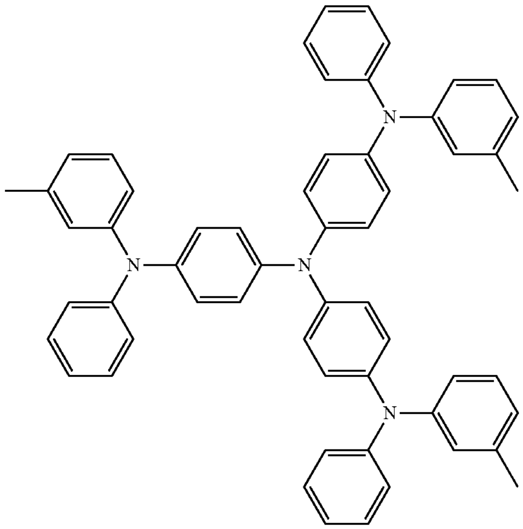
m-MTDATA
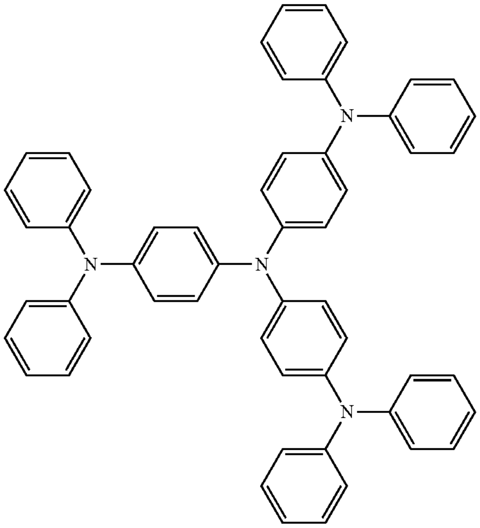
TDATA
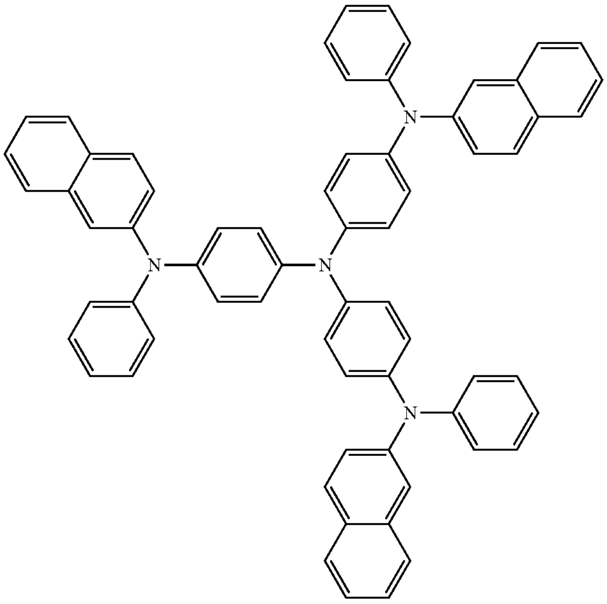
2-TNATA
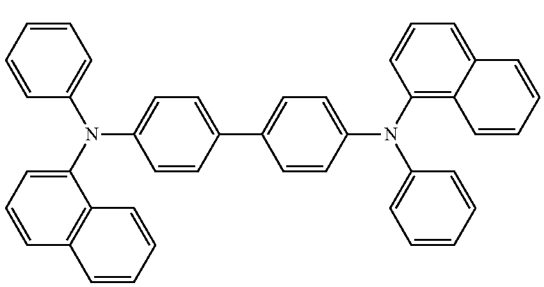
NPB
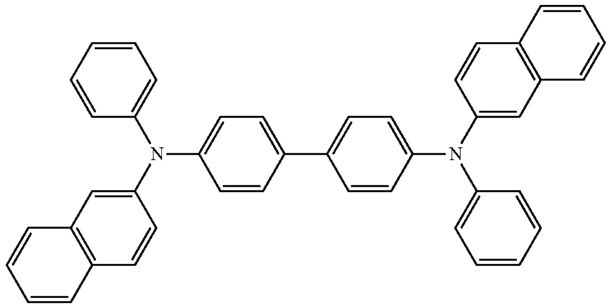
β-NPB -continued

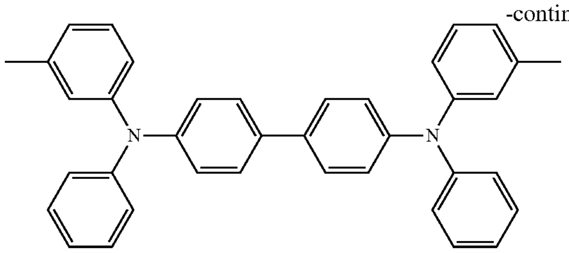

TPD

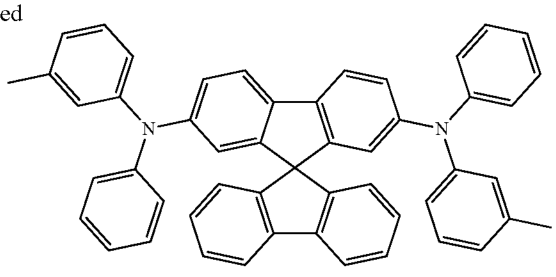

Spiro-TPD

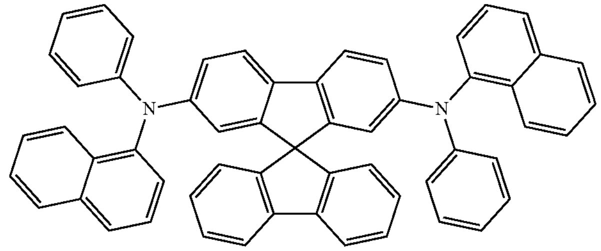

Spiro-NPB

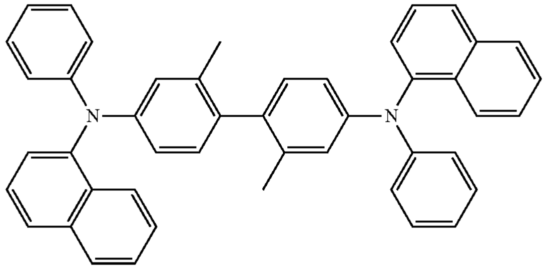

methylated-NPB

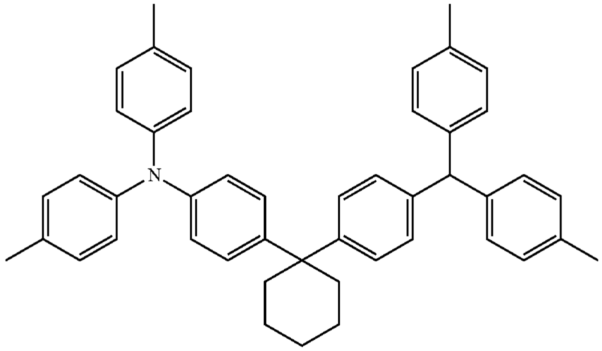

TAPC

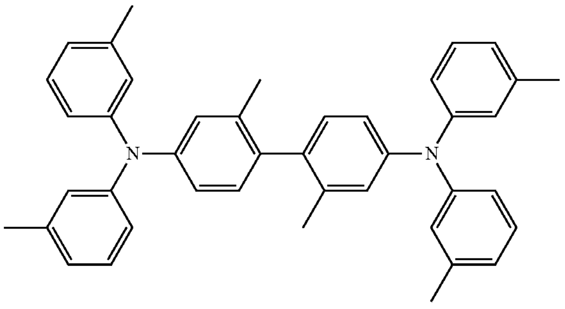

HMTPD

The thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer and the hole transport layer are within these ranges, satisfactory hole transporting characteristics may be obtained without a substantial increase in driving voltage.

The emission auxiliary layer may increase light-luminance efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

p-Dopant

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material). The charge-generation material may be, for example, a p-dopant. In an embodiment, the lowest unoccupied molecular orbital (LUMO) energy level of the p-dopant may be about −3.5 energy level (eV) or less.

In an embodiment, the p-dopant may include a quinone derivative, a cyano group-containing compound, a compound containing element EL1 and element EL2, or any combination thereof. Examples of the quinone derivative are tetracyanoquinodimethane (TCNQ), 2,3,5,6-tetrafluoro-7,7,8,8-tetracyanoquinodimethane (F4-TCNQ), etc.

Examples of the cyano group-containing compound are 1,4,5,8,9,11-hexaazatriphenylene-hexacarbonitrile (HAT-CN), and a compound represented by Formula 221 below.

TCNQ

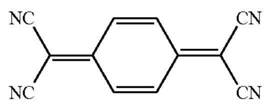

-continued

F4-TCNQ

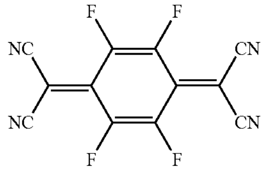

HAT-CN

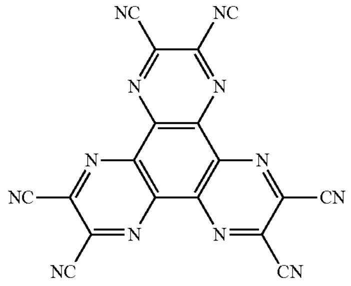

Formula 221

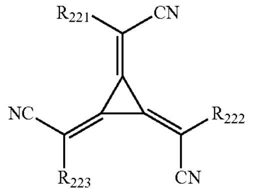

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be a non-metal, a metalloid, or a combination thereof.

Examples of the metal are an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.). Examples of the metalloid are silicon (Si), antimony (Sb), and tellurium (Te). Examples of the non-metal are oxygen (O) and a halogen (for example, F, Cl, Br, I, etc.). In an embodiment, examples of the compound containing element EL1 and element EL2 are a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide are a tungsten oxide (for example, WO, $W_2O_3$, $WO_2$, $WO_3$, $W_2O_5$, etc.), a vanadium oxide (for example, VO, $V_2O_3$, $VO_2$, $V_2O_5$, etc.), a molybdenum oxide (MoO, $Mo_2O_3$, $MoO_2$, $MoO_3$, $Mo_2O_5$, etc.), and a rhenium oxide (for example, $ReO_3$, etc.). Examples of the metal halide are an alkali metal halide, an alkaline earth metal halide, a transition metal halide, a post-transition metal halide, and a lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI. Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$. Examples of the transition metal halide are a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide are a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.). Examples of the lanthanide metal halide are YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$. An example of the metalloid halide is an antimony halide (for example, $SbCl_5$, etc.).

Examples of the metal telluride are an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In an embodiment, the emission layer may have a stacked structure of two or more layers of the red emission layer, the green emission layer, and the blue emission layer, in which the two or more layers contact each other or are separated from each other. In an embodiment, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof. The dopant may include the organometallic compound represented by Formula 1. The amount of the dopant in the emission layer may be from about 0.01 parts by weight to about 15 parts by weight based on 100 parts by weight of the host. In an embodiment, the emission layer may include a quantum dot.

The emission layer may include a delayed fluorescence material. The delayed fluorescence material may act as a host or a dopant in the emission layer. The thickness of the emission layer may be in a range of about 100 Å to about 1,000 Å, for example, about 200 Å to about 600 Å. When the thickness of the emission layer is within these ranges, excellent light-emission characteristics may be obtained without a substantial increase in driving voltage.

Host

In an embodiment, the host may include a compound represented by Formula 301 below:

$$[Ar_{301}]_{xb11}\text{-}[(L_{301})_{xb1}\text{-}R_{301}]_{xb21}$$ Formula 301

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer selected from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), or —P(═O)($Q_{301}$)($Q_{302}$), xb21 may be an integer selected from 1 to 5, and $Q_{301}$ to $Q_{303}$ are the same as described in connection with $Q_1$.

For example, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination thereof:

Formula 301-1

See FIG. 5B

Formula 301-2

See FIG. 5B

In Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described herein, $L_{302}$ to $L_{304}$ are each independently the same as described in connection with $L_{301}$, xb2 to xb4 are each independently the same as described in connection with xb1, and $R_{302}$ to $R_{305}$ and $R_{311}$ to $R_{314}$ are each the same as described in connection with $R_{301}$.

In one embodiment, the host may include an alkaline earth-metal complex. In an embodiment, the host may include a Be complex (for example, Compound H55), an Mg complex, a Zn complex, or a combination thereof. In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di(carbazol-9-yl)benzene (mCP), 1,3,5-tri(carbazol-9-yl)benzene (TCP), or any combination thereof:

H1

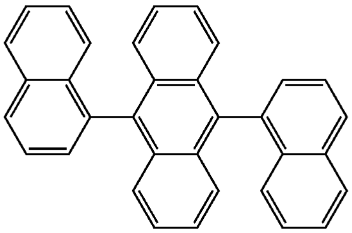

H2

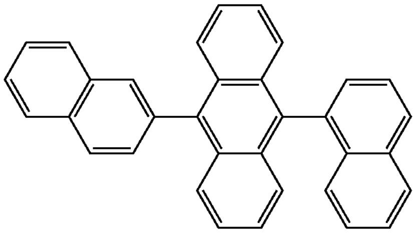

H3

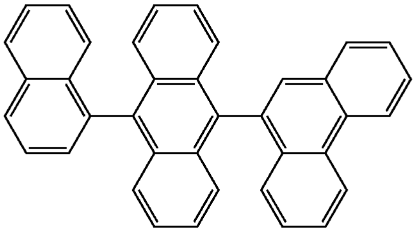

H4

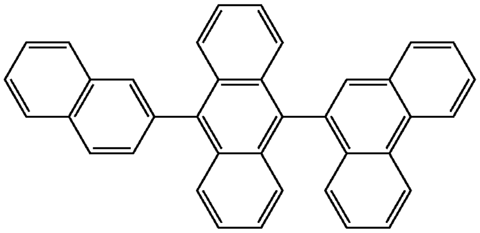

-continued
H5
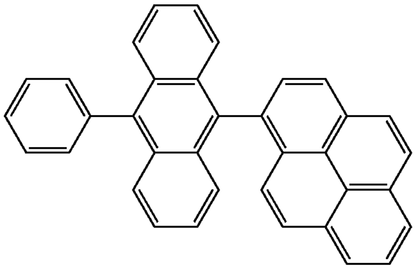
H6
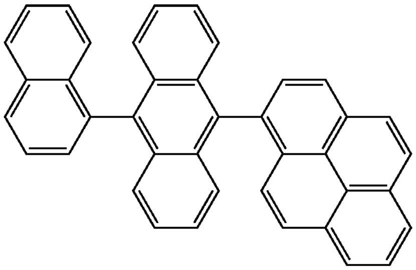
H7
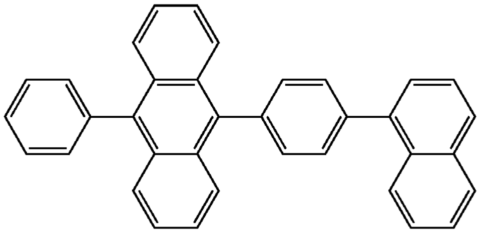
H8
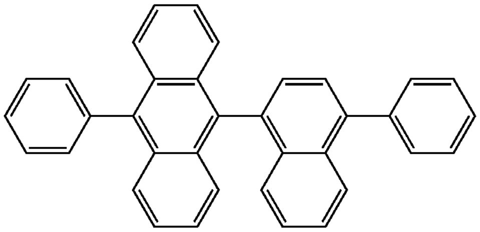
H9
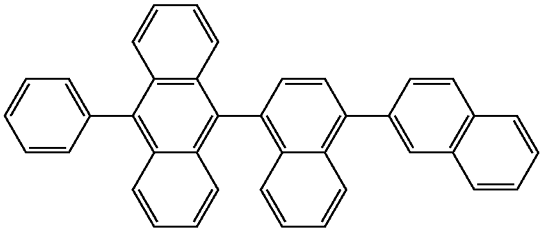
H10
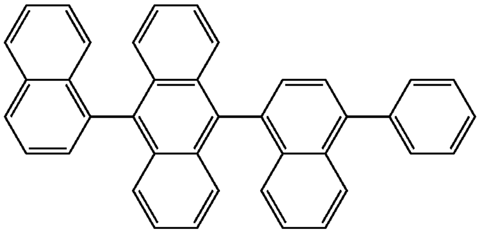
-continued
H11
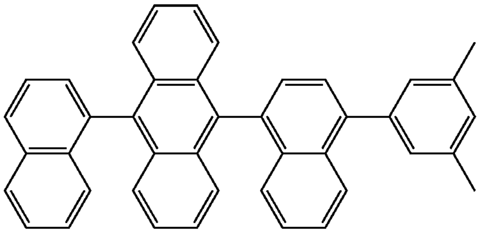
H12
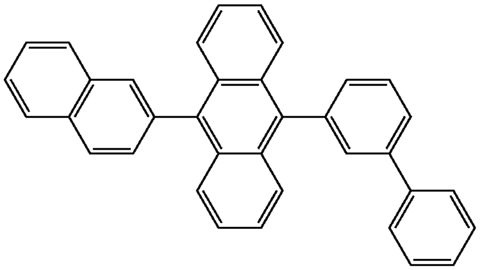
H13
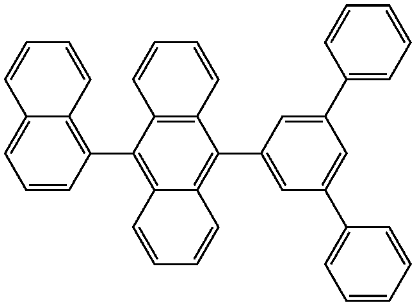
H14
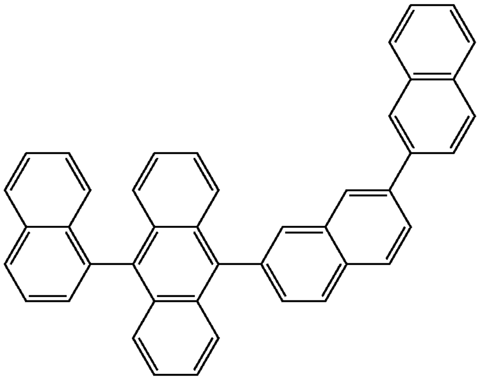
H15
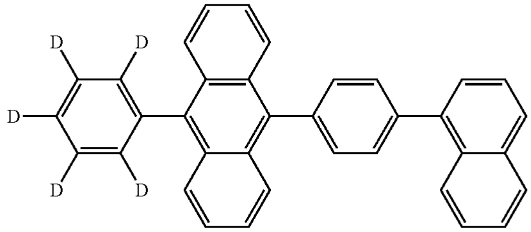

-continued
H16
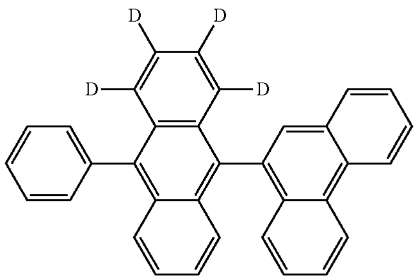
H17
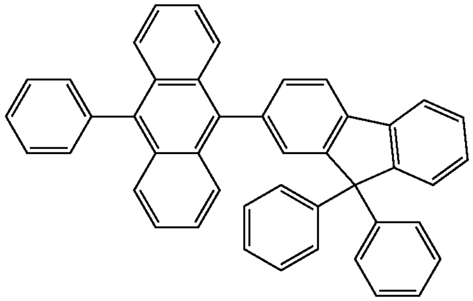
H18
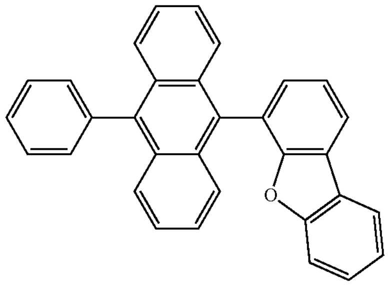
H19
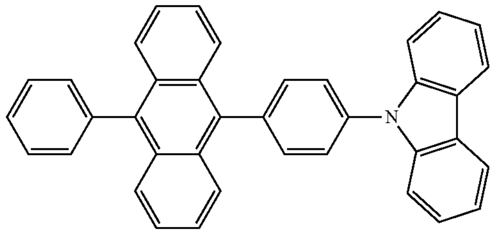
H20
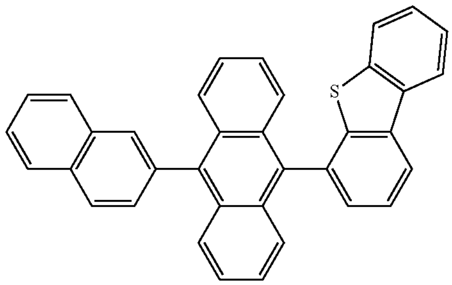
-continued
H21
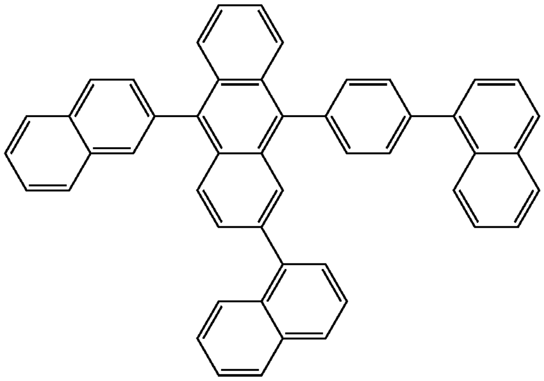
H22
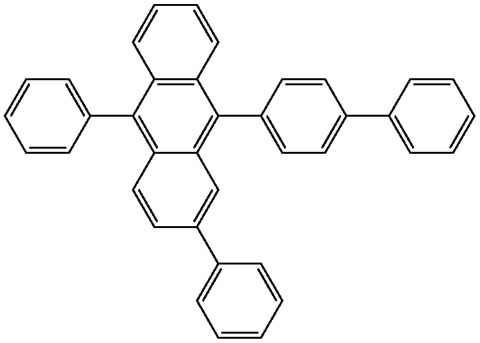
H23
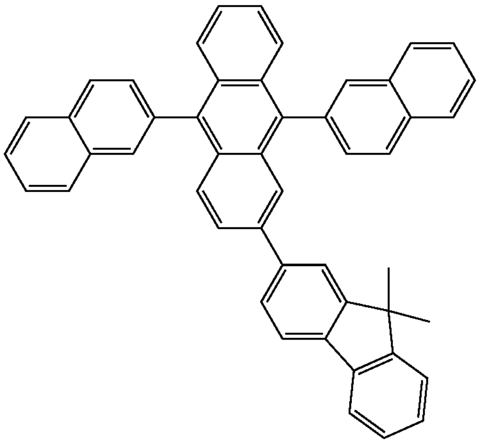
H24
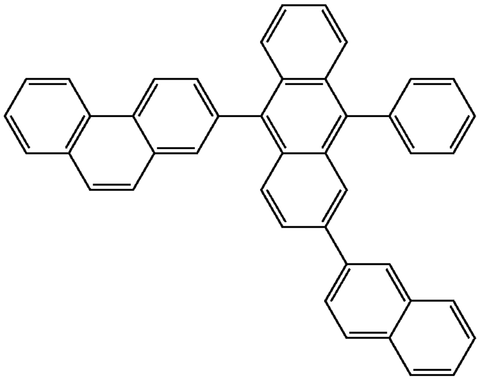

-continued
H25
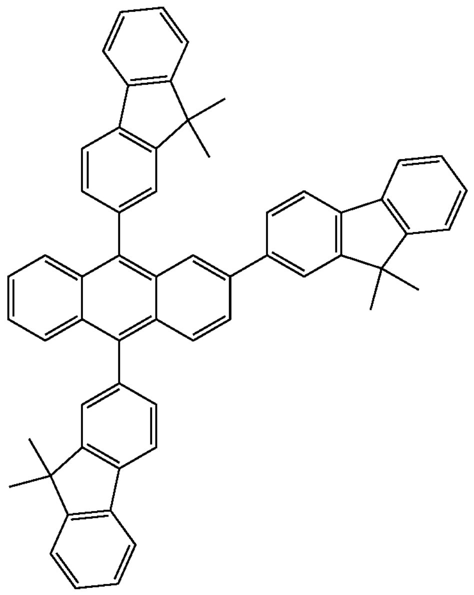
H26
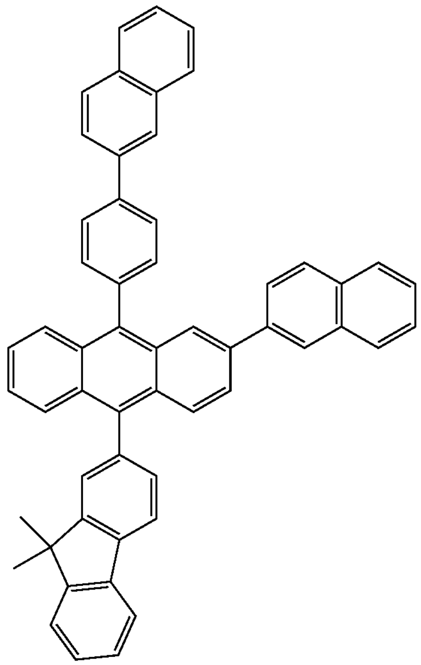
-continued
H27
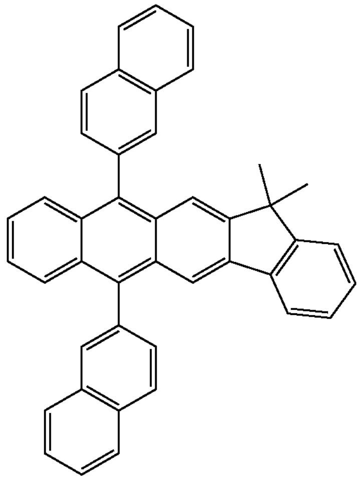
H28
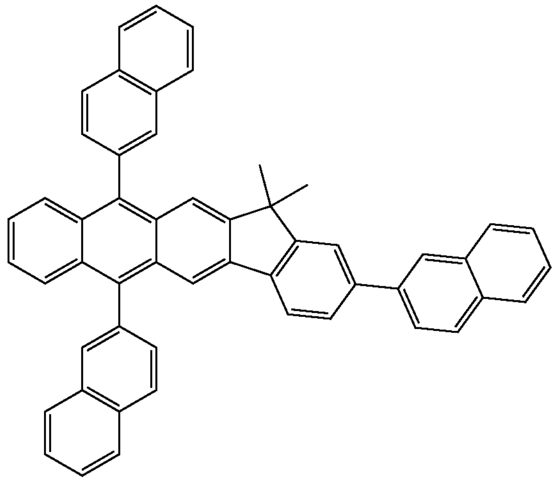
H29
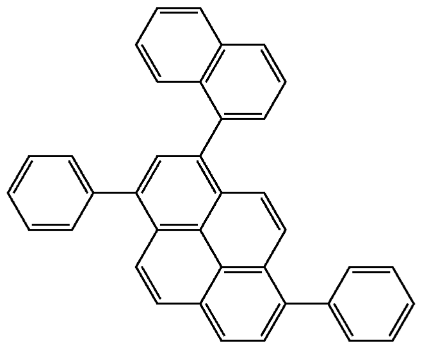

-continued
H30
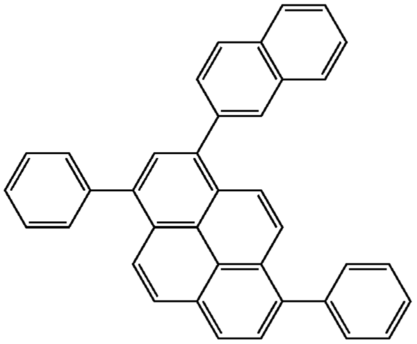
H31
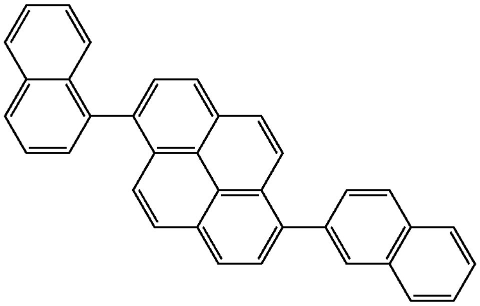
H32
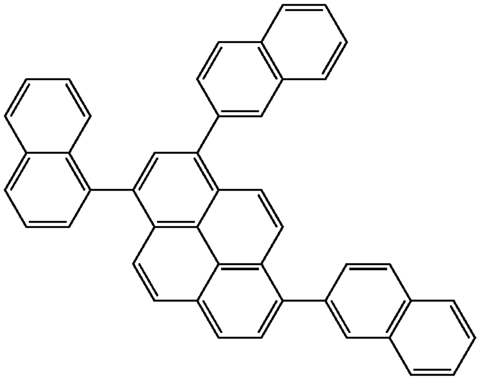
H33
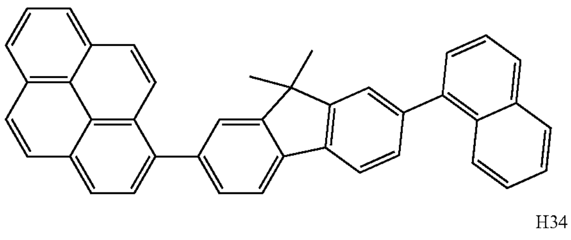
H34
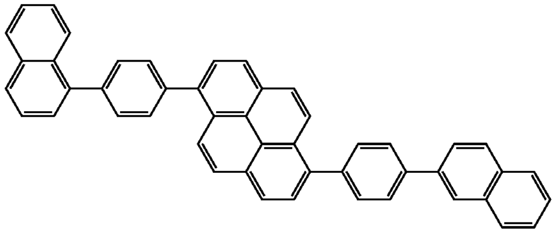
-continued
H35
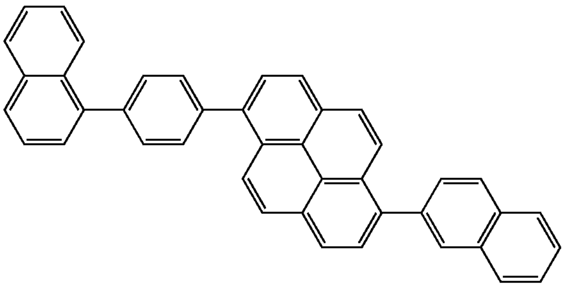
H36
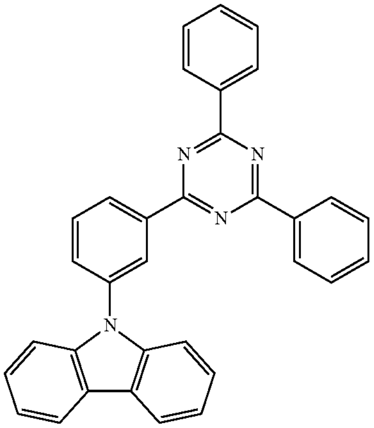
H37
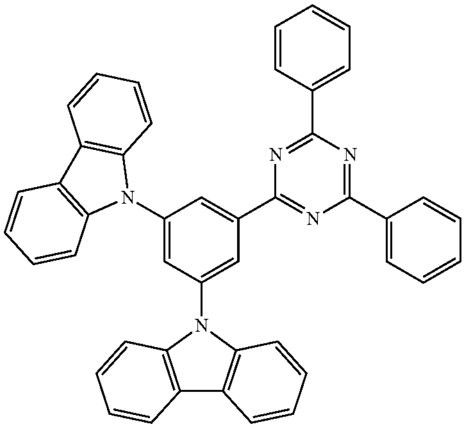
H38
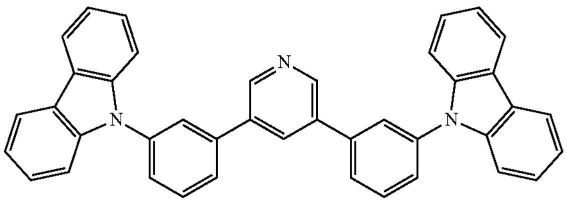

-continued
H39
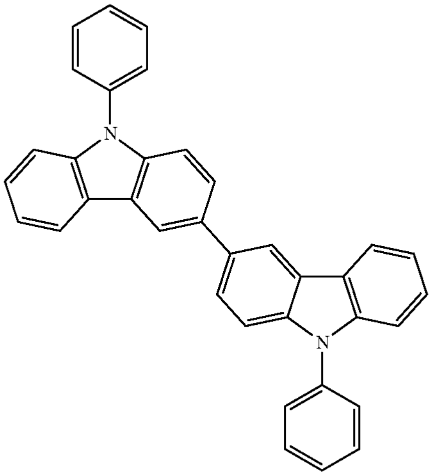
H40
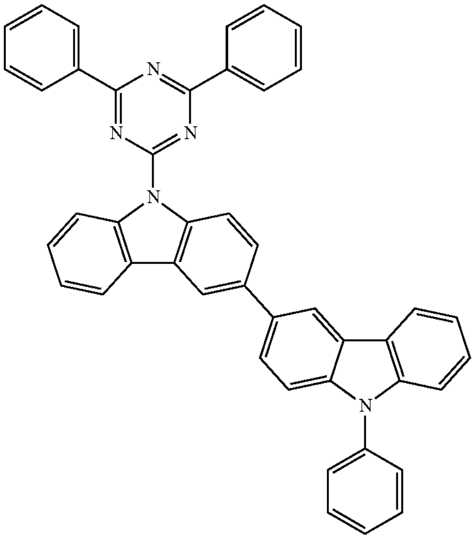
H41
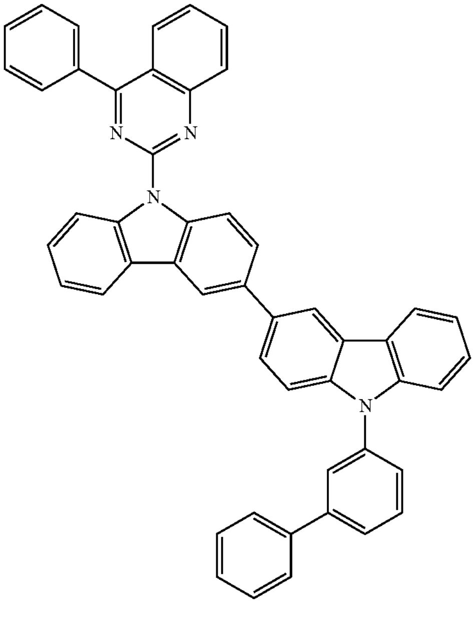
-continued
H42
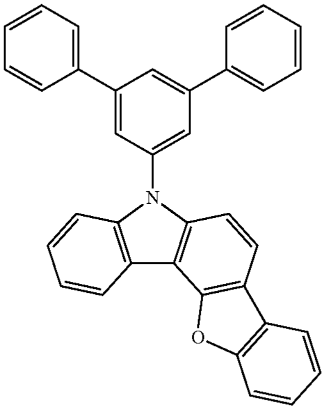
H43
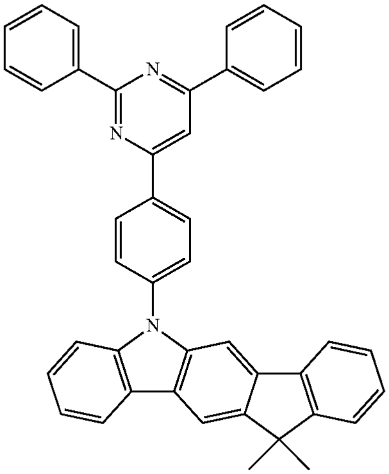
H44
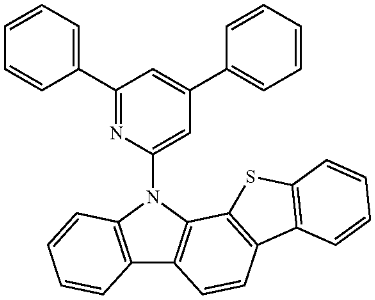
H45
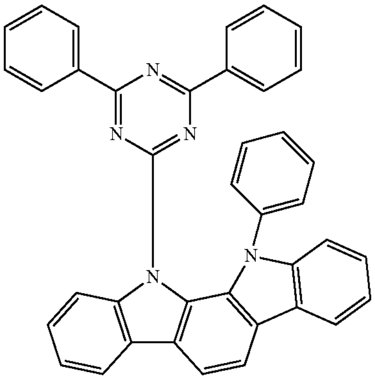

-continued
H46
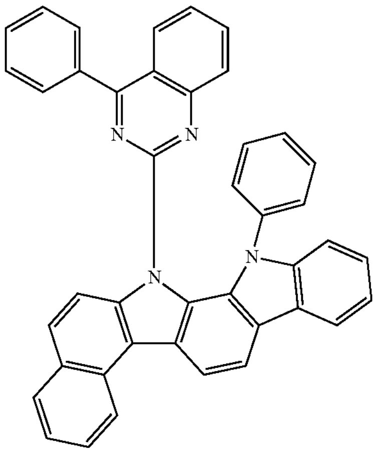
H47
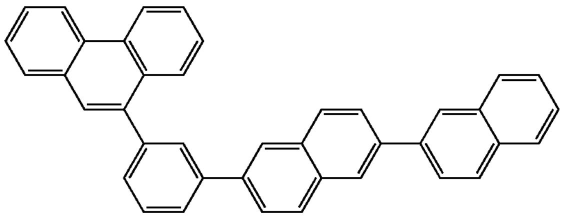
H48
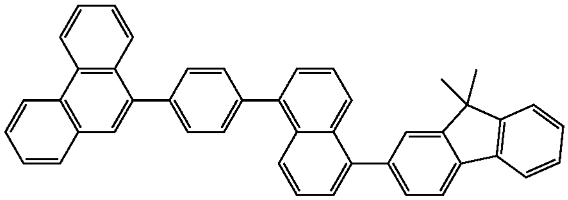
H49
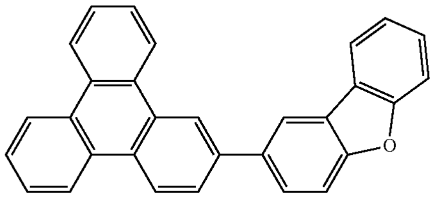
H50
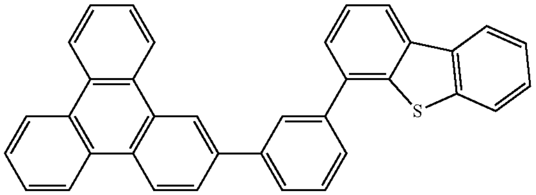
H51
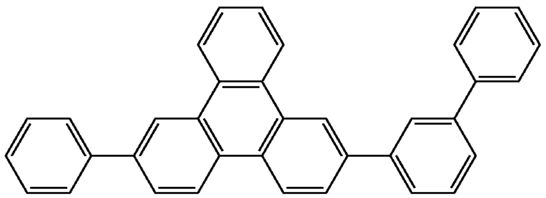
-continued
H52
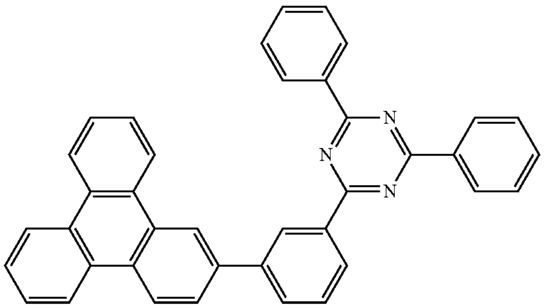
H53
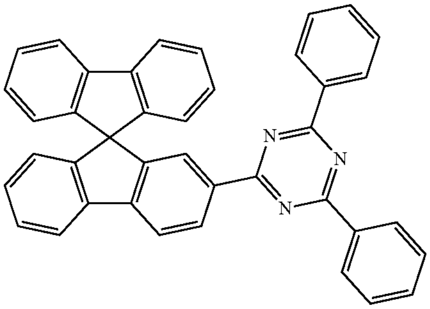
H54
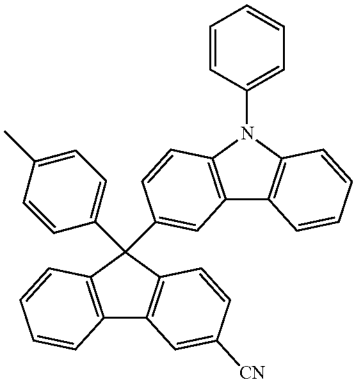
H55
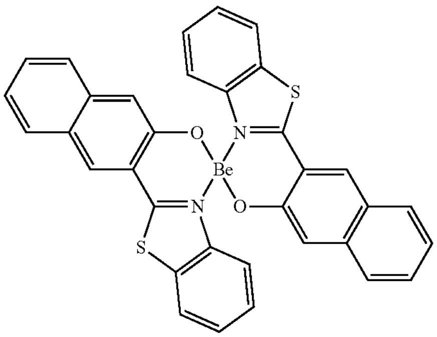

-continued
H56
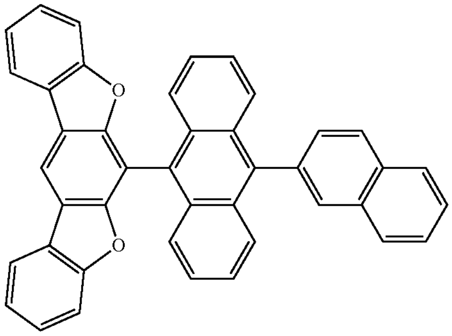
H57
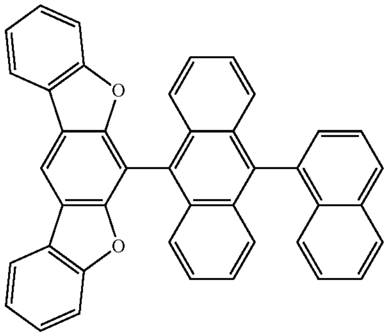
H58
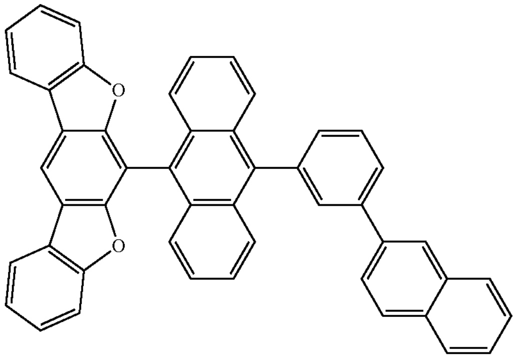
H59
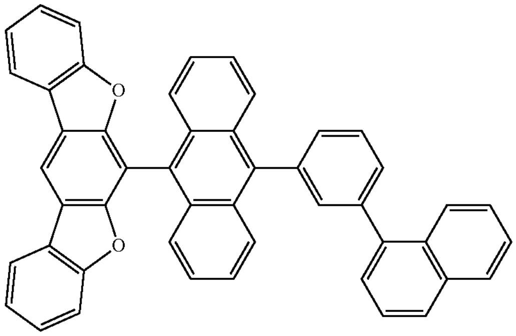
-continued
H60
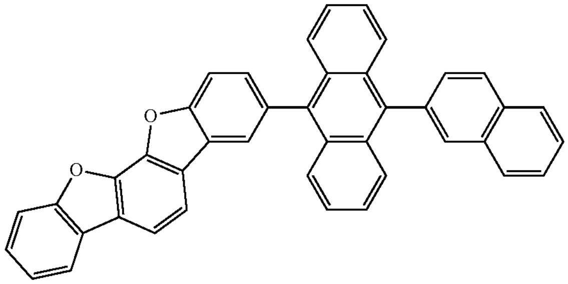
H61
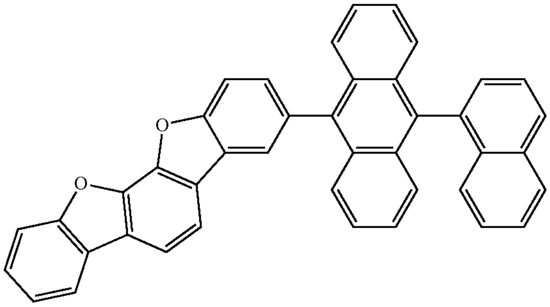
H62
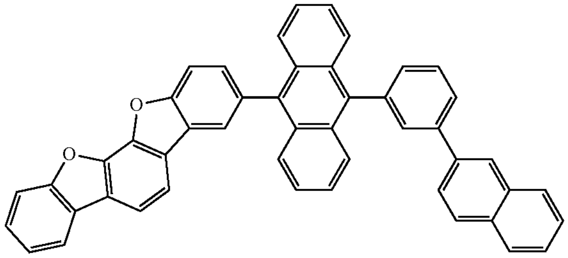
H63
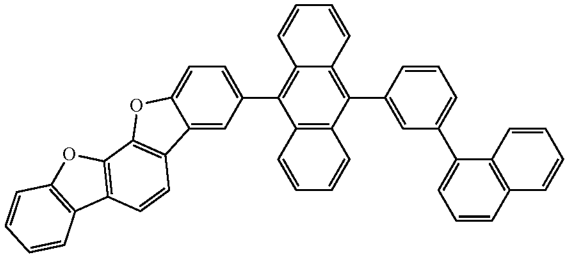
H64
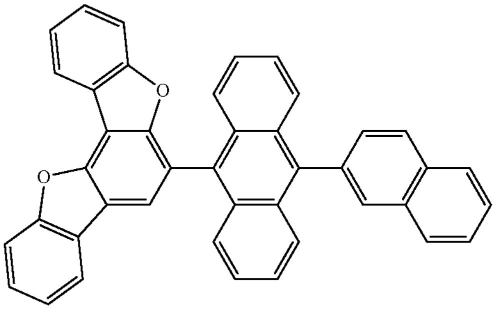

-continued
H65
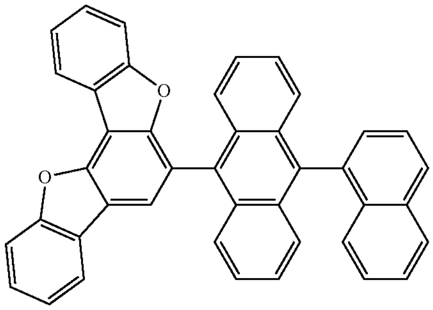
H66
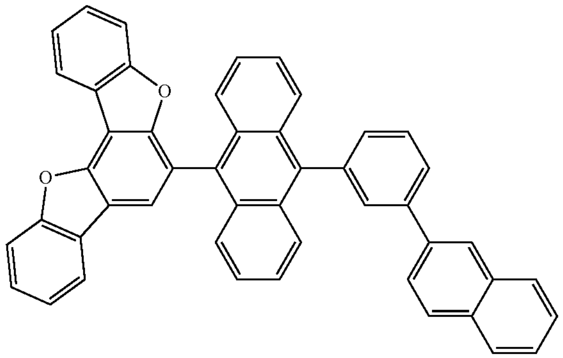
H67
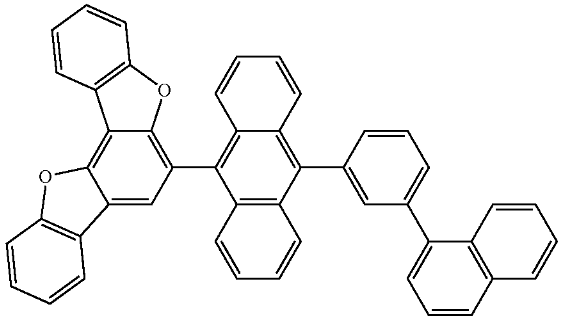
H68
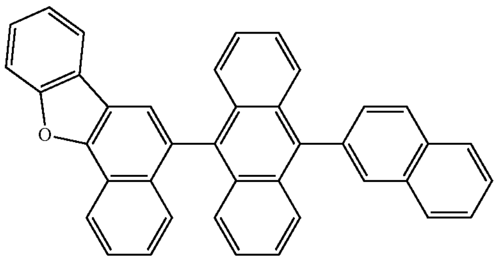
H69
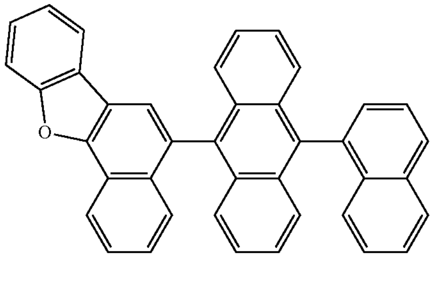
-continued
H70
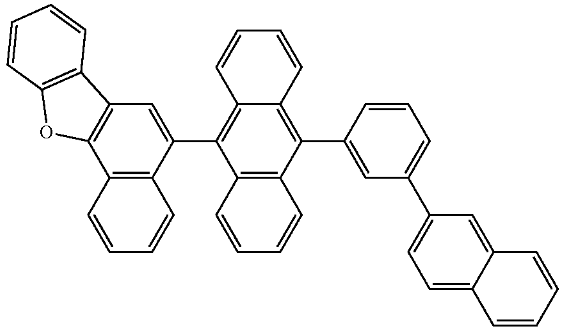
H71
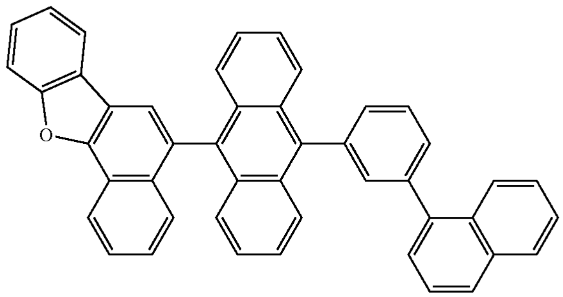
H72
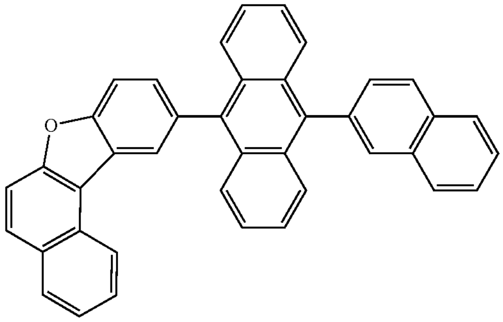
H73
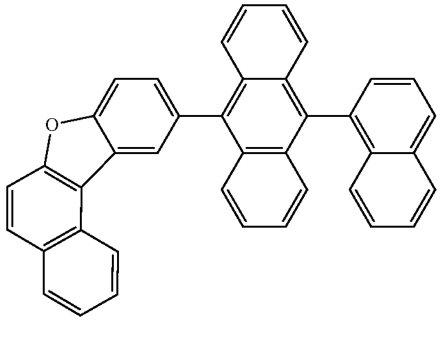

-continued
H74
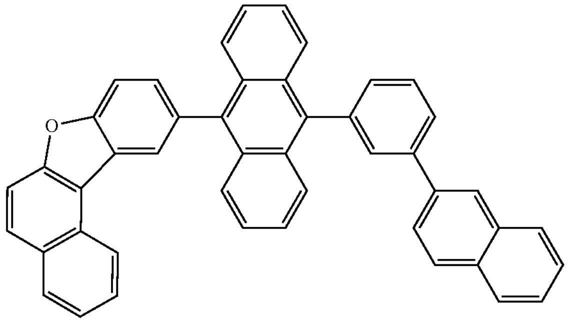
H75
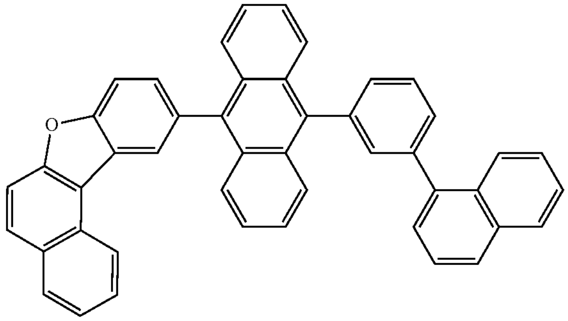
H76
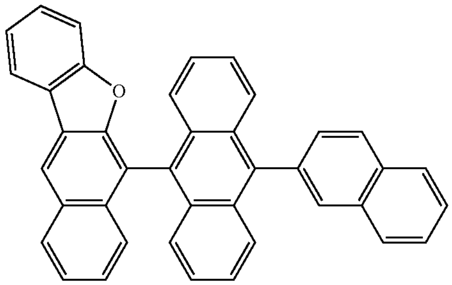
H77
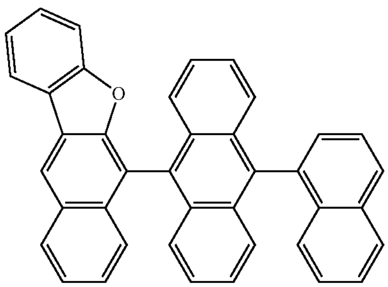
-continued
H78
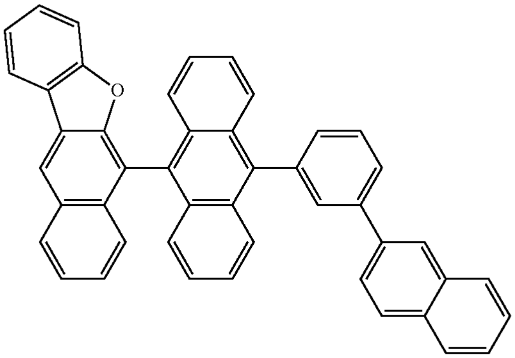
H79
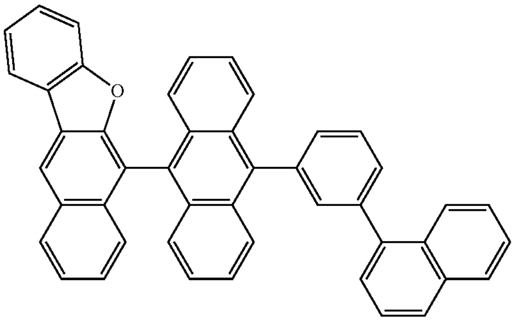
H80
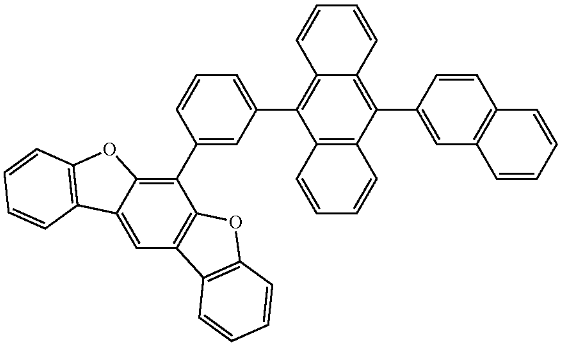
H81
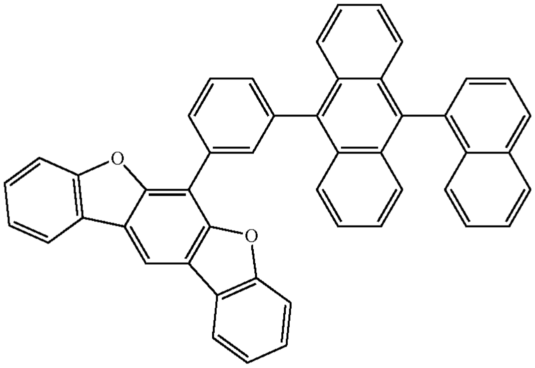

-continued
H82
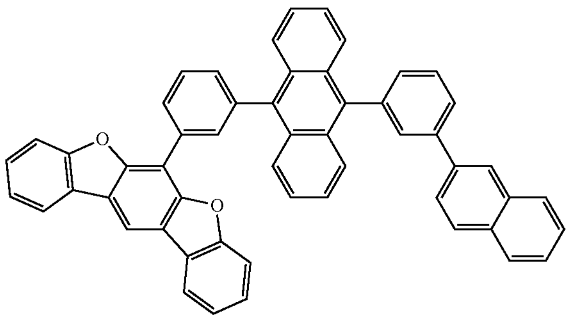
H83
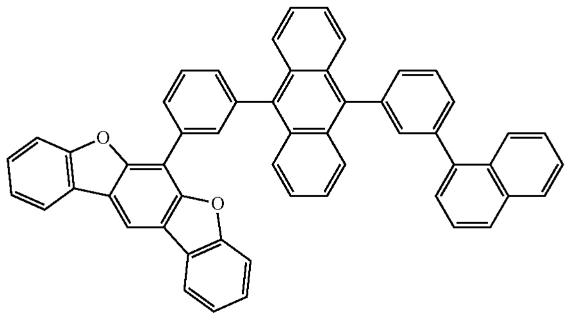
H84
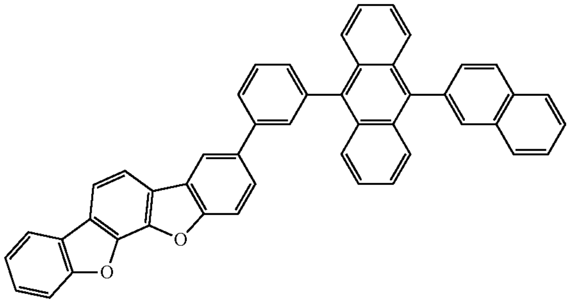
H85
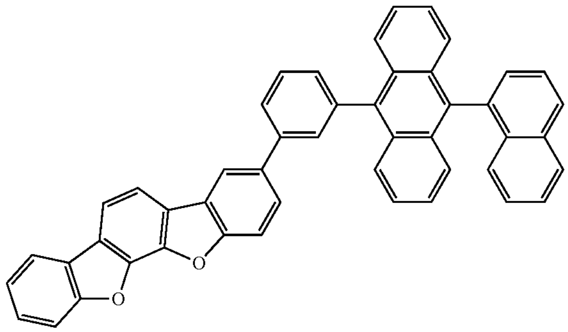
-continued
H86
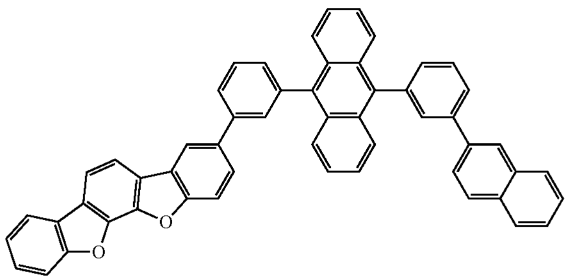
H87
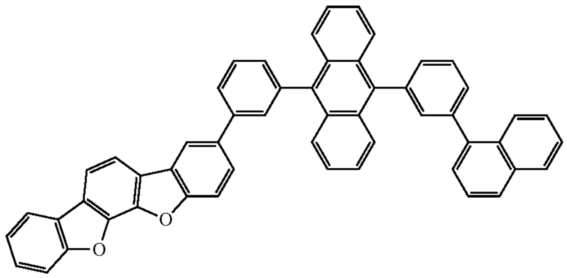
H88
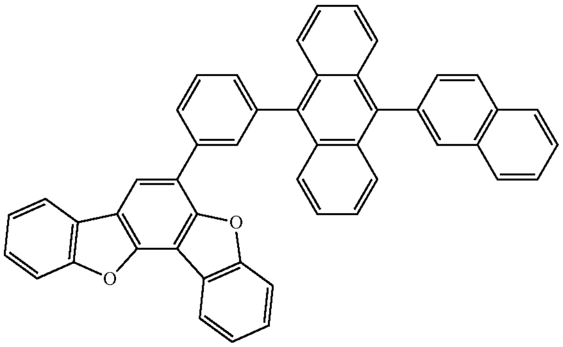
H89
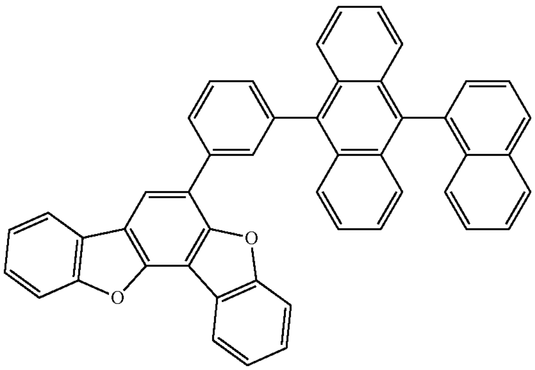

-continued
H90
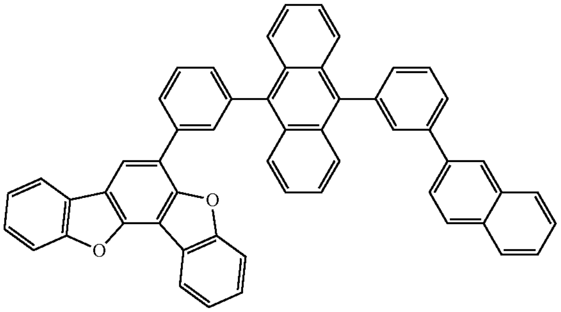
H91
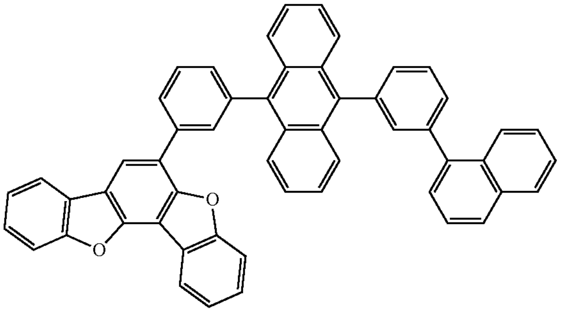
H92
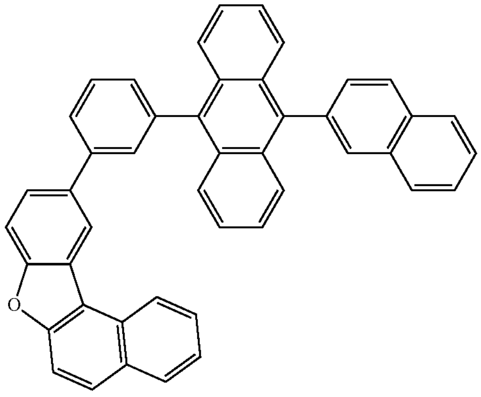
H93
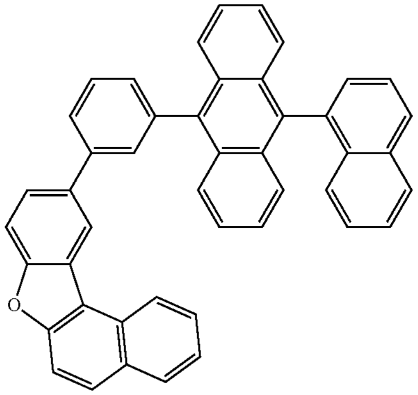
-continued
H94
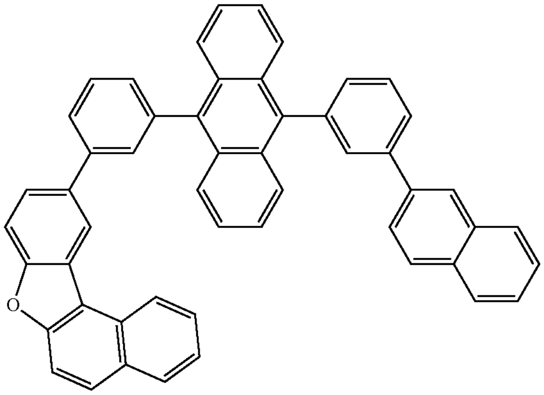
H95
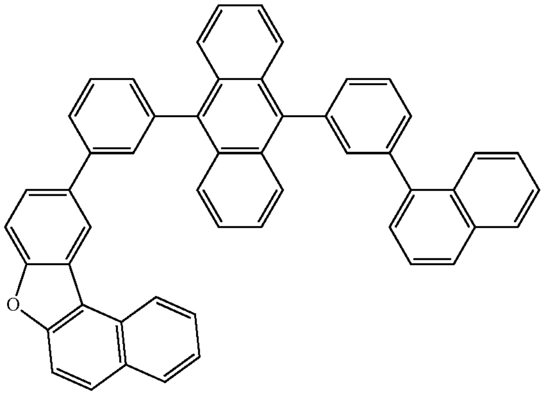
H96
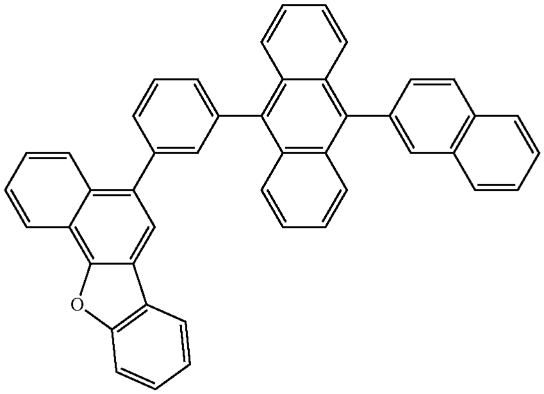
H97
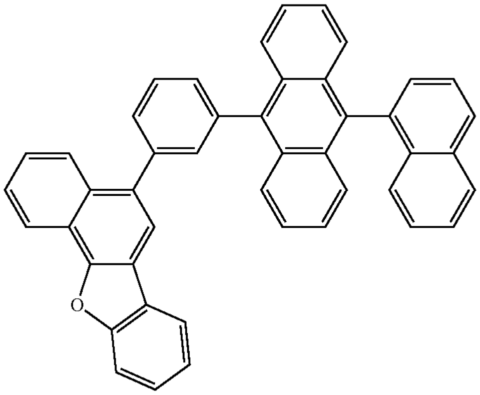

H98
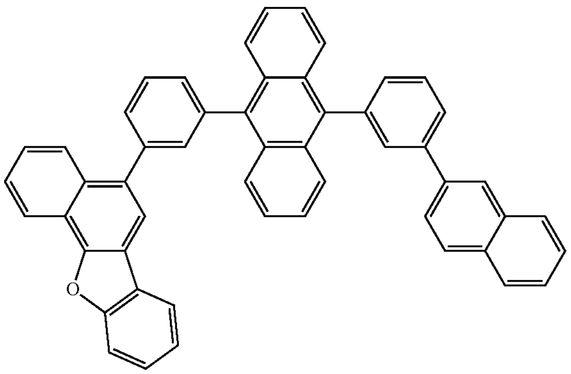
H99
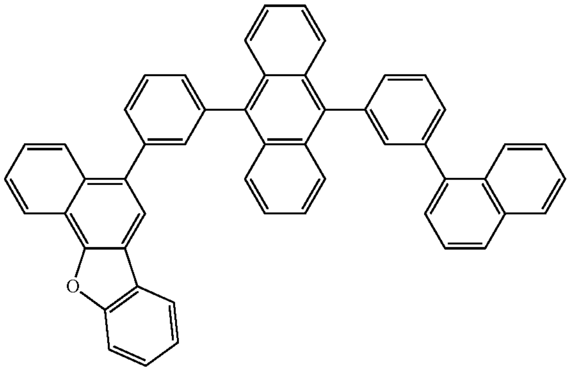
H100
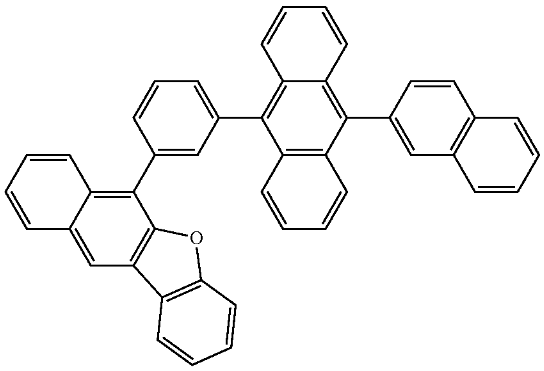
H101
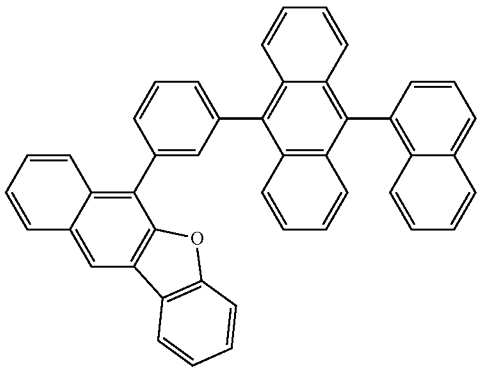
H102
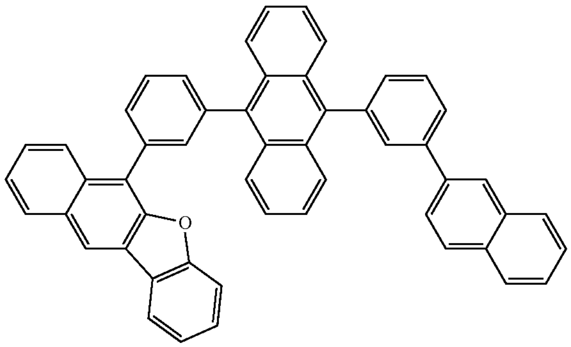
H103
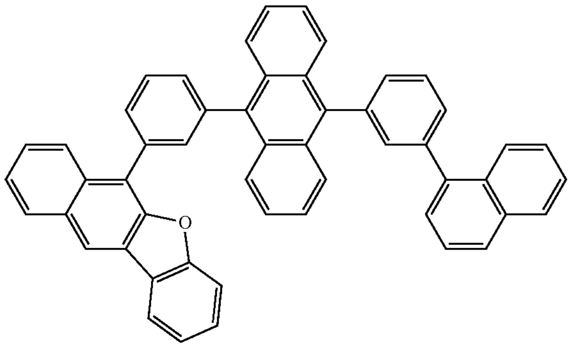
H104
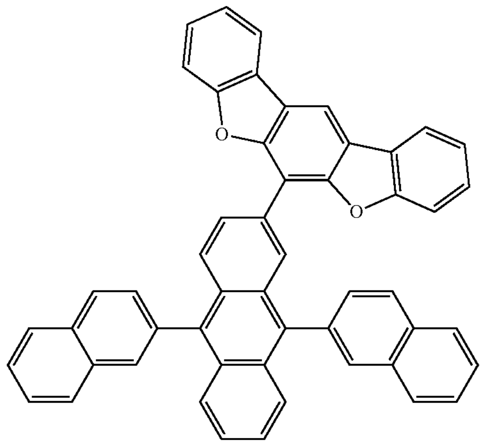

-continued
H105
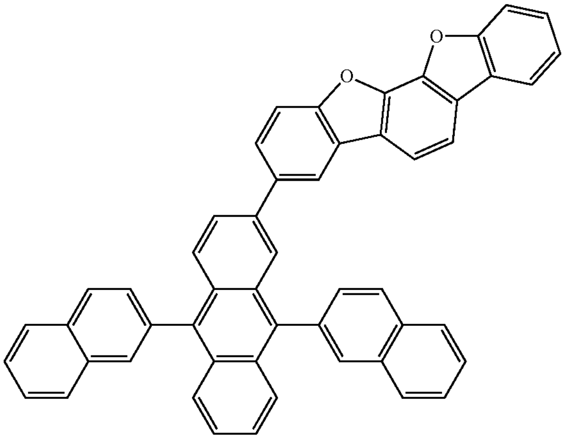
H106
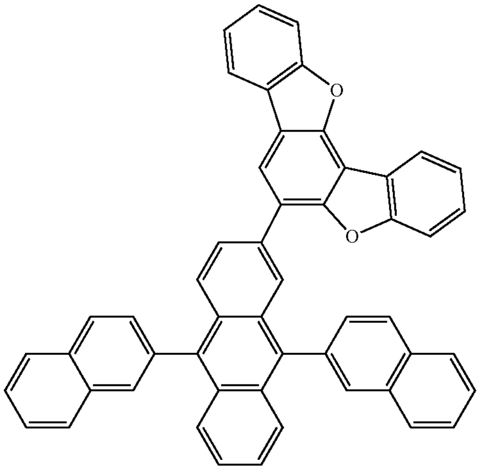
H107
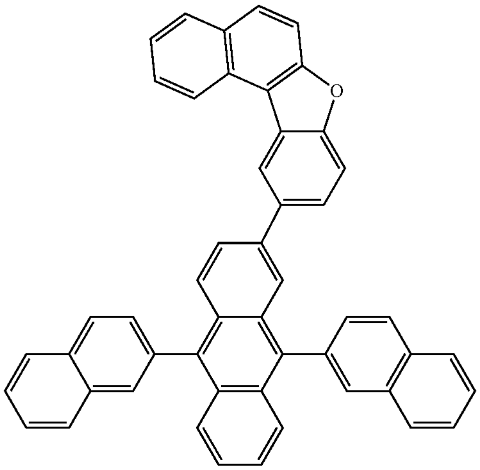
-continued
H108
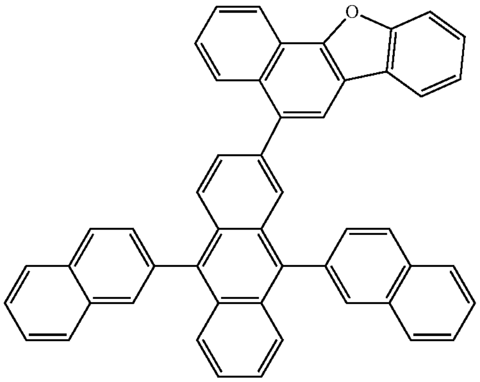
H109
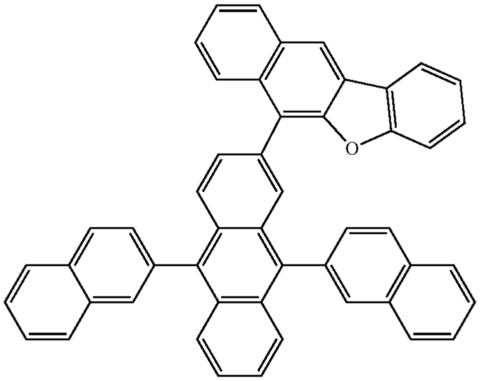
H110
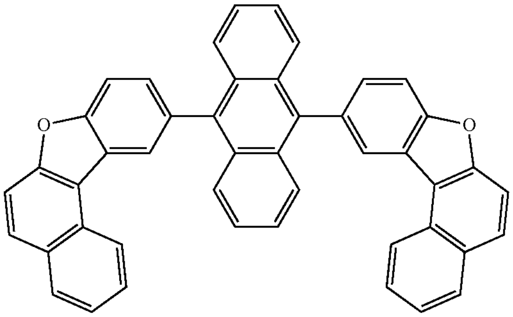
H111
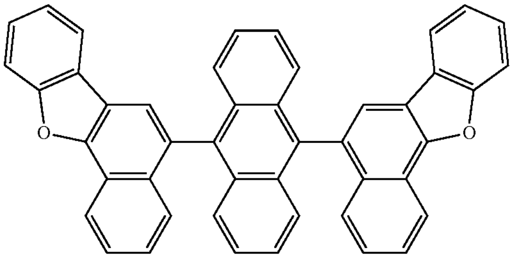

-continued
H112
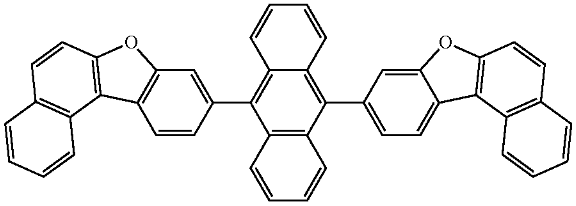
H113
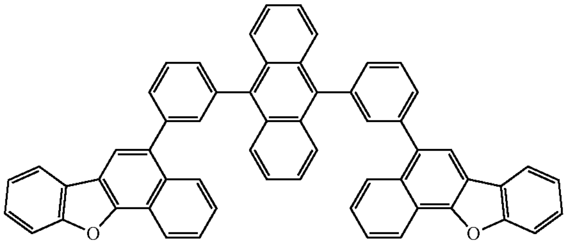
H114
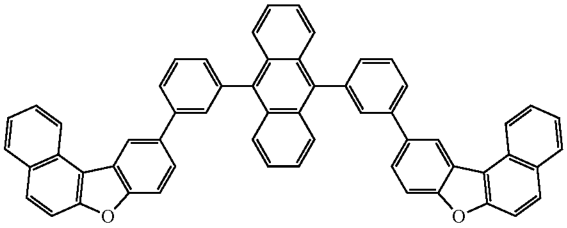
H115
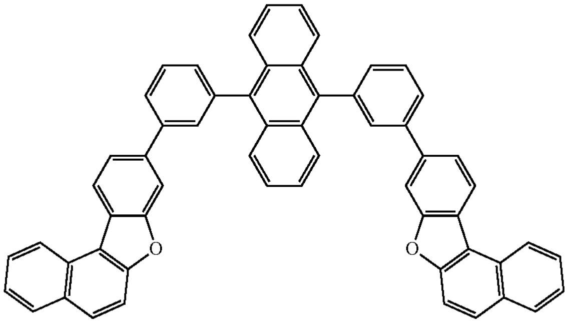
H116
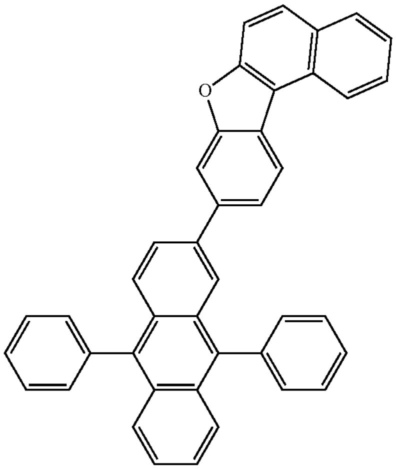
-continued
H117
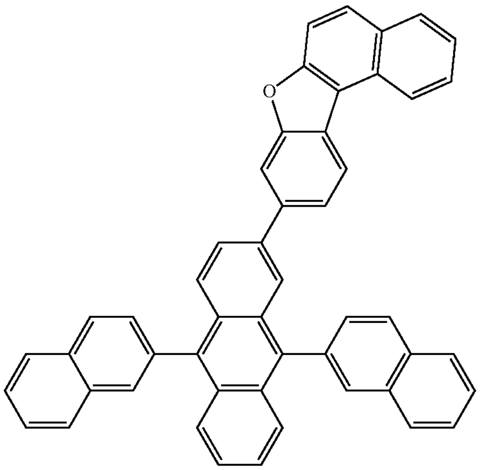
H118
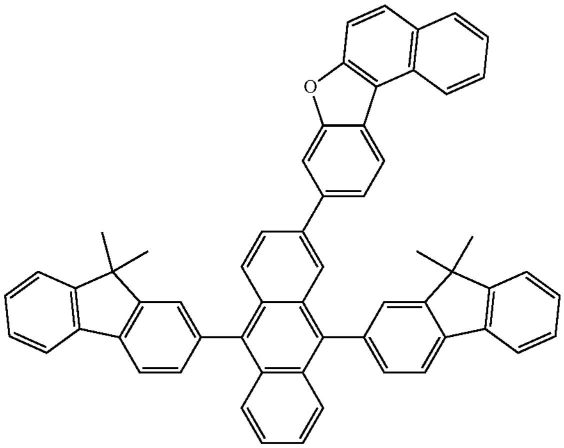
H119
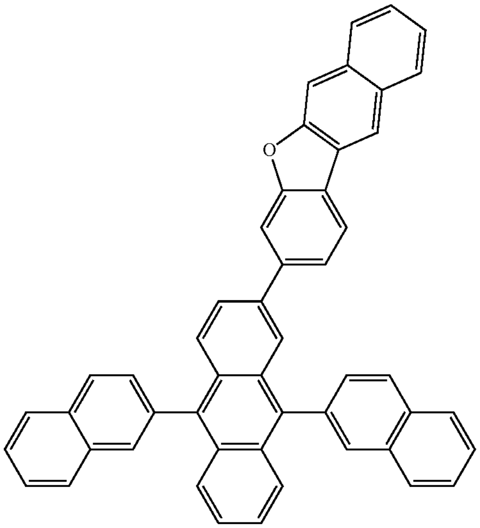

-continued

H120

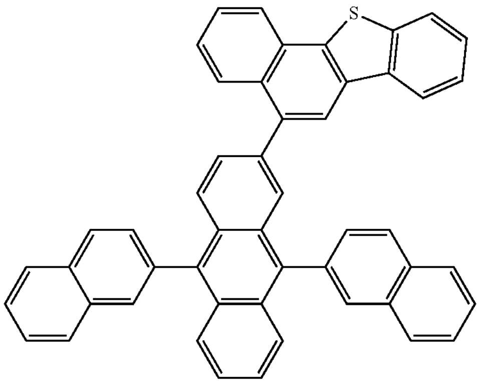

H121

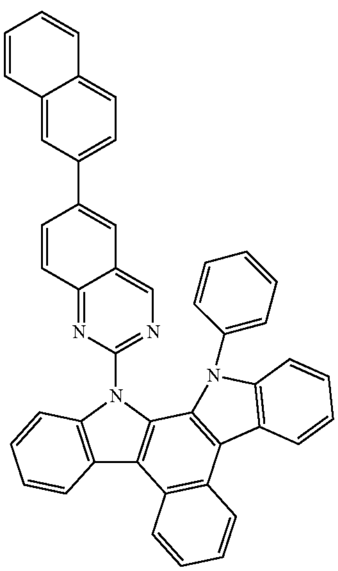

H122

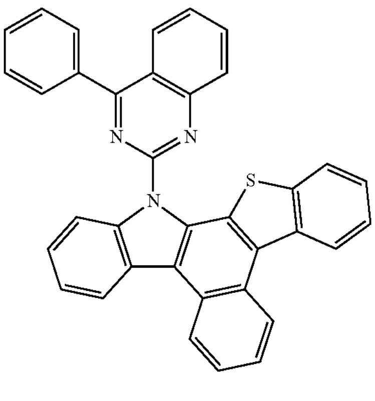

-continued

H123

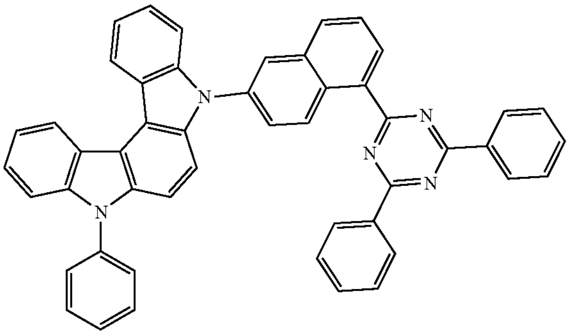

H124

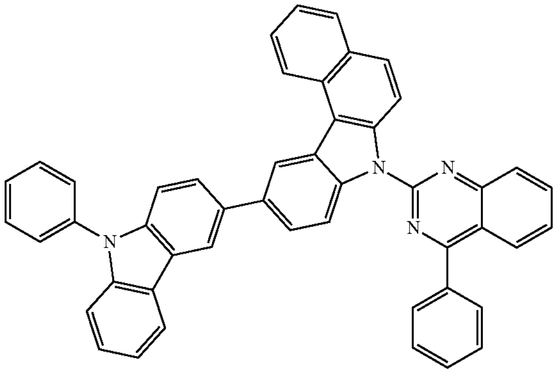

Delayed Fluorescence Material

The emission layer may include a delayed fluorescence material. The delayed fluorescence material may be selected from compounds capable of emitting delayed fluorescence based on a delayed fluorescence emission mechanism. The delayed fluorescence material included in the emission layer may act as a host or a dopant depending on the type of other materials included in the emission layer.

In an embodiment, the difference between the triplet energy level (eV) of the delayed fluorescence material and the singlet energy level (eV) of the delayed fluorescence material may be greater than or equal to about 0 eV and less than or equal to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescent materials may effectively occur, and thus, the luminance efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

In an embodiment, the delayed fluorescence material may include at least one of the following compounds DF1 to DF9:

DF1
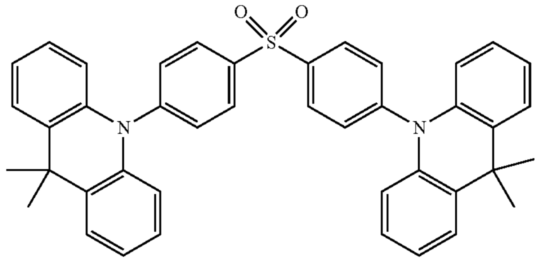
(DMAC-DPS)
DF2
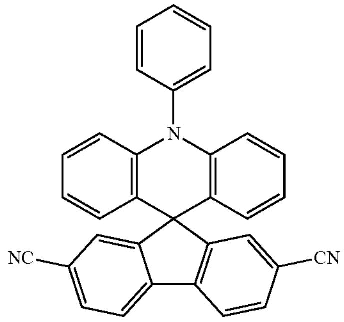
(ACRFLCN)
DF3
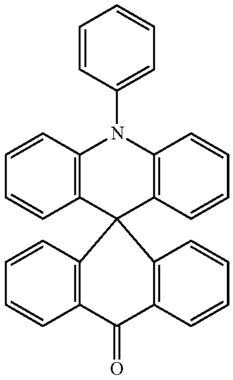
(ACRSA)
DF4
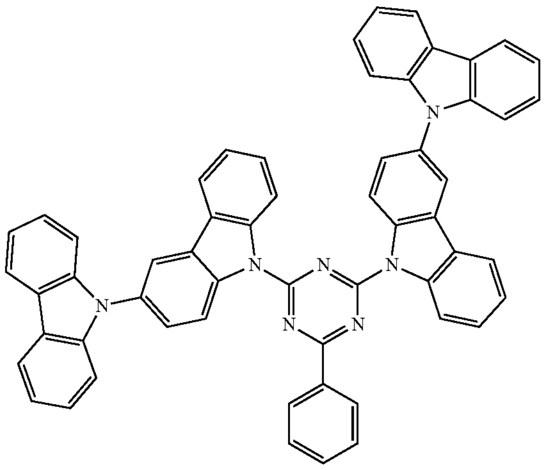
(PIC-TRZ)
-continued
DF5
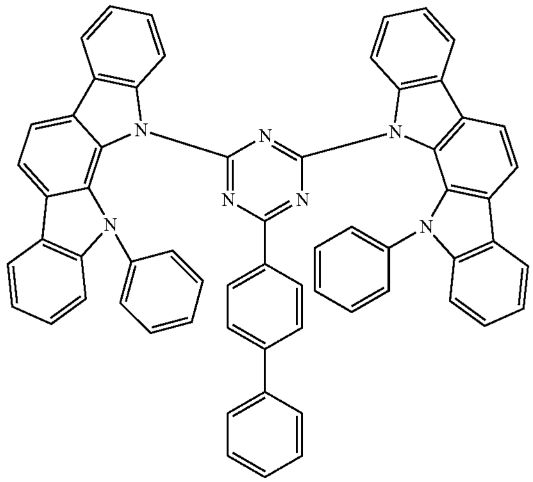
PIC-TRZ
DF6
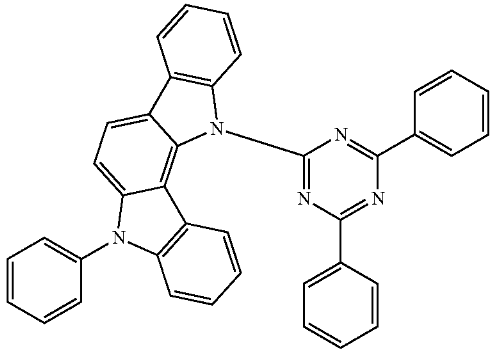
(PIC-TRZ2)
DF7
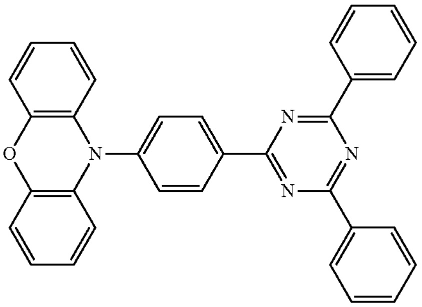
(PXZ-TRZ)
DF8
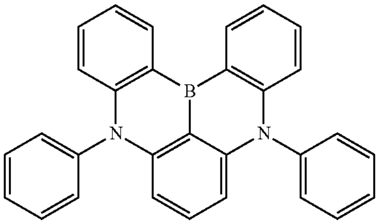
(DABNA-1)

-continued

DF9

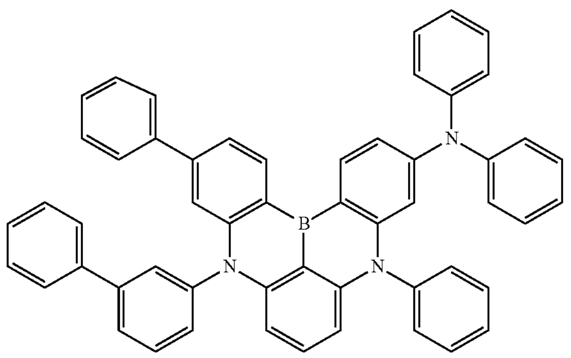

(DABNA-2)

Quantum Dot

The emission layer may include a quantum dot. The diameter of the quantum dot may be, for example, in a range of about 1 nm to about 10 nm. The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) or molecular beam epitaxy (MBE), and which requires low costs.

The quantum dot may include a semiconductor compound of Groups II-VI, a semiconductor compound of Groups III-V, a semiconductor compound of Groups III-VI, a semiconductor compound of Groups I-III-VI, a semiconductor compound of Groups IV-VI, an element or a compound of Group IV; or any combination thereof.

Examples of the semiconductor compound of Groups II-VI are a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the semiconductor compound of Groups III-V are a binary compound, such as GaN, GaP, GaAs, GaSb, AlN, AlP, AlAs, AlSb, InN, InP, InAs, InSb, or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or the like; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or the like; or any combination thereof. The semiconductor compound of Groups III-V may further include Group II elements. Examples of the semiconductor compound of Groups III-V further including Group II elements are InZnP, InGaZnP, InAlZnP, etc.

Examples of the semiconductor compound of Groups III-VI are a binary compound, such as GaS, GaSe, $Ga_2Se_3$, GaTe, InS, InSe, $In_2Se_3$, or InTe; a ternary compound, such as $InGaS_3$, or $InGaSe_3$; and any combination thereof. Examples of the semiconductor compound of Groups I, III, and VI are a ternary compound, such as AgInS, $AgInS_2$, CuInS, $CuInS_2$, $CuGaO_2$, $AgGaO_2$, or $AgAlO_2$; or any combination thereof.

Examples of the semiconductor compound of Groups IV-VI are a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof. The Group IV element or compound may include a single element compound, such as Si or Ge; a binary compound, such as SiC or SiGe; or any combination thereof.

Each element included in a multi-element compound such as the binary compound, ternary compound and quaternary compound, may exist in a particle with a uniform concentration or non-uniform concentration. The quantum dot may have a single structure or a dual core-shell structure. In the case of the quantum dot having a single structure, the concentration of each element included in the corresponding quantum dot is uniform. In an embodiment, the material contained in the core and the material contained in the shell may be different from each other.

The shell of the quantum dot may act as a protective layer to prevent chemical degeneration of the core to maintain semiconductor characteristics and/or as a charging layer to impart electrophoretic characteristics to the quantum dot. The shell may be a single layer or a multi-layer. The interface between the core and the shell may have a concentration gradient that decreases toward the center of the element present in the shell.

Examples of the shell of the quantum dot may be an oxide of metal, or non-metal, a semiconductor compound, and any combination thereof. Examples of the oxide of metal or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; and any combination thereof. Examples of the semiconductor compound are, as described herein, a semiconductor compound of Groups III-VI; a semiconductor compound of Groups II-VI; a semiconductor compound of Groups III-V; a semiconductor compound of Groups III-VI; a semiconductor compound of Groups I, III, and VI; a semiconductor compound of Groups IV-VI; and any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The full width at half maximum (FWHM) of an emission wavelength spectrum of the quantum dot may be about 45 nm or less, for example, about 40 nm or less, for example, about 30 nm or less, and within these ranges, color purity or color gamut may be increased. In addition, since the light emitted through the quantum dot is emitted in all directions, the wide viewing angle can be improved. In addition, the quantum dot may be a generally spherical particle, a generally pyramidal particle, a generally multi-armed particle, a generally cubic nanoparticle, a generally nanotube-shaped particle, a generally nanowire-shaped particle, a generally nanofiber-shaped particle, or a generally nanoplate-shaped particle.

Because the energy band gap can be adjusted by controlling the size of the quantum dot, light having various wavelength bands can be obtained from the quantum dot emission layer. Therefore, by using quantum dots of different sizes, a light-emitting device that emits light of various wavelengths may be implemented. In an embodiment, the size of the quantum dot may be selected to emit red, green and/or blue light. In addition, the size of the quantum dot may be configured to emit white light by combining light of various colors.

Electron Transport Region in Interlayer 130

The electron transport region may have: i) a single-layered structure consisting of a single layer consisting of a single material, ii) a single-layered structure consisting of a single layer consisting of a plurality of different materials, or iii) a multi-layered structure including a plurality of layers including different materials. The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

In an embodiment, the electron transport region (for example, the buffer layer, the hole-blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

$[Ar_{601}]_{xe11}$-$[(L_{601})_{xe1}$-$R_{601}]_{xe21}$ Formula 601

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ are each the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked via a single bond. In an embodiment, $Ar_{601}$ in Formula 601 may be a substituted or unsubstituted anthracene group. In an embodiment, the electron transport region may include a compound represented by Formula 601-1:

Formula 601-1

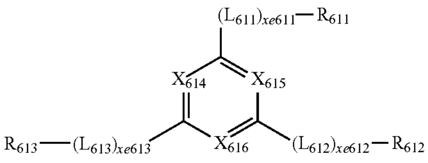

In Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ are each the same as described in connection with $L_{601}$, xe611 to xe613 are each the same as described in connection with xe1, $R_{611}$ to $R_{613}$ are each the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), tris-(8-hydroxyquinoline)aluminum ($AlQ_3$), bis(2-methyl-8-quinolinolato-N1,O8)-(1,1'-biphenyl-4-olato)aluminum (BAlq), 3-(biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole (NTAZ), or any combination thereof:

ET1

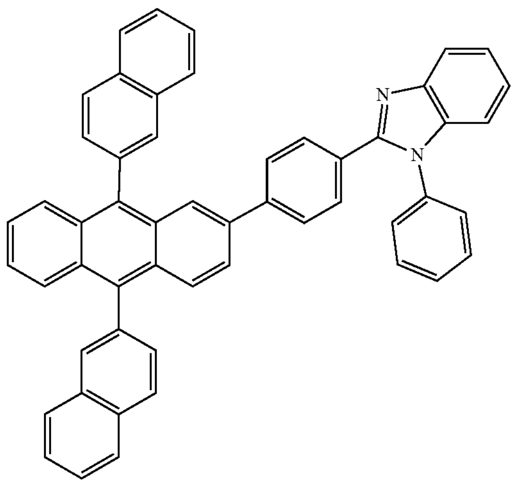

-continued
ET2
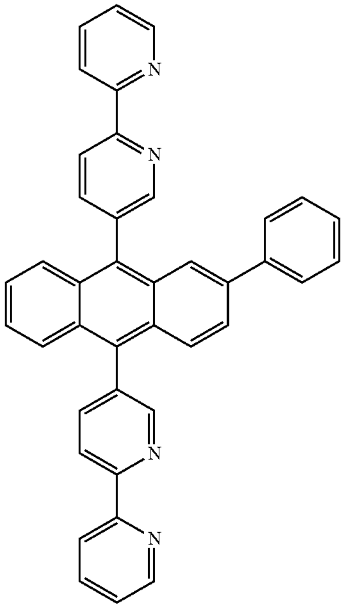
ET3
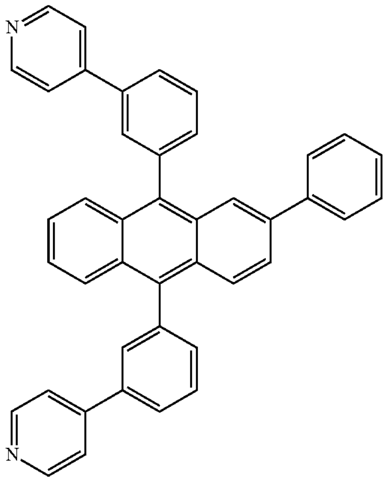
ET4
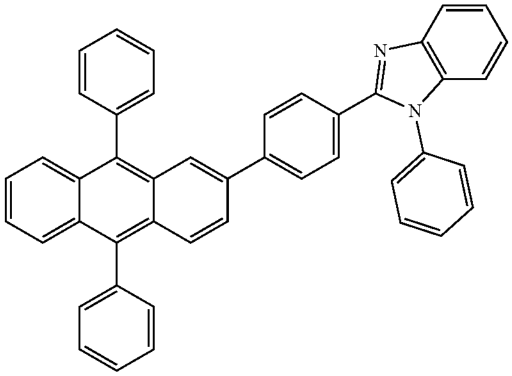
-continued
ET5
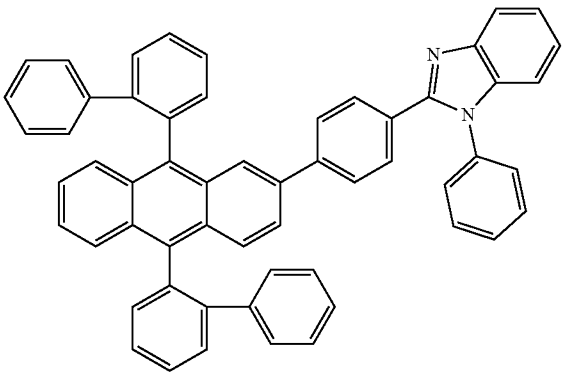
ET6
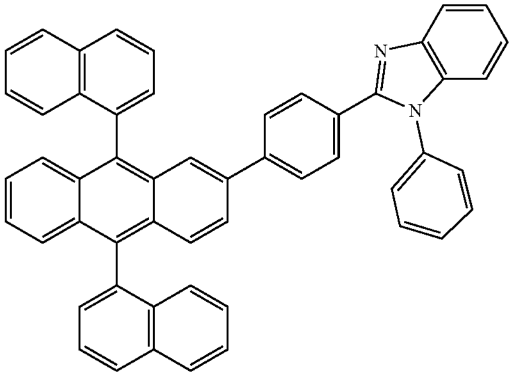
ET7
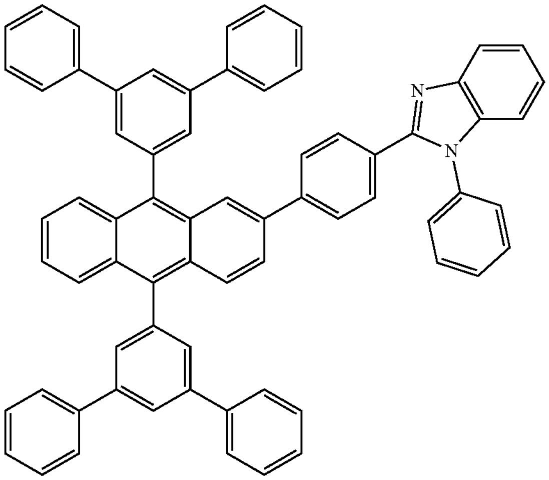

ET8
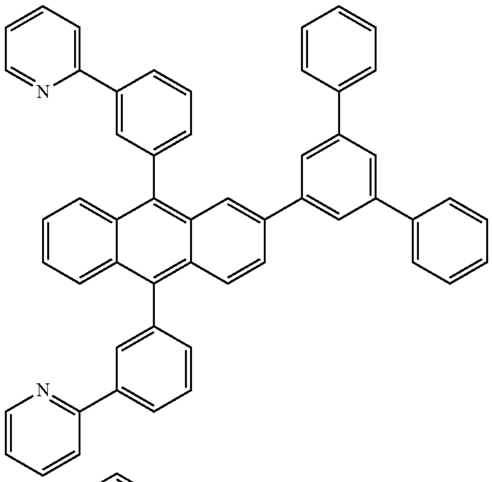
ET9
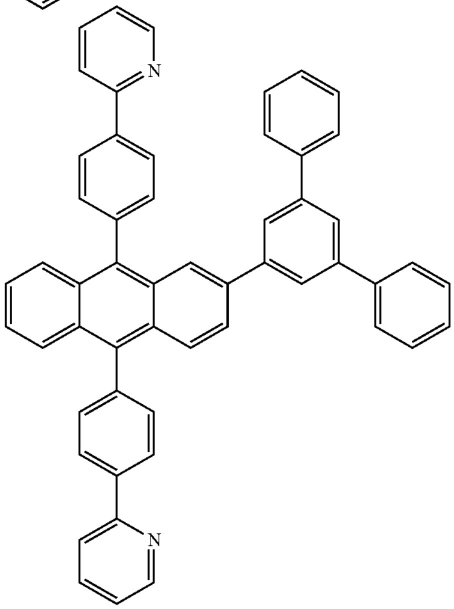
ET10
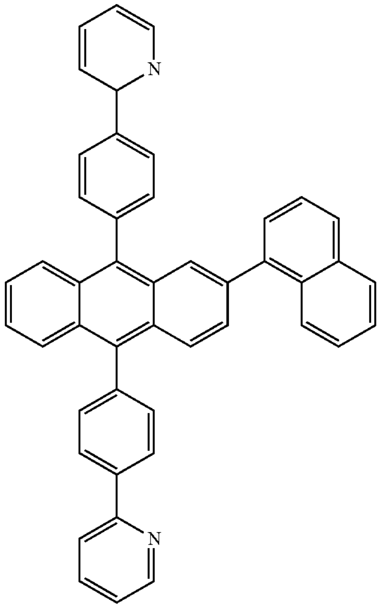
ET11
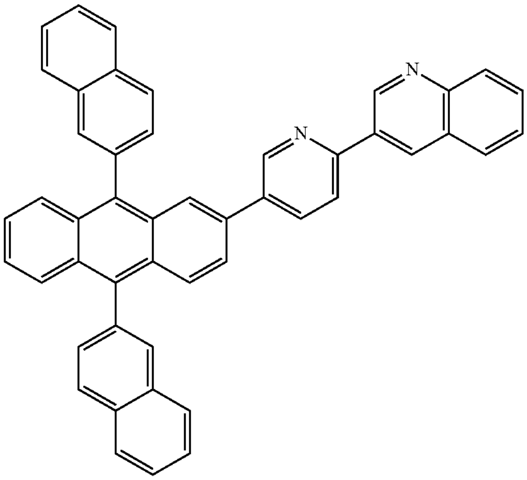
ET12
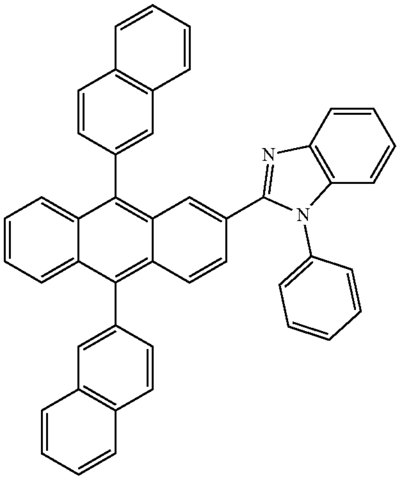
ET13
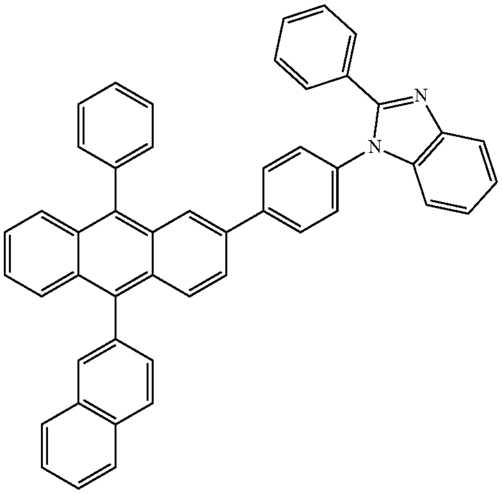

-continued
ET14
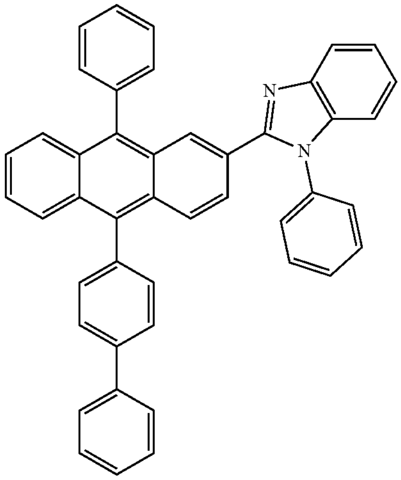
ET15
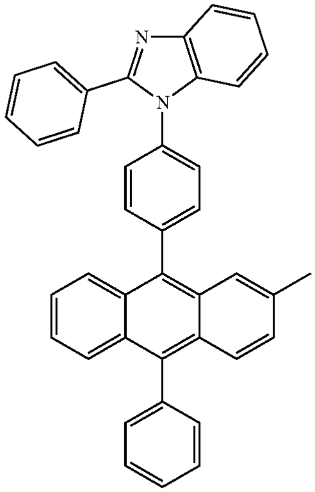
ET16
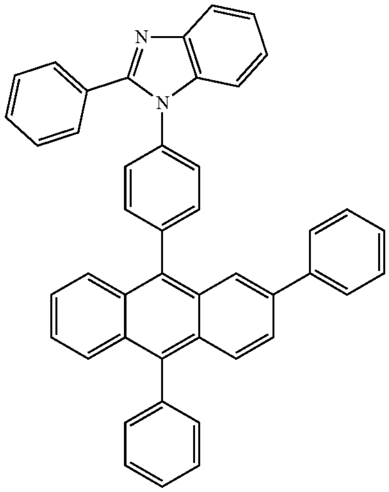
-continued
ET17
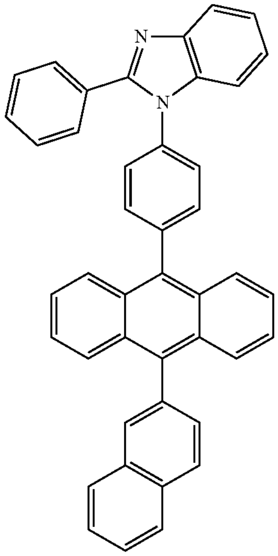
ET18
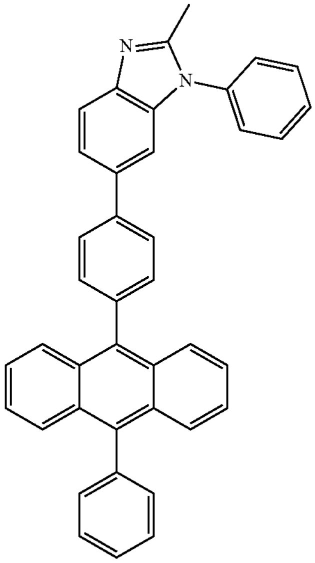
ET19
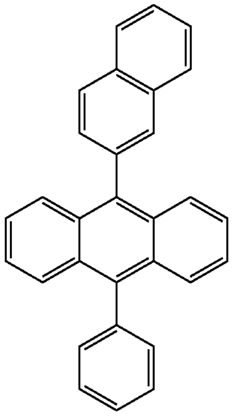

-continued
ET20
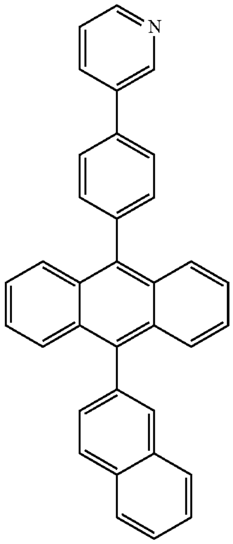
ET21
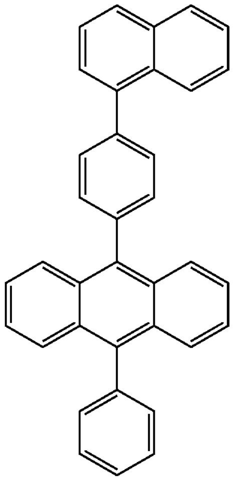
ET22
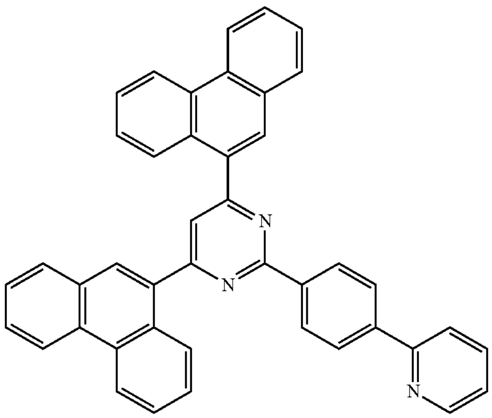
-continued
ET23
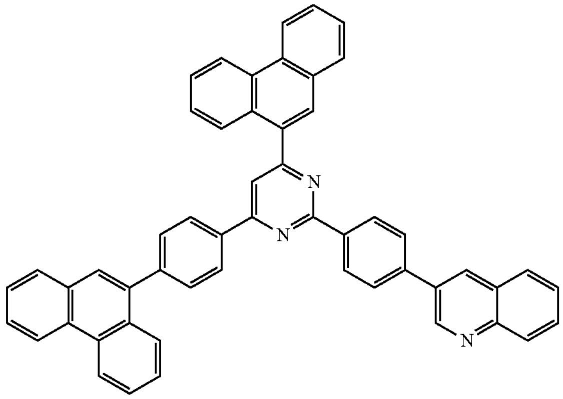
ET24
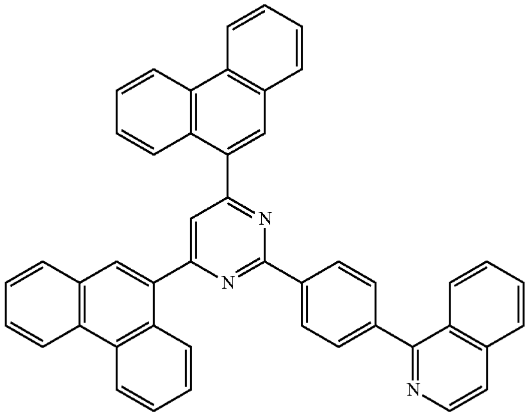
ET25
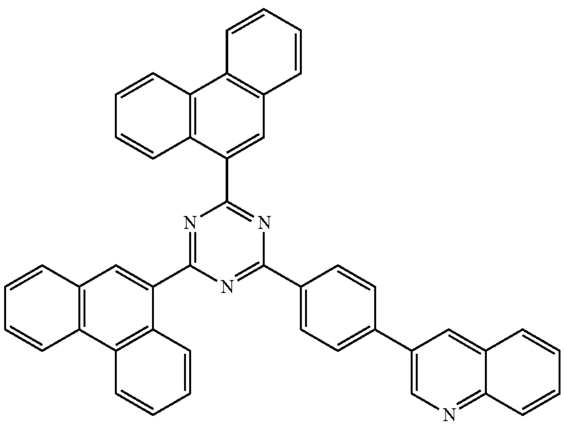

-continued
ET26
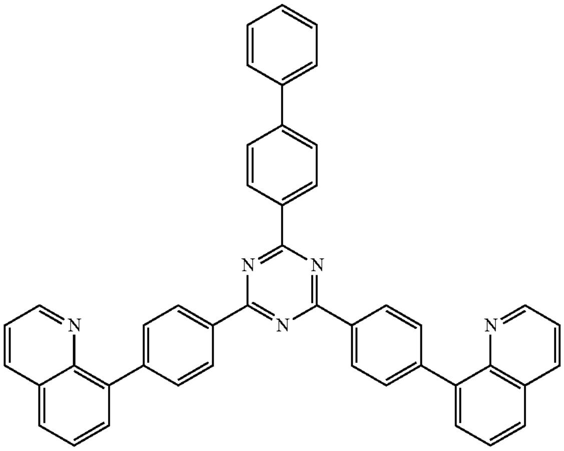
ET27
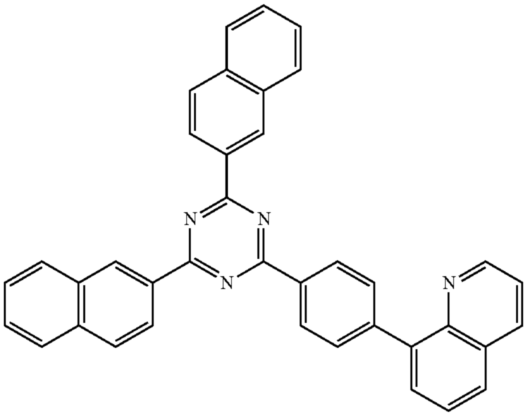
ET28
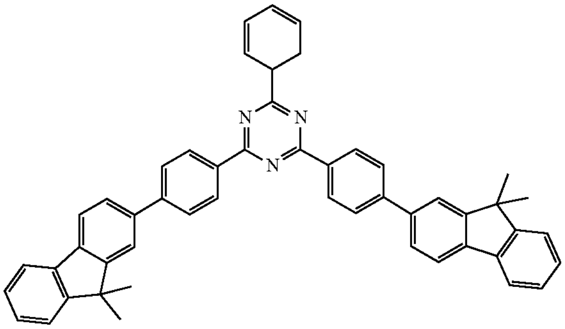
-continued
ET29
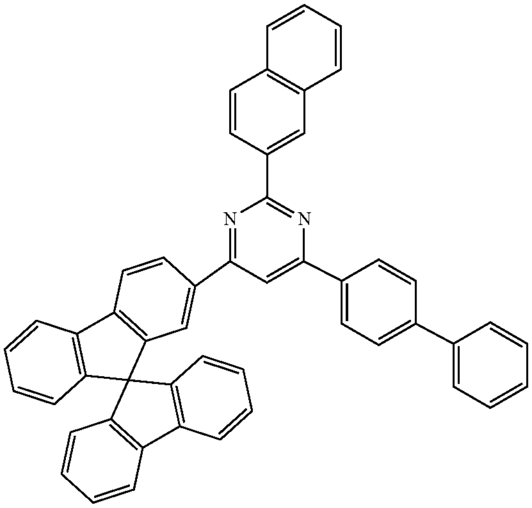
ET30
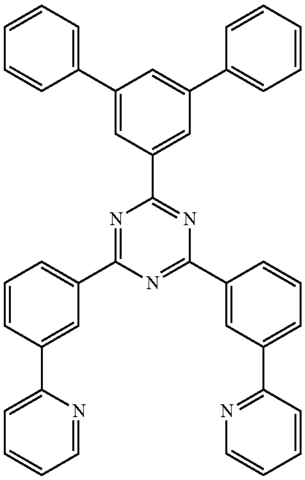
ET31
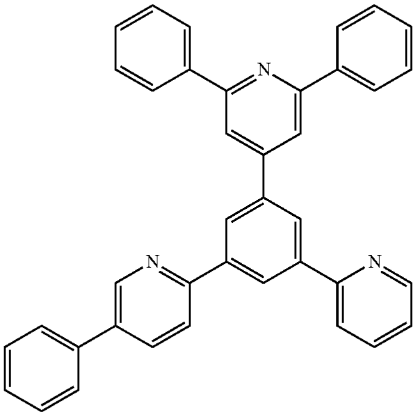

-continued
ET32
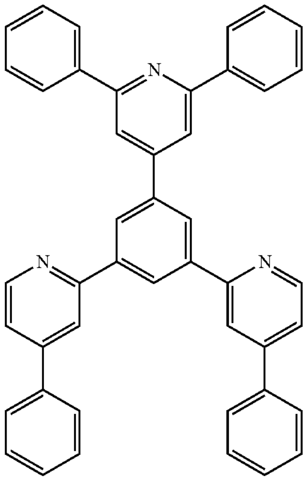
ET33
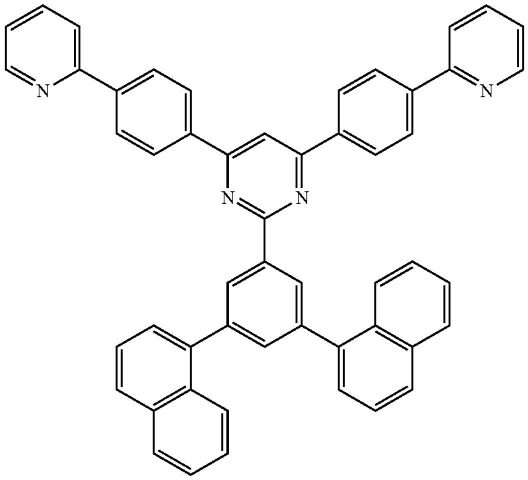
ET34
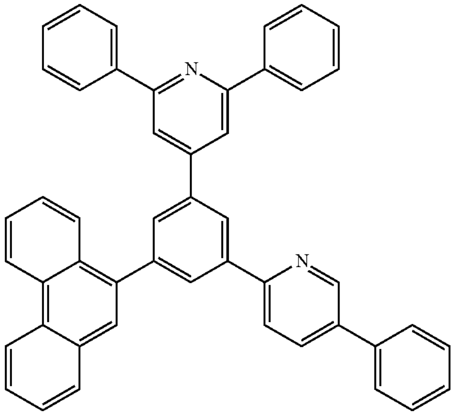
-continued
ET35
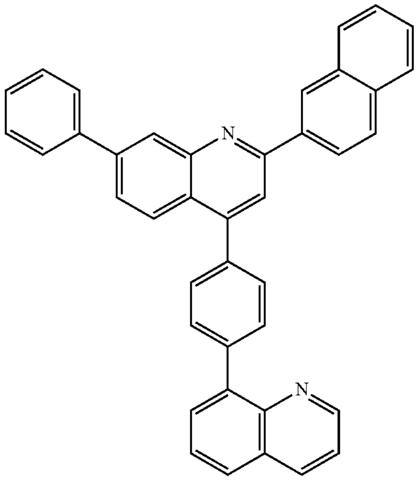
ET36
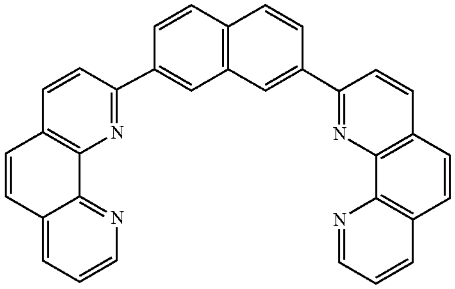
ET37
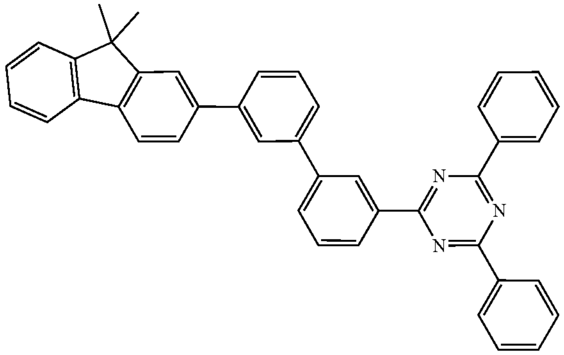
ET38
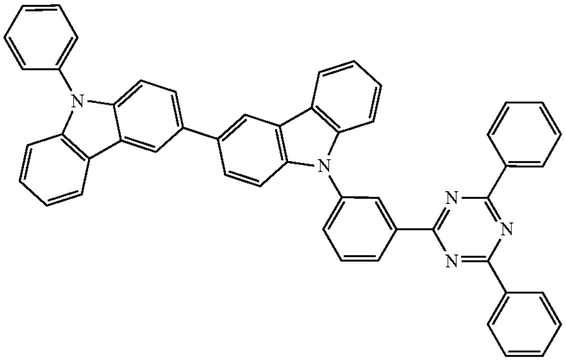

-continued
ET39
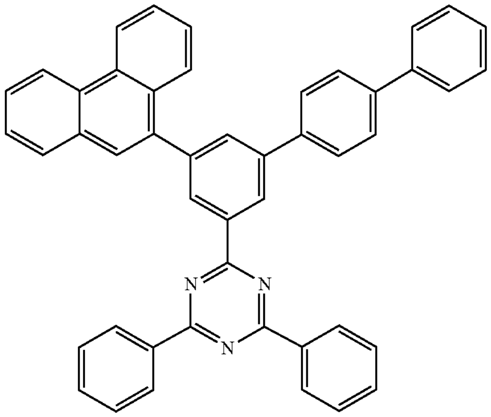
ET40
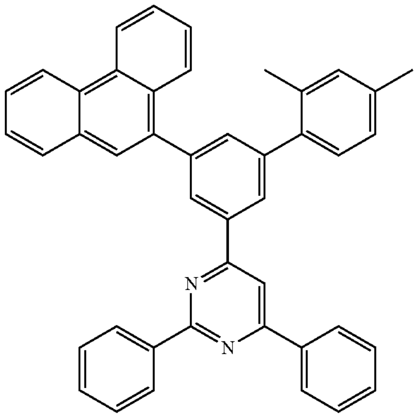
ET41
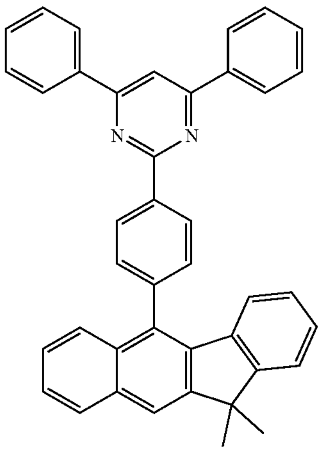
-continued
ET42
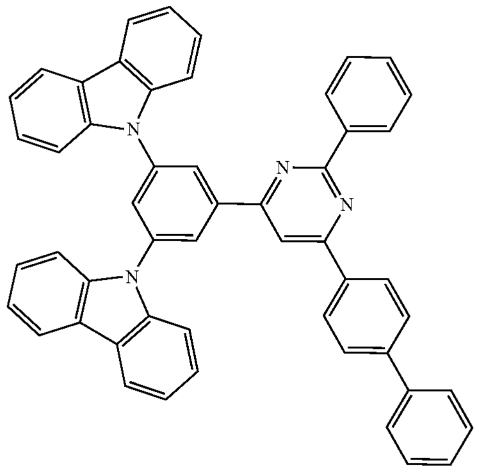
ET43
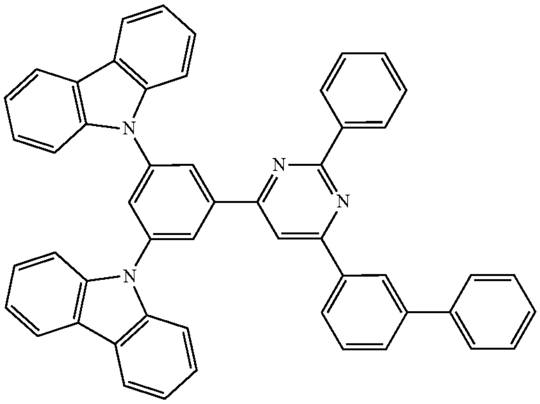
ET44
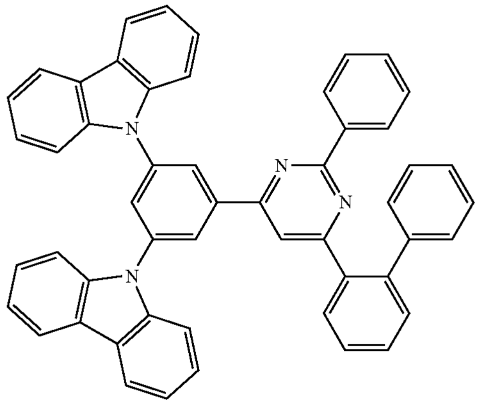
ET45
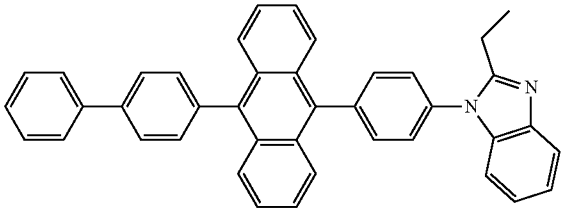

-continued

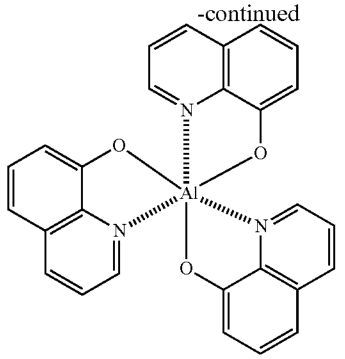

Alq3

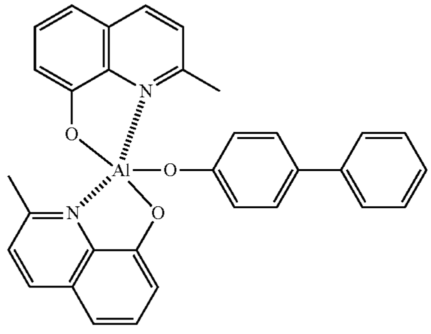

BAlq

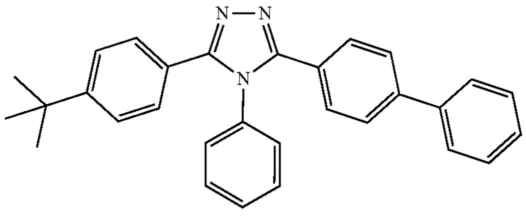

TAZ

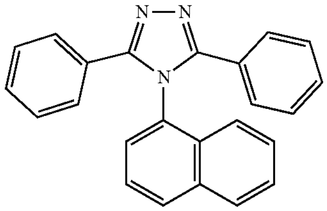

NTAZ

The thickness of the electron transport region may be from about 100 Å to about 5,000 Å, for example, from about 160 Å to about 4,000 Å. When the electron transport region includes the buffer layer, the hole-blocking layer, the electron control layer, the electron transport layer, or any combination thereof, the thickness of the buffer layer, the hole-blocking layer, or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thicknesses of the buffer layer, hole-blocking layer, electron control layer, electron transport layer and/or electron transport layer are within these ranges, satisfactory electron transporting characteristics may be obtained without a substantial increase in driving voltage. The electron transport region (for example, the electron transport layer in the electron transport region) may further include, in addition to the materials described above, a metal-containing material.

The metal-containing material may include an alkali metal complex, alkaline earth metal complex, or any combination thereof. The metal ion of an alkali metal complex may be a Li ion, a Na ion, a K ion, a Rb ion, or a Cs ion, and the metal ion of alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxydiphenyloxadiazole, a hydroxydiphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (lithium quinolate, LiQ) or ET-D2:

ET-D1

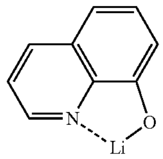

ET-D2

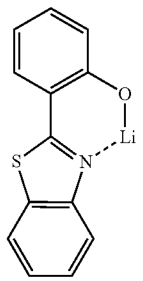

The electron transport region may include an electron injection layer that facilitates the injection of electrons from the second electrode 150. The electron injection layer may directly contact the second electrode 150.

The electron injection layer may have: i) a single-layered structure consisting of a single layer consisting of a single material, ii) a single-layered structure consisting of a single layer consisting of a plurality of different materials, or iii) a multi-layered structure including a plurality of layers including different materials. The electron injection layer may include an alkali metal, alkaline earth metal, a rare earth metal, an alkali metal-containing compound, alkaline earth metal-containing compound, a rare earth metal-containing compound, an alkali metal complex, alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof. The alkali metal-containing compound, the alkaline earth metal-containing compound, and the rare earth metal-containing compound may be oxides, halides (for example, fluorides, chlorides, bromides, or iodides), or tellurides of the alkali metal, the alkaline earth metal, and the rare earth metal, or any combination thereof.

The alkali metal-containing compound may include alkali metal oxides, such as $Li_2O$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxydiphenyloxadiazole, a hydroxydiphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

The thickness of the electron injection layer may be in a range of about 1 Å to about 100 Å, and, for example, about 3 Å to about 90 Å. When the thickness of the electron injection layer is within the range described above, the electron injection layer may have satisfactory electron injection characteristics without a substantial increase in driving voltage.

Second Electrode 150

The second electrode 150 may be located on the interlayer 130 having such a structure. The second electrode 150 may be a cathode, which is an electron injection electrode, and as the material for the second electrode 150, a metal, an alloy, an electrically conductive compound, or any combination thereof, each having a low work function, may be used.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), an ITO, an IZO, or a combination thereof. The second electrode 150 may be a transmissive electrode, a semi-transmissive electrode, or a reflective electrode. The second electrode 150 may have a single-layered structure or a multi-layered structure including two or more layers.

Capping Layer

A first capping layer may be located outside the first electrode 110, and/or a second capping layer may be located outside the second electrode 150. In detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer or light generated in an emission layer of the interlayer 130 of the light-emitting device 10 may be extracted toward the outside through the second electrode 150, which is a semi-transmissive electrode or a transmissive electrode, and the second capping layer.

Although not wanting to be bound by theory, the first capping layer and the second capping layer may increase external luminance efficiency according to the principle of constructive interference. Accordingly, the light extraction efficiency of the light-emitting device 10 is increased, so that the luminance efficiency of the light-emitting device 10 may be improved.

Each of the first capping layer and second capping layer may include a material having a refractive index (at 589 nm) of about 1.6 or more. The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof. In an embodiment, at least one of the first capping layer and the second capping layer may each independently include one of Compounds HT28 to HT33, one of Compounds CP1 to CP6, β-NPB, or any combination thereof:

CP1

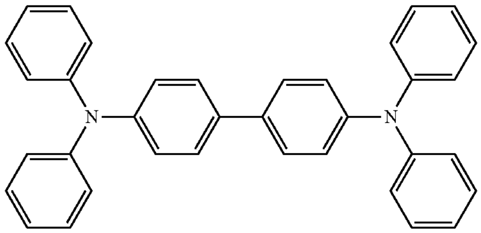

CP2

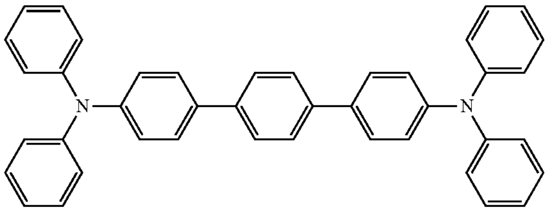

CP3

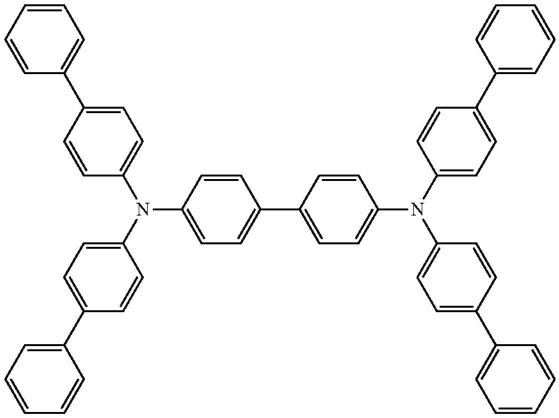

CP4

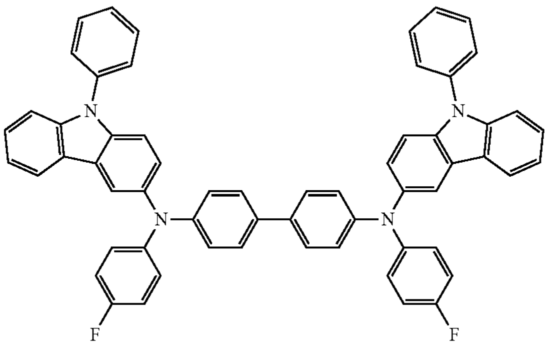

-continued

CP5

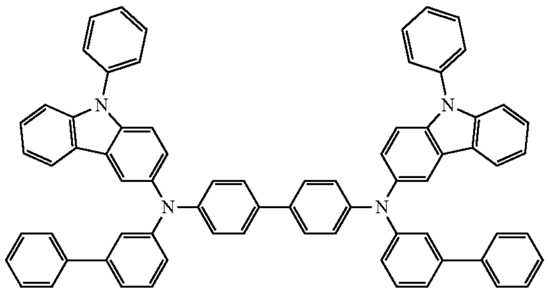

CP6

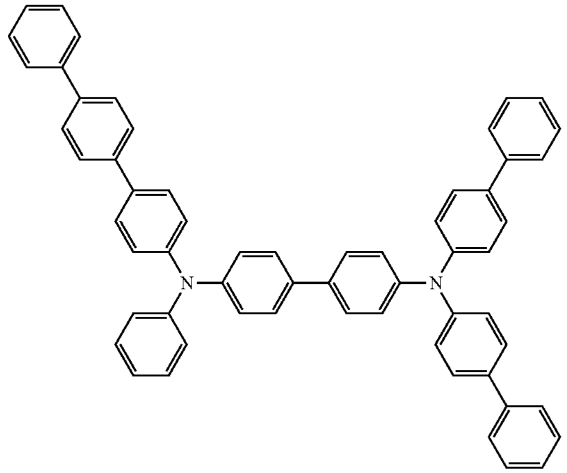

β-NPB

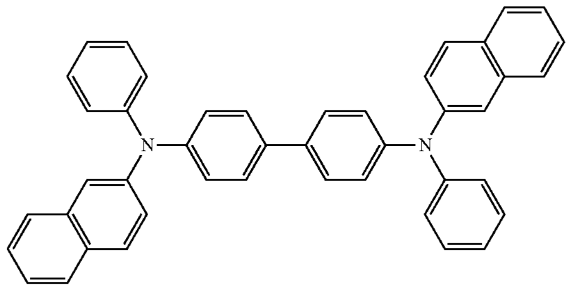

Electronic Apparatus

The light-emitting device 10 may be included in various electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device 10, i) a color filter, ii) a color conversion layer, or iii) a color filter and a color conversion layer. The color filter and/or the color conversion layer may be located in at least one traveling direction of light emitted from the light-emitting device 10. In an embodiment, the light emitted from the light-emitting device 10 may be blue light or white light. The light-emitting device 10 may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas. A pixel-defining film may be located among the subpixel areas to define each of the subpixel areas. The color filter may further include a plurality of color filter areas and light-shielding patterns located among the color filter areas, and the color conversion layer may include a plurality of color conversion areas and light-shielding patterns located among the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In detail, the first area may include a red quantum dot, the second area may include a green quantum dot, and the third area may not include a quantum dot. The quantum dot is the same as described herein. The first area, the second area, and/or the third area may each include a scatter.

In an embodiment, the light-emitting device 10 may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. In detail, the first light may be blue light, the first first-color light may be red light, the second first-color light may be green light, and the third first-color light may be blue light.

The electronic apparatus may further include a thin-film transistor in addition to the light-emitting device 10 as described above. The thin-film transistor may include a source electrode, a drain electrode, and an activation layer, wherein any one of the source electrode and the drain electrode may be electrically connected to any one of the first electrode and the second electrode of the light-emitting device 10.

The thin-film transistor may further include a gate electrode, a gate insulating film, etc. The activation layer may include a crystalline silicon, an amorphous silicon, an organic semiconductor, an oxide semiconductor, or the like.

The electronic apparatus may further include a sealing portion for sealing the light-emitting device 10. The sealing portion and/or the color conversion layer may be located between the color filter and the light-emitting device 10. The sealing portion allows light from the light-emitting device 10 to be extracted to the outside, while simultaneously preventing ambient air and moisture from penetrating into the light-emitting device 10. The sealing portion may be a sealing substrate including a transparent glass substrate or a plastic substrate. The sealing portion may be a thin-film encapsulation layer including at least one layer of an organic layer and/or an inorganic layer. When the sealing portion is a thin film encapsulation layer, the electronic apparatus may be flexible.

Various functional layers may be additionally located on the sealing portion, in addition to the color filter and/or the color conversion layer, according to the use of the electronic apparatus. The functional layers may include a touchscreen layer, a polarizing layer, and the like. The touchscreen layer may be a pressure-sensitive touchscreen layer, a capacitive touchscreen layer, or an infrared touchscreen layer. The authentication apparatus may be, for example, a biometric authentication apparatus that authenticates an individual by using biometric information of a living body (for example, fingertips, pupils, etc.). The authentication apparatus may further include, in addition to the light-emitting device 10, a biometric information collector.

The electronic apparatus may take the form of or be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
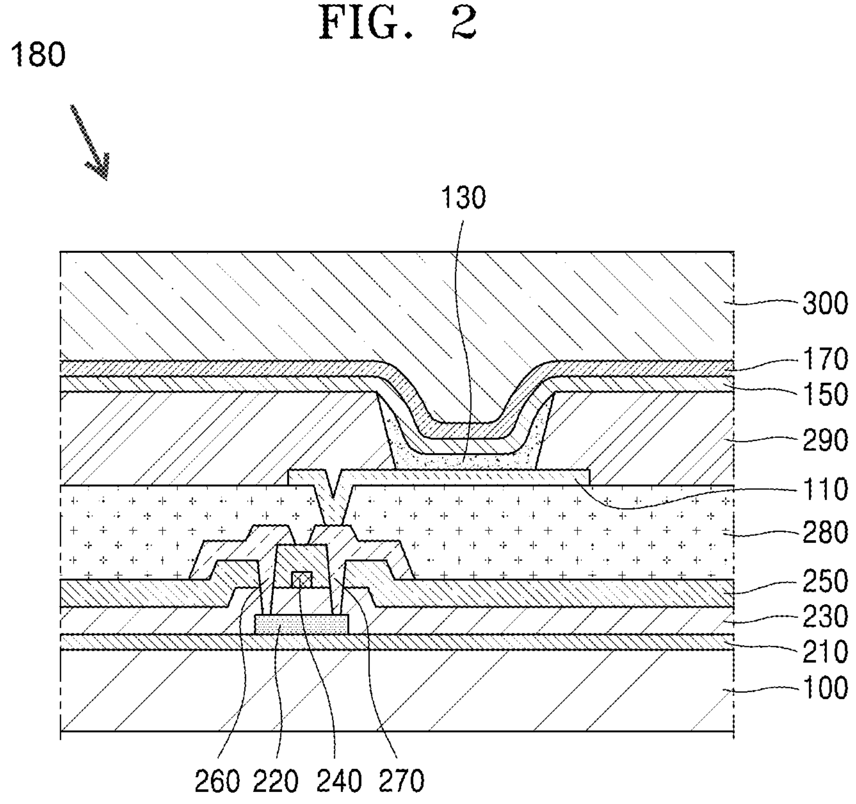
FIG. 2 is a schematic cross-sectional view of an embodiment of a light-emitting apparatus including a light-emitting device.
Figure 3:
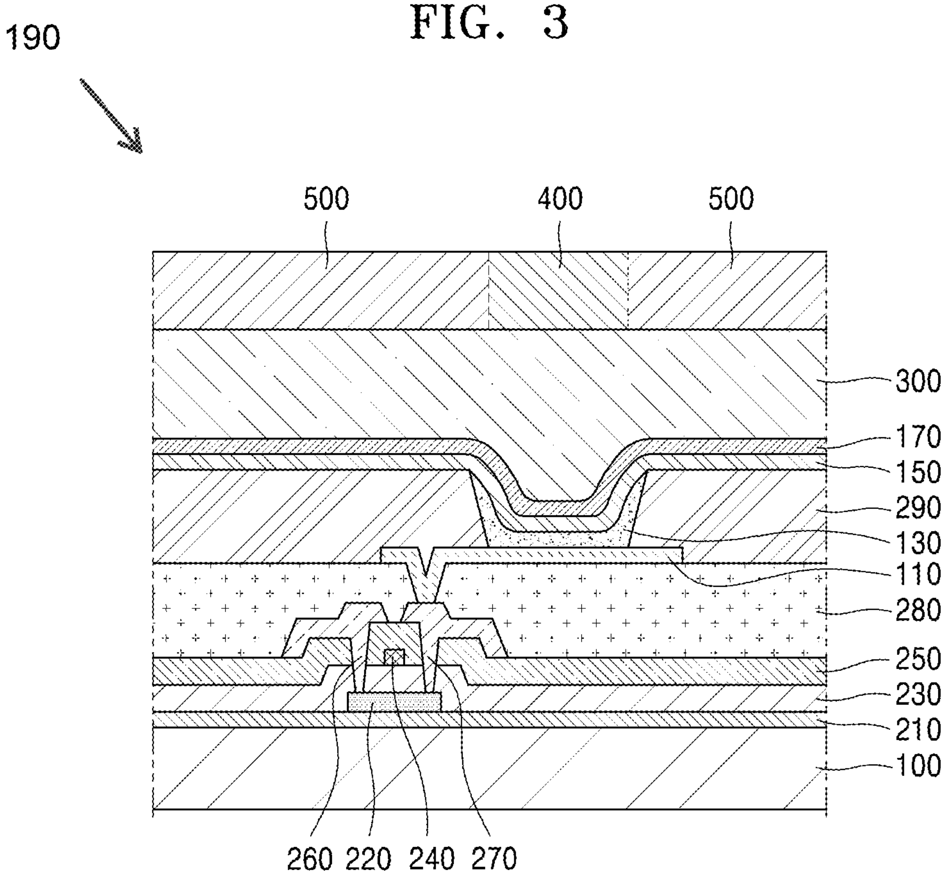
FIG. 3 is a schematic cross-sectional view of another embodiment of a light-emitting apparatus including a light-emitting device.

Description of FIGS. 2 and 3

FIG. 2 is a schematic cross-sectional view of an embodiment of a light-emitting apparatus including a light-emitting device.

The light-emitting apparatus 180 of FIG. 2 includes a substrate 100, a thin-film transistor (TFT) 200, a light-emitting device 10, and an encapsulation portion 300 that seals the light-emitting device 10. The substrate 100 may be a flexible substrate, a glass substrate, or a metal substrate. A buffer layer 210 may be formed on the substrate 100. The buffer layer 210 may prevent penetration of impurities through the substrate 100 and may provide a substantially flat surface on the substrate 100.

The TFT 200 may be located on the buffer layer 210. The TFT 200 may include an activation layer 220, a gate electrode 240, a source electrode 260, and a drain electrode 270. The activation layer 220 may include an inorganic semiconductor such as a silicon or a polysilicon, an organic semiconductor, or an oxide semiconductor, and may include a source region, a drain region and a channel region. A gate insulating film 230 for insulating the activation layer 220 from the gate electrode 240 may be located on the activation layer 220, and the gate electrode 240 may be located on the gate insulating film 230. An interlayer insulating film 250 is located on the gate electrode 240. The interlayer insulating film 250 may be located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT 200 is electrically connected to a light-emitting device 10 to drive the light-emitting device 10, and is covered by a passivation layer 280. The passivation layer 280 may include an inorganic insulating film, an organic insulating film, or a combination thereof. The light-emitting device 10 is provided on the passivation layer 280. The light-emitting device 10 may include a first electrode 110, an interlayer 130, and a second electrode 150. The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel defining layer 290 containing an insulating material may be located on the first electrode 110. The pixel defining layer 290 exposes a region of the first electrode 110, and an interlayer 130 may be formed in the exposed region of the first electrode 110. The pixel defining layer 290 may be a polyimide or a polyacrylic organic film. At least some layers of the interlayer 130 may extend beyond the upper portion of the pixel defining layer 290 to be located in the form of a common layer. The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device 10 to protect the light-emitting device from moisture or oxygen. The encapsulation portion 300 may include: an inorganic film including a silicon nitride ($SiN_x$), a silicon oxide ($SiO_x$), an indium tin oxide, an indium zinc oxide, or any combination thereof, an organic film including a polyethylene terephthalate, a polyethylene naphthalate, a polycarbonate, a polyimide, a polyethylene sulfonate, a polyoxymethylene, a polyarylate, a hexamethyldisiloxane, an acrylic resin (for example, a polymethyl methacrylate, a polyacrylic acid, or the like), an epoxy-based resin (for example, an aliphatic glycidyl ether (AGE), or the like), or a combination thereof; or a combination of the inorganic film and the organic film.

FIG. 3 is a schematic cross-sectional view of another embodiment of a light-emitting apparatus including a light-emitting device.

The light-emitting apparatus 190 of FIG. 3 is substantially the same as the light-emitting apparatus 180 of FIG. 2, except that a light-shielding pattern 500 and a functional region 400 are additionally located on the encapsulation portion 300. The functional region 400 may be a combination of i) a color filter area, ii) a color conversion area, or iii) a combination of the color filter area and the color conversion area. In an embodiment, the light-emitting device 10 included in the light-emitting apparatus 190 of FIG. 3 may be a tandem light-emitting device.

Description of FIG. 4

FIG. 4 shows the electron distribution in the HOMO and LUMO energy level of Compound C1 and Compound 2 measured using the DFT method of the Gaussian program, which is structure-optimized at the B3LYP/6-31G(d,p) level.

FIG. 4 shows (A) the electron distribution of Compound C1 (as depicted above) in the HOMO and LUMO energy level, and (B) the electron distribution of Compound 2 (as depicted above) in the HOMO and LUMO energy level. It is also shown that the LUMO site in the pyridine ring in (A) is transferred to the imidazolidine group (NHC ring) in (B).

Manufacture Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "interlayer" as used herein refers to a single layer and/or all of a plurality of layers located between a first electrode and a second electrode of a light-emitting device.

The term "quantum dot" refers to a crystal of a semiconductor compound, and may include any material capable of emitting light of various emission wavelengths according to the size of the crystal.

As used herein, the term "energy level" may be abbreviated "eV".

As used herein, the term "atom" may mean an element or its corresponding radical bonded to one or more other atoms.

The terms "hydrogen" and "deuterium" refer to their respective atoms and corresponding radicals with the deuterium radical abbreviated "-D", and the terms "—F, —Cl, —Br, and —I" are radicals of, respectively, fluorine, chlorine, bromine, and iodine. In addition, deuterium radicals may be modified with a numbered subscript, such as $D_x$, where "x" represents the number, such as three or five, of deuterium radicals substituted on, e.g., a carbon radical or an aromatic ring.

As used herein, a substituent for a monovalent group, e.g., alkyl, may also be, independently, a substituent for a corresponding divalent group, e.g., alkylene.

The term "$C_3$-$C_{60}$ carbocyclic group" as used herein refers to a cyclic group consisting of carbon only and having three to sixty carbon atoms, and the term "$C_1$-$C_{60}$ heterocyclic group" as used herein refers to a cyclic group that has one to sixty carbon atoms and further has, in addition to carbon, a heteroatom. The $C_3$-$C_{60}$ carbocyclic group and the $C_1$-$C_{60}$ heterocyclic group may each be a monocyclic group consisting of one ring or a polycyclic group in which two or more rings are fused with each other. For example, the number of ring-forming atoms of the $C_1$-$C_{60}$ heterocyclic group may be from 3 to 61.

The "cyclic group" as used herein may include the $C_3$-$C_{60}$ carbocyclic group, and the $C_1$-$C_{60}$ heterocyclic group.

The term "π electron-rich $C_3$-$C_{60}$ cyclic group" as used herein refers to a cyclic group that has three to sixty carbon atoms and does not include *—N═*' as a ring-forming moiety, and the term "π electron-deficient nitrogen-containing $C_1$-$C_{60}$ cyclic group" as used herein refers to a heterocyclic group that has one to sixty carbon atoms and includes *—N═*' as a ring-forming moiety.

For example, the $C_3$-$C_{60}$ carbocyclic group may be i) group TG1 or ii) a fused cyclic group in which two or more groups TG1 are fused with each other, for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group.

The $C_1$-$C_{60}$ heterocyclic group may be i) group TG2, ii) a fused cyclic group in which two or more groups TG2 are fused with each other, or iii) a fused cyclic group in which at least one group TG2 and at least one group TG1 are fused with each other, for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.

The π electron-rich $C_3$-$C_{60}$ cyclic group may be i) group TG1, ii) a fused cyclic group in which two or more groups TG1 are fused with each other, iii) group TG3, iv) a fused cyclic group in which two or more groups TG3 are fused with each other, or v) a fused cyclic group in which at least one group TG3 and at least one group TG1 are fused with each other, for example, the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.

The π electron-deficient nitrogen-containing $C_1$-$C_{60}$ cyclic group may be i) group TG4, ii) a fused cyclic group in which two or more group TG4 are fused with each other, iii) a fused cyclic group in which at least one group TG4 and at least one group TG1 are fused with each other, iv) a fused cyclic group in which at least one group TG4 and at least one group TG3 are fused with each other, or v) a fused cyclic group in which at least one group TG4, at least one group TG1, and at least one group TG3 are fused with one another, for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.

The group TG1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group.

The group TG2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The group TG3 may be a furan group, a thiophene group, a 1H-pyrrole group, a silole group, or a borole group.

The group TG4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group, the $C_3$-$C_{60}$ carbocyclic group, the $C_1$-$C_{60}$ heterocyclic group, the π electron-rich $C_3$-$C_{60}$ cyclic group, or the π electron-deficient nitrogen-containing $C_1$-$C_{60}$ cyclic group" as used herein refer to a group fused to any cyclic group or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, or the like, which may be easily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, and a monovalent non-aromatic fused heteropolycyclic group, and examples of the divalent $C_3$-$C_{60}$ carbocyclic group and the divalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic fused polycyclic group, and divalent non-aromatic fused heteropolycyclic group.

The term "$C_1$-$C_{60}$ alkyl group" as used herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having a structure corresponding to the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of the $C_2$-$C_{60}$ alkyl group, and examples thereof are an ethenyl group, a propenyl group, and a butenyl group. The term "$C_2$-$C_{60}$ alkenylene group" as used herein refers to a divalent group having a structure corresponding to the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having a structure corresponding to the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo [2.2.1]heptyl group), a bicyclo[1.1.1]pentyl group, a bicyclo [2.1.1]hexyl group, and a bicyclo[2.2.2]octyl group. The term "$C_3$-$C_{10}$ cycloalkylene group" as used herein refers to a divalent group having a structure corresponding to the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having a structure corresponding to the $C_1$-$C_{10}$ heterocycloalkyl group.

The term $C_3$-$C_{10}$ cycloalkenyl group used herein refers to a monovalent cyclic group that has three to ten carbon atoms and at least one carbon-carbon double bond in the ring thereof and no aromaticity, and examples thereof are a cyclopentenyl group, a cyclohexenyl group, and a cycloheptenyl group. The term "$C_3$-$C_{10}$ cycloalkenylene group" as used herein refers to a divalent group having a structure corresponding to the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having a structure corresponding to the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group are a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be fused with each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be fused with each other.

The term "monovalent non-aromatic fused polycyclic group" as used herein refers to a monovalent group (for example, having 8 to 60 carbon atoms) having two or more rings fused to each other, only carbon atoms as ring-forming atoms, and no aromaticity in its entire molecular structure. Examples of the monovalent non-aromatic fused polycyclic group are an indenyl group, a fluorenyl group, a spiro-bifluorenyl group, a benzofluorenyl group, an indenophenanthrenyl group, and an indeno anthracenyl group. The term "divalent non-aromatic fused polycyclic group" as used herein refers to a divalent group having a structure corresponding to a monovalent non-aromatic fused polycyclic group.

The term "monovalent non-aromatic fused heteropolycyclic group" as used herein refers to a monovalent group (for example, having 1 to 60 carbon atoms) having two or more rings fused to each other, at least one heteroatom other than carbon atoms, as a ring-forming atom, and non-aromaticity in its entire molecular structure. Examples of the monovalent non-aromatic fused heteropolycyclic group are a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic heterofused polycyclic group" as used herein refers to a divalent group having a structure corresponding to a monovalent non-aromatic heterofused polycyclic group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

$Q_1$ to $Q_3$ used herein may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ is alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof, or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, wherein $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom" as used herein refers to any atom other than a carbon atom. Examples of the heteroatom are O, S, N, P, Si, B, Ge, Se, and any combination thereof.

As used herein, the term "Ph" refers to a phenyl group, the term "Me" refers to a methyl group, the term "Et" refers to an ethyl group, the term "tert-Bu", "ter-Bu", "t-Bu", or "Bu" refers to a tert-butyl group, and the term "OMe" refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula.

Hereinafter, a compound according to embodiments and a light-emitting device according to embodiments will be described in detail with reference to Synthesis Examples and Examples. The wording "B was used instead of A" used in describing Synthesis Examples refers to that an identical molar equivalent of B was used in place of A.

EXAMPLES

Synthesis Example 1: Synthesis of Compound 1

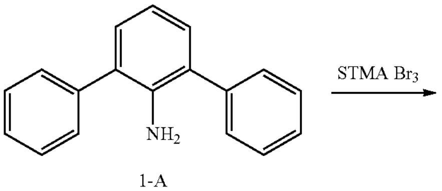

1-A

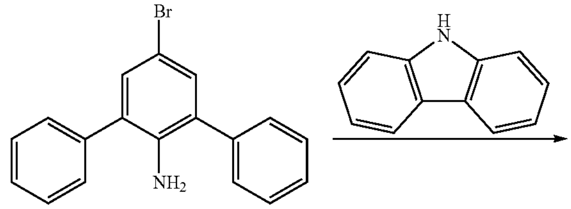

1-B

-continued
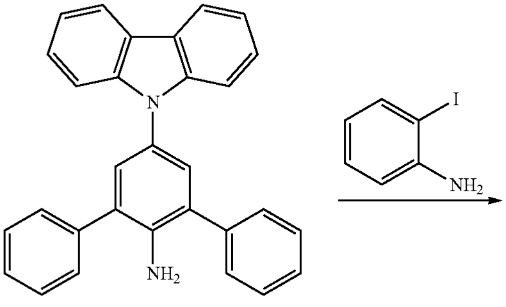
1-C
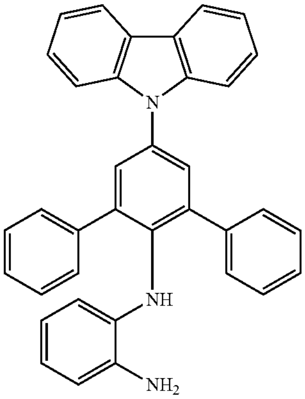
1-D
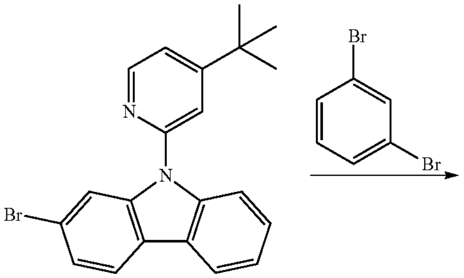
1-E
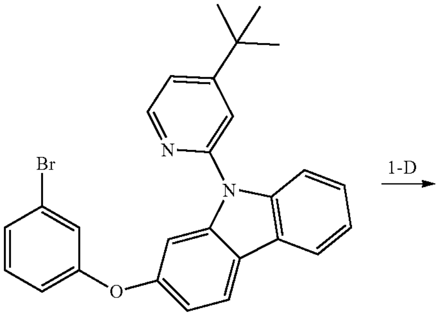
1-F
-continued
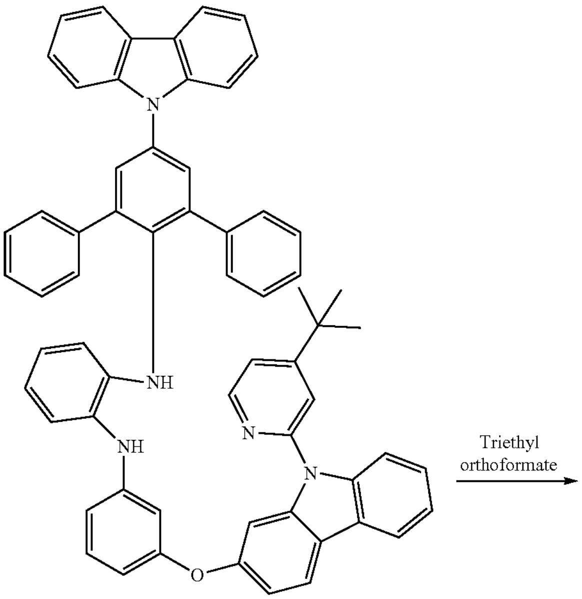
1-G
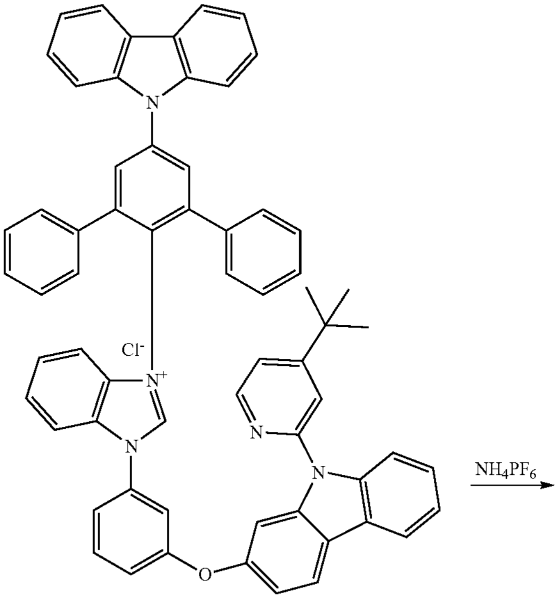
1-H -continued

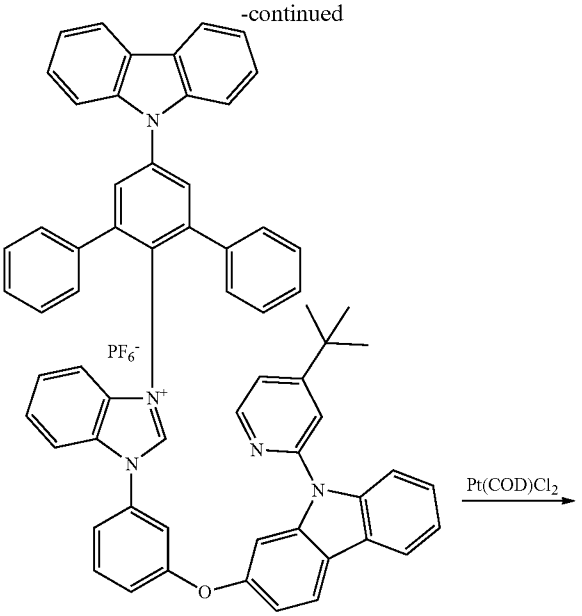

1-I

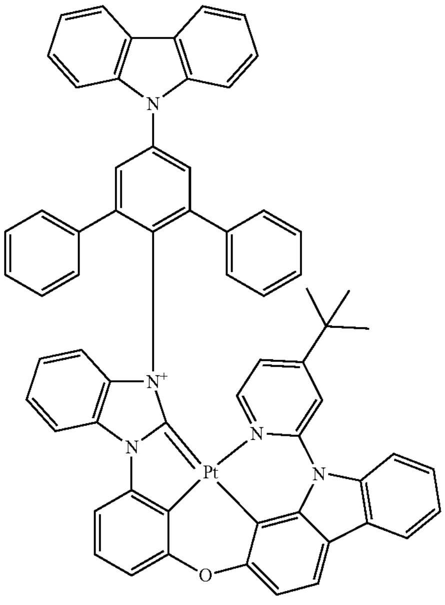

1

Synthesis of Intermediate 1-B

Compound 1-A (1 eq), benzyltrimethylammonium tribromide (BTMA·$Br_3$, 1.2 mole equivalent (eq)), and calcium carbonate ($CaCO_3$, 3 eq) were stirred for 2 hours at room temperature under a mixed solution of dichloromethane ($CH_2Cl_2$, 0.2 molar concentration (M)) and methanol (MeOH, 0.5 M). The reaction mixture was filtrated and the filtrate was washed several times with 10 percent (%) of sodium hydrogensulfite ($NaHSO_3$). An oil layer was separated, washed several times with $CH_2Cl_2$ and distilled water, dried with anhydrous magnesium sulfate, filtered, and concentrated under reduced pressure. The concentrate was purified by column chromatography to thereby obtain Intermediate 1-B at a yield of 80%.

Synthesis of Intermediate 1-C

Intermediate 1-B (1 eq), carbazole (1.1 eq), tris(dibenzylideneacetone)dipalladium(0) ($Pd_2(dba)_3$, 5 mole %), tri-tert-butylphosphine (t-$Bu_3P$) (10 mole %), and sodium tert-butoxide (NAO t-Bu) (2 eq) were suspended in toluene (0.2 M), heated to 100° C., and stirred for 12 hours. The reaction mixture was washed several times with $CH_2Cl_2$ and distilled water, dried with magnesium sulfate, filtered, and concentrated under reduced pressure. The concentrate was purified by column chromatography to thereby obtain Intermediate 1-C at a yield of 72%.

Synthesis of Intermediate 1-D

Intermediate 1-C(1 eq), 2-iodoaniline (2 eq), $Pd_2(dba)_3$ (5 mole %), dicyclohexyl(2',6'-dimethoxy[1,1'-biphenyl]-2-yl) phosphane (SPhos, 10 mole %), and NaO t-Bu (2 eq) were suspended in toluene (0.2 M), heated to 120° C., and stirred for 12 hours. The reaction mixture was washed several times with $CH_2Cl_2$ and distilled water, dried with magnesium sulfate, filtered, and concentrated under reduced pressure. The concentrate was purified by column chromatography to thereby obtain Intermediate 1-D at a yield of 85%.

Synthesis of Intermediate 1-F

Compound 1-E (1 eq), 1,3-dibromobenzene (1.5 eq), copper iodide (5 mole %), bromomethylated poly(2,6-dimethyl-1,4-phenylene oxide) (BPPO, 10 mole %), and tripotassium phosphate ($K_3PO_4$, 2 eq) were heated to 160° C. with dimethylformamide (DMF, 0.2 M) and stirred for 12 hours. The reaction mixture was washed several times with $CH_2Cl_2$ and distilled water, dried with magnesium sulfate, filtered, and concentrated under reduced pressure. The concentrate was purified by column chromatography to thereby obtain Intermediate 1-F at a yield of 80%.

Synthesis of Intermediate 1-G

Intermediate 1-F (1 eq), Intermediate 1-D (1.2 eq), $Pd_2(dba)_3$ (5 mole %), SPhos (10 mole %), and NaO t-Bu (2 eq) were suspended in toluene (0.2 M), heated to 120° C., and stirred for 12 hours. The reaction mixture was washed several times with $CH_2Cl_2$ and distilled water, dried with magnesium sulfate, filtered, and concentrated under reduced pressure. The concentrate was purified by column chromatography to thereby obtain Intermediate 1-G at a yield of 85%.

Synthesis of Intermediate 1-H

Triethyl orthoformate (0.2 M) and hydrochloric acid (HCl, 1 M) were added to Intermediate 1-G (1 eq), heated to 80° C., and stirred for 12 hours. The reaction mixture was concentrated under reduced pressure, and the concentrate was purified by column chromatography to thereby obtain Intermediate 1-H at a yield of 90%.

Synthesis of Intermediate 1-I

Intermediate 1-H (1 eq) was dissolved in a mixed solvent of MeOH and distilled water at a ratio of 4:1 and ammonium hexafluorophosphate ($NH_4PF_6$, 2 eq) was added thereto. The produced solid was stirred at room temperature for 2 hours, filtered, and washed several times with distilled water and diethyl ether to thereby obtain Intermediate 1-I at a yield of 90%.

Synthesis of Compound 1

Intermediate 1-H (1 eq), dichloro(1,5-cyclooctadiene) platinum(II) $Pt(cod)Cl_2$ (1.1 eq), and sodium acetate (3 eq) were suspended in 1,4-dioxane (0.1 M), heated to 120° C., and stirred for 3 days. After completion of the reaction, the reaction mixture was removed of the solvent under reduced pressure and purified by column chromatography to thereby obtain Compound 1 at a yield of 50%.

Synthesis Example 2: Synthesis of Compound 2

Compound 2 was obtained in the same manner as in Synthesis Example 1 except that [1,1':3',1"-terphenyl]-2,2",3,3",4,4",5,5",6,6"-d10-2'-amine substituted with deuterium was used instead of Compound 1-A.

Synthesis Example 3: Synthesis of Compound 7

Compound 7 was obtained in the same manner as in Synthesis Example 1 except that [1,1':3',1"-terphenyl]-2,2",3,3",4,4",5,5",6,6"-d10-2'-amine and 3,6-di-tert-butyl-9H-carbazole were used instead of Compound 1-A and carbazole.

Synthesis Example 4: Synthesis of Compound 18

Compound 18 was obtained in the same manner as in Synthesis Example 1 except that 4,4"-bis(methyl-d3)-[1,1':3',1"-terphenyl]-2,2",3,3",5,5",6,6"-d8-2'-amine was used instead of Compound 1-A.

Synthesis Example 5: Synthesis of Compound 31

Compound 31 was obtained in the same manner as in Synthesis Example 1 except that [1,1':3',1"-terphenyl]-2,2",3,3",4,4",5,5",6,6"-d10-2'-amine and 1,3-dibromo-5-(tert-butyl)benzene were used instead of Compound 1-A and 1,3-dibromobenzene.

Synthesis Example 6: Synthesis of Compound 42

Compound 42 was obtained in the same manner as in Synthesis Example 1 except that [1,1':3',1"-terphenyl]-2,2",3,3",4,4",5,5",6,6"-d10-2'-amine and 3,5-dibromo-6'-(phenyl-d5)-1,1':2',1"-terphenyl-2",3",4",5",6"-d5 were used instead of Compound 1-A and 1,3-dibromobenzene.

Results of proton nuclear magnetic resonance ($^1H$ NMR) and mass spectroscopy/fast atom bombardment (MS/FAB) of the compounds synthesized according to Synthesis Examples 1 to 6 are shown in Table 3.

Synthesis methods for other compounds than the compounds shown in Table 3 may be easily recognized by those skilled in the technical field by referring to the synthesis paths and source material materials described above.

TABLE 3

| Compound | $^1H$ NMR (δ) | MS/FAB Calc | MS/FAB Found |
|---|---|---|---|
| 1 | 8.74 (d, 1H), 8.55 (d, 1H), 8.39 (d, 1H), 8.27 (s, 2H), 8.15-8.19 (m, 2H), 7.94 (d, 1H), 7.35-7.75 (m, 13H), 7.05-7.20 (m, 10H), 6.90-7.00 (m, 3H), 6.65-6.70 (m, 2H), 1.32 (s, 9H) | 1094.33 | 1095.18 |
| 2 | 8.74 (d, 1H), 8.55 (d, 1H), 8.39 (d, 1H), 8.27 (s, 2H), 8.15-8.19 (m, 2H), 7.94 (d, 1H), 7.35-7.60 (m, 7H), 7.14-7.21 (m, 6H), 6.90-6.95 (m, 3H), 6.65-6.70 (m, 2H), 1.32 (s, 9H) | 1104.39 | 1105.24 |
| 7 | 8.95 (s, 1H), 8.74 (s, 1H), 8.35-8.40 (m, 2H), 8.29 (s, 2H), 8.19 (d, 1H), 7.86 (d, 1H), 7.40-7.65 (m, 6H), 7.10-7.20 (m, 5H), 6.90-7.00 (m, 3H), 6.65-6.70 (m, 2H), 1.43 (s, 18H), 1.32 (s, 9H) | 1216.52 | 1217.46 |
| 18 | 8.74 (d, 1H), 8.55 (d, 1H), 8.39 (d, 1H), 8.27 (s, 2H), 8.15-8.19 (m, 2H), 7.94 (d, 1H), 7.35-7.60 (m, 7H), 7.14-7.21 (m, 6H), 6.90-6.95 (m, 3H), 6.65-6.70 (m, 2H), 1.32 (s, 9H) | 1136.45 | 1137.32 |
| 31 | 8.74 (d, 1H), 8.55 (d, 1H), 8.39 (d, 1H), 8.27 (s, 2H), 8.15-8.19 (m, 2H), 7.94 (d, 1H), 7.15-7.60 (m, 13H), 6.93-9.96 (m, 2H), 6.98-6.70 (m, 2H), 1.33 (s, 9H), 1.32 (s, 9H) | 1160.45 | 1161.35 |
| 42 | 8.74 (d, 1H), 8.55 (d, 1H), 8.39 (d, 1H), 8.27 (s, 2H), 8.15-8.19 (m, 2H), 7.80-8.07 (m, 4H), 6.95-7.60 (m, 16H), 6.69 (d, 1H), 1.32 (s, 9H) | 1342.55 | 1343.60 |

Example 1

As an anode, a glass substrate with 15 Ω/$cm^2$ (1,200 Å) ITO thereon, which was manufactured by Corning Inc. of Corning, New York, was cut to a size of 50 mm×50 mm×0.7 mm, and the glass substrate was sonicated by using isopropyl alcohol and pure water for 5 minutes each, and then ultraviolet (UV) light was irradiated for 30 minutes thereto and ozone was exposed thereto for cleaning. Then, the resultant glass substrate was loaded onto a vacuum deposition apparatus.

The compound 2-TNATA was vacuum-deposited on the ITO anode formed on the glass substrate to form a hole injection layer having a thickness of 600 Å, and then, 4,4'-bis[N-(1-naphthyl)-N-phenylamino]biphenyl (NPB) was vacuum deposited on the hole injection layer to form a hole transport layer having a thickness of 300 Å.

A host 3,3-Di(9H-carbazol-9-yl)biphenyl(mCBP) and Compound 1 (weight ratio of 90:10) as a dopant were co-deposited on the hole transport layer to form an emission layer having a thickness 300 Å.

The compound diphenyl(4-(triphenylsilyl)phenyl)-phosphine oxide (TSPO1) was vacuum-deposited on the emission layer to form a hole blocking layer having a thickness of 50 Å. Next, the compound $AlQ_3$ was deposited on the hole blocking layer to form an electron transport layer having a thickness of 300 Å, the compound LiF, which is a halogenated alkali metal, was deposited on the electron transport layer to form an electron injection layer having a thickness of 10 Å, and the element Al was vacuum-deposited as a cathode on the electron injection layer to form a cathode having a thickness of 3,000 Å to form a lithium fluoride/aluminum (LiF/Al) electrode, thereby completing the manufacture of a light-emitting device.

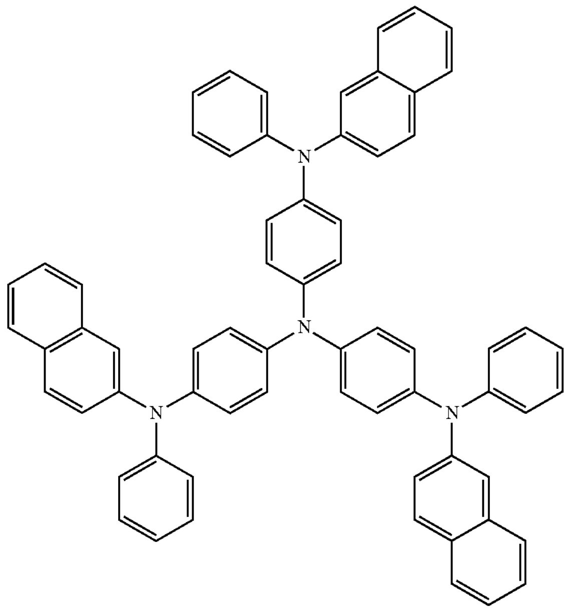

2-TNATA

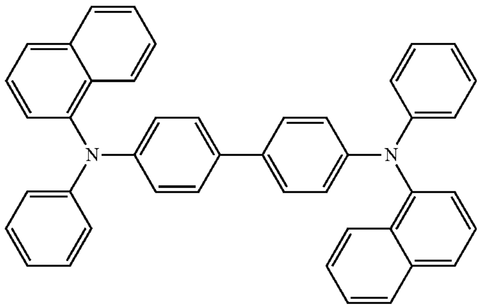

NPB

-continued

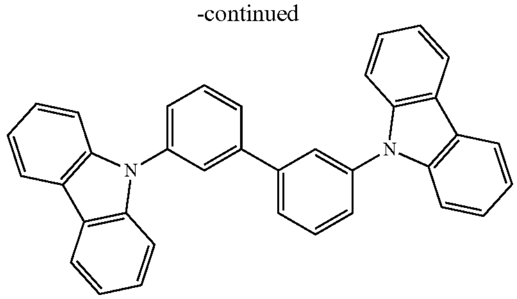

mCBP

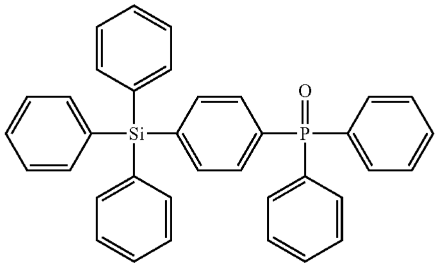

TSPO1

Examples 2 to 6 and Comparative Examples 1 and 2

Organic light-emitting devices were manufactured in the same manner as in Example 1, except that compounds shown in Table 4 were each used instead of Compound 1 as a dopant in forming an emission layer.

Evaluation Example 1

To evaluate characteristics of the light-emitting devices manufactured according to Examples 1 to 6 and Comparative Examples 1 and 2, the driving voltage at the current density of 50 $mA/cm^2$, brightness, and luminance efficiency thereof were measured. The driving voltage of the light-emitting device was measured a source-measure unit sold under the trade designation Keithley Instrument 2400 series by Tektronix, Inc., of Beaverton, Oregon. The abbreviation $T_{90}$ is a measure of the time taken when the brightness reaches 90% of the initial brightness, and the result of the evaluation of characteristics of the light-emitting device is shown in Table 4.

TABLE 4

| | Emission layer | Driving voltage (V) | Current density ($mA/cm^2$) | Luminance ($cd/m^2$) | Luminance efficiency (cd/A) | Maximum emission wavelength (nm) | $T_{90}$ lifespan (h) |
|---|---|---|---|---|---|---|---|
| Example 1 | Compound 1 | 4.52 | 50 | 5.60 | 23.65 | 453 | 75 |
| Example 2 | Compound 2 | 4.30 | 50 | 5.95 | 25.00 | 450 | 98 |
| Example 3 | Compound 7 | 4.65 | 50 | 5.38 | 21.01 | 452 | 81 |
| Example 4 | Compound 18 | 4.72 | 50 | 5.02 | 18.50 | 453 | 65 |
| Example 5 | Compound 31 | 4.55 | 50 | 5.55 | 23.52 | 455 | 85 |
| Example 6 | Compound 42 | 4.69 | 50 | 5.27 | 22.71 | 453 | 83 |

TABLE 4-continued

| | Emission layer | Driving voltage (V) | Current density ($mA/cm^2$) | Luminance ($cd/m^2$) | Luminance efficiency (cd/A) | Maximum emission wavelength (nm) | $T_{90}$ lifespan (h) |
|---|---|---|---|---|---|---|---|
| Comparative Example 1 | Compound A1 | 5.52 | 50 | 4.12 | 11.50 | 465 | 33 |
| Comparative Example 2 | Compound A2 | 5.25 | 50 | 4.00 | 12.00 | 480 | 35 |

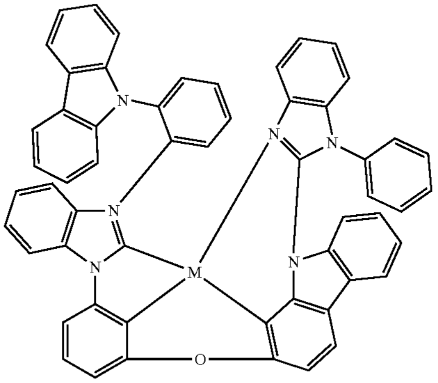

Compound A1

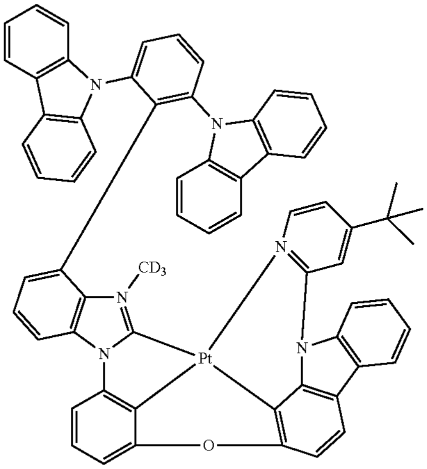

Compound A2

From Table 4, it can be seen that the light-emitting devices of Examples 1 to 6 have lower driving voltage, higher brightness, and higher luminance efficiency than the light-emitting devices of Comparative Examples 1 and 2.

Some of the advantages that may be achieved by illustrative implementations/embodiments of the invention and/or illustrative methods of the invention include an organometallic compound that can be used in manufacturing a light-emitting device having a high efficiency and a long lifespan, and the light-emitting device may be used in manufacturing a high-quality electronic apparatus having a high efficiency and a long lifespan.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:

a first electrode;

a second electrode facing the first electrode;

an interlayer between the first electrode and the second electrode and comprising an emission layer; and at least one organometallic compound of Formula 1:

Formula 1

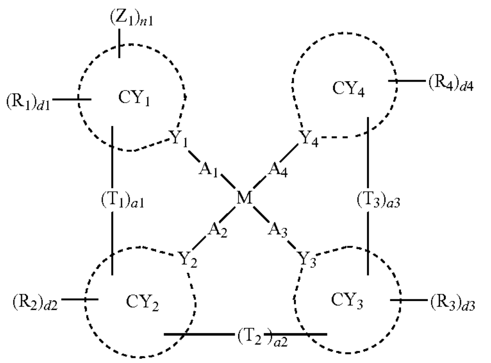

Formula 2

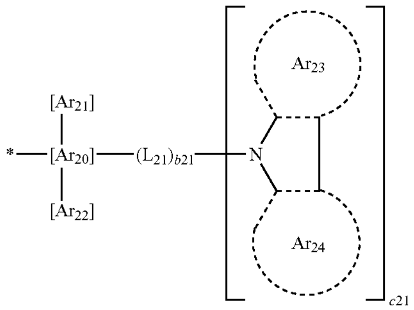

wherein, in Formula 1, $Z_1$ is a group of Formula 2, n1 is an integer of 1 to 3, wherein, in Formula 1 and Formula 2, M is platinum, palladium, $CY_1$ to $CY_4$ are each, independently from one another, a $C_3$-$C_{60}$ carbocyclic group or a $C_1$-$C_{60}$ heterocyclic group, $Y_1$ to $Y_4$ are each, independently from one another, C or N, $A_1$ to $A_4$ are each, independently from one another, a chemical bond, O, or S, $T_1$ to $T_3$ are each, independently from one another, a single bond, a double bond, *—N[$(L_1)_{b1}$-$(R_{1a})$[—*', *—B($R_{1a}$)—*', *—P($R_{1a}$)—*', *—C($R_{1a}$)($R_{1b}$)—*', *—Si($R_{1a}$)($R_{1b}$)—*', *—Ge($R_{1a}$)($R_{1b}$)—*', *—S—*', *—Se—*', *—O—*', *—C(═O)—*', *—S(═O)—*', *—S(═O)$_2$—*', *—C($R_{1a}$)═*', *═C($R_{1a}$)—*', *—C($R_{1a}$)═C($R_{1b}$)—*', *—C(═S)—*', or *—C≡C—*', a1 to a3 are each, independently from one another, an integer of 1 to 3,

* and *' each indicate a binding site to a neighboring atom, and $Ar_{20}$, $Ar_{23}$, and $Ar_{24}$ are each, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_1$ and $L_{21}$ are each, independently from one another, a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b1 and b21 are each, independently from one another, an integer of 1 to 3, c21 is an integer of 1 to 3, $R_1$ to $R_4$, $R_{1a}$, and $R_{1b}$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), d1 to d4 are each, independently from one another, an integer of 1 to 10, two or more groups of $R_1$ to $R_4$, $R_{1a}$, and $R_{1b}$ are optionally linked to form a $C_5$-$C_{30}$ carbocyclic group unsubstituted or substituted with at least one $R_{10a}$ or a $C_2$-$C_{30}$ heterocyclic group unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or

—P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, wherein $Ar_{21}$ and $Ar_{22}$ in Formula 2 are each, independently from one another, a group of one of Formulae 3-1 to 3-34:

-continued
3-1
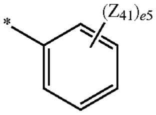
3-2
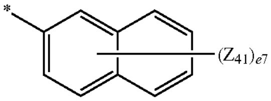
3-3
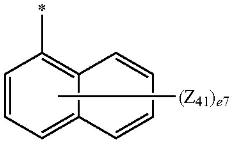
3-4
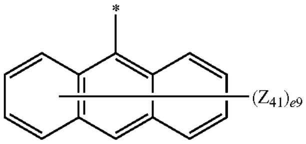
3-5
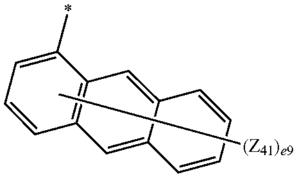
3-6
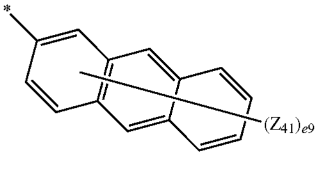
3-7
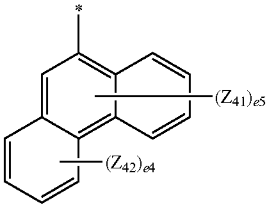
3-8
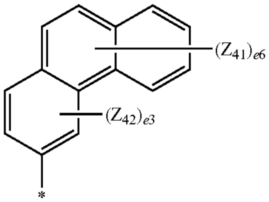
3-9
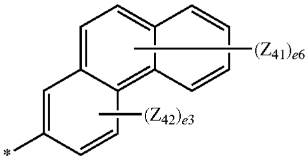
3-10
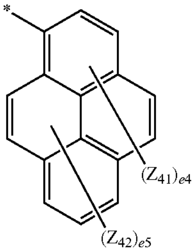
3-11
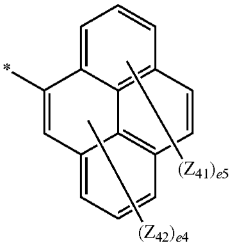
3-12
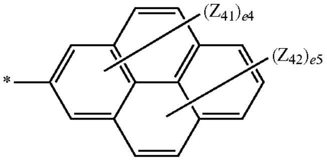
3-13
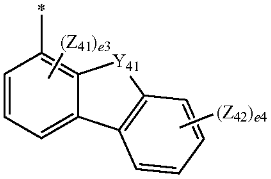
3-14
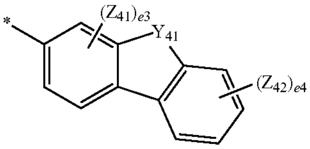
3-15
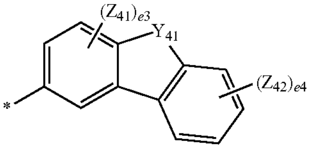
3-16
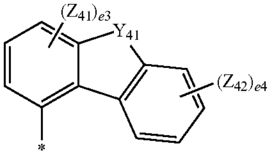

-continued
3-17
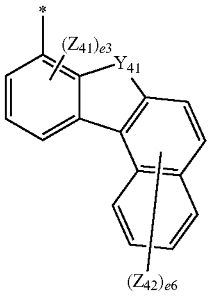
3-18
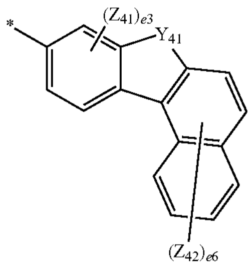
3-19
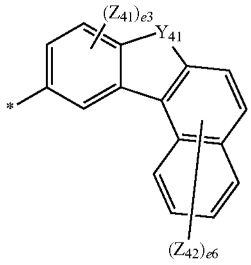
3-20
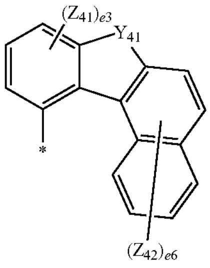
3-21
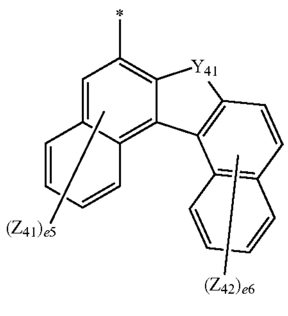
-continued
3-22
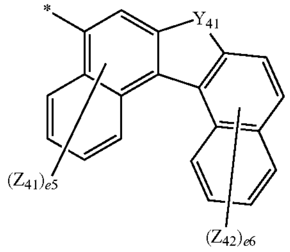
3-23
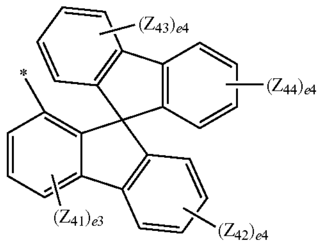
3-24
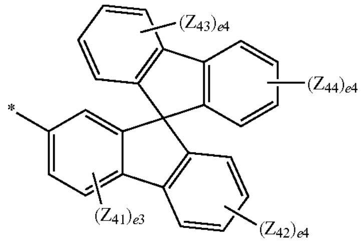
3-25
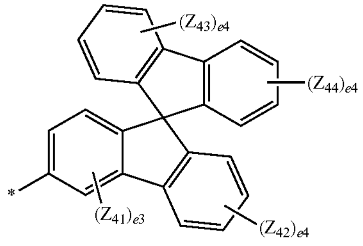
3-26
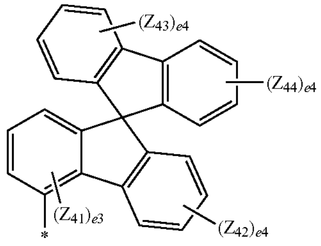
3-27
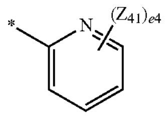
3-28
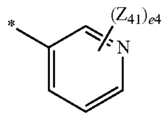
3-29
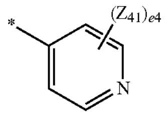

-continued 3-30

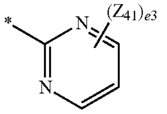

3-31

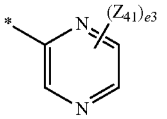

3-32

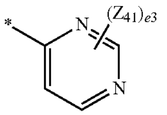

3-33

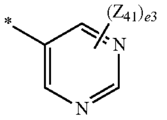

3-34

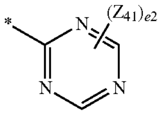

wherein, in Formulae 3-1 to 3-34, $Y_{41}$ is O, S, $N(Z_{45})$, $C(Z_{45})(Z_{46})$, or $Si(Z_{45})(Z_{46})$, $Z_{41}$ to $Z_{46}$ are each, independently from one another, deuterium, —F, —Cl, —Br, —I, a hydroxyl group, a cyano group, a nitro group, an amidino group, a hydrazino group, a hydrazono group, $—CF_3$, $—CF_2H$, $—CFH_2$, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyridinyl group, a pyrimidinyl group, a pyrazinyl group, a triazinyl group, a quinolinyl group, an isoquinolinyl group, a benzoquinolinyl group, a naphthyridinyl group, a quinoxalinyl group, a quinazolinyl group, a phenanthridinyl group, an acridinyl group, a phenanthrolinyl group, a phenazinyl group, a carbazolyl group, a dibenzofuranyl group, a dibenzothiophenyl group, a dibenzosilolyl group, $—Si(Q_{31})(Q_{32})(Q_{33})$, $—N(Q_{31})(Q_{32})$, or $—B(Q_{31})(Q_{32})$, e2 is 1 or 2, e3 is an integer of 1 to 3, e4 is an integer of 1 to 4, e5 is an integer of 1 to 5, e6 is an integer of 1 to 6, e7 is an integer of 1 to 7, e9 is an integer of 1 to 9, $Q_{31}$ to $Q_{33}$ are each, independently from one another, a $C_1$-$C_{10}$ alkyl group, a $C_1$-$C_{10}$ alkoxy group, a phenyl group, a biphenyl group, a terphenyl group, or a naphthyl group, and

* indicates a binding site to a neighboring atom, and wherein when at least one selected from $Ar_{21}$ and $Ar_{22}$ is a group of Formula 3-1, then at least one $Z_{41}$ is substituted at the 1 or 5 position of Formula 3-1.

2. The light-emitting device of claim 1, wherein the first electrode comprises an anode, the second electrode comprises a cathode, the interlayer comprises the at least one organometallic compound, and the interlayer further comprises a hole transport region between the first electrode and the emission layer and an electron transport region between the emission layer and the second electrode, the hole transport region comprises a hole injection layer, a hole transport layer, an emission auxiliary layer, an electron blocking layer, or any combination thereof, and the electron transport region further comprises a hole blocking layer, an electron transport layer, an electron injection layer, or any combination thereof.

3. The light-emitting device of claim 1, wherein the emission layer comprises the at least one organometallic compound of Formula 1.

4. The light-emitting device of claim 3, wherein the emission layer further comprises a host, and an amount of the at least one organometallic compound of Formula 1 is from about 0.01 parts or greater by weight to about 49.99 parts or less by weight based on 100 parts by weight of the emission layer.

5. The light-emitting device of claim 3, wherein the emission layer is configured to emit blue light or blue-green light.

6. An electronic apparatus comprising the light-emitting device of claim 1.

7. The electronic apparatus of claim 6, wherein the electronic apparatus comprises a thin-film transistor, wherein the thin-film transistor comprises a source electrode and a drain electrode, wherein the first electrode of the light-emitting device is electrically connected to at least one of the source electrode and the drain electrode of the thin-film transistor.

8. The electronic apparatus of claim 6, wherein the electronic apparatus comprises a color filter, a color conversion layer, a touchscreen layer, a polarizing layer, or any combination thereof.

9. An organometallic compound of Formula 1:

Formula 1

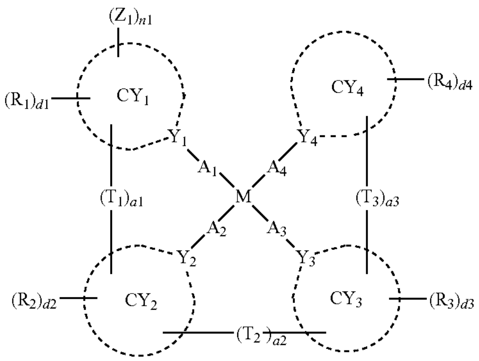

-continued

Formula 2

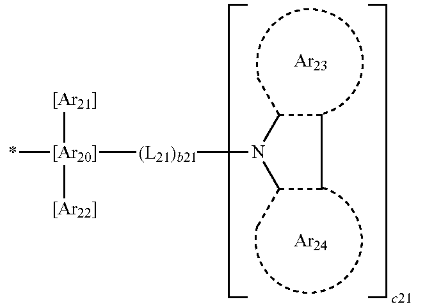

wherein, in Formula 1, $Z_1$ is a group of Formula 2, n1 is an integer of 1 to 3, wherein, in Formula 1 and Formula 2, M is platinum, palladium, $CY_1$ to $CY_4$ are each, independently from one another, a $C_3$-$C_{60}$ carbocyclic group or a $C_1$-$C_{60}$ heterocyclic group, $Y_1$ to $Y_4$ are each, independently from one another, C or N, $A_1$ to $A_4$ are each, independently from one another, a chemical bond, O, or S, $T_1$ to $T_3$ are each, independently from one another, a single bond, a double bond, *—N[$(L_1)_{b1}$-$(R_{1a})$]—*', *—B($R_{1a}$)—*', *—P($R_{1a}$)—*', *—C($R_{1a}$)($R_{1b}$)—*', *—Si($R_{1a}$)($R_{1b}$)—*', *—Ge($R_{1a}$)($R_{1b}$)—*', *—S—*', *—Se—*', *—O—*', *—C(═O)—*', *—S(═O)—*', *—S(═O)$_2$—*', *—C($R_{1a}$)═*', *═C($R_{1a}$)—*', *—C($R_{1a}$)═C($R_{1b}$)—*', *—C(═S)—*', or *—C≡C—*', a1 to a3 are each, independently from one another, an integer of 1 to 3,

* and *' each indicate a binding site to a neighboring atom, $Ar_{20}$, $Ar_{23}$, and $Ar_{24}$ are each, independently from one another, a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_1$ and $L_{21}$ are each, independently from one another, a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b1 and b21 are each, independently from one another, an integer of 1 to 3, c21 is an integer of 1 to 3, $R_1$ to $R_4$, $R_{1a}$, and $R_{1b}$ are each, independently from one another, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), d1 to d4 are each, independently from one another, an integer of 1 to 10, two or more groups of $R_1$ to $R_4$, $R_{1a}$, and $R_{1b}$ are optionally linked to form a $C_5$-$C_{30}$ carbocyclic group unsubstituted or substituted with at least one $R_{10a}$ or a $C_2$-$C_{30}$ heterocyclic group unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group each, independently from one another, unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group each, independently from one another, unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each, independently from one another: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group each, independently from one another, unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, wherein $Ar_{21}$ and $Ar_{22}$ in Formula 2 are each, independently from one another, a group of one of Formulae 3-1 to 3-34:

3-1

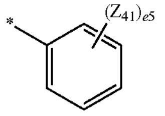

3-2

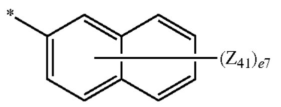

-continued
3-3
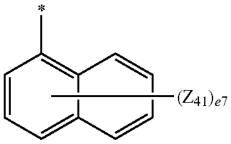
3-4
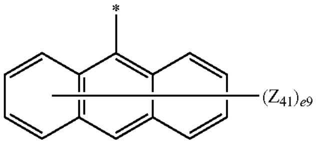
3-5
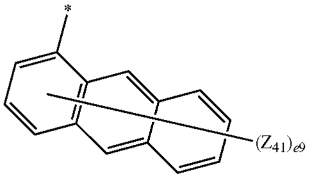
3-6
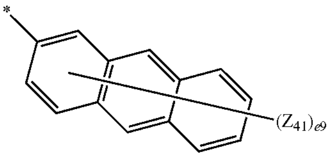
3-7
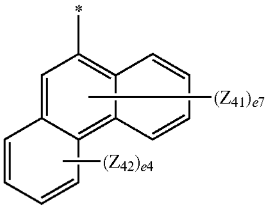
3-8
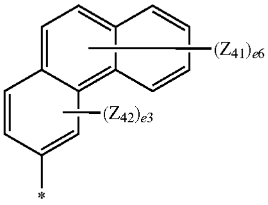
3-9
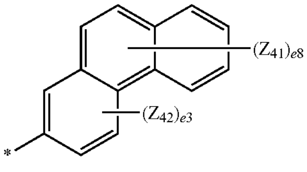
3-10
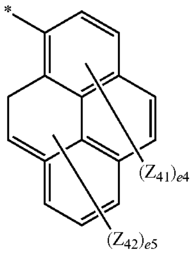
-continued
3-11
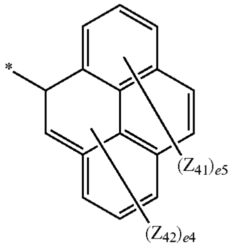
3-12
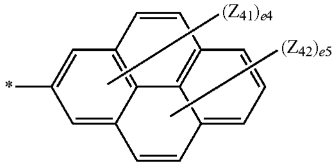
3-13
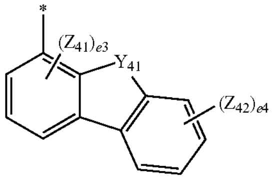
3-14
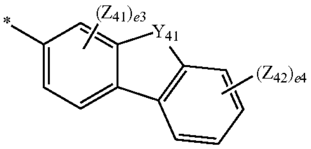
3-15
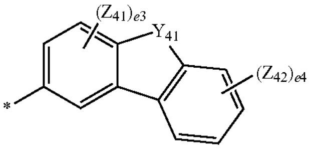
3-16
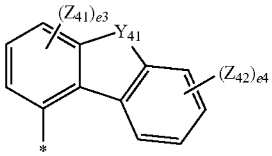
3-17
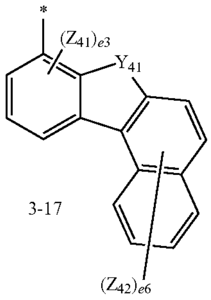
3-17

-continued
3-18
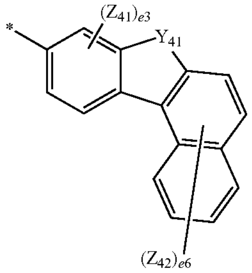
3-19
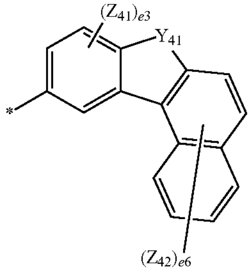
3-20
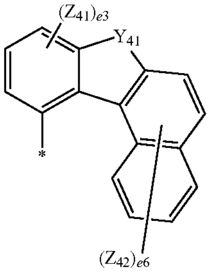
3-21
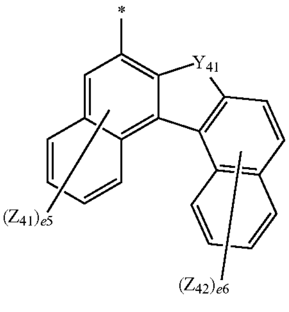
3-22
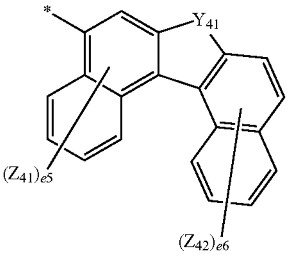
-continued
3-23
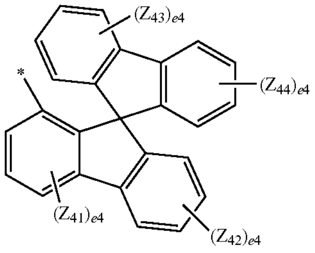
3-24
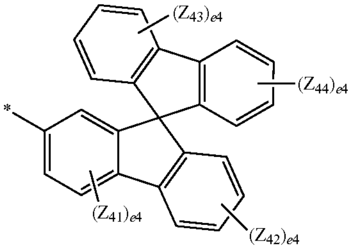
3-25
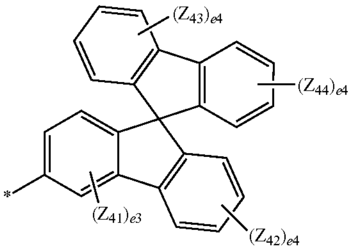
3-26
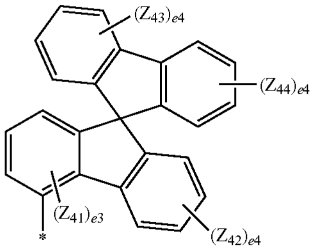
3-27
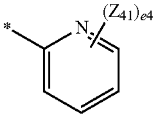
3-28
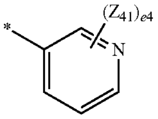
3-29
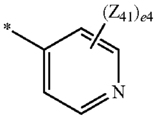
3-30
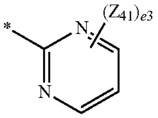

-continued 3-31

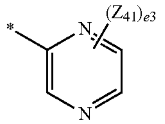

3-32

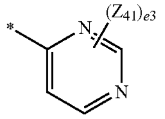

3-33

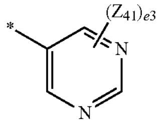

3-34

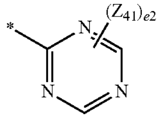

wherein, in Formulae 3-1 to 3-34, $Y_{41}$ is O, S, $N(Z_{45})$, $C(Z_{45})(Z_{46})$, or $Si(Z_{45})(Z_{46})$, $Z_{41}$ to $Z_{46}$ are each, independently from one another, deuterium, —F, —Cl, —Br, —I, a hydroxyl group, a cyano group, a nitro group, an amidino group, a hydrazino group, a hydrazono group, $—CF_3$, $—CF_2H$, $—CFH_2$, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a naphthyl group, a fluorenyl group, a spiro-bifluorenyl group, a spiro-fluorene-benzofluorenyl group, a benzofluorenyl group, a dibenzofluorenyl group, a phenalenyl group, a phenanthrenyl group, an anthracenyl group, a fluoranthenyl group, a triphenylenyl group, a pyridinyl group, a pyrimidinyl group, a pyrazinyl group, a triazinyl group, a quinolinyl group, an isoquinolinyl group, a benzoquinolinyl group, a naphthyridinyl group, a quinoxalinyl group, a quinazolinyl group, a phenanthridinyl group, an acridinyl group, a phenanthrolinyl group, a phenazinyl group, a carbazolyl group, a dibenzofuranyl group, a dibenzothiophenyl group, a dibenzosilolyl group, $—Si(Q_{31})(Q_{32})(Q_{33})$, $—N(Q_{31})(Q_{32})$, or $—B(Q_{31})(Q_{32})$, e2 is 1 or 2, e3 is an integer of 1 to 3, e4 is an integer of 1 to 4, e5 is an integer of 1 to 5, e6 is an integer of 1 to 6, e7 is an integer of 1 to 7, e9 is an integer of 1 to 9, $Q_{31}$ to $Q_{33}$ are each, independently from one another, a $C_1$-$C_{10}$ alkyl group, a $C_1$-$C_{10}$ alkoxy group, a phenyl group, a biphenyl group, a terphenyl group, or a naphthyl group, and

* indicates a binding site to a neighboring atom, and wherein when at least one selected from $Ar_{21}$ and $Ar_{22}$ is a group of Formula 3-1, then at least one $Z_{41}$ is substituted at the 1 or 5 position of Formula 3-1.

10. The organometallic compound of claim 9, wherein $CY_1$ to $CY_4$ are, independently from one another, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzotriazole, a benzoxazole group, a benzothiazole group, a benzoxadiazole group, a benzothiadiazole group, a 5,6,7,8-tetrahydroisoquinoline group, or a 5,6,7,8-tetrahydroquinoline group.

11. The organometallic compound of claim 9, wherein CY1 is a group of one of Formulae CY1-1 to CY1-70, CY2 is a group of one of Formulae CY2-1 to CY2-14, $CY_3$ is a group of one of Formulae CY3-1 to CY3-14, and $CY_4$ is a group of one of Formulae CY4-1 to CY4-70:

CY1-1

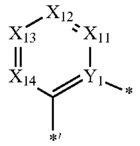

CY1-2

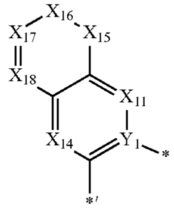

CY1-3

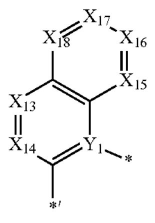

-continued
CY1-4
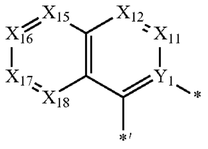
CY1-5
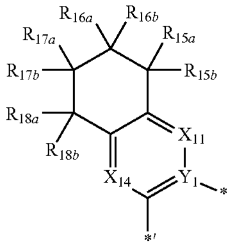
CY1-6
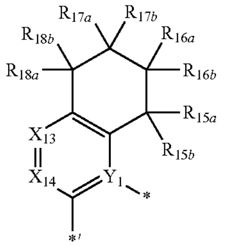
CY1-7
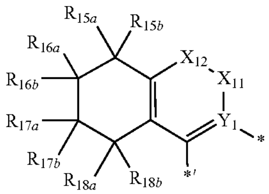
CY1-8
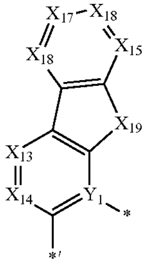
CY1-9
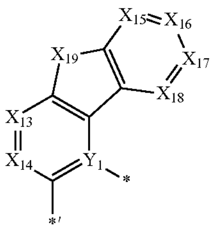
CY1-10
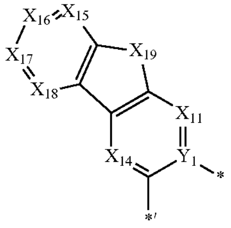
-continued
CY1-11
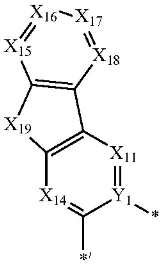
CY1-12
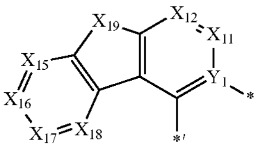
CY1-13
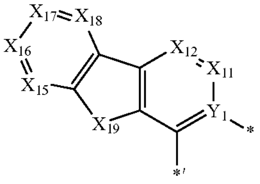
CY1-14
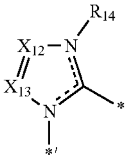
CY1-15
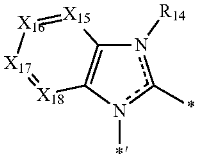
CY1-16
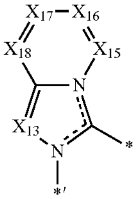
CY1-17
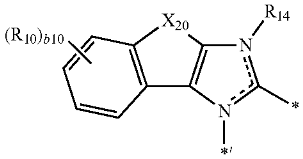
CY1-18
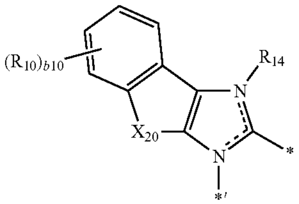

-continued
CY1-19
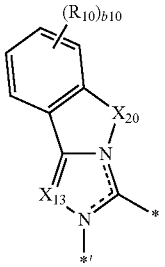
CY1-20
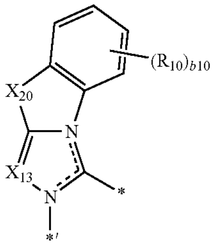
CY1-21
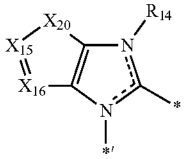
CY1-22
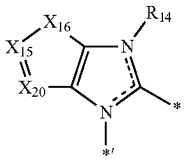
CY1-23
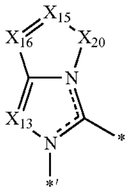
CY1-24
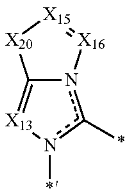
CY1-25
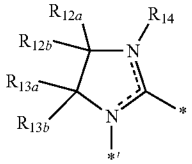
-continued
CY1-26
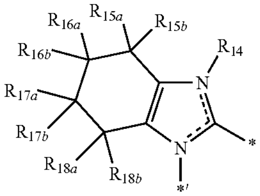
CY1-27
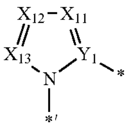
CY1-28
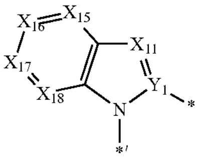
CY1-29
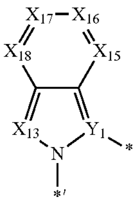
CY1-30
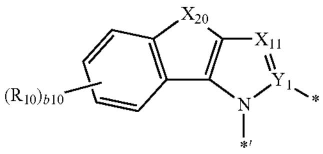
CY1-31
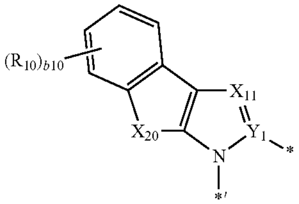
CY1-32
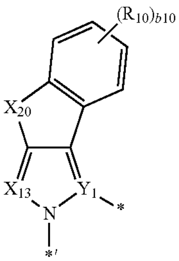
CY1-33
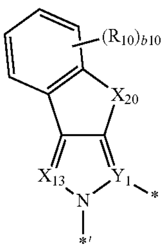

-continued
CY1-34
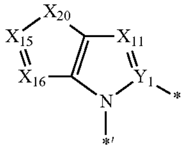
CY1-35
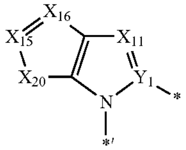
CY1-36
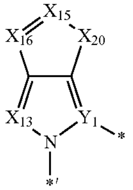
CY1-37
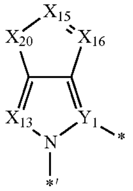
CY1-38
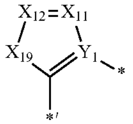
CY1-39
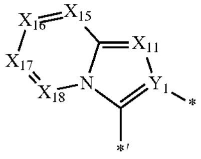
CY1-40
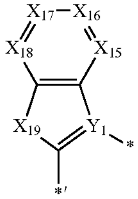
CY1-41
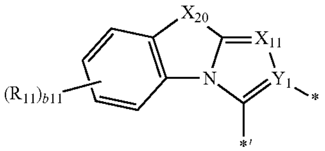
CY1-42
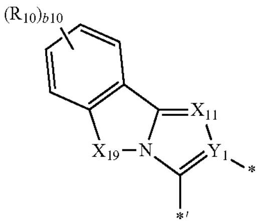
-continued
CY1-43
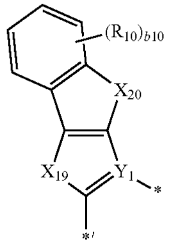
CY1-44
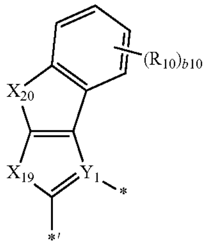
CY1-45
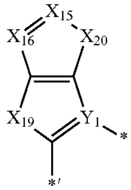
CY1-46
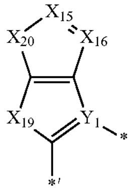
CY1-47
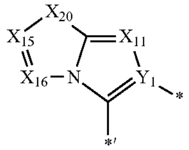
CY1-48
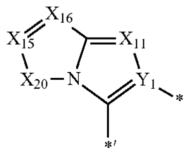
CY1-49
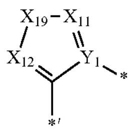
CY1-50
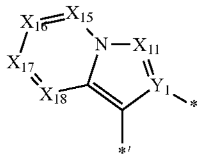

-continued
CY1-51
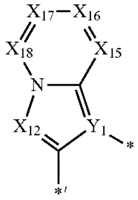
CY1-52
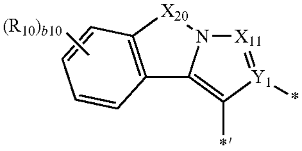
CY1-53
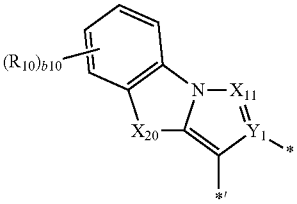
CY1-54
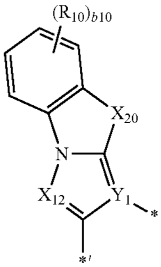
CY1-55
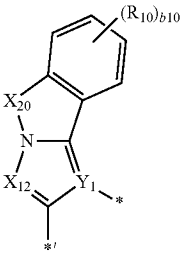
CY1-56
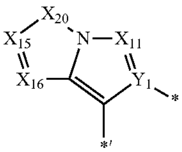
CY1-57
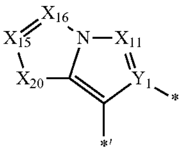
CY1-58
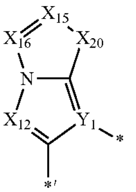
-continued
CY1-59
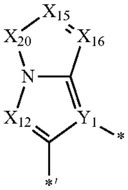
CY1-60
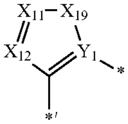
CY1-61
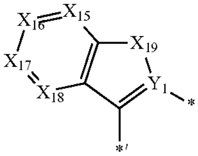
CY1-62
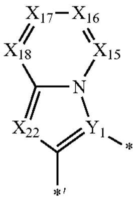
CY1-63
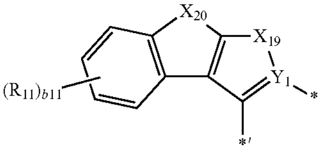
CY1-64
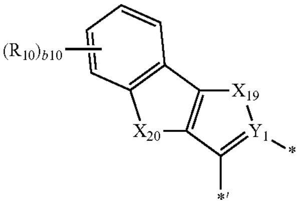
CY1-65
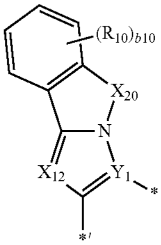
CY1-66
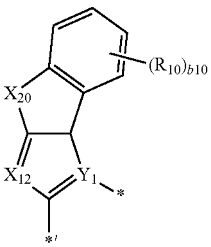

-continued
CY1-67
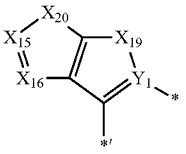
CY1-68
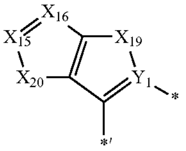
CY1-69
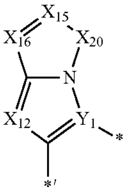
CY1-70
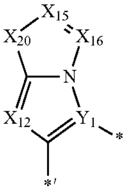
CY2-1
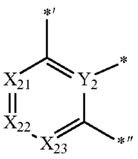
CY2-2
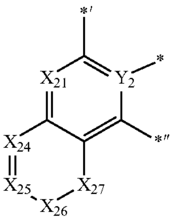
CY2-3
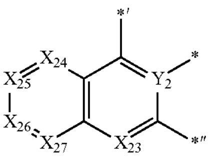
CY2-4
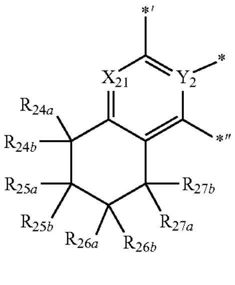
-continued
CY2-5
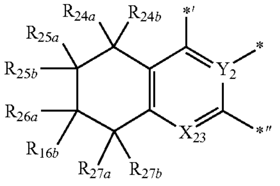
CY2-6
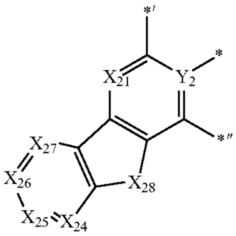
CY2-7
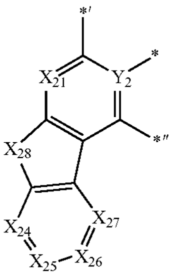
CY2-8
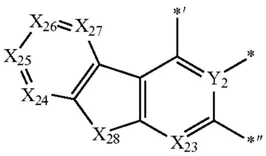
CY2-9
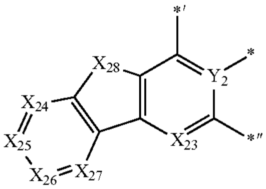
CY2-10
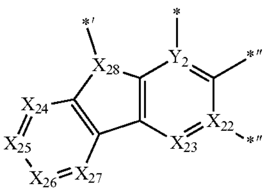
CY2-11
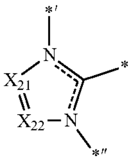
CY2-12
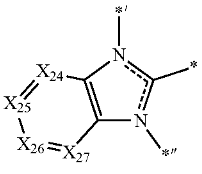

-continued
CY2-13
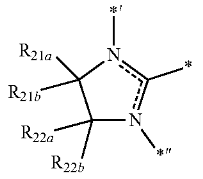
CY2-14
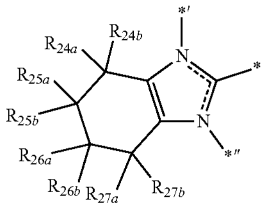
CY3-1
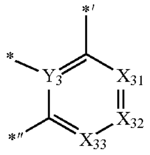
CY3-2
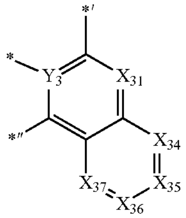
CY3-3
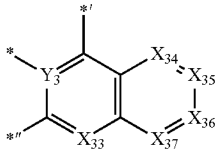
CY3-4
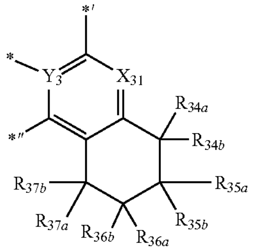
CY3-5
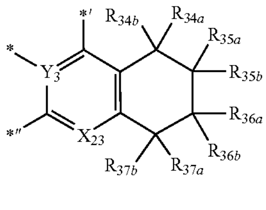
-continued
CY3-6
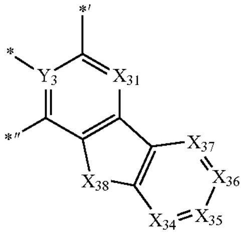
CY3-7
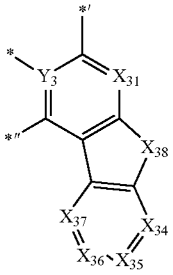
CY3-8
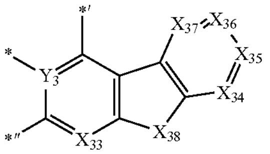
CY3-9
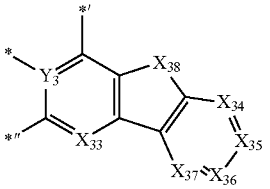
CY3-10
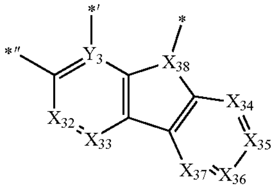
CY3-11
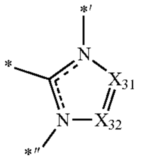
CY3-12
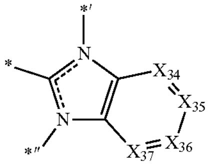
CY3-13
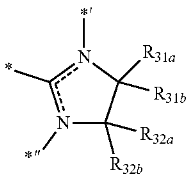

-continued
CY3-14
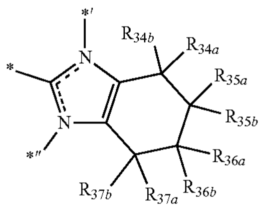
CY4-1
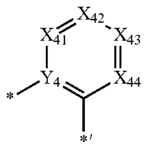
CY4-2
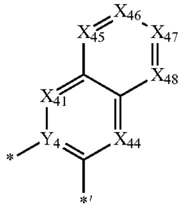
CY4-3
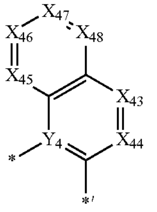
CY4-4
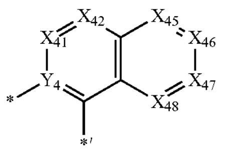
CY4-5
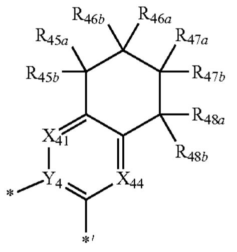
CY4-6
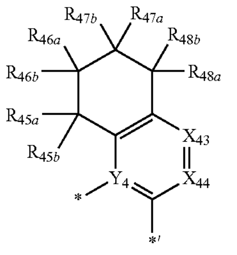
-continued
CY4-7
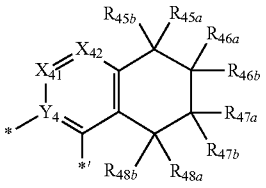
CY4-8
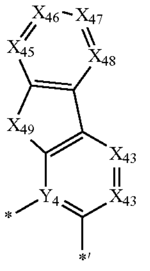
CY4-9
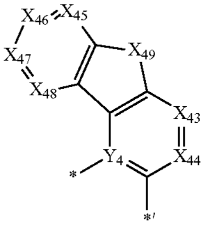
CY4-10
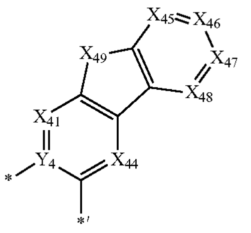
CY4-11
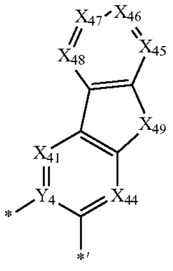
CY4-12
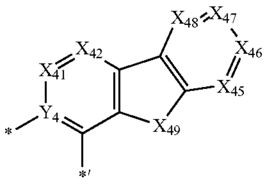
CY4-13
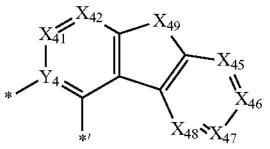

-continued
CY4-14
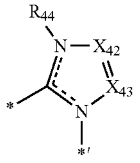
CY4-15
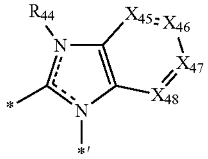
CY4-16
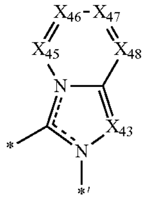
CY4-17
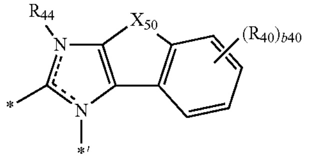
CY4-18
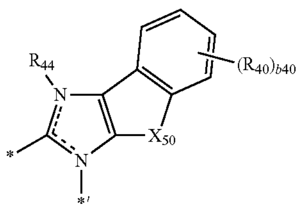
CY4-19
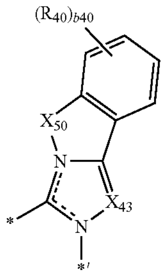
CY4-20
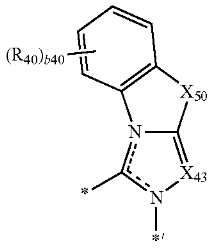
CY4-21
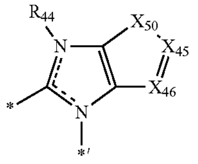
-continued
CY4-22
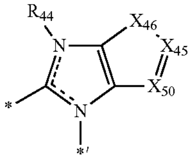
CY4-23
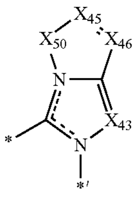
CY4-24
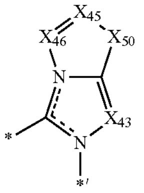
CY4-25
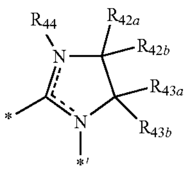
CY4-26
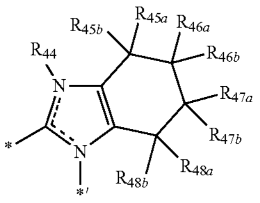
CY4-27
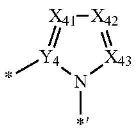
CY4-28
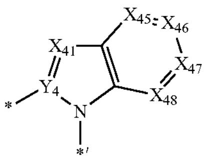
CY4-29
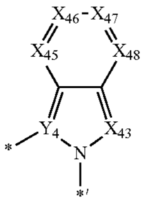
CY4-30
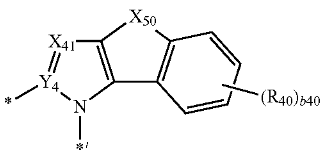

-continued
CY4-31
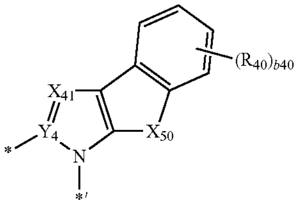
CY4-32
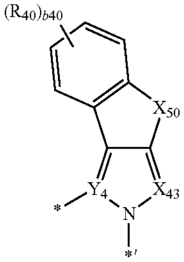
CY4-33
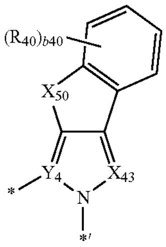
CY4-34
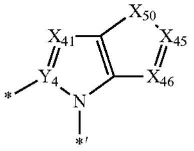
CY4-35
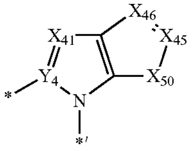
CY4-36
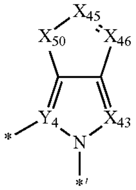
CY4-37
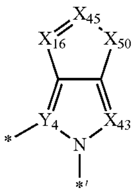
CY4-38
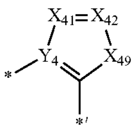
-continued
CY4-39
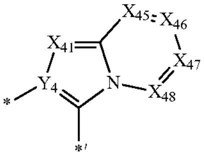
CY4-40
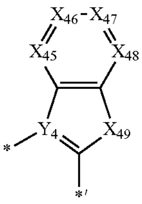
CY4-41
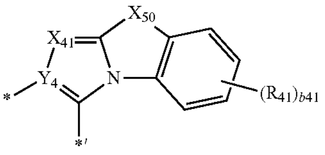
CY4-42
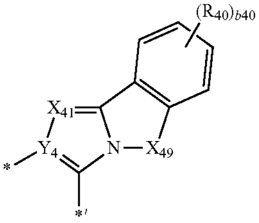
CY4-43
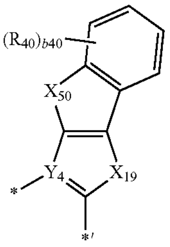
CY4-44
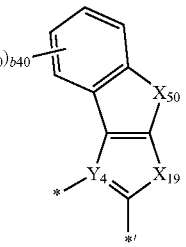
CY4-45
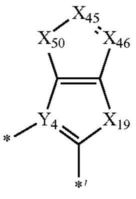

-continued
CY4-46
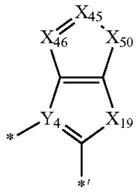
CY4-47
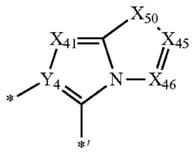
CY4-48
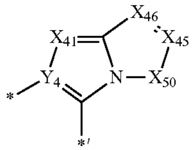
CY4-49
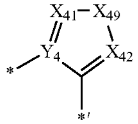
CY4-50
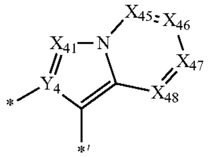
CY4-51
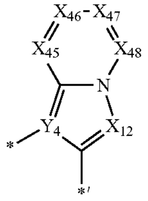
CY1-52
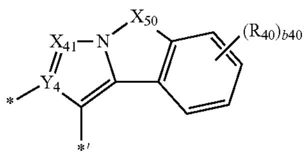
CY4-53
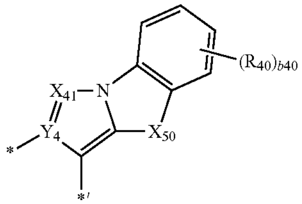
-continued
CY4-54
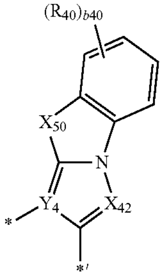
CY4-55
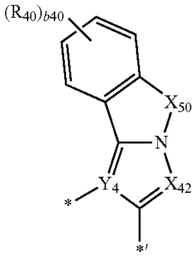
CY4-56
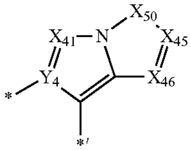
CY4-57
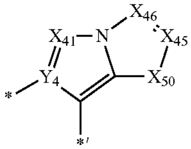
CY4-58
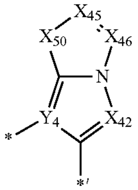
CY4-59
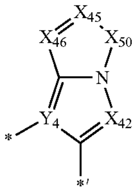
CY4-60
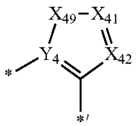
CY4-61
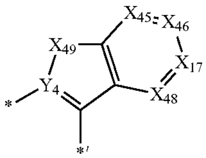

-continued

CY4-62

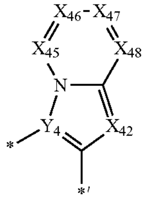

CY4-63

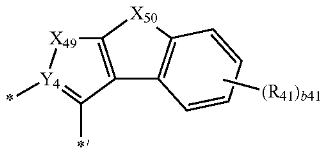

CY4-64

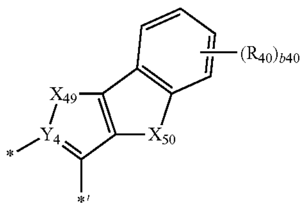

CY4-65

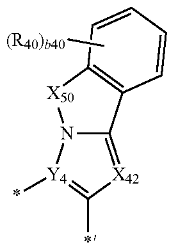

CY4-66

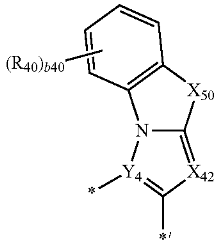

CY4-67

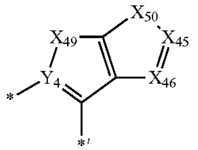

CY4-68

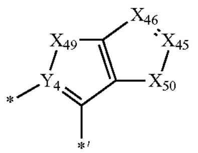

CY4-69

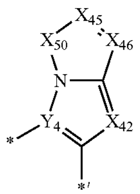

-continued

CY4-70

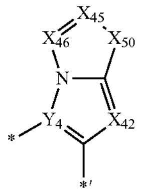

wherein, in Formulae CY1-1 to CY1-70, Formulae CY2-1 to CY2-14, CY3-1 to CY3-14, and Formulae CY4-1 to CY4-70, $Y_1$ to $Y_4$ each have the same meaning, independently from one another, as in claim 9, $X_{11}$ is $C(R_{11})$ or N, $X_{12}$ is $C(R_{12})$ or N, $X_{13}$ is $C(R_{13})$ or N, $X_{14}$ is $C(R_{14})$ or N, $X_{15}$ is $C(R_{15})$ or N, $X_{16}$ is $C(R_{16})$ or N, $X_{17}$ is $C(R_{17})$ or N, $X_{18}$ is $C(R_{18})$ or N, $X_{19}$ is $C(R_{19a})(R_{19b})$, $Si(R_{19a})(R_{19b})$, $N(R_{19})$, O, or S, $X_{20}$ is $C(R_{20a})(R_{20b})$, $Si(R_{20a})(R_{20b})$, $N(R_{20})$, O, or S, $X_{21}$ is $C(R_{21})$ or N, $X_{22}$ is $C(R_{22})$ or N, $X_{23}$ is $C(R_{23})$ or N, $X_{24}$ is $C(R_{24})$ or N, $X_{25}$ is $C(R_{25})$ or N, $X_{26}$ is $C(R_{26})$ or N, $X_{27}$ is $C(R_{27})$ or N, $X_{28}$ is $C(R_{28a})(R_{28b})$, $Si(R_{28a})(R_{28b})$, $N(R_{28})$, O, or S, $X_{31}$ is $C(R_{31})$ or N, $X_{32}$ is $C(R_{32})$ or N, $X_{33}$ is $C(R_{33})$ or N, $X_{34}$ is $C(R_{34})$ or N, $X_{35}$ is $C(R_{35})$ or N, $X_{36}$ is $C(R_{36})$ or N, $X_{37}$ is $C(R_{37})$ or N, $X_{38}$ is $C(R_{38a})(R_{38b})$, $Si(R_{38a})(R_{38b})$, $N(R_{38})$, O, or S, $X_{41}$ is $C(R_{41})$ or N, $X_{42}$ is $C(R_{42})$ or N, $X_{43}$ is $C(R_{43})$ or N, $X_{44}$ is $C(R_{44})$ or N, $X_{45}$ is $C(R_{45})$ or N, $X_{46}$ is $C(R_{46})$ or N, $X_{47}$ is $C(R_{47})$ or N, $X_{48}$ is $C(R_{48})$ or N, $X_{49}$ is $C(R_{49a})(R_{49b})$, $Si(R_{49a})(R_{49b})$, $N(R_{49})$, O, or S, $X_{50}$ is $C(R_{50a})(R_{50b})$, $Si(R_{50a})(R_{50b})$, $N(R_{50})$, O, or S, $R_{10}$ to $R_{20}$, $R_{12a}$, $R_{13a}$, $R_{15a}$ to $R_{20a}$, $R_{12b}$, $R_{13b}$, and $R_{15b}$ to $R_{20b}$ each has, independently from one another, the same meaning as $R_1$ in claim 9, $R_{21}$ to $R_{28}$, $R_{21a}$, $R_{22a}$, $R_{24a}$ to $R_{28a}$, $R_{21b}$, $R_{22b}$, and $R_{24b}$ to $R_{28b}$ each has, independently from one another, the same meaning as $R_2$ in claim 9, $R_{31}$ to $R_{38}$, $R_{31a}$, $R_{32a}$, $R_{34a}$ to $R_{38a}$, $R_{31b}$, $R_{32b}$, and $R_{34b}$ each has, independently from one another, the same meaning as $R_3$ in claim 9, $R_{40}$ to $R_{50}$, $R_{42a}$, $R_{43a}$, $R_{45a}$ to $R_{50a}$, $R_{42b}$, $R_{43b}$, and $R_{45b}$ to $R_{50b}$ each has, independently from one another, the same meaning as $R_4$ in claim 9, b10, b11, b40, and b41 are each, independently from one another, an integer of from 1 to 4,

* indicates a binding site to M, and

*' in Formulae CY1-1 to CY1-70 indicates a binding site to $T_1$, *' in Formulae CY2-1 to CY2-14 indicates a binding site to $T_1$ and *" indicates a binding site to $T_2$, *' in Formulae CY3-1 to CY3-14 indicates a binding site to $T_3$, and *" indicates a binding site to $T_2$, and *' in Formulae CY4-1 to CY4-70 indicates a binding site to $T_3$.

12. The organometallic compound of claim 9, wherein $Y_1$, $Y_3$, and $Y_4$ are each C and $Y_2$ is N; or $Y_1$ to $Y_3$ are each C and $Y_4$ is N.

13. The organometallic compound of claim 9, wherein, when $X_1$ is C, $A_1$ is a coordinate bond.

14. The organometallic compound of claim 9, wherein a moiety of

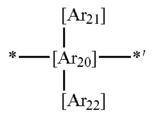
in Formula 2 is a group of one of Formulae 2-1 to 2-20:
2-1
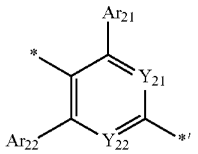
2-2
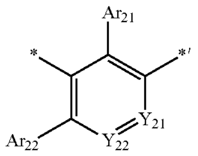
2-3
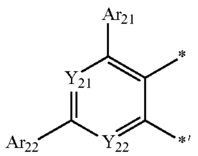
2-4
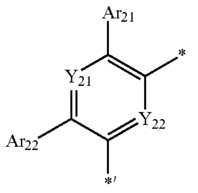
2-5
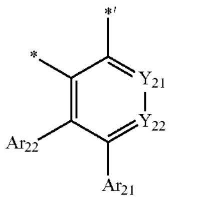
2-6
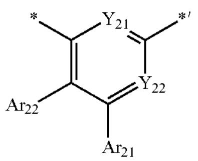
2-7
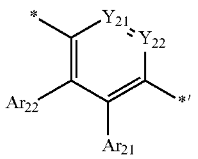
-continued
2-8
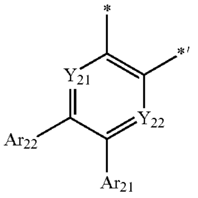
2-9
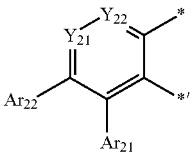
2-10
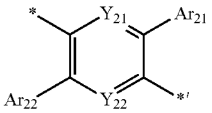
2-11
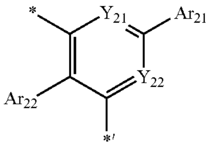
2-12
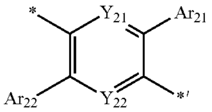
2-13
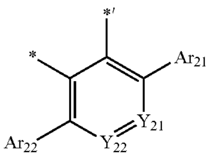
2-14
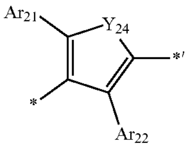
2-15
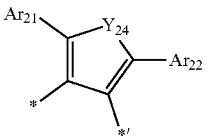
2-16
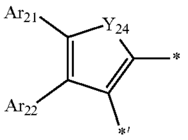
2-17
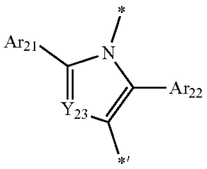

-continued 2-18

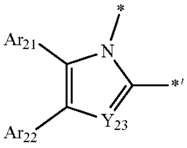

2-19

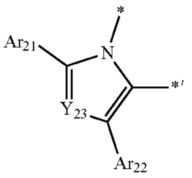

2-20

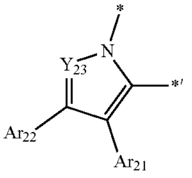

wherein, in Formula 2-1 to 2-20, $Y_{21}$ is N or $C(Z_{21})$, $Y_{22}$ is N or $C(Z_{23})$, $Y_{23}$ is N or $C(Z_{23})$, $Y_{24}$ is O, S, $C(Z_{24})(Z_{25})$, or $N(Z_{24})$,

* is a binding site to CY1, *' is a binding site to a neighboring atom, $Z_{21}$ to $Z_{25}$ each has, independently from one another, the same meaning as $R_1$ in claim 9, but neighboring groups among $Z_{21}$ to $Z_{25}$ are optionally linked to form a $C_2$-$C_{30}$ heterocyclic group unsubstituted or substituted with at least one $R_{10a}$ or a $C_3$-$C_{30}$ carbocyclic group unsubstituted or substituted with at least one $R_{10a}$, and $R_{10a}$, $Ar_{21}$, and $Ar_{22}$ each has, independently from one another, the same meaning as in claim 9.

15. The organometallic compound of claim 9, wherein Formula 2 is of Formula 2A:

Formula 2A

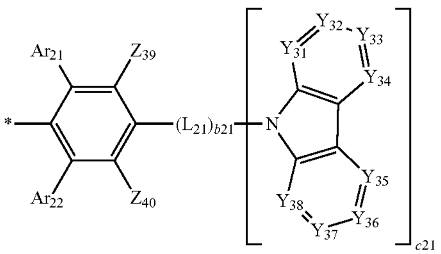

wherein, in Formula 2A, $Y_{31}$ is N or $C(Z_{31})$, $Y_{32}$ is N or $C(Z_{32})$, $Y_{33}$ is N or $C(Z_{33})$, $Y_{34}$ is N or $C(Z_{34})$, $Y_{35}$ is N or $C(Z_{35})$, $Y_{36}$ is N or $C(Z_{36})$, $Y_{37}$ is N or $C(Z_{37})$, $Y_{38}$ is N or $C(Z_{38})$,

* indicates a binding site to a neighboring atom, and $Ar_{21}$ and $Ar_{22}$, $L_{21}$, b21, and c21 each has, independently from one another, the same meaning as in claim 9, and $Z_{31}$ to $Z_{40}$ each has, independently from one another, the same meaning as $R_1$ in claim 9.

16. The organometallic compound of claim 9, wherein at least one of $Ar_{20}$ to $Ar_{24}$ in Formula 2 comprises at least one deuterium.

17. The organometallic compound of claim 9, wherein the organometallic compound is of Formula 1-1:

Formula 1-1

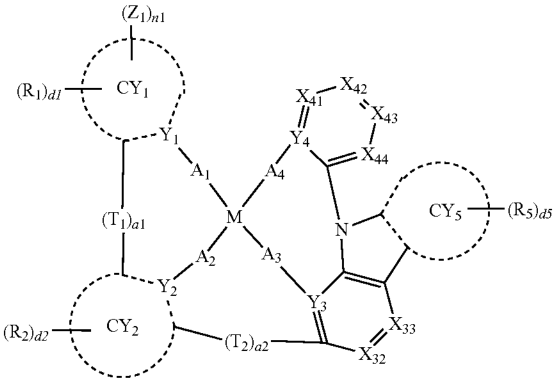

wherein, in Formula 1-1,

M, $Y_1$ to $Y_4$, CY1, CY2, $A_1$ to $A_4$, $T_1$, $T_2$, a1, a2, $R_1$, $R_2$, $Z_1$, d1, d2, and n1 each has, independently from one another, the same meaning as in claim 9, $X_{32}$ is $C(R_{32})$ or N, $X_{33}$ is $C(R_{33})$ or N, $X_{41}$ is $C(R_{41})$ or N, $X_{42}$ is $C(R_{42})$ or N, $X_{43}$ is $C(R_{43})$ or N, $X_{44}$ is $C(R_{44})$ or N, CY5 is a $C_5$-$C_{60}$ carbocyclic group or a $C_1$-$C_{60}$ heterocyclic group, d5 is an integer of 1 to 8, $R_5$, $R_{32}$, and $R_{33}$ each has, independently from one another, the same meaning as $R_3$ in claim 9, and $R_{41}$ to $R_{44}$ each has, independently from one another, the same meaning as $R_4$ in claim 9.

18. The organometallic compound of claim 9, wherein the organometallic compound is of Formula 1-2 or 1-3:

Formula 1-2

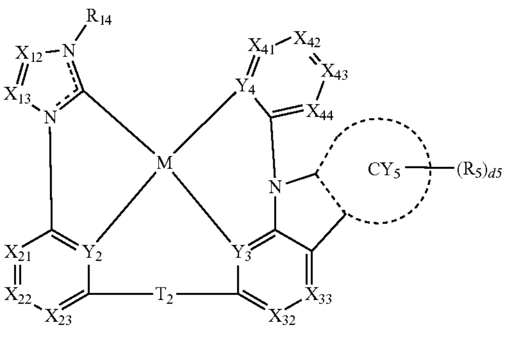

-continued

Formula 1-3

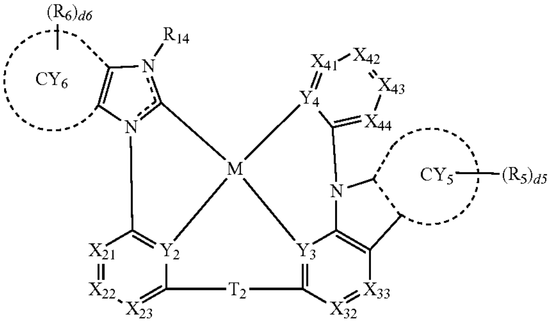

wherein, in Formulae 1-2 and 1-3,

M, $Y_2$ to $Y_4$, and $T_2$ each has, independently from one another, the same meaning as in claim 9, $X_{12}$ is $C(R_{12})$ or N, $X_{13}$ is $C(R_{13})$ or N, $X_{21}$ is $C(R_{21})$ or N, $X_{22}$ is $C(R_{22})$ or N, $X_{23}$ is $C(R_{23})$ or N, $X_{32}$ is $C(R_{32})$ or N, $X_{33}$ is $C(R_{33})$ or N, $X_{41}$ is $C(R_{41})$ or N, $X_{42}$ is $C(R_{42})$ or N, $X_{43}$ is $C(R_{43})$ or N, $X_{44}$ is $C(R_{44})$ or N, $R_6$ and $R_{12}$ to $R_{14}$ each has, independently from one another, the same meaning as $R_1$ in claim 9, $R_{21}$ to $R_{23}$ each has, independently from one another, the same meaning as $R_2$ in claim 1, $R_5$, $R_{32}$, and $R_{33}$ each has, independently from one another, the same meaning as $R_3$ in claim 9, $R_{41}$ to $R_{44}$ each has, independently from one another, the same meaning as $R_4$ in claim 9, $CY_5$ and $CY_6$ are each, independently from one another, a $C_5$-$C_{60}$ carbocyclic group or a $C_1$-$C_{60}$ heterocyclic group, d5 and d6 are each, independently from one another, an integer of 1 to 8, and at least one of $R_{12}$ to $R_{14}$ in Formula 1-2 is a group of Formula 2, and at least one of $R_6$ in the number of d6 and $R_{14}$(s) in Formula 1-3 is a group of Formula 2.

19. An organometallic, wherein the organometallic compound is one of Compounds 2 to 12 14 to 16, or 20 to 99:

2

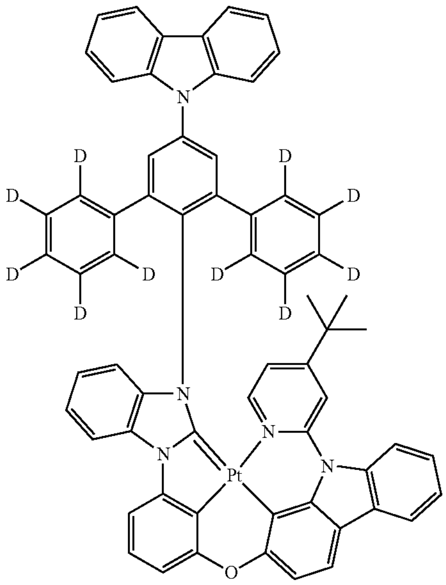

-continued

3

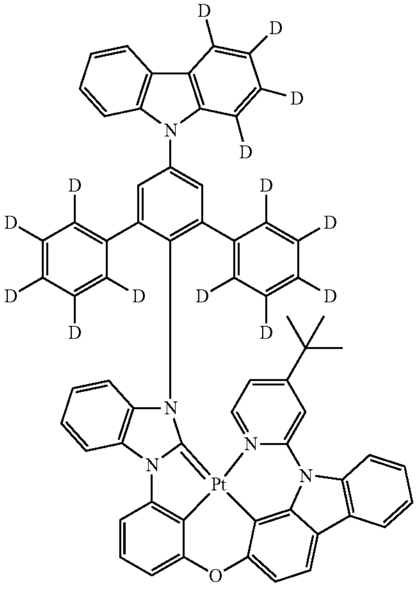

4

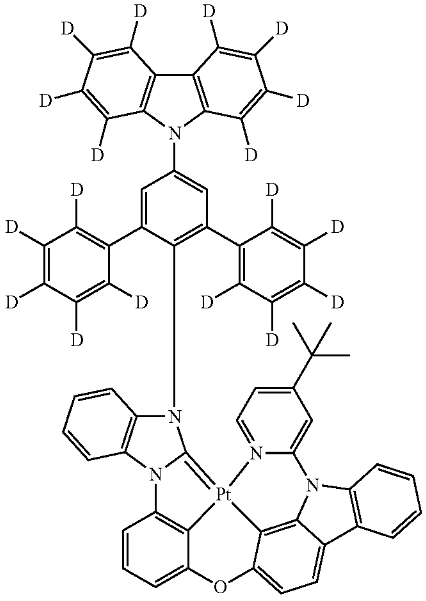

-continued
5
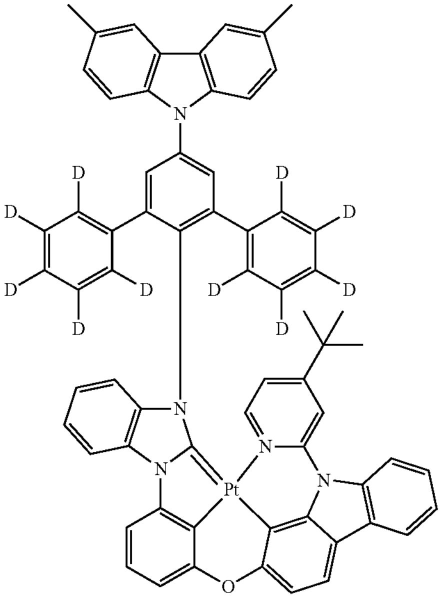
6
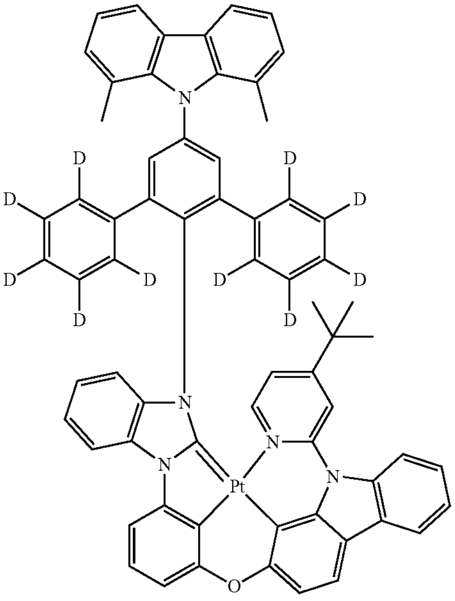
-continued
7
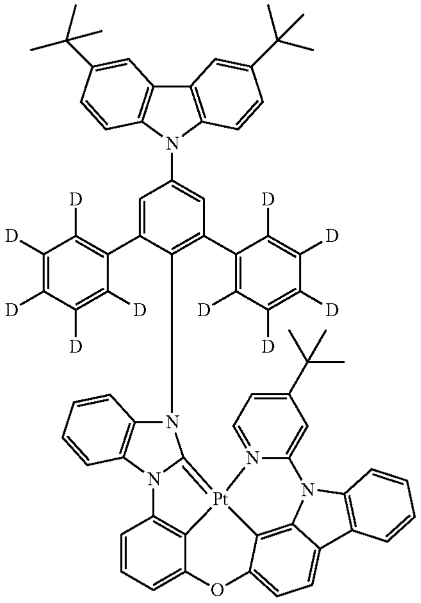
8
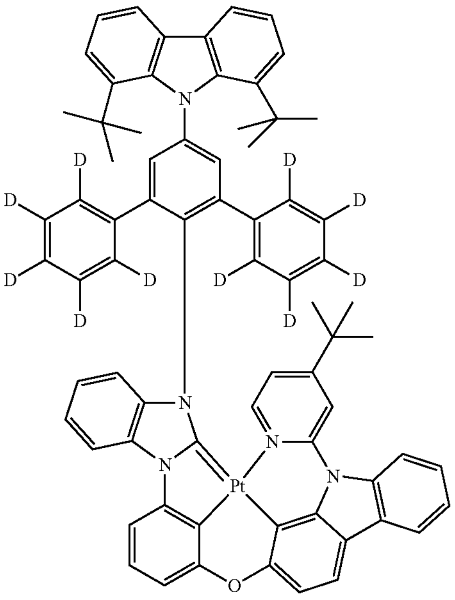

-continued
9
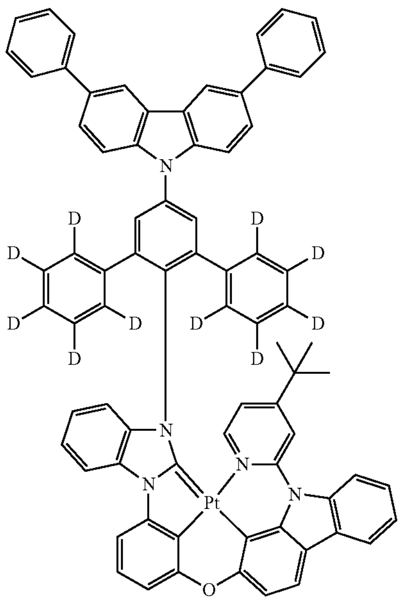
11
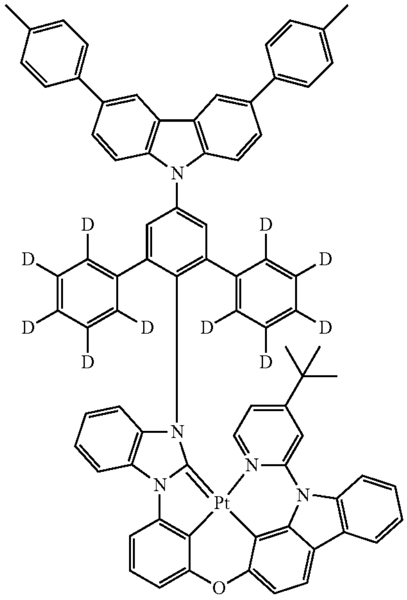
10
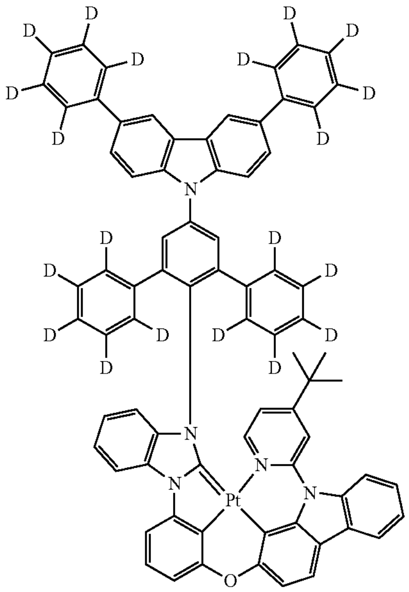
12
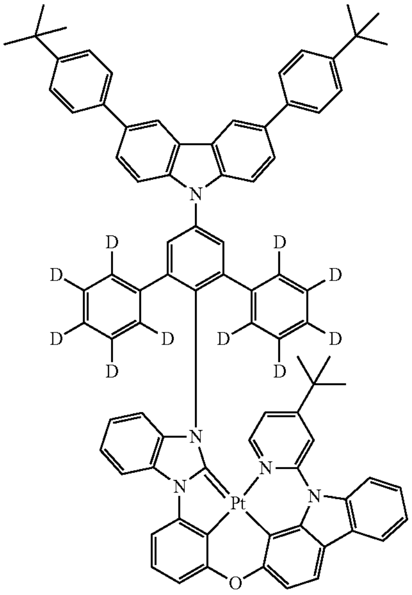

-continued
14
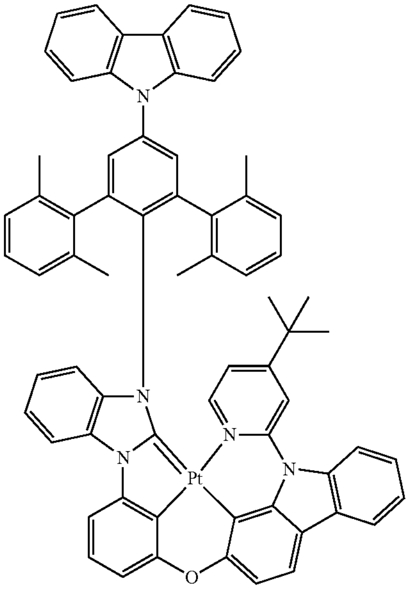
-continued
16
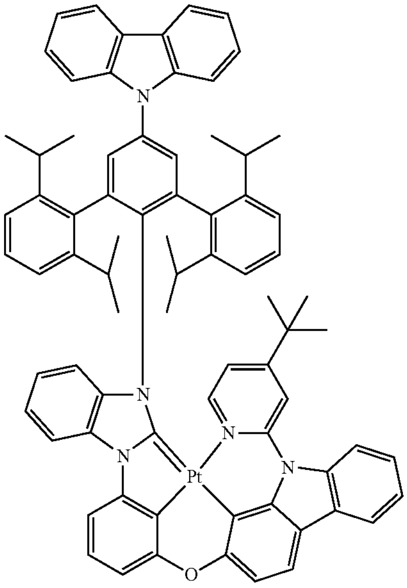
15
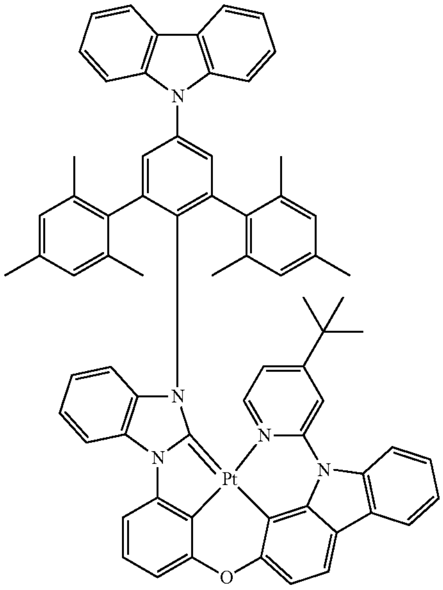
20
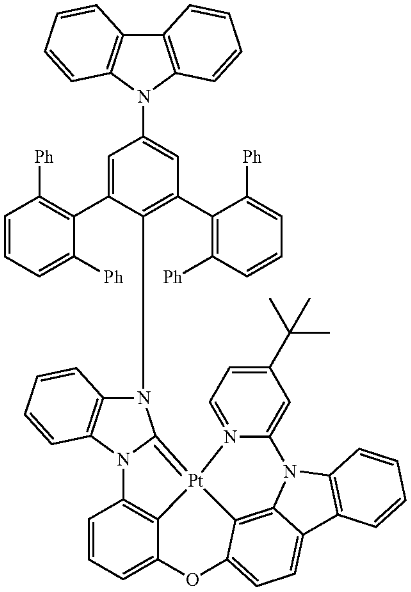

-continued
21
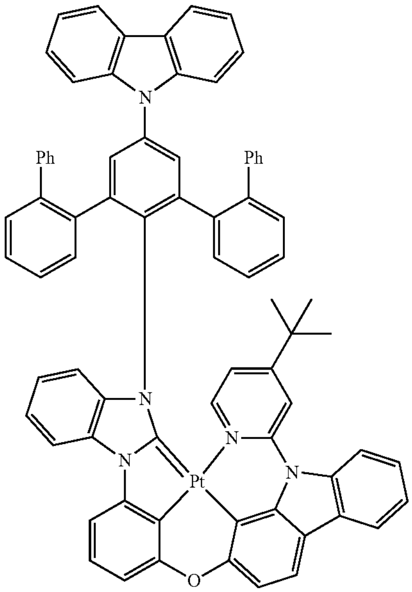
22
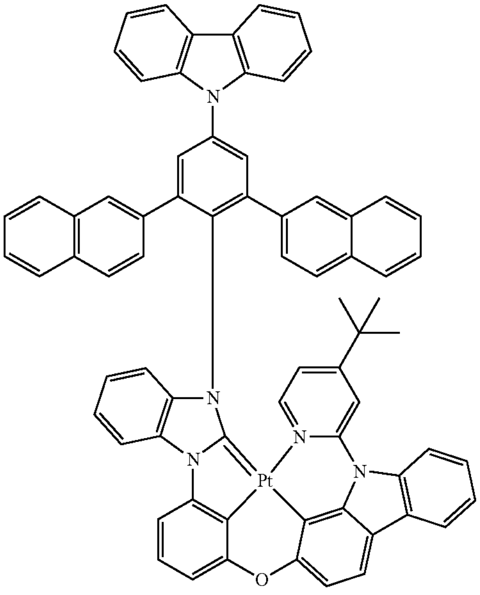
-continued
23
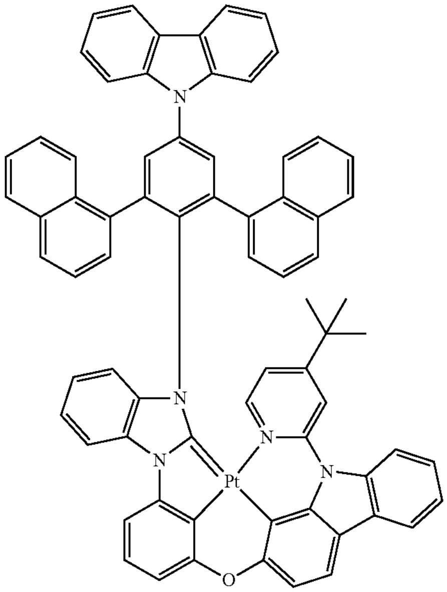
24
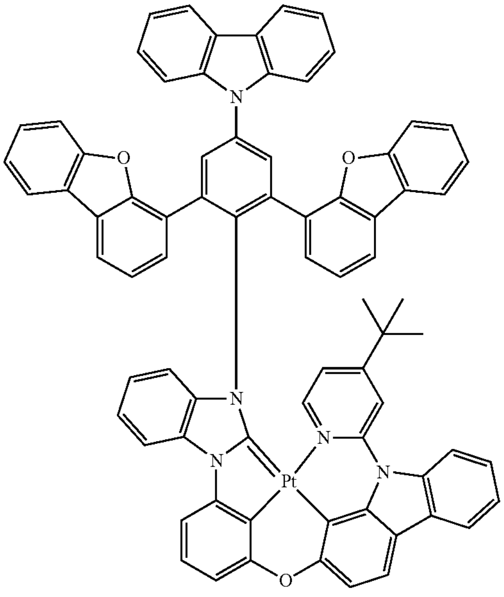

-continued
25
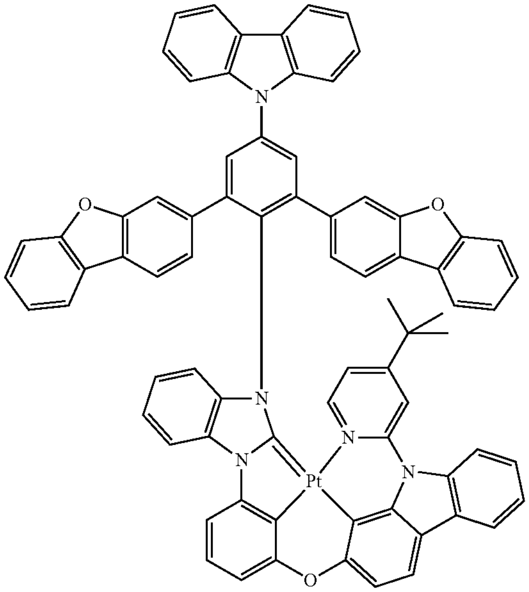
27
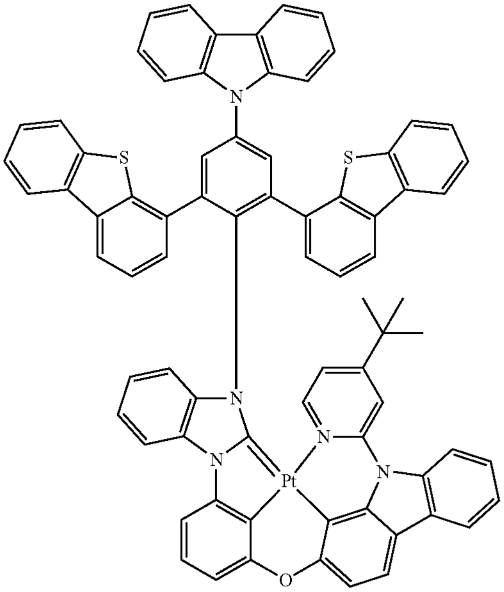
26
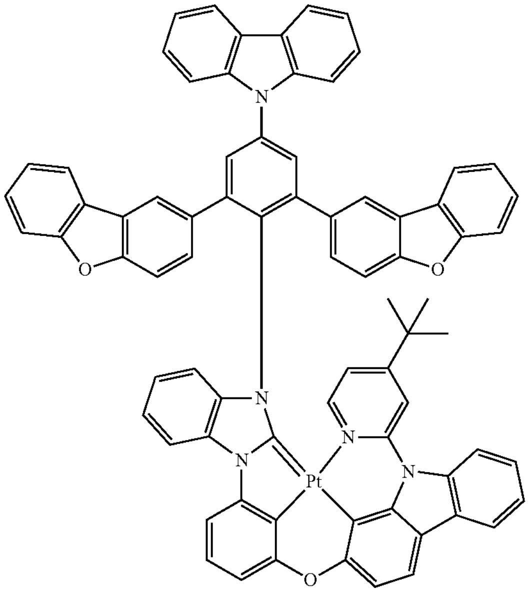
28
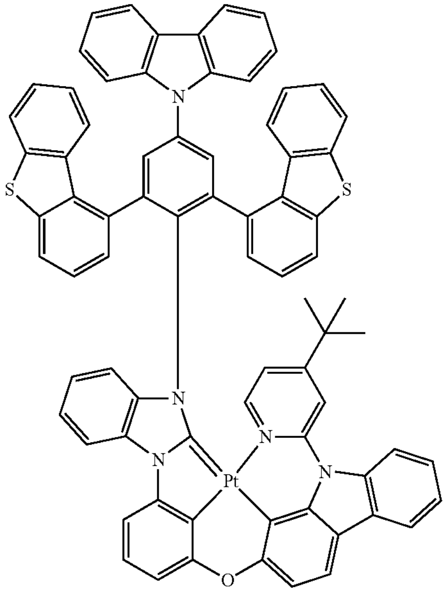

-continued
29
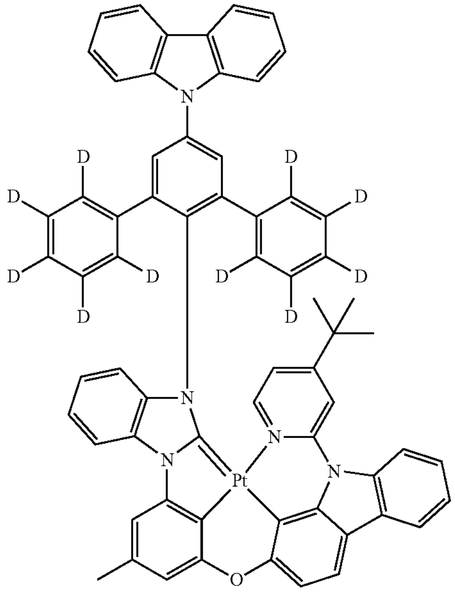
31
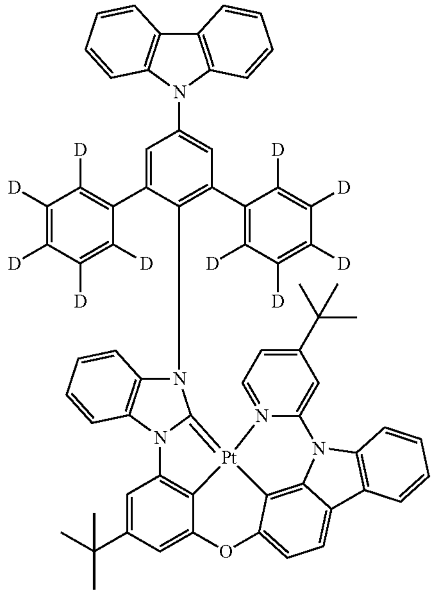
30
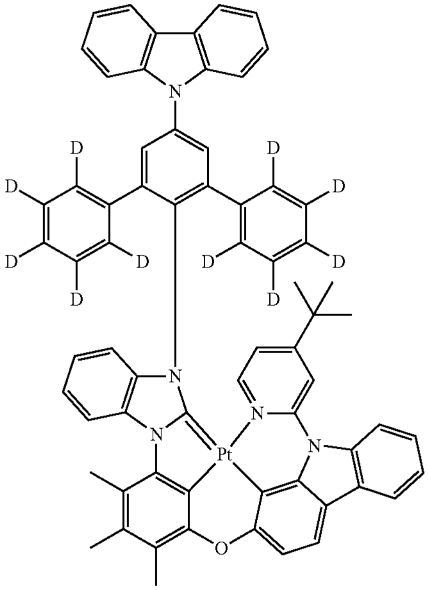
32
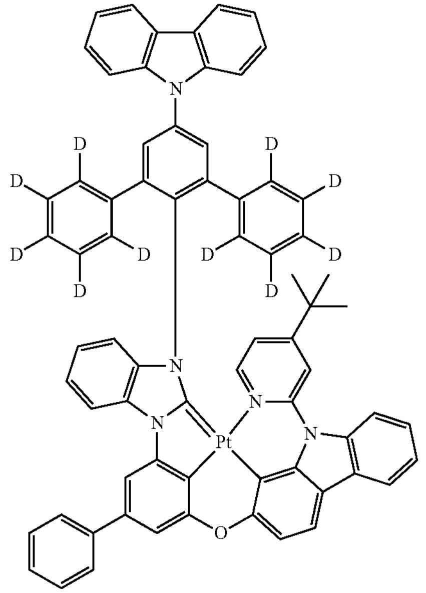

-continued
33
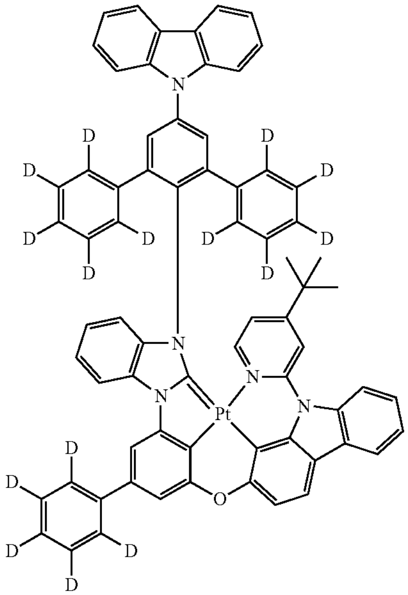
34
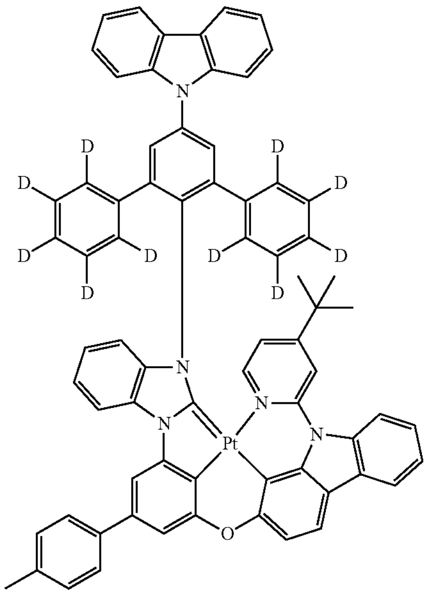
-continued
35
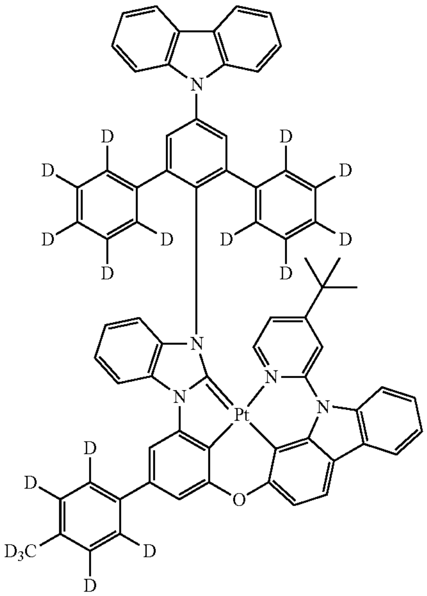
36
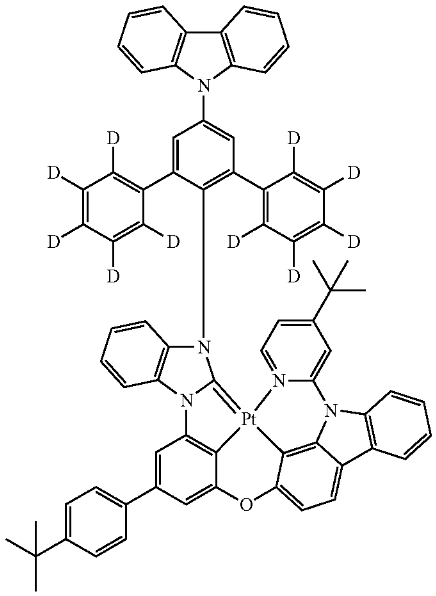

-continued
37
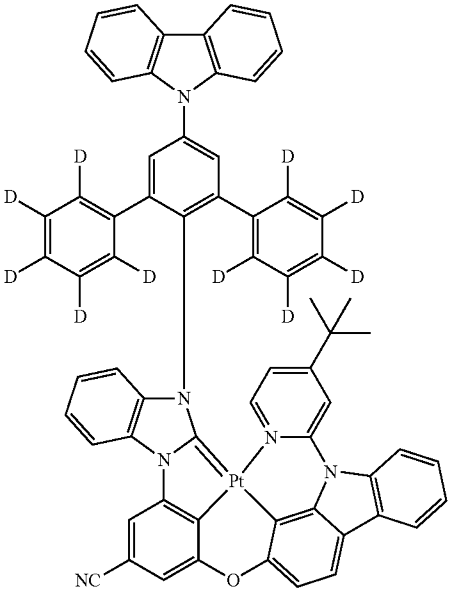
39
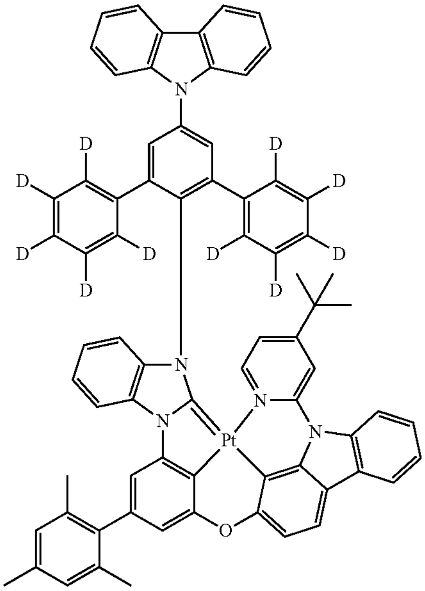
38
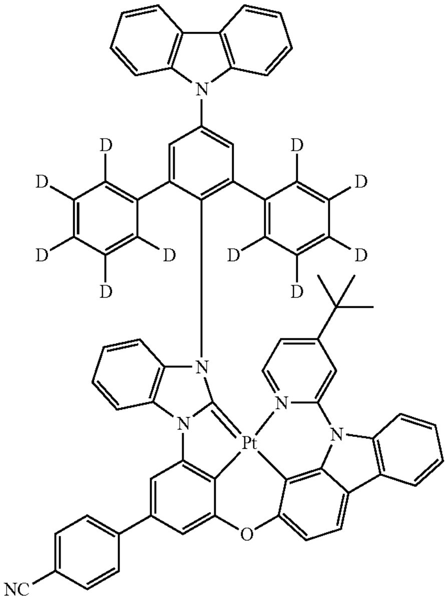
40
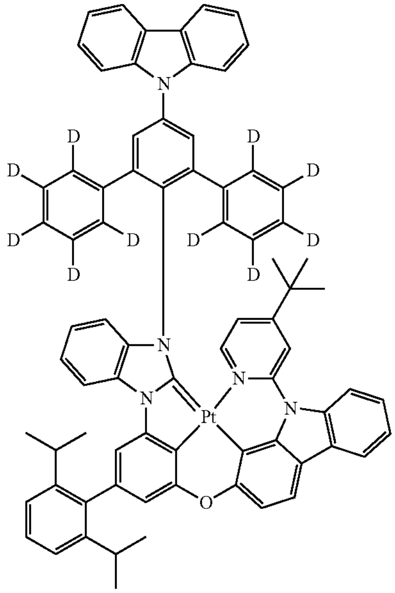

-continued
41
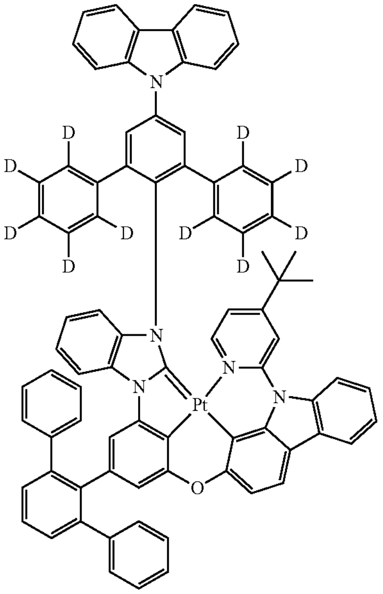
42
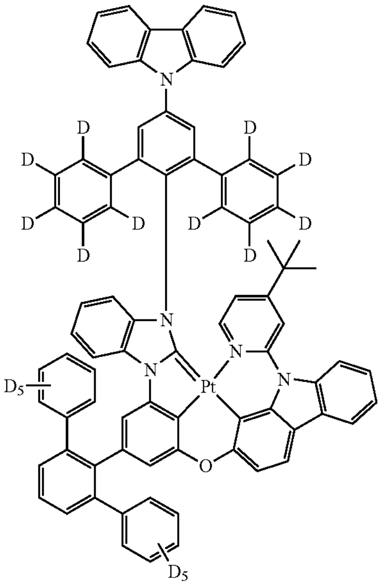
-continued
43
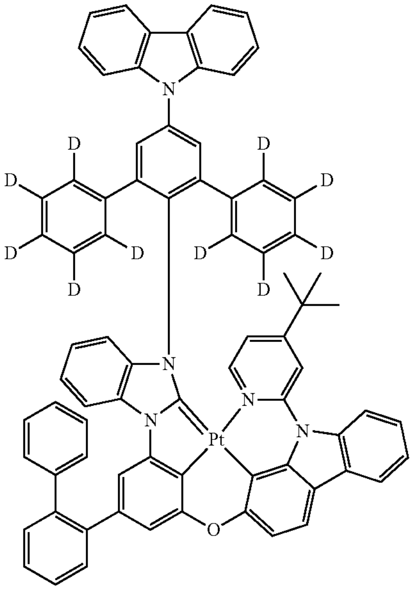
44
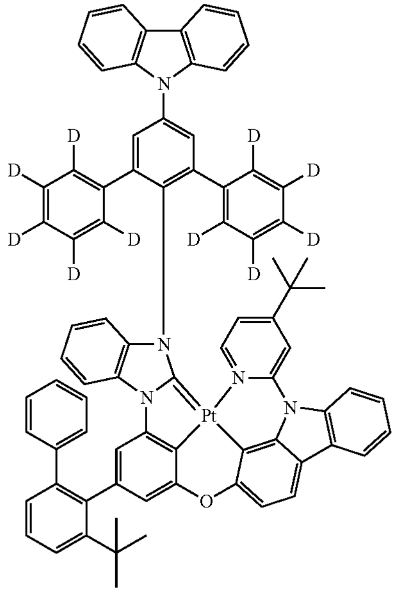

-continued
45
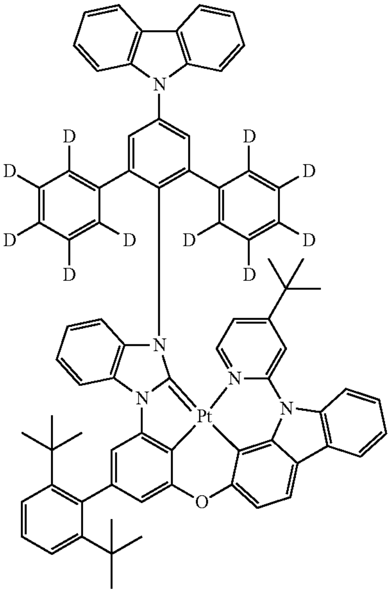
46
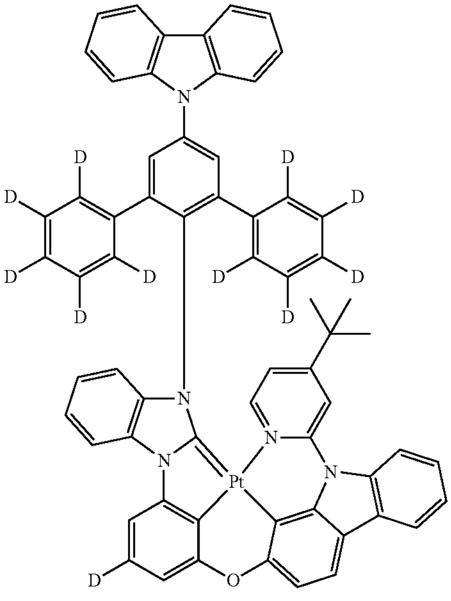
-continued
47
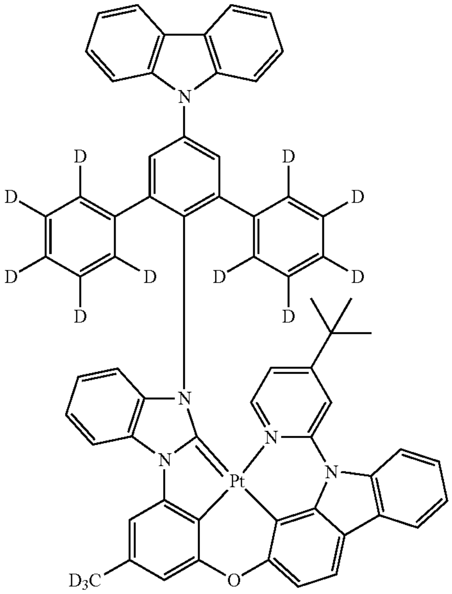
48
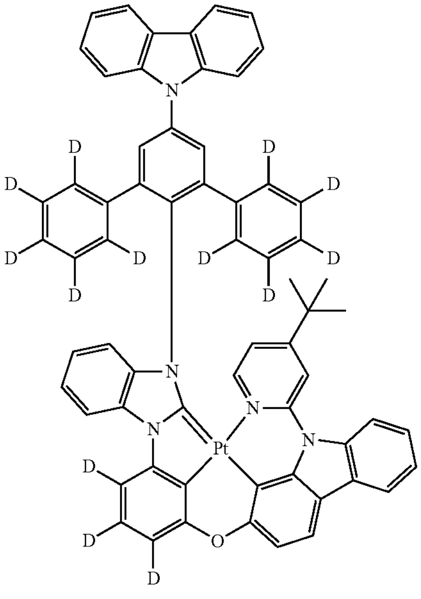

-continued
49
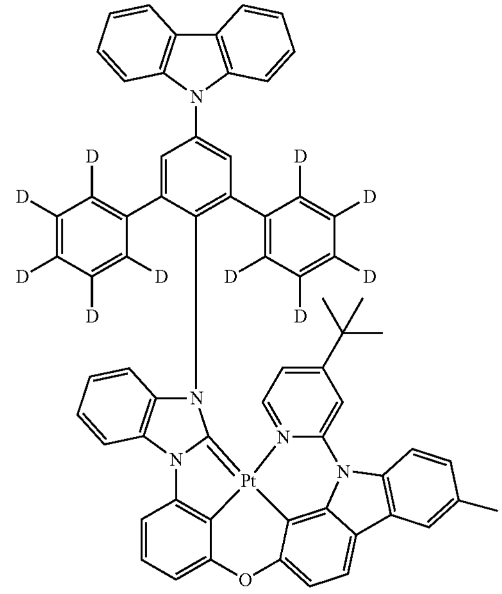
50
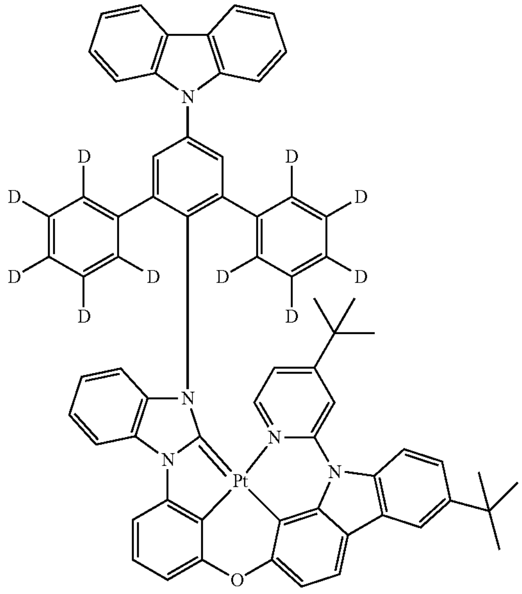
-continued
51
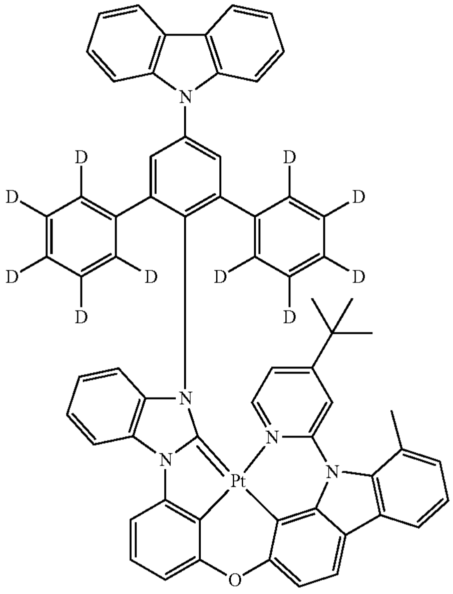
52
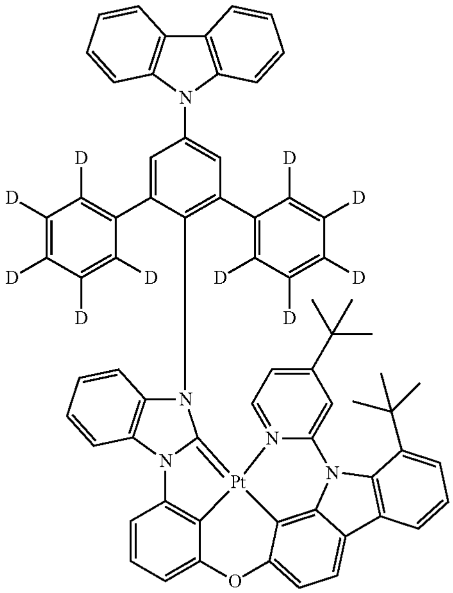

-continued
53
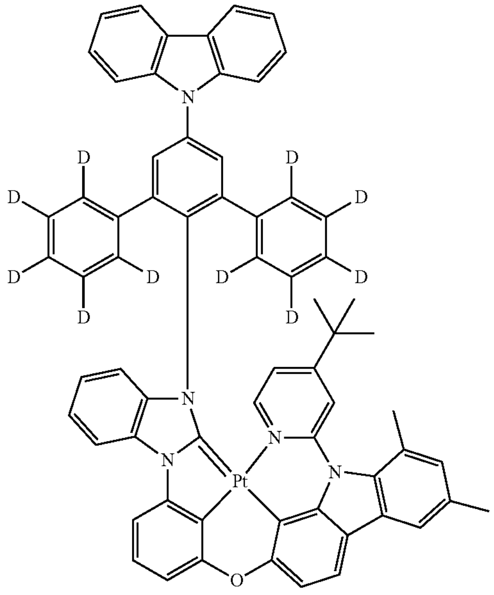
55
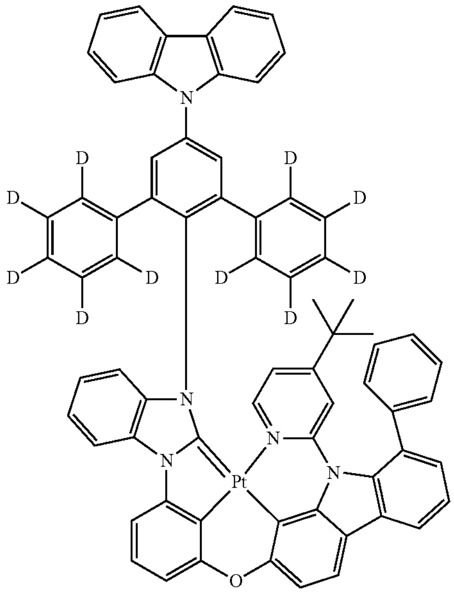
54
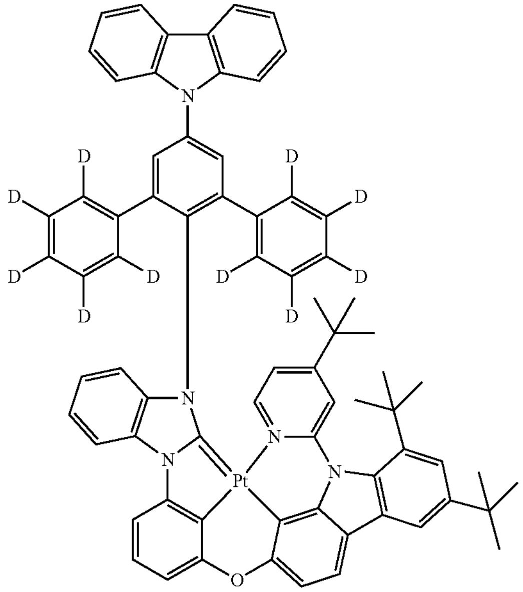
56
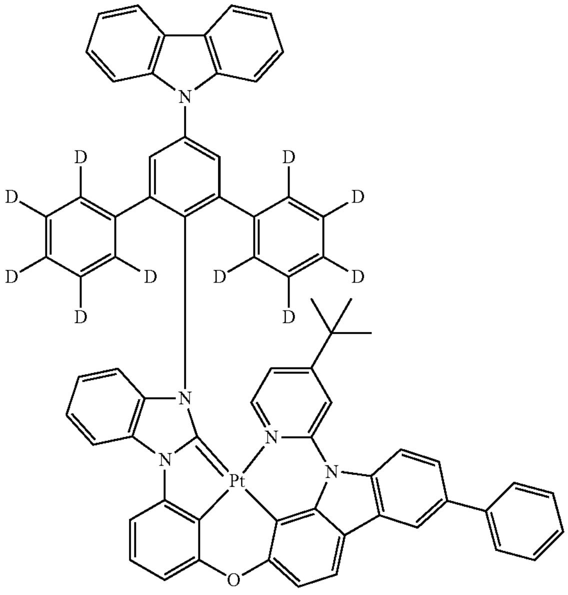

-continued
57
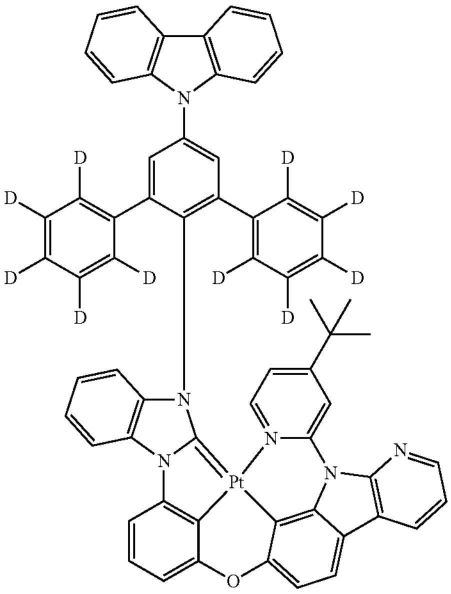
58
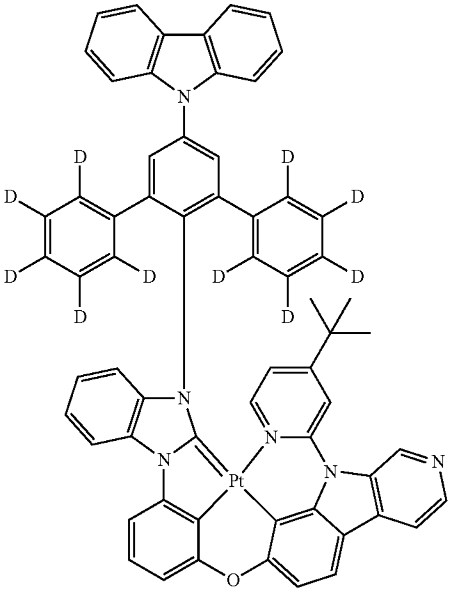
-continued
59
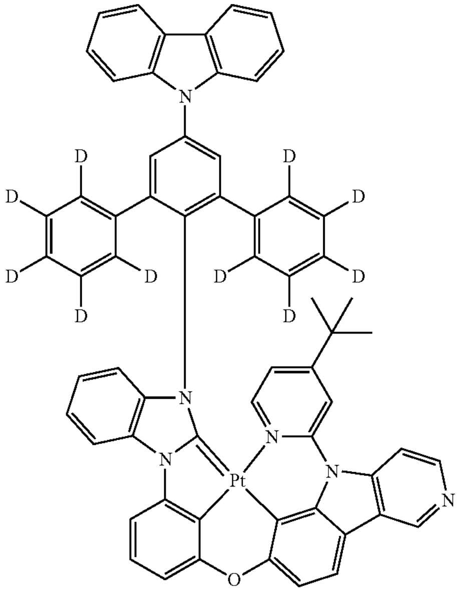
60
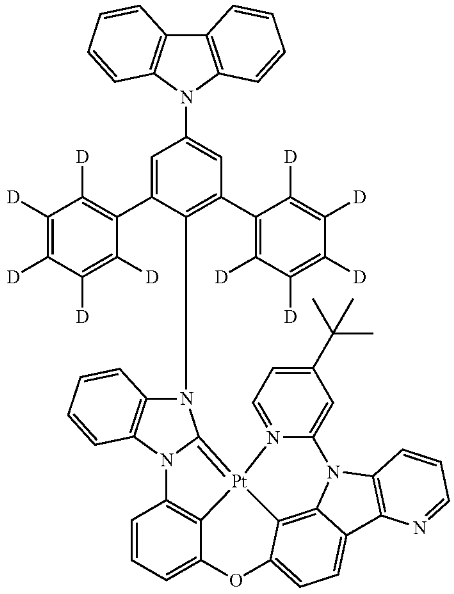

-continued
61
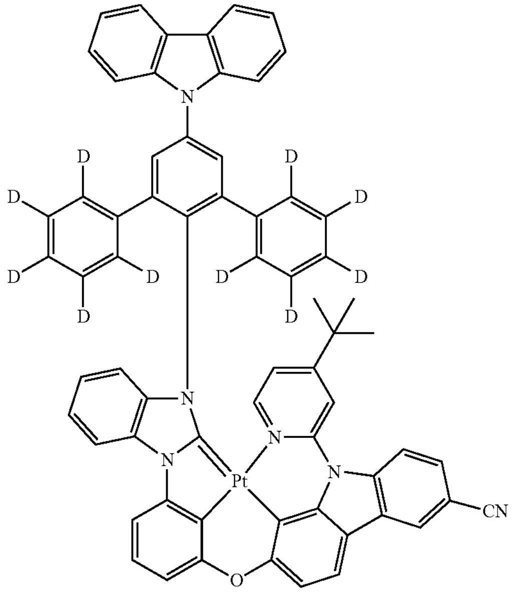
62
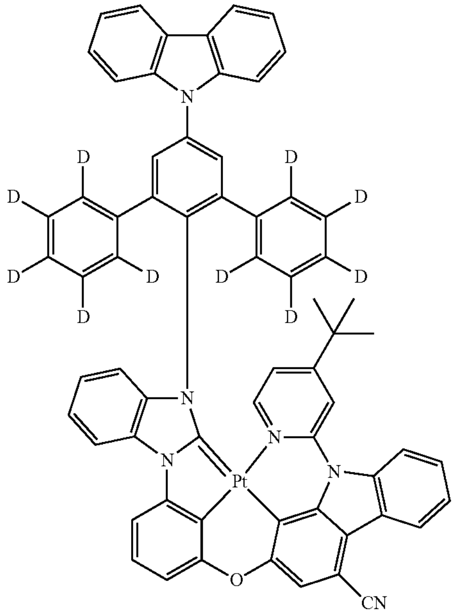
-continued
63
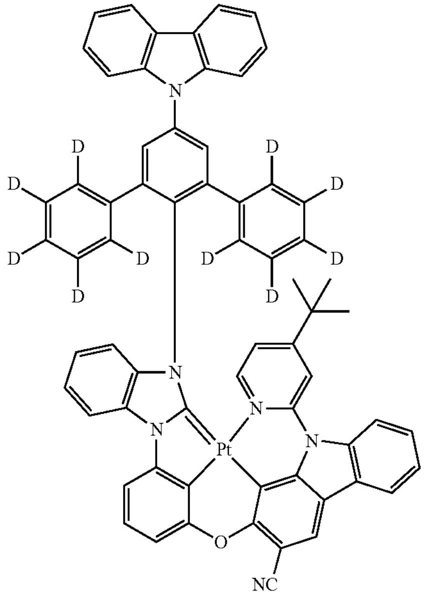
64
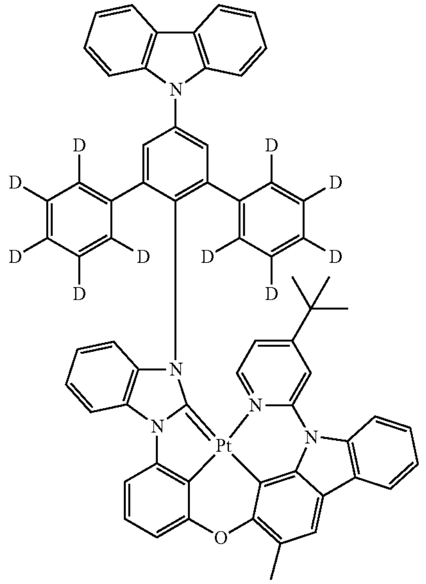

-continued
65
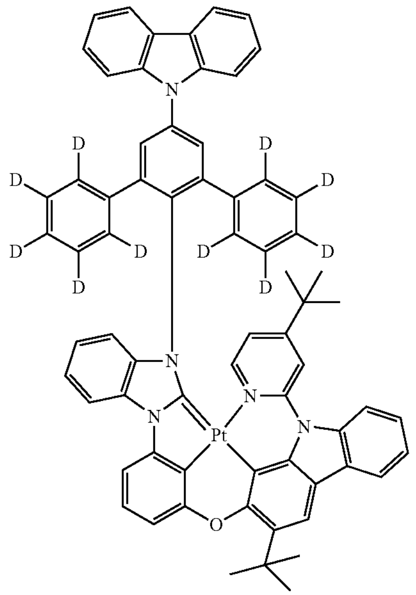
66
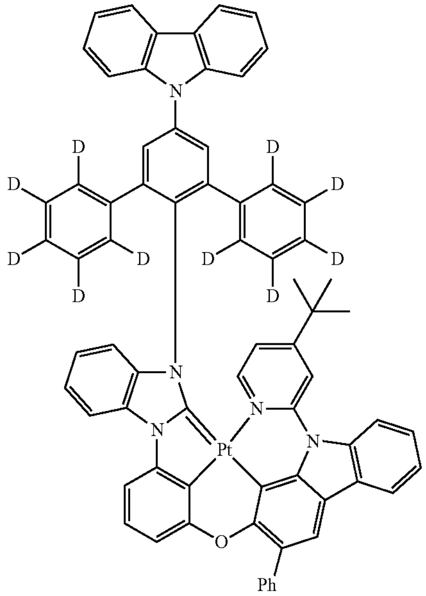
-continued
67
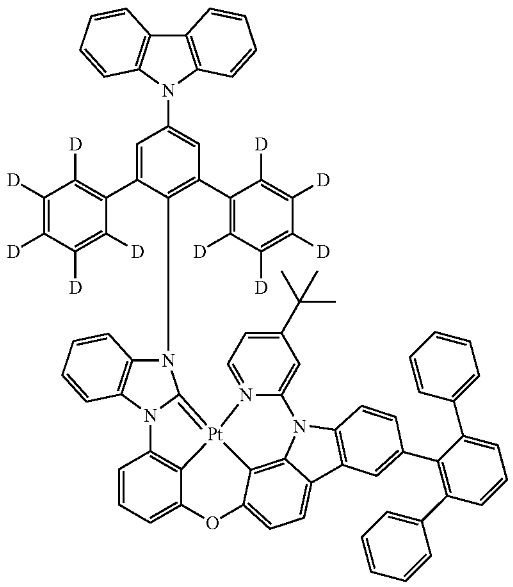
68
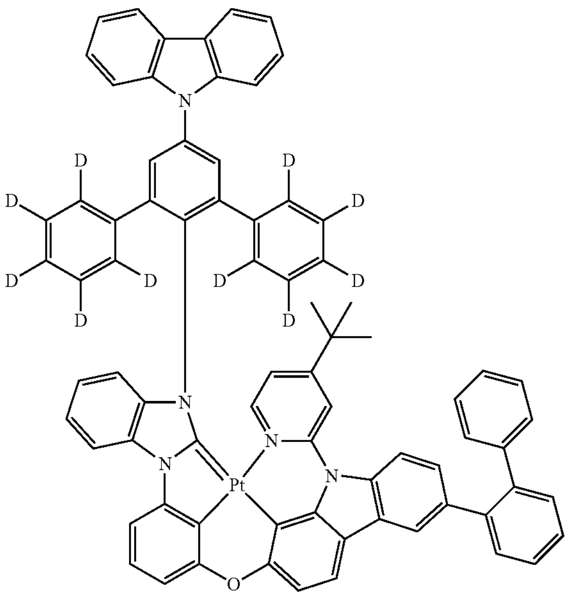

-continued
69
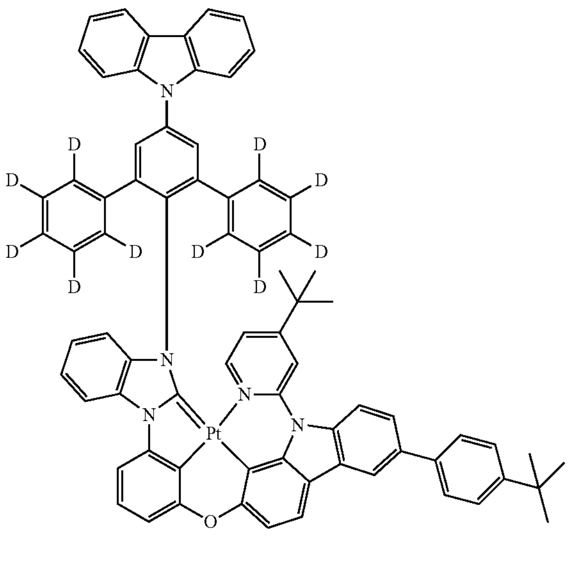
71
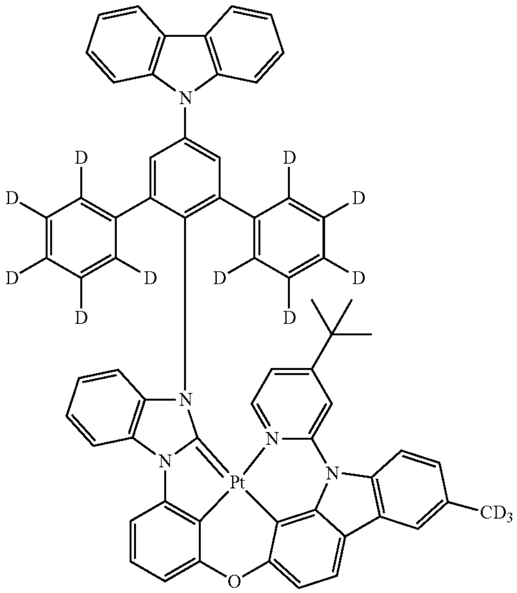
70
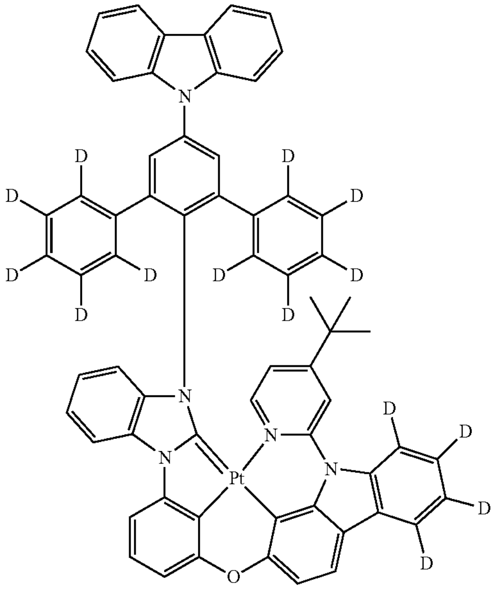
72
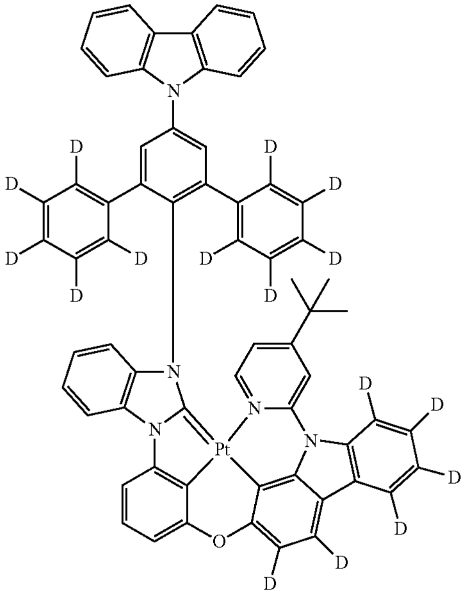

-continued
73
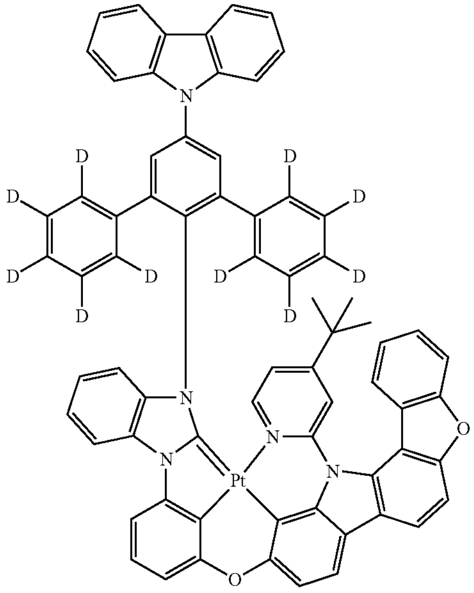
74
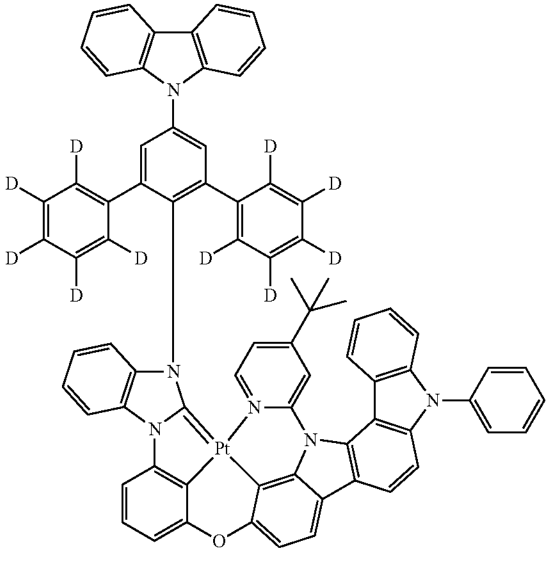
-continued
75
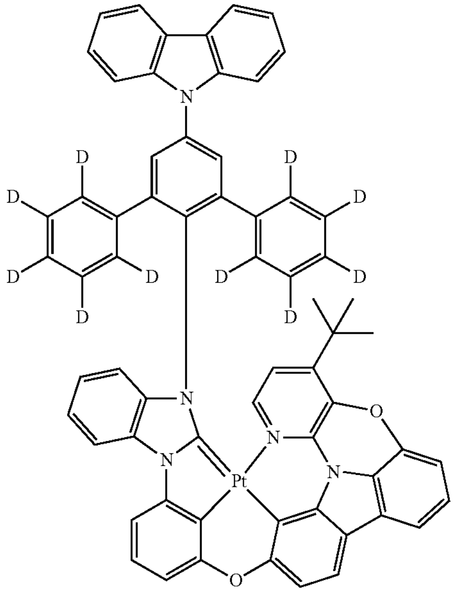
76
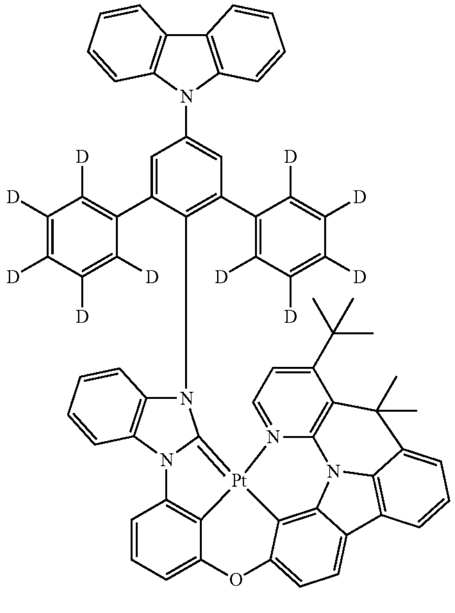

-continued
77
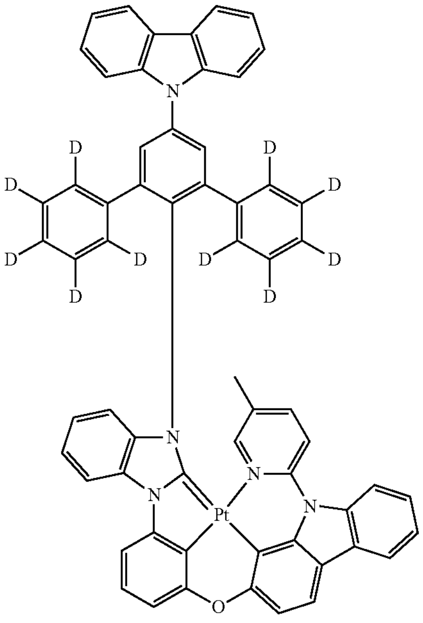
78
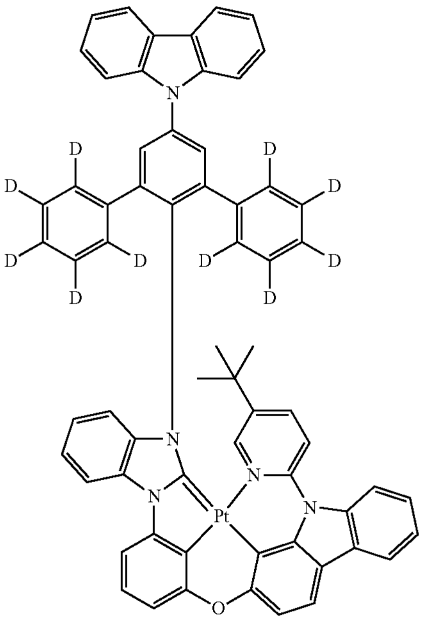
-continued
79
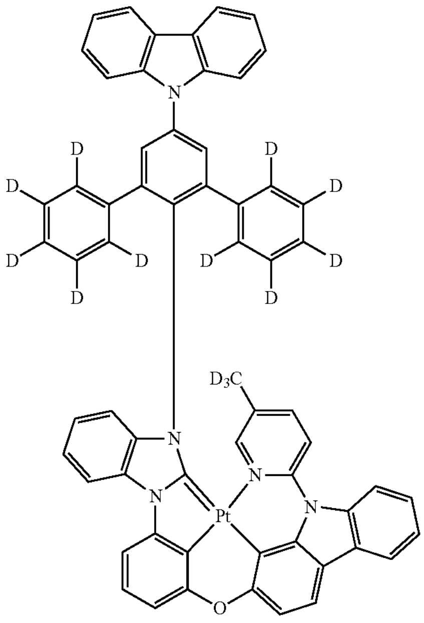
80
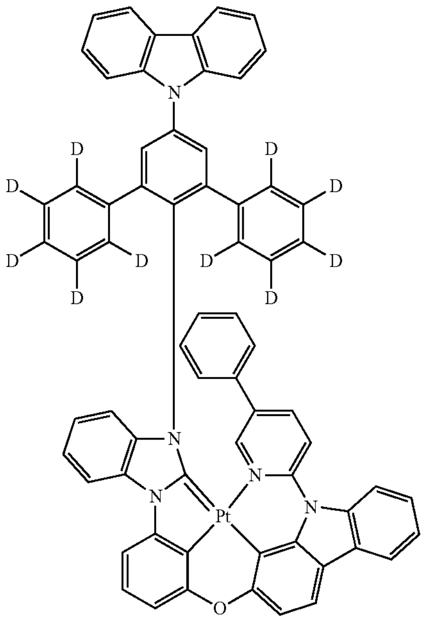

-continued
81
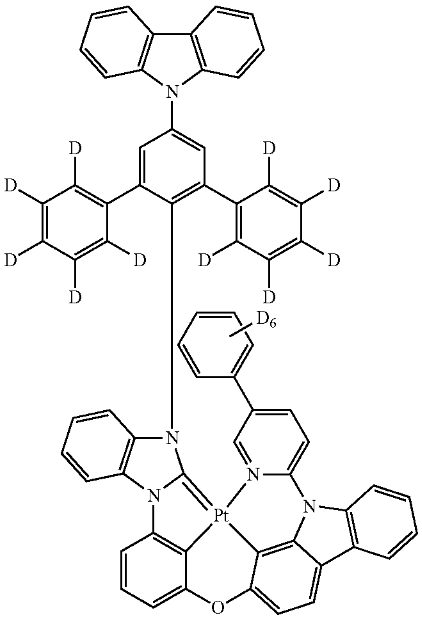
82
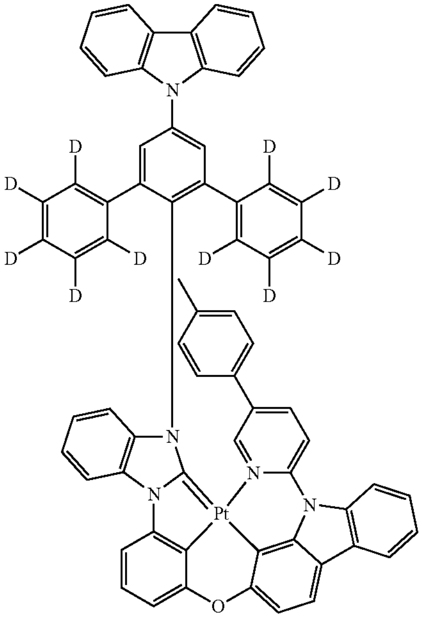
-continued
83
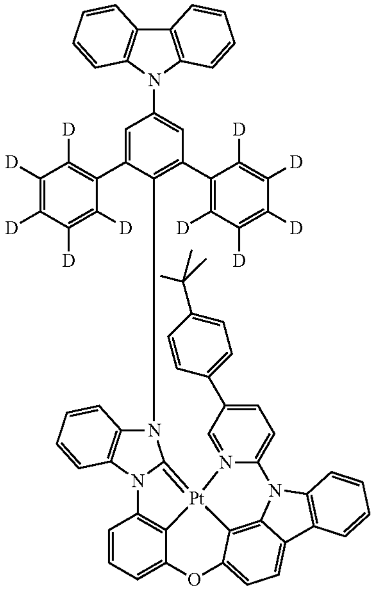
84
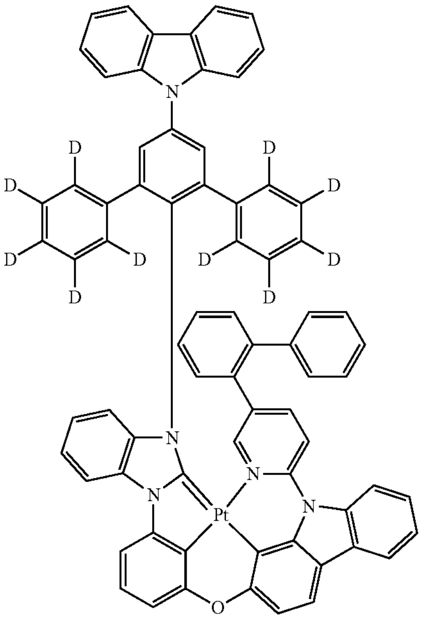

-continued
85
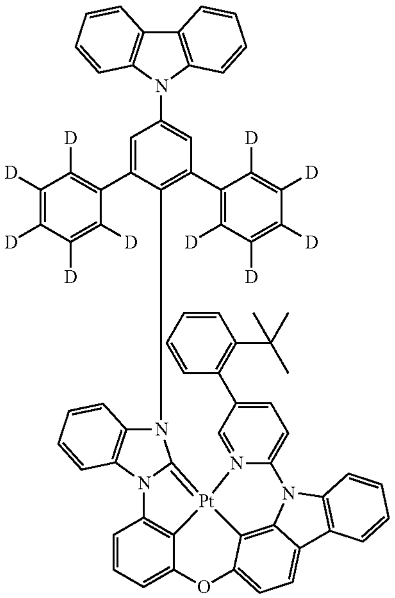
86
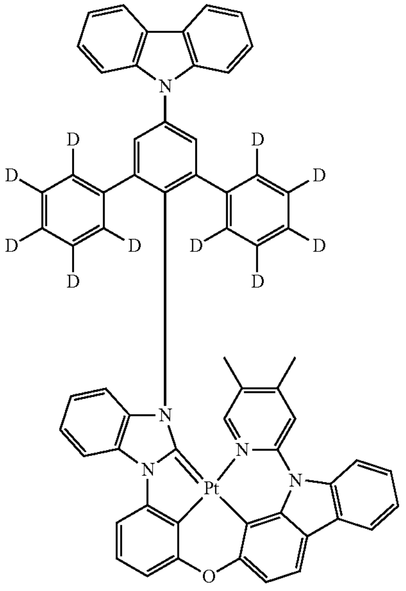
-continued
87
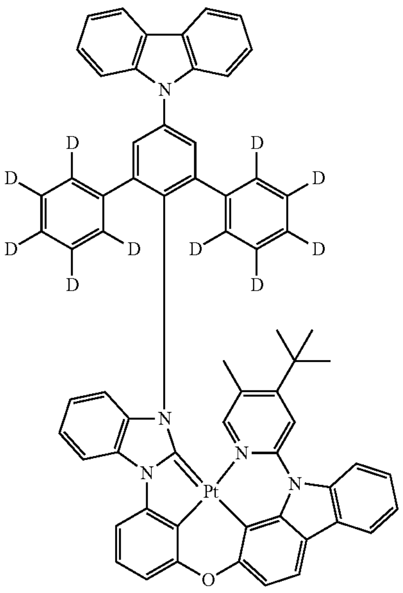
88
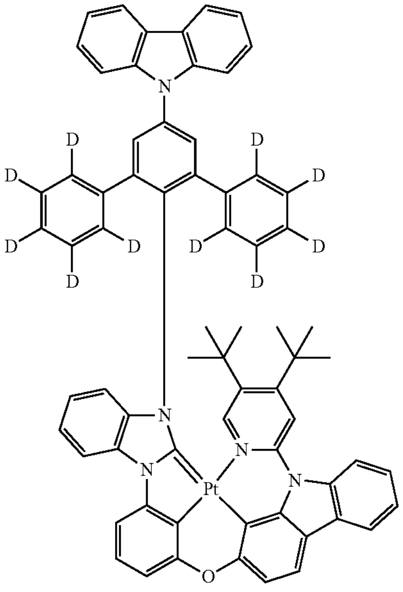

-continued
89
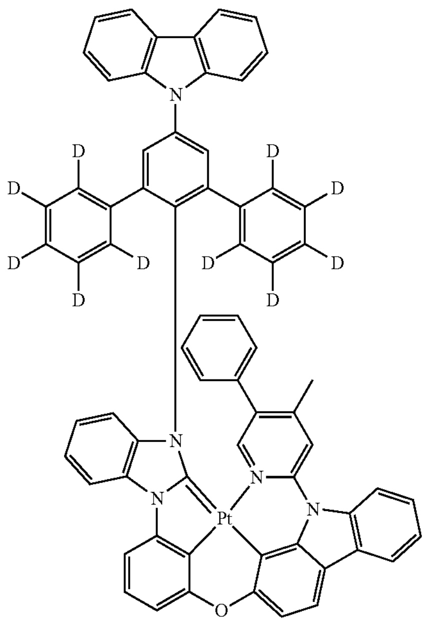
90
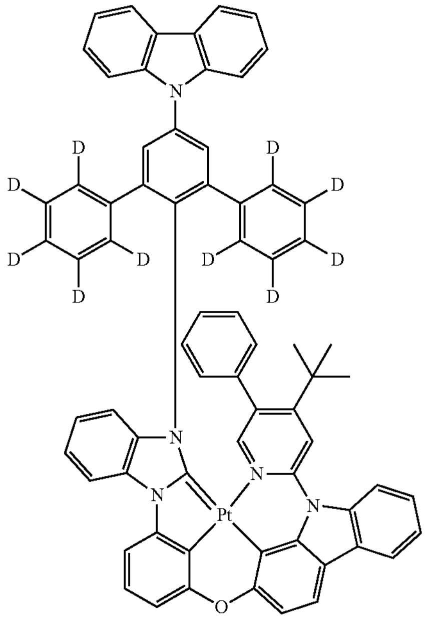
-continued
91
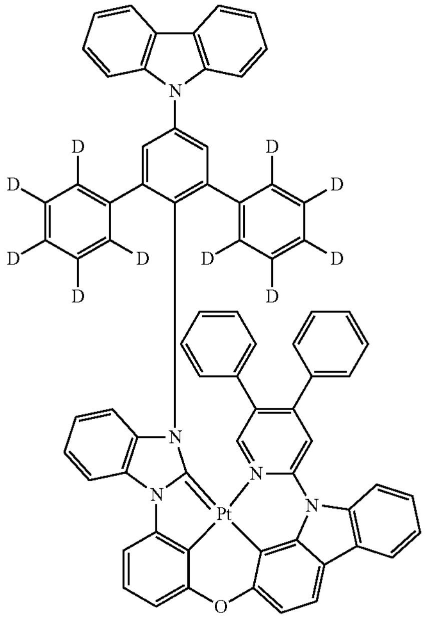
92
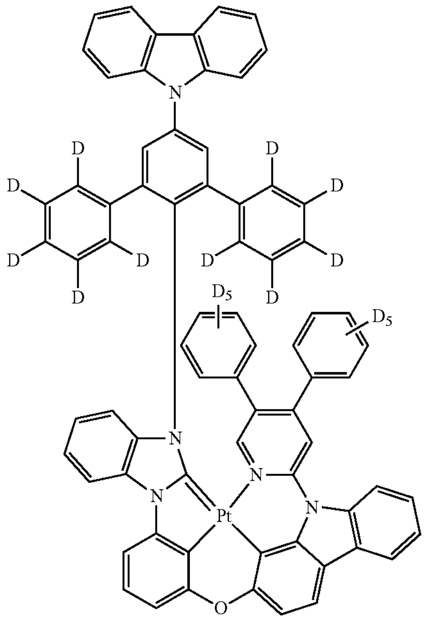

93
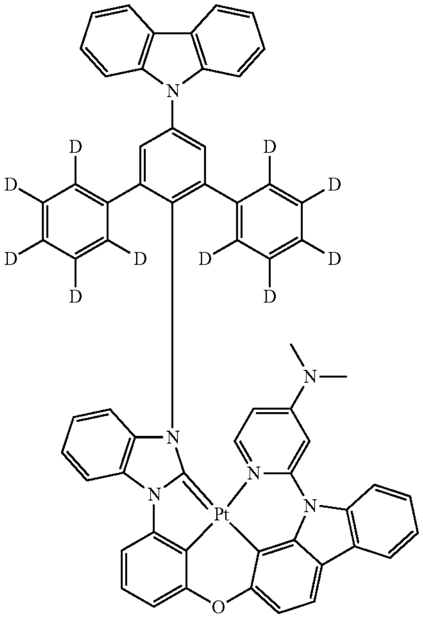
94
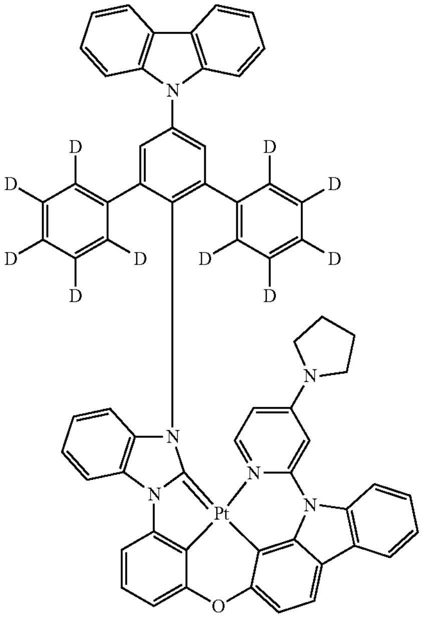
-continued
95
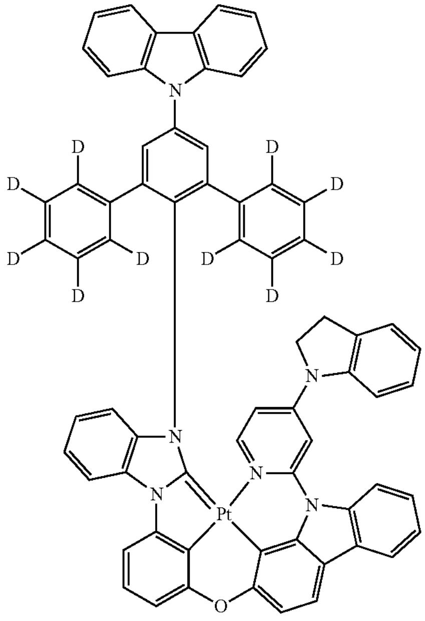
96
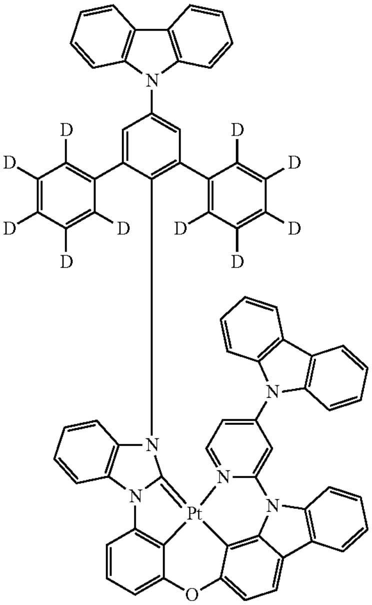

-continued
97
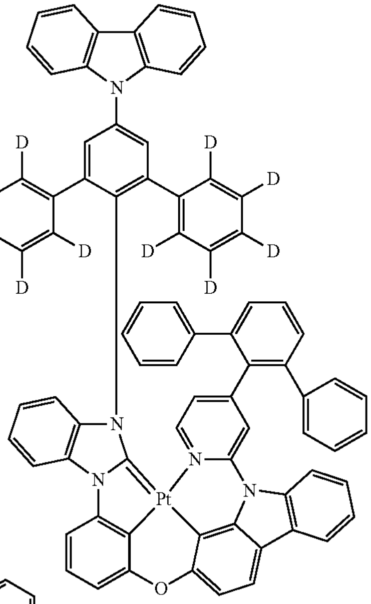
98
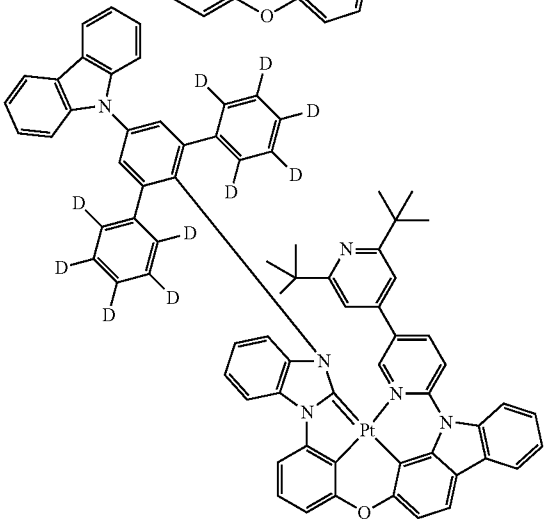
-continued
99
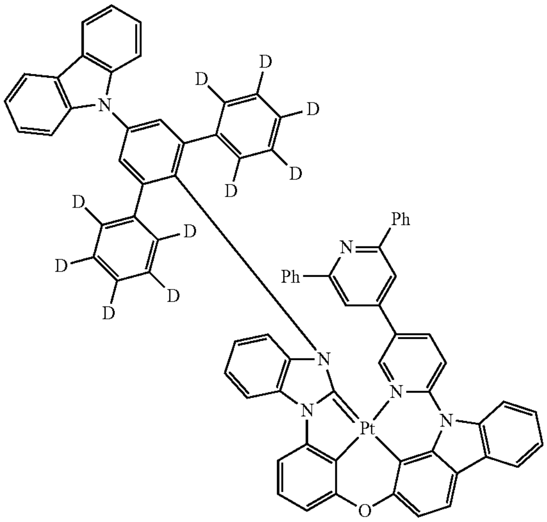
.
* * * * *